US008115788B2

(12) United States Patent  
Kimura et al.

(10) Patent No.: US 8,115,788 B2
(45) Date of Patent: Feb. 14, 2012

(54) DISPLAY DEVICE, DRIVING METHOD OF DISPLAY DEVICE, AND ELECTRONIC APPLIANCE

(75) Inventors: Hajime Kimura, Atsugi (JP); Hideaki Shishido, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1014 days.

(21) Appl. No.: 11/802,473

(22) Filed: May 23, 2007

(65) Prior Publication Data

US 2007/0279344 A1 Dec. 6, 2007

(30) Foreign Application Priority Data

May 31, 2006 (JP) ................................. 2006-151100

(51) Int. Cl.
*G09G 5/02* (2006.01)

(52) U.S. Cl. .......... 345/694; 345/690; 345/204; 345/77; 345/76

(58) Field of Classification Search .................... 345/60, 345/694, 77
See application file for complete search history.

(56) References Cited

U.S. PATENT DOCUMENTS

| | | | |
|---|---|---|---|
| 5,808,594 A * | 9/1998 | Tsuboyama et al. | 345/89 |
| 6,072,555 A * | 6/2000 | Mizutome et al. | 349/144 |
| 6,081,309 A * | 6/2000 | Suzuki et al. | 349/106 |
| 6,144,364 A | 11/2000 | Otobe et al. | |
| 6,192,159 B1 | 2/2001 | Wood et al. | |
| 6,222,512 B1 | 4/2001 | Tajima et al. | |
| 6,249,265 B1 | 6/2001 | Tajima et al. | |
| 6,335,778 B1 * | 1/2002 | Kubota et al. | 349/151 |
| 6,417,835 B1 | 7/2002 | Otobe et al. | |
| 6,448,960 B1 | 9/2002 | Shigeta | |
| 6,518,941 B1 | 2/2003 | Kimura | |

(Continued)

FOREIGN PATENT DOCUMENTS

JP 2639311 4/1997

(Continued)

OTHER PUBLICATIONS

Chinese Office Action (Application No. 200710109821.9) Dated Sep. 16, 2010.

(Continued)

*Primary Examiner* — Richard Hjerpe
*Assistant Examiner* — Dorothy Harris
(74) *Attorney, Agent, or Firm* — Eric J. Robinson; Robinson Intellectual Property Law Office, P.C.

(57) ABSTRACT

An object is to reduce a pseudo contour occurring in time gray scale method display. One pixel is divided into m subpixels (m is an integer of m≧2), and the area of the (s+1)th subpixel (1≦s≦m−1) is twice the area of the s-th subpixel. Further, one frame is divided into n subframes (n is an integer of n≧2), and a lighting period of the (p+1)th subframe (1≦p≦n−1) is $2^m$ times longer than a lighting period of a p-th subframe. Then, at least one subframe of the n subframes is divided into a plurality of subpixels each having a lighting period shorter than that of the subframe so that the n subframes are increased to t subframes (t>n). In at least one subframe of the t subframes, lighting periods of the subframes in a lighting state are sequentially added by the m subpixels, so that a gray scale of the pixel is expressed.

28 Claims, 81 Drawing Sheets

U.S. PATENT DOCUMENTS

| | | | |
|---|---|---|---|
| 6,563,486 B2 | 5/2003 | Otobe et al. | |
| 6,861,810 B2 * | 3/2005 | Rutherford | 315/169.3 |
| 6,965,365 B2 * | 11/2005 | Nakamura | 345/87 |
| 7,053,868 B1 * | 5/2006 | Kojima et al. | 345/60 |
| 7,084,848 B2 * | 8/2006 | Senda et al. | 345/92 |
| 7,095,390 B2 | 8/2006 | Otobe et al. | |
| 7,119,766 B2 | 10/2006 | Otobe et al. | |
| 7,129,918 B2 | 10/2006 | Kimura | |
| 7,342,249 B2 * | 3/2008 | Park et al. | 257/59 |
| 2002/0054000 A1 | 5/2002 | Tokunaga et al. | |
| 2002/0140364 A1 | 10/2002 | Inukai | |
| 2003/0090447 A1 * | 5/2003 | Kimura | 345/82 |
| 2003/0218584 A1 * | 11/2003 | Kimura | 345/76 |
| 2005/0200788 A1 * | 9/2005 | Edwards | 349/139 |
| 2007/0001954 A1 | 1/2007 | Shishido et al. | |
| 2007/0035488 A1 | 2/2007 | Kimura | |
| 2007/0115223 A1 | 5/2007 | Kimura | |

FOREIGN PATENT DOCUMENTS

| | | |
|---|---|---|
| JP | 2639311 | 8/1997 |
| JP | 10-307561 | 11/1998 |
| JP | 11-073158 | 3/1999 |
| JP | 2903984 | 3/1999 |
| JP | 2903984 | 6/1999 |
| JP | 3075335 | 6/2000 |
| JP | 2000206922 A * | 7/2000 |
| JP | 3075335 | 8/2000 |
| JP | 2001-125526 | 5/2001 |
| JP | 3322809 | 6/2002 |
| JP | 3322809 | 9/2002 |
| JP | 2003-168109 A | 6/2003 |
| JP | 3489884 | 11/2003 |
| JP | 3489884 | 1/2004 |
| JP | 3585369 | 8/2004 |
| JP | 3585369 | 11/2004 |
| TW | 522360 | 3/2003 |

OTHER PUBLICATIONS

Chinese Office Action (Application No. 200710109821.9) Dated Sep. 8, 2011.

* cited by examiner

| Subframe Lighting Period | SF1 | | SF2 | | SF31 | | SF32 | |
|---|---|---|---|---|---|---|---|---|
| | 1 | | 4 | | 8 | | 8 | |
| Area of Subpixel | SP1 | SP2 | SP1 | SP2 | SP1 | SP2 | SP1 | SP2 |
| | 1 | 2 | 1 | 2 | 1 | 2 | 1 | 2 |
| Light Emission Intensity | 1 | 2 | 4 | 8 | 8 | 16 | 8 | 16 |
| Gray Scale | | | | | | | | |
| 0 | × | × | × | × | × | × | × | × |
| 1 | ○ | × | × | × | × | × | × | × |
| 2 | × | ○ | × | × | × | × | × | × |
| 3 | ○ | ○ | × | × | × | × | × | × |
| 4 | × | × | ○ | × | × | × | × | × |
| 5 | ○ | × | ○ | × | × | × | × | × |
| 6 | × | ○ | ○ | × | × | × | × | × |
| 7 | ○ | ○ | ○ | × | × | × | × | × |
| 8 | × | × | × | × | ○ | × | × | × |
| 9 | ○ | × | × | × | ○ | × | × | × |
| 10 | × | ○ | × | × | ○ | × | × | × |
| 11 | ○ | ○ | × | × | ○ | × | × | × |
| 12 | × | × | ○ | × | ○ | × | × | × |
| 13 | ○ | × | ○ | × | ○ | × | × | × |
| 14 | × | ○ | ○ | × | ○ | × | × | × |
| 15 | ○ | ○ | ○ | × | ○ | × | × | × |
| 16 | × | × | × | × | ○ | × | ○ | × |
| 17 | ○ | × | × | × | ○ | × | ○ | × |
| 18 | × | ○ | × | × | ○ | × | ○ | × |
| 19 | ○ | ○ | × | × | ○ | × | ○ | × |
| 20 | × | × | ○ | × | ○ | × | ○ | × |
| 21 | ○ | × | ○ | × | ○ | × | ○ | × |
| 22 | × | ○ | ○ | × | ○ | × | ○ | × |
| 23 | ○ | ○ | ○ | × | ○ | × | ○ | × |
| 24 | × | × | × | ○ | ○ | × | ○ | × |
| 25 | ○ | × | × | ○ | ○ | × | ○ | × |
| 26 | × | ○ | × | ○ | ○ | × | ○ | × |
| 27 | ○ | ○ | × | ○ | ○ | × | ○ | × |
| 28 | × | × | ○ | ○ | ○ | × | ○ | × |
| 29 | ○ | × | ○ | ○ | ○ | × | ○ | × |
| 30 | × | ○ | ○ | ○ | ○ | × | ○ | × |
| 31 | ○ | ○ | ○ | ○ | ○ | × | ○ | × |
| 32 | × | × | × | × | ○ | ○ | ○ | × |
| 33 | ○ | × | × | × | ○ | ○ | ○ | × |
| 34 | × | ○ | × | × | ○ | ○ | ○ | × |
| 35 | ○ | ○ | × | × | ○ | ○ | ○ | × |
| 36 | × | × | ○ | × | ○ | ○ | ○ | × |
| 37 | ○ | × | ○ | × | ○ | ○ | ○ | × |
| 38 | × | ○ | ○ | × | ○ | ○ | ○ | × |
| 39 | ○ | ○ | ○ | × | ○ | ○ | ○ | × |
| 40 | × | × | × | ○ | ○ | ○ | ○ | × |
| 41 | ○ | × | × | ○ | ○ | ○ | ○ | × |
| 42 | × | ○ | × | ○ | ○ | ○ | ○ | × |
| 43 | ○ | ○ | × | ○ | ○ | ○ | ○ | × |
| 44 | × | × | ○ | ○ | ○ | ○ | ○ | × |
| 45 | ○ | × | ○ | ○ | ○ | ○ | ○ | × |
| 46 | × | ○ | ○ | ○ | ○ | ○ | ○ | × |
| 47 | ○ | ○ | ○ | ○ | ○ | ○ | ○ | × |
| 48 | × | × | × | × | ○ | ○ | ○ | ○ |
| 49 | ○ | × | × | × | ○ | ○ | ○ | ○ |
| 50 | × | ○ | × | × | ○ | ○ | ○ | ○ |
| 51 | ○ | ○ | × | × | ○ | ○ | ○ | ○ |
| 52 | × | × | ○ | × | ○ | ○ | ○ | ○ |
| 53 | ○ | × | ○ | × | ○ | ○ | ○ | ○ |
| 54 | × | ○ | ○ | × | ○ | ○ | ○ | ○ |
| 55 | ○ | ○ | ○ | × | ○ | ○ | ○ | ○ |
| 56 | × | × | × | ○ | ○ | ○ | ○ | ○ |
| 57 | ○ | × | × | ○ | ○ | ○ | ○ | ○ |
| 58 | × | ○ | × | ○ | ○ | ○ | ○ | ○ |
| 59 | ○ | ○ | × | ○ | ○ | ○ | ○ | ○ |
| 60 | × | × | ○ | ○ | ○ | ○ | ○ | ○ |
| 61 | ○ | × | ○ | ○ | ○ | ○ | ○ | ○ |
| 62 | × | ○ | ○ | ○ | ○ | ○ | ○ | ○ |
| 63 | ○ | ○ | ○ | ○ | ○ | ○ | ○ | ○ |

○: Lighting

×: non-Lighting

FIG. 1

Overlapping Time Gray Scale Method

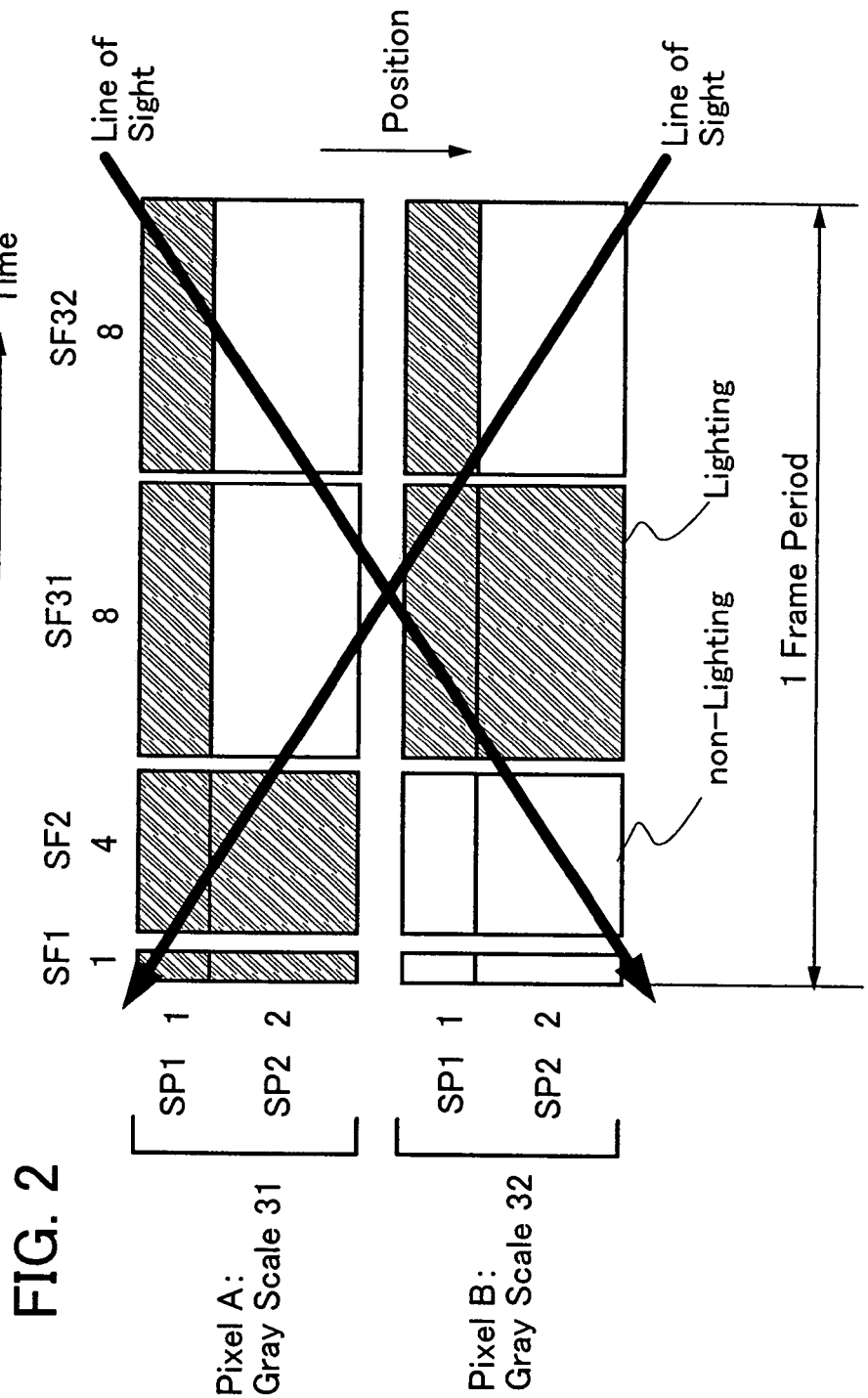

FIG. 3

Subframe Lighting Period / Area of Subpixel / Light Emission Intensity

| Gray Scale | SF1 | | SF2 | | SF31 | | SF32 | | SF33 | | SF34 | |
|---|---|---|---|---|---|---|---|---|---|---|---|---|
| | 1 | | 4 | | 4 | | 4 | | 4 | | 4 | |
| | SP1 | SP2 | SP1 | SP2 | SP1 | SP2 | SP1 | SP2 | SP1 | SP2 | SP1 | SP2 |
| | 1 | 2 | 1 | 2 | 1 | 2 | 1 | 2 | 1 | 2 | 1 | 2 |
| | 1 | 2 | 4 | 8 | 4 | 8 | 4 | 8 | 4 | 8 | 4 | 8 |
| 0 | × | × | × | × | × | × | × | × | × | × | × | × |
| 1 | ○ | × | × | × | × | × | × | × | × | × | × | × |
| 2 | × | ○ | × | × | × | × | × | × | × | × | × | × |
| 3 | ○ | ○ | × | × | × | × | × | × | × | × | × | × |
| 4 | × | × | ○ | × | × | × | × | × | × | × | × | × |
| 5 | ○ | × | ○ | × | × | × | × | × | × | × | × | × |
| 6 | × | ○ | ○ | × | × | × | × | × | × | × | × | × |
| 7 | ○ | ○ | ○ | × | × | × | × | × | × | × | × | × |
| 8 | × | × | ○ | × | ○ | × | × | × | × | × | × | × |
| 9 | ○ | × | ○ | × | ○ | × | × | × | × | × | × | × |
| 10 | × | ○ | ○ | × | ○ | × | × | × | × | × | × | × |
| 11 | ○ | ○ | ○ | × | ○ | × | × | × | × | × | × | × |
| 12 | × | × | ○ | × | ○ | × | ○ | × | × | × | × | × |
| 13 | ○ | × | ○ | × | ○ | × | ○ | × | × | × | × | × |
| 14 | × | ○ | ○ | × | ○ | × | ○ | × | × | × | × | × |
| 15 | ○ | ○ | ○ | × | ○ | × | ○ | × | × | × | × | × |
| 16 | × | × | ○ | × | ○ | × | ○ | × | ○ | × | × | × |
| 17 | ○ | × | ○ | × | ○ | × | ○ | × | ○ | × | × | × |
| 18 | × | ○ | ○ | × | ○ | × | ○ | × | ○ | × | × | × |
| 19 | ○ | ○ | ○ | × | ○ | × | ○ | × | ○ | × | × | × |
| 20 | × | × | ○ | × | ○ | × | ○ | × | ○ | × | ○ | × |
| 21 | ○ | × | ○ | × | ○ | × | ○ | × | ○ | × | ○ | × |
| 22 | × | ○ | ○ | × | ○ | × | ○ | × | ○ | × | ○ | × |
| 23 | ○ | ○ | ○ | × | ○ | × | ○ | × | ○ | × | ○ | × |
| 24 | × | × | ○ | ○ | ○ | × | ○ | × | ○ | × | × | × |
| 25 | ○ | × | ○ | ○ | ○ | × | ○ | × | ○ | × | × | × |
| 26 | × | ○ | ○ | ○ | ○ | × | ○ | × | ○ | × | × | × |
| 27 | ○ | ○ | ○ | ○ | ○ | × | ○ | × | ○ | × | × | × |
| 28 | × | × | ○ | ○ | ○ | × | ○ | × | ○ | × | ○ | × |
| 29 | ○ | × | ○ | ○ | ○ | × | ○ | × | ○ | × | ○ | × |
| 30 | × | ○ | ○ | ○ | ○ | × | ○ | × | ○ | × | ○ | × |
| 31 | ○ | ○ | ○ | ○ | ○ | × | ○ | × | ○ | × | ○ | × |
| 32 | × | × | ○ | ○ | ○ | ○ | ○ | × | ○ | × | × | × |
| 33 | ○ | × | ○ | ○ | ○ | ○ | ○ | × | ○ | × | × | × |
| 34 | × | ○ | ○ | ○ | ○ | ○ | ○ | × | ○ | × | × | × |
| 35 | ○ | ○ | ○ | ○ | ○ | ○ | ○ | × | ○ | × | × | × |
| 36 | × | × | ○ | ○ | ○ | ○ | ○ | × | ○ | × | ○ | × |
| 37 | ○ | × | ○ | ○ | ○ | ○ | ○ | × | ○ | × | ○ | × |
| 38 | × | ○ | ○ | ○ | ○ | ○ | ○ | × | ○ | × | ○ | × |
| 39 | ○ | ○ | ○ | ○ | ○ | ○ | ○ | ○ | ○ | × | ○ | × |
| 40 | × | × | ○ | ○ | ○ | ○ | ○ | ○ | ○ | × | × | × |
| 41 | ○ | × | ○ | ○ | ○ | ○ | ○ | ○ | ○ | × | × | × |
| 42 | × | ○ | ○ | ○ | ○ | ○ | ○ | ○ | ○ | × | × | × |
| 43 | ○ | ○ | ○ | ○ | ○ | ○ | ○ | ○ | ○ | × | × | × |
| 44 | × | × | ○ | ○ | ○ | ○ | ○ | ○ | ○ | × | ○ | × |
| 45 | ○ | × | ○ | ○ | ○ | ○ | ○ | ○ | ○ | × | ○ | × |
| 46 | × | ○ | ○ | ○ | ○ | ○ | ○ | ○ | ○ | × | ○ | × |
| 47 | ○ | ○ | ○ | ○ | ○ | ○ | ○ | ○ | ○ | × | ○ | × |
| 48 | × | × | ○ | ○ | ○ | ○ | ○ | ○ | ○ | ○ | × | × |
| 49 | ○ | × | ○ | ○ | ○ | ○ | ○ | ○ | ○ | ○ | × | × |
| 50 | × | ○ | ○ | ○ | ○ | ○ | ○ | ○ | ○ | ○ | × | × |
| 51 | ○ | ○ | ○ | ○ | ○ | ○ | ○ | ○ | ○ | ○ | × | × |
| 52 | × | × | ○ | ○ | ○ | ○ | ○ | ○ | ○ | ○ | ○ | × |
| 53 | ○ | × | ○ | ○ | ○ | ○ | ○ | ○ | ○ | ○ | ○ | × |
| 54 | × | ○ | ○ | ○ | ○ | ○ | ○ | ○ | ○ | ○ | ○ | × |
| 55 | ○ | ○ | ○ | ○ | ○ | ○ | ○ | ○ | ○ | ○ | ○ | × |
| 56 | × | × | ○ | ○ | ○ | ○ | ○ | ○ | ○ | ○ | × | ○ |
| 57 | ○ | × | ○ | ○ | ○ | ○ | ○ | ○ | ○ | ○ | × | ○ |
| 58 | × | ○ | ○ | ○ | ○ | ○ | ○ | ○ | ○ | ○ | × | ○ |
| 59 | ○ | ○ | ○ | ○ | ○ | ○ | ○ | ○ | ○ | ○ | × | ○ |
| 60 | × | × | ○ | ○ | ○ | ○ | ○ | ○ | ○ | ○ | ○ | ○ |
| 61 | ○ | × | ○ | ○ | ○ | ○ | ○ | ○ | ○ | ○ | ○ | ○ |
| 62 | × | ○ | ○ | ○ | ○ | ○ | ○ | ○ | ○ | ○ | ○ | ○ |
| 63 | ○ | ○ | ○ | ○ | ○ | ○ | ○ | ○ | ○ | ○ | ○ | ○ |

○: Lighting
×: non-Lighting

Overlapping Time Gray Scale Method

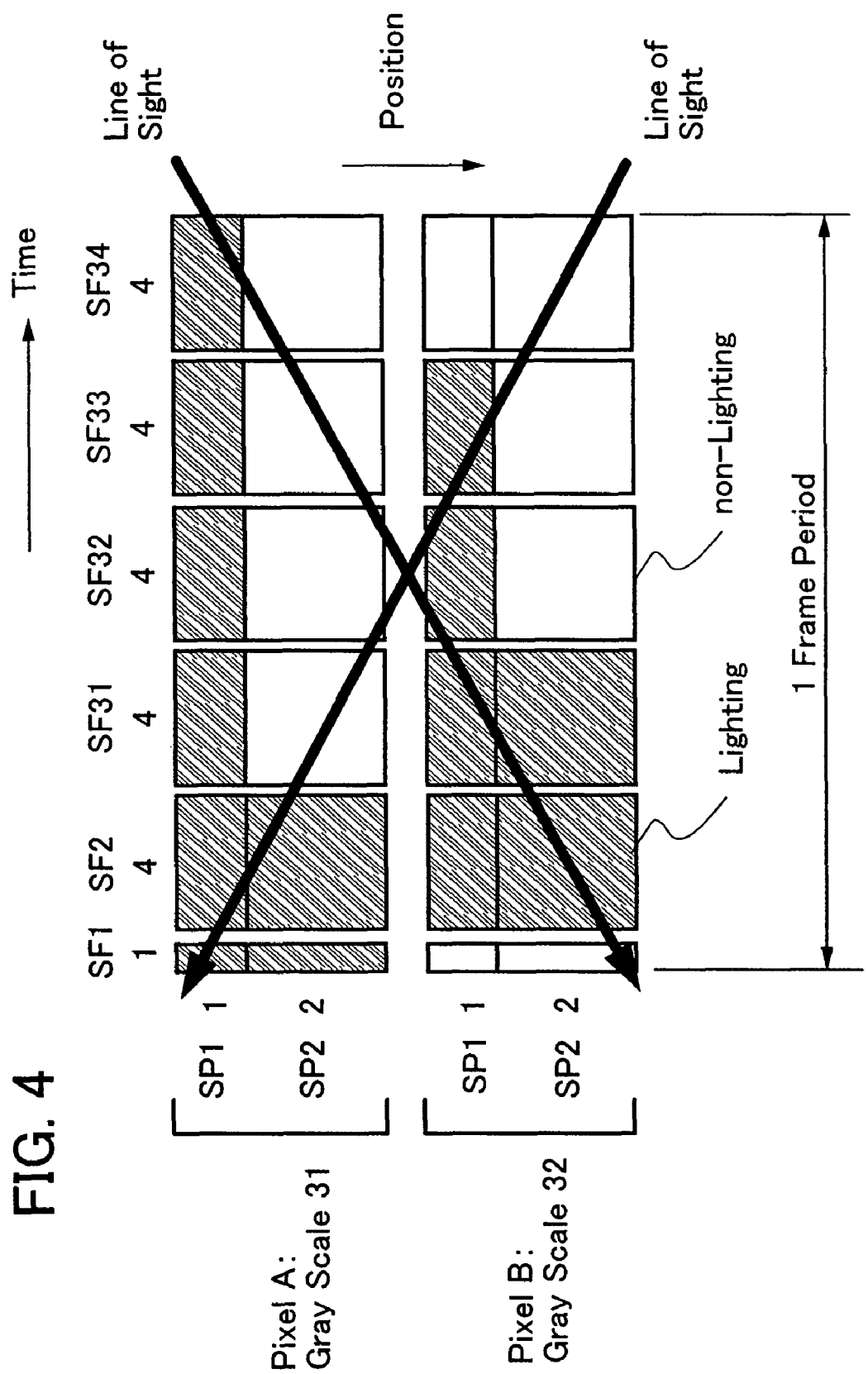

| | | SF1 | | SF2 | | SF31 | | SF32 | |
|---|---|---|---|---|---|---|---|---|---|
| Subframe Lighting Period | | 1 | | 4 | | 4 | | 12 | |
| Area of Subpixel | | SP1 | SP2 | SP1 | SP2 | SP1 | SP2 | SP1 | SP2 |
| | | 1 | 2 | 1 | 2 | 1 | 2 | 1 | 2 |
| Light Emission Intensity | | 1 | 2 | 4 | 8 | 4 | 8 | 12 | 24 |
| Gray Scale | 0 | × | × | × | × | × | × | × | × |
| | 1 | ○ | × | × | × | × | × | × | × |
| | 2 | × | ○ | × | × | × | × | × | × |
| | 3 | ○ | ○ | × | × | × | × | × | × |
| | 4 | × | × | ○ | × | × | × | × | × |
| | 5 | ○ | × | ○ | × | × | × | × | × |
| | 6 | × | ○ | ○ | × | × | × | × | × |
| | 7 | ○ | ○ | ○ | × | × | × | × | × |
| | 8 | × | × | ○ | × | ○ | × | × | × |
| | 9 | ○ | × | ○ | × | ○ | × | × | × |
| | 10 | × | ○ | ○ | × | ○ | × | × | × |
| | 11 | ○ | ○ | ○ | × | ○ | × | × | × |
| | 12 | × | × | ○ | ○ | × | × | × | × |
| | 13 | ○ | × | ○ | ○ | × | × | × | × |
| | 14 | × | ○ | ○ | ○ | × | × | × | × |
| | 15 | ○ | ○ | ○ | ○ | × | × | × | × |
| | 16 | × | × | ○ | ○ | ○ | × | × | × |
| | 17 | ○ | × | ○ | ○ | ○ | × | × | × |
| | 18 | × | ○ | ○ | ○ | ○ | × | × | × |
| | 19 | ○ | ○ | ○ | ○ | ○ | × | × | × |
| | 20 | × | × | ○ | ○ | × | ○ | × | × |
| | 21 | ○ | × | ○ | ○ | × | ○ | × | × |
| | 22 | × | ○ | ○ | ○ | × | ○ | × | × |
| | 23 | ○ | ○ | ○ | ○ | × | ○ | × | × |
| | 24 | × | × | ○ | ○ | ○ | ○ | × | × |
| | 25 | ○ | × | ○ | ○ | ○ | ○ | × | × |
| | 26 | × | ○ | ○ | ○ | ○ | ○ | × | × |
| | 27 | ○ | ○ | ○ | ○ | ○ | ○ | × | × |
| | 28 | × | × | ○ | ○ | ○ | × | ○ | × |
| | 29 | ○ | × | ○ | ○ | ○ | × | ○ | × |
| | 30 | × | ○ | ○ | ○ | ○ | × | ○ | × |
| | 31 | ○ | ○ | ○ | ○ | ○ | × | ○ | × |
| | 32 | × | × | ○ | ○ | × | ○ | ○ | × |
| | 33 | ○ | × | ○ | ○ | × | ○ | ○ | × |
| | 34 | × | ○ | ○ | ○ | × | ○ | ○ | × |
| | 35 | ○ | ○ | ○ | ○ | × | ○ | ○ | × |
| | 36 | × | × | ○ | ○ | ○ | ○ | ○ | × |
| | 37 | ○ | × | ○ | ○ | ○ | ○ | ○ | × |
| | 38 | × | ○ | ○ | ○ | ○ | ○ | ○ | × |
| | 39 | ○ | ○ | ○ | ○ | ○ | ○ | ○ | × |
| | 40 | × | × | ○ | ○ | ○ | × | × | ○ |
| | 41 | ○ | × | ○ | ○ | ○ | × | × | ○ |
| | 42 | × | ○ | ○ | ○ | ○ | × | × | ○ |
| | 43 | ○ | ○ | ○ | ○ | ○ | × | × | ○ |
| | 44 | × | × | ○ | ○ | × | ○ | × | ○ |
| | 45 | ○ | × | ○ | ○ | × | ○ | × | ○ |
| | 46 | × | ○ | ○ | ○ | × | ○ | × | ○ |
| | 47 | ○ | ○ | ○ | ○ | × | ○ | × | ○ |
| | 48 | × | × | ○ | ○ | ○ | ○ | × | ○ |
| | 49 | ○ | × | ○ | ○ | ○ | ○ | × | ○ |
| | 50 | × | ○ | ○ | ○ | ○ | ○ | × | ○ |
| | 51 | ○ | ○ | ○ | ○ | ○ | ○ | × | ○ |
| | 52 | × | × | ○ | ○ | ○ | × | ○ | ○ |
| | 53 | ○ | × | ○ | ○ | ○ | × | ○ | ○ |
| | 54 | × | ○ | ○ | ○ | ○ | × | ○ | ○ |
| | 55 | ○ | ○ | ○ | ○ | ○ | × | ○ | ○ |
| | 56 | × | × | ○ | ○ | × | ○ | ○ | ○ |
| | 57 | ○ | × | ○ | ○ | × | ○ | ○ | ○ |
| | 58 | × | ○ | ○ | ○ | × | ○ | ○ | ○ |
| | 59 | ○ | ○ | ○ | ○ | × | ○ | ○ | ○ |
| | 60 | × | × | ○ | ○ | ○ | ○ | ○ | ○ |
| | 61 | ○ | × | ○ | ○ | ○ | ○ | ○ | ○ |
| | 62 | × | ○ | ○ | ○ | ○ | ○ | ○ | ○ |
| | 63 | ○ | ○ | ○ | ○ | ○ | ○ | ○ | ○ |

○: Lighting
×: non-Lighting

FIG. 5  Overlapping Time Gray Scale Method

| Subframe Lighting Period | | SF1 | | SF2 | | SF31 | | SF32 | | SF33 | |
|---|---|---|---|---|---|---|---|---|---|---|---|
| | | 1 | | 4 | | 4 | | 4 | | 8 | |
| Area of Subpixel | | SP1 | SP2 | SP1 | SP2 | SP1 | SP2 | SP1 | SP2 | SP1 | SP2 |
| | | 1 | 2 | 1 | 2 | 1 | 2 | 1 | 2 | 1 | 2 |
| Light Emission Intensity | | 1 | 2 | 4 | 8 | 4 | 8 | 4 | 8 | 8 | 16 |
| Gray Scale | 0 | × | × | × | × | × | × | × | × | × | × |
| | 1 | ○ | × | × | × | × | × | × | × | × | × |
| | 2 | × | ○ | × | × | × | × | × | × | × | × |
| | 3 | ○ | ○ | × | × | × | × | × | × | × | × |
| | 4 | × | × | ○ | × | × | × | × | × | × | × |
| | 5 | ○ | × | ○ | × | × | × | × | × | × | × |
| | 6 | × | ○ | ○ | × | × | × | × | × | × | × |
| | 7 | ○ | ○ | ○ | × | × | × | × | × | × | × |
| | 8 | × | × | ○ | × | ○ | × | × | × | × | × |
| | 9 | ○ | × | ○ | × | ○ | × | × | × | × | × |
| | 10 | × | ○ | ○ | × | ○ | × | × | × | × | × |
| | 11 | ○ | ○ | ○ | × | ○ | × | × | × | × | × |
| | 12 | × | × | ○ | × | ○ | × | ○ | × | × | × |
| | 13 | ○ | × | ○ | × | ○ | × | ○ | × | × | × |
| | 14 | × | ○ | ○ | × | ○ | × | ○ | × | × | × |
| | 15 | ○ | ○ | ○ | × | ○ | × | ○ | × | × | × |
| | 16 | × | × | ○ | ○ | ○ | × | × | × | × | × |
| | 17 | ○ | × | ○ | ○ | ○ | × | × | × | × | × |
| | 18 | × | ○ | ○ | ○ | ○ | × | × | × | × | × |
| | 19 | ○ | ○ | ○ | ○ | ○ | × | × | × | × | × |
| | 20 | × | × | ○ | ○ | ○ | × | ○ | × | × | × |
| | 21 | ○ | × | ○ | ○ | ○ | × | ○ | × | × | × |
| | 22 | × | ○ | ○ | ○ | ○ | × | ○ | × | × | × |
| | 23 | ○ | ○ | ○ | ○ | ○ | × | ○ | × | × | × |
| | 24 | × | × | ○ | ○ | ○ | ○ | × | × | × | × |
| | 25 | ○ | × | ○ | ○ | ○ | ○ | × | × | × | × |
| | 26 | × | ○ | ○ | ○ | ○ | ○ | × | × | × | × |
| | 27 | ○ | ○ | ○ | ○ | ○ | ○ | × | × | × | × |
| | 28 | × | × | ○ | ○ | ○ | ○ | ○ | × | × | × |
| | 29 | ○ | × | ○ | ○ | ○ | ○ | ○ | × | × | × |
| | 30 | × | ○ | ○ | ○ | ○ | ○ | ○ | × | × | × |
| | 31 | ○ | ○ | ○ | ○ | ○ | ○ | ○ | × | × | × |
| | 32 | × | × | ○ | ○ | ○ | ○ | × | ○ | × | × |
| | 33 | ○ | × | ○ | ○ | ○ | ○ | × | ○ | × | × |
| | 34 | × | ○ | ○ | ○ | ○ | ○ | × | ○ | × | × |
| | 35 | ○ | ○ | ○ | ○ | ○ | ○ | × | ○ | × | × |
| | 36 | × | × | ○ | ○ | ○ | ○ | ○ | ○ | × | × |
| | 37 | ○ | × | ○ | ○ | ○ | ○ | ○ | ○ | × | × |
| | 38 | × | ○ | ○ | ○ | ○ | ○ | ○ | ○ | × | × |
| | 39 | ○ | ○ | ○ | ○ | ○ | ○ | ○ | ○ | × | × |
| | 40 | × | × | ○ | ○ | ○ | ○ | × | ○ | ○ | × |
| | 41 | ○ | × | ○ | ○ | ○ | ○ | × | ○ | ○ | × |
| | 42 | × | ○ | ○ | ○ | ○ | ○ | × | ○ | ○ | × |
| | 43 | ○ | ○ | ○ | ○ | ○ | ○ | × | ○ | ○ | × |
| | 44 | × | × | ○ | ○ | ○ | ○ | ○ | ○ | ○ | × |
| | 45 | ○ | × | ○ | ○ | ○ | ○ | ○ | ○ | ○ | × |
| | 46 | × | ○ | ○ | ○ | ○ | ○ | ○ | ○ | ○ | × |
| | 47 | ○ | ○ | ○ | ○ | ○ | ○ | ○ | ○ | ○ | × |
| | 48 | × | × | ○ | ○ | ○ | ○ | × | ○ | × | ○ |
| | 49 | ○ | × | ○ | ○ | ○ | ○ | × | ○ | × | ○ |
| | 50 | × | ○ | ○ | ○ | ○ | ○ | × | ○ | × | ○ |
| | 51 | ○ | ○ | ○ | ○ | ○ | ○ | × | ○ | × | ○ |
| | 52 | × | × | ○ | ○ | ○ | ○ | ○ | ○ | × | ○ |
| | 53 | ○ | × | ○ | ○ | ○ | ○ | ○ | ○ | × | ○ |
| | 54 | × | ○ | ○ | ○ | ○ | ○ | ○ | ○ | × | ○ |
| | 55 | ○ | ○ | ○ | ○ | ○ | ○ | ○ | ○ | × | ○ |
| | 56 | × | × | ○ | ○ | ○ | ○ | ○ | ○ | ○ | ○ |
| | 57 | ○ | × | ○ | ○ | ○ | ○ | × | ○ | ○ | ○ |
| | 58 | × | ○ | ○ | ○ | ○ | ○ | × | ○ | ○ | ○ |
| | 59 | ○ | ○ | ○ | ○ | ○ | ○ | × | ○ | ○ | ○ |
| | 60 | × | × | ○ | ○ | ○ | ○ | ○ | ○ | ○ | ○ |
| | 61 | ○ | × | ○ | ○ | ○ | ○ | ○ | ○ | ○ | ○ |
| | 62 | × | ○ | ○ | ○ | ○ | ○ | ○ | ○ | ○ | ○ |
| | 63 | ○ | ○ | ○ | ○ | ○ | ○ | ○ | ○ | ○ | ○ |

○: Lighting
×: non-Lighting

FIG. 7

Overlapping Time Gray Scale Method

| Subframe Lighting Period | SF1 | | SF2 | | SF31 | | SF32 | | SF33 | |
|---|---|---|---|---|---|---|---|---|---|---|
| | 1 | | 4 | | 4 | | 6 | | 6 | |
| Area of Subpixel | SP1 | SP2 | SP1 | SP2 | SP1 | SP2 | SP1 | SP2 | SP1 | SP2 |
| | 1 | 2 | 1 | 2 | 1 | 2 | 1 | 2 | 1 | 2 |
| Light Emission Intensity | 1 | 2 | 4 | 8 | 4 | 8 | 6 | 12 | 6 | 12 |
| Gray Scale | | | | | | | | | | |
| 0 | × | × | × | × | × | × | × | × | × | × |
| 1 | O | × | × | × | × | × | × | × | × | × |
| 2 | × | O | × | × | × | × | × | × | × | × |
| 3 | O | O | × | × | × | × | × | × | × | × |
| 4 | × | × | O | × | × | × | × | × | × | × |
| 5 | O | × | O | × | × | × | × | × | × | × |
| 6 | × | O | O | × | × | × | × | × | × | × |
| 7 | O | O | O | × | × | × | × | × | × | × |
| 8 | × | × | O | × | O | × | × | × | × | × |
| 9 | O | × | O | × | O | × | × | × | × | × |
| 10 | × | O | O | × | O | × | × | × | × | × |
| 11 | O | O | O | × | O | × | × | × | × | × |
| 12 | × | O | O | × | × | × | O | × | × | × |
| 13 | O | O | O | × | × | × | O | × | × | × |
| 14 | × | × | O | × | O | × | O | × | × | × |
| 15 | O | × | O | × | O | × | O | × | × | × |
| 16 | × | O | O | × | O | × | O | × | × | × |
| 17 | O | O | O | × | O | × | O | × | × | × |
| 18 | × | O | O | × | × | × | O | × | O | × |
| 19 | O | O | O | × | × | × | O | × | O | × |
| 20 | × | × | O | × | O | × | O | × | O | × |
| 21 | O | × | O | × | O | × | O | × | O | × |
| 22 | × | O | O | × | O | × | O | × | O | × |
| 23 | O | O | O | × | O | × | O | × | O | × |
| 24 | × | × | O | O | × | × | O | × | O | × |
| 25 | O | × | O | O | × | × | O | × | O | × |
| 26 | × | O | O | O | × | × | O | × | O | × |
| 27 | O | O | O | O | × | × | O | × | O | × |
| 28 | × | × | O | O | O | × | O | × | O | × |
| 29 | O | × | O | O | O | × | O | × | O | × |
| 30 | × | O | O | O | O | × | O | × | O | × |
| 31 | O | O | O | O | O | × | O | × | O | × |
| 32 | × | × | O | O | × | O | O | × | O | × |
| 33 | O | × | O | O | × | O | O | × | O | × |
| 34 | × | O | O | O | × | O | O | × | O | × |
| 35 | O | O | O | O | × | O | O | × | O | × |
| 36 | × | × | O | O | O | O | O | × | O | × |
| 37 | O | × | O | O | O | O | O | × | O | × |
| 38 | × | O | O | O | O | O | × | × | O | × |
| 39 | O | O | O | O | O | O | O | × | O | × |
| 40 | × | × | O | O | O | × | O | O | O | × |
| 41 | O | × | O | O | O | × | O | O | O | × |
| 42 | × | O | O | O | O | × | O | O | O | × |
| 43 | O | O | O | O | O | × | O | O | O | × |
| 44 | × | × | O | O | × | O | O | O | O | × |
| 45 | O | × | O | O | × | O | O | O | O | × |
| 46 | × | O | O | O | × | O | O | O | O | × |
| 47 | O | O | O | O | × | O | O | O | O | × |
| 48 | × | × | O | O | O | O | O | O | O | × |
| 49 | O | × | O | O | O | O | O | O | O | × |
| 50 | × | O | O | O | O | O | O | O | O | × |
| 51 | O | O | O | O | O | O | O | O | O | × |
| 52 | × | × | O | O | O | × | O | O | O | O |
| 53 | O | × | O | O | O | × | O | O | O | O |
| 54 | × | O | O | O | O | × | O | O | O | O |
| 55 | O | O | O | O | O | × | O | O | O | O |
| 56 | × | × | O | O | O | O | O | O | O | O |
| 57 | O | × | O | O | O | O | O | O | O | O |
| 58 | × | O | O | O | O | O | O | O | O | O |
| 59 | O | O | O | O | × | O | O | O | O | O |
| 60 | × | × | O | O | O | O | O | O | O | O |
| 61 | O | × | O | O | O | O | O | O | O | O |
| 62 | × | O | O | O | O | O | O | O | O | O |
| 63 | O | O | O | O | O | O | O | O | O | O |

O: Lighting
×: non-Lighting

FIG. 9  Overlapping Time Gray Scale Method

FIG. 11  Overlapping Time Gray Scale Method

FIG. 13 — Overlapping Time Gray Scale Method

Legend: ○ = Lighting, × = non-Lighting

| Subframe Lighting Period → | SF1 | | SF21 | | SF22 | | SF31 | | SF32 | | SF33 | | SF34 | |
|---|---|---|---|---|---|---|---|---|---|---|---|---|---|---|
| Area of Subpixel → | 1 | | 2 | | 2 | | 4 | | 4 | | 4 | | 4 | |
| | SP1 | SP2 | SP1 | SP2 | SP1 | SP2 | SP1 | SP2 | SP1 | SP2 | SP1 | SP2 | SP1 | SP2 |
| | 1 | 2 | 1 | 2 | 1 | 2 | 1 | 2 | 1 | 2 | 1 | 2 | 1 | 2 |
| Gray Scale / Light Emission Intensity | 1 | 2 | 2 | 4 | 2 | 4 | 4 | 8 | 4 | 8 | 4 | 8 | 4 | 8 |
| 0 | × | × | × | × | × | × | × | × | × | × | × | × | × | × |
| 1 | ○ | × | × | × | × | × | × | × | × | × | × | × | × | × |
| 2 | × | × | ○ | × | × | × | × | × | × | × | × | × | × | × |
| 3 | ○ | × | ○ | × | × | × | × | × | × | × | × | × | × | × |
| 4 | × | × | ○ | × | ○ | × | × | × | × | × | × | × | × | × |
| 5 | ○ | × | ○ | × | ○ | × | × | × | × | × | × | × | × | × |
| 6 | × | ○ | ○ | × | ○ | × | × | × | × | × | × | × | × | × |
| 7 | ○ | ○ | ○ | × | ○ | × | × | × | × | × | × | × | × | × |
| 8 | × | × | ○ | × | ○ | × | ○ | × | × | × | × | × | × | × |
| 9 | ○ | × | ○ | × | ○ | × | ○ | × | × | × | × | × | × | × |
| 10 | × | ○ | ○ | × | ○ | × | ○ | × | × | × | × | × | × | × |
| 11 | ○ | ○ | ○ | × | ○ | × | ○ | × | × | × | × | × | × | × |
| 12 | × | × | ○ | × | ○ | × | ○ | × | ○ | × | × | × | × | × |
| 13 | ○ | × | ○ | × | ○ | × | ○ | × | ○ | × | × | × | × | × |
| 14 | × | ○ | ○ | × | ○ | × | ○ | × | ○ | × | × | × | × | × |
| 15 | ○ | ○ | ○ | × | ○ | × | ○ | × | ○ | × | × | × | × | × |
| 16 | × | × | ○ | × | ○ | × | ○ | × | ○ | × | ○ | × | × | × |
| 17 | ○ | × | ○ | × | ○ | × | ○ | × | ○ | × | ○ | × | × | × |
| 18 | × | ○ | ○ | × | ○ | × | ○ | × | ○ | × | ○ | × | × | × |
| 19 | ○ | ○ | ○ | × | ○ | × | ○ | × | ○ | × | ○ | × | × | × |
| 20 | × | × | ○ | × | ○ | × | ○ | × | ○ | × | ○ | × | ○ | × |
| 21 | ○ | × | ○ | × | ○ | × | ○ | × | ○ | × | ○ | × | ○ | × |
| 22 | × | ○ | ○ | × | ○ | × | ○ | × | ○ | × | ○ | × | ○ | × |
| 23 | ○ | ○ | ○ | × | ○ | × | ○ | × | ○ | × | ○ | × | ○ | × |
| 24 | × | × | ○ | ○ | ○ | × | ○ | × | ○ | × | ○ | × | ○ | × |
| 25 | ○ | × | ○ | ○ | ○ | × | ○ | × | ○ | × | ○ | × | ○ | × |
| 26 | × | ○ | ○ | ○ | ○ | × | ○ | × | ○ | × | ○ | × | ○ | × |
| 27 | ○ | ○ | ○ | ○ | ○ | × | ○ | × | ○ | × | ○ | × | ○ | × |
| 28 | × | × | ○ | ○ | ○ | ○ | ○ | × | ○ | × | ○ | × | ○ | × |
| 29 | ○ | × | ○ | ○ | ○ | ○ | ○ | × | ○ | × | ○ | × | ○ | × |
| 30 | × | ○ | ○ | ○ | ○ | ○ | ○ | × | ○ | × | ○ | × | ○ | × |
| 31 | ○ | ○ | ○ | ○ | ○ | ○ | ○ | × | ○ | × | ○ | × | ○ | × |
| 32 | × | × | ○ | ○ | ○ | × | ○ | ○ | ○ | × | ○ | × | ○ | × |
| 33 | ○ | × | ○ | ○ | ○ | × | ○ | ○ | ○ | × | ○ | × | ○ | × |
| 34 | × | ○ | ○ | ○ | ○ | × | ○ | ○ | ○ | × | ○ | × | ○ | × |
| 35 | ○ | ○ | ○ | ○ | ○ | × | ○ | ○ | ○ | × | ○ | × | ○ | × |
| 36 | × | × | ○ | ○ | ○ | ○ | ○ | ○ | ○ | × | ○ | × | ○ | × |
| 37 | ○ | × | ○ | ○ | ○ | ○ | ○ | ○ | ○ | × | ○ | × | ○ | × |
| 38 | × | ○ | ○ | ○ | ○ | ○ | ○ | ○ | ○ | × | ○ | × | ○ | × |
| 39 | ○ | ○ | ○ | ○ | ○ | ○ | ○ | ○ | ○ | × | ○ | × | ○ | × |
| 40 | × | × | ○ | ○ | ○ | × | ○ | ○ | ○ | ○ | ○ | × | ○ | × |
| 41 | ○ | × | ○ | ○ | ○ | × | ○ | ○ | ○ | ○ | ○ | × | ○ | × |
| 42 | × | ○ | ○ | ○ | ○ | × | ○ | ○ | ○ | ○ | ○ | × | ○ | × |
| 43 | ○ | ○ | ○ | ○ | ○ | × | ○ | ○ | ○ | ○ | ○ | × | ○ | × |
| 44 | × | × | ○ | ○ | ○ | ○ | ○ | ○ | ○ | ○ | ○ | × | ○ | × |
| 45 | ○ | × | ○ | ○ | ○ | ○ | ○ | ○ | ○ | ○ | ○ | × | ○ | × |
| 46 | × | ○ | ○ | ○ | ○ | ○ | ○ | ○ | ○ | ○ | ○ | × | ○ | × |
| 47 | ○ | ○ | ○ | ○ | ○ | ○ | ○ | ○ | ○ | ○ | ○ | × | ○ | × |
| 48 | × | × | ○ | ○ | ○ | × | ○ | ○ | ○ | ○ | ○ | ○ | ○ | × |
| 49 | ○ | × | ○ | ○ | ○ | × | ○ | ○ | ○ | ○ | ○ | ○ | ○ | × |
| 50 | × | ○ | ○ | ○ | ○ | × | ○ | ○ | ○ | ○ | ○ | ○ | ○ | × |
| 51 | ○ | ○ | ○ | ○ | ○ | × | ○ | ○ | ○ | ○ | ○ | ○ | ○ | × |
| 52 | × | × | ○ | ○ | ○ | ○ | ○ | ○ | ○ | ○ | ○ | ○ | ○ | × |
| 53 | ○ | × | ○ | ○ | ○ | ○ | ○ | ○ | ○ | ○ | ○ | ○ | ○ | × |
| 54 | × | ○ | ○ | ○ | ○ | ○ | ○ | ○ | ○ | ○ | ○ | ○ | ○ | × |
| 55 | ○ | ○ | ○ | ○ | ○ | ○ | ○ | ○ | ○ | ○ | ○ | ○ | ○ | × |
| 56 | × | × | ○ | ○ | ○ | × | ○ | ○ | ○ | ○ | ○ | ○ | ○ | ○ |
| 57 | ○ | × | ○ | ○ | ○ | × | ○ | ○ | ○ | ○ | ○ | ○ | ○ | ○ |
| 58 | × | ○ | ○ | ○ | ○ | × | ○ | ○ | ○ | ○ | ○ | ○ | ○ | ○ |
| 59 | ○ | ○ | ○ | ○ | ○ | × | ○ | ○ | ○ | ○ | ○ | ○ | ○ | ○ |
| 60 | × | × | ○ | ○ | ○ | ○ | ○ | ○ | ○ | ○ | ○ | ○ | ○ | ○ |
| 61 | ○ | × | ○ | ○ | ○ | ○ | ○ | ○ | ○ | ○ | ○ | ○ | ○ | ○ |
| 62 | × | ○ | ○ | ○ | ○ | ○ | ○ | ○ | ○ | ○ | ○ | ○ | ○ | ○ |
| 63 | ○ | ○ | ○ | ○ | ○ | ○ | ○ | ○ | ○ | ○ | ○ | ○ | ○ | ○ |

FIG. 13

| | SF1 | | SF2 | | SF31 | | SF32 | |
|---|---|---|---|---|---|---|---|---|
| Subframe Lighting Period | 1 | | 4 | | 8 | | 8 | |
| Area of Subpixel | SP1 | SP2 | SP1 | SP2 | SP1 | SP2 | SP1 | SP2 |
| | 1 | 2 | 1 | 2 | 1 | 2 | 1 | 2 |
| Light Emission Intensity | 1 | 2 | 4 | 8 | 8 | 16 | 8 | 16 |
| Gray Scale | | | | | | | | |
| 0 | × | × | × | × | × | × | × | × |
| 1 | ○ | × | × | × | × | × | × | × |
| 2 | × | ○ | × | × | × | × | × | × |
| 3 | ○ | ○ | × | × | × | × | × | × |
| 4 | × | × | ○ | × | × | × | × | × |
| 5 | ○ | × | ○ | × | × | × | × | × |
| 6 | × | ○ | ○ | × | × | × | × | × |
| 7 | ○ | ○ | ○ | × | × | × | × | × |
| 8 | × | × | × | × | ○ | × | × | × |
| 9 | ○ | × | × | × | ○ | × | × | × |
| 10 | × | ○ | × | × | ○ | × | × | × |
| 11 | ○ | ○ | × | × | ○ | × | × | × |
| 12 | × | × | ○ | × | ○ | × | × | × |
| 13 | ○ | × | ○ | × | ○ | × | × | × |
| 14 | × | ○ | ○ | × | ○ | × | × | × |
| 15 | ○ | ○ | ○ | × | ○ | × | × | × |
| 16 | × | × | × | × | ○ | × | ○ | × |
| 17 | ○ | × | × | × | ○ | × | ○ | × |
| 18 | × | ○ | × | × | ○ | × | ○ | × |
| 19 | ○ | ○ | × | × | ○ | × | ○ | × |
| 20 | × | × | ○ | × | ○ | × | ○ | × |
| 21 | ○ | × | ○ | × | ○ | × | ○ | × |
| 22 | × | ○ | ○ | × | ○ | × | ○ | × |
| 23 | ○ | ○ | ○ | × | ○ | × | ○ | × |
| 24 | × | × | × | ○ | ○ | × | ○ | × |
| 25 | ○ | × | × | ○ | ○ | × | ○ | × |
| 26 | × | ○ | × | ○ | ○ | × | ○ | × |
| 27 | ○ | ○ | × | ○ | ○ | × | ○ | × |
| 28 | × | × | ○ | ○ | ○ | × | ○ | × |
| 29 | ○ | × | ○ | ○ | ○ | × | ○ | × |
| 30 | × | ○ | ○ | ○ | ○ | × | ○ | × |
| 31 | ○ | ○ | ○ | ○ | × | ○ | × | × |
| 32 | × | × | × | ○ | × | ○ | ○ | × |
| 33 | ○ | × | × | × | ○ | ○ | ○ | × |
| 34 | × | ○ | × | × | ○ | ○ | ○ | × |
| 35 | ○ | ○ | × | × | ○ | ○ | ○ | × |
| 36 | × | × | ○ | × | ○ | ○ | ○ | × |
| 37 | ○ | × | ○ | × | ○ | ○ | ○ | × |
| 38 | × | ○ | ○ | × | ○ | ○ | ○ | × |
| 39 | ○ | ○ | ○ | × | ○ | ○ | ○ | × |
| 40 | × | × | × | ○ | ○ | ○ | ○ | × |
| 41 | ○ | × | × | ○ | ○ | ○ | ○ | × |
| 42 | × | ○ | × | ○ | ○ | ○ | ○ | × |
| 43 | ○ | ○ | × | ○ | ○ | ○ | ○ | × |
| 44 | × | × | ○ | ○ | ○ | ○ | ○ | × |
| 45 | ○ | × | ○ | ○ | ○ | ○ | ○ | × |
| 46 | × | ○ | ○ | ○ | ○ | ○ | ○ | × |
| 47 | ○ | ○ | ○ | ○ | ○ | ○ | ○ | × |
| 48 | × | × | × | × | ○ | ○ | ○ | ○ |
| 49 | ○ | × | × | × | ○ | ○ | ○ | ○ |
| 50 | × | ○ | × | × | ○ | ○ | ○ | ○ |
| 51 | ○ | ○ | × | × | ○ | ○ | ○ | ○ |
| 52 | × | × | ○ | × | ○ | ○ | ○ | ○ |
| 53 | ○ | × | ○ | × | ○ | ○ | ○ | ○ |
| 54 | × | ○ | ○ | × | ○ | ○ | ○ | ○ |
| 55 | ○ | ○ | ○ | × | ○ | ○ | ○ | ○ |
| 56 | × | × | × | ○ | ○ | ○ | ○ | ○ |
| 57 | ○ | × | × | ○ | ○ | ○ | ○ | ○ |
| 58 | × | ○ | × | ○ | ○ | ○ | ○ | ○ |
| 59 | ○ | ○ | × | ○ | ○ | ○ | ○ | ○ |
| 60 | × | × | ○ | ○ | ○ | ○ | ○ | ○ |
| 61 | ○ | × | ○ | ○ | ○ | ○ | ○ | ○ |
| 62 | × | ○ | ○ | ○ | ○ | ○ | ○ | ○ |
| 63 | ○ | ○ | ○ | ○ | ○ | ○ | ○ | ○ |

○: Lighting
×: non-Lighting

FIG. 15  Overlapping Time Gray Scale Method

| | | SF1 | | SF32 | | SF31 | | SF2 | |
|---|---|---|---|---|---|---|---|---|---|
| Subframe Lighting Period | | 1 | | 8 | | 8 | | 4 | |
| Area of Subpixel | | SP1 | SP2 | SP1 | SP2 | SP1 | SP2 | SP1 | SP2 |
| | | 1 | 2 | 1 | 2 | 1 | 2 | 1 | 2 |
| Light Emission Intensity | | 1 | 2 | 8 | 16 | 8 | 16 | 4 | 8 |
| Gray Scale | 0 | × | × | × | × | × | × | × | × |
| | 1 | ○ | × | × | × | × | × | × | × |
| | 2 | × | ○ | × | × | × | × | × | × |
| | 3 | ○ | ○ | × | × | × | × | × | × |
| | 4 | × | × | × | × | × | × | ○ | × |
| | 5 | ○ | × | × | × | × | × | ○ | × |
| | 6 | × | ○ | × | × | × | × | ○ | × |
| | 7 | ○ | ○ | × | × | × | × | ○ | × |
| | 8 | × | × | × | × | ○ | × | × | × |
| | 9 | ○ | × | × | × | ○ | × | × | × |
| | 10 | × | ○ | × | × | ○ | × | × | × |
| | 11 | ○ | ○ | × | × | ○ | × | × | × |
| | 12 | × | × | × | × | ○ | × | ○ | × |
| | 13 | ○ | × | × | × | ○ | × | ○ | × |
| | 14 | × | ○ | × | × | ○ | × | ○ | × |
| | 15 | ○ | ○ | × | × | ○ | × | ○ | × |
| | 16 | × | × | ○ | × | ○ | × | × | × |
| | 17 | ○ | × | ○ | × | ○ | × | × | × |
| | 18 | × | ○ | ○ | × | ○ | × | × | × |
| | 19 | ○ | ○ | ○ | × | ○ | × | × | × |
| | 20 | × | × | ○ | × | ○ | × | ○ | × |
| | 21 | ○ | × | ○ | × | ○ | × | ○ | × |
| | 22 | × | ○ | ○ | × | ○ | × | ○ | × |
| | 23 | ○ | ○ | ○ | × | ○ | × | ○ | × |
| | 24 | × | × | ○ | × | ○ | × | × | ○ |
| | 25 | ○ | × | ○ | × | ○ | × | × | ○ |
| | 26 | × | ○ | ○ | × | ○ | × | × | ○ |
| | 27 | ○ | ○ | ○ | × | ○ | × | × | ○ |
| | 28 | × | × | ○ | × | ○ | × | ○ | ○ |
| | 29 | ○ | × | ○ | × | ○ | × | ○ | ○ |
| | 30 | × | ○ | ○ | × | ○ | × | ○ | ○ |
| | 31 | ○ | ○ | ○ | × | ○ | × | ○ | ○ |
| | 32 | × | × | ○ | × | ○ | ○ | × | × |
| | 33 | ○ | × | ○ | × | ○ | ○ | × | × |
| | 34 | × | ○ | ○ | × | ○ | ○ | × | × |
| | 35 | ○ | ○ | ○ | × | ○ | ○ | × | × |
| | 36 | × | × | ○ | × | ○ | ○ | ○ | × |
| | 37 | ○ | × | ○ | × | ○ | ○ | ○ | × |
| | 38 | × | ○ | ○ | × | ○ | ○ | ○ | × |
| | 39 | ○ | ○ | ○ | × | ○ | ○ | ○ | × |
| | 40 | × | × | ○ | × | ○ | ○ | × | ○ |
| | 41 | ○ | × | ○ | × | ○ | ○ | × | ○ |
| | 42 | × | ○ | ○ | × | ○ | ○ | × | ○ |
| | 43 | ○ | ○ | ○ | × | ○ | ○ | × | ○ |
| | 44 | × | × | ○ | × | ○ | ○ | ○ | ○ |
| | 45 | ○ | × | ○ | × | ○ | ○ | ○ | ○ |
| | 46 | × | ○ | ○ | × | ○ | ○ | ○ | ○ |
| | 47 | ○ | ○ | ○ | × | ○ | ○ | ○ | ○ |
| | 48 | × | × | ○ | ○ | ○ | ○ | × | × |
| | 49 | ○ | × | ○ | ○ | ○ | ○ | × | × |
| | 50 | × | ○ | ○ | ○ | ○ | ○ | × | × |
| | 51 | ○ | ○ | ○ | ○ | ○ | ○ | × | × |
| | 52 | × | × | ○ | ○ | ○ | ○ | ○ | × |
| | 53 | ○ | × | ○ | ○ | ○ | ○ | ○ | × |
| | 54 | × | ○ | ○ | ○ | ○ | ○ | ○ | × |
| | 55 | ○ | ○ | ○ | ○ | ○ | ○ | ○ | × |
| | 56 | × | × | ○ | ○ | ○ | ○ | × | ○ |
| | 57 | ○ | × | ○ | ○ | ○ | ○ | × | ○ |
| | 58 | × | ○ | ○ | ○ | ○ | ○ | × | ○ |
| | 59 | ○ | ○ | ○ | ○ | ○ | ○ | × | ○ |
| | 60 | × | × | ○ | ○ | ○ | ○ | ○ | ○ |
| | 61 | ○ | × | ○ | ○ | ○ | ○ | ○ | ○ |
| | 62 | × | ○ | ○ | ○ | ○ | ○ | ○ | ○ |
| | 63 | ○ | ○ | ○ | ○ | ○ | ○ | ○ | ○ |

○: Lighting
×: non-Lighting

FIG. 17  Overlapping Time Gray Scale Method

| Subframe Lighting Period | SF1 | | | SF21 | | | SF22 | | |
|---|---|---|---|---|---|---|---|---|---|
| | 1 | | | 4 | | | 4 | | |
| Area of Subpixel | SP1 | SP2 | SP3 | SP1 | SP2 | SP3 | SP1 | SP2 | SP3 |
| | 1 | 2 | 4 | 1 | 2 | 4 | 1 | 2 | 4 |
| Light Emission Intensity | 1 | 2 | 4 | 4 | 8 | 16 | 4 | 8 | 16 |
| Gray Scale | | | | | | | | | |
| 0 | × | × | × | × | × | × | × | × | × |
| 1 | ○ | × | × | × | × | × | × | × | × |
| 2 | × | ○ | × | × | × | × | × | × | × |
| 3 | ○ | ○ | × | × | × | × | × | × | × |
| 4 | × | × | × | ○ | × | × | × | × | × |
| 5 | ○ | × | × | ○ | × | × | × | × | × |
| 6 | × | ○ | × | ○ | × | × | × | × | × |
| 7 | ○ | ○ | × | ○ | × | × | × | × | × |
| 8 | × | × | × | ○ | × | × | ○ | × | × |
| 9 | ○ | × | × | ○ | × | × | ○ | × | × |
| 10 | × | ○ | × | ○ | × | × | ○ | × | × |
| 11 | ○ | ○ | × | ○ | × | × | ○ | × | × |
| 12 | × | × | ○ | ○ | × | × | ○ | × | × |
| 13 | ○ | × | ○ | ○ | × | × | ○ | × | × |
| 14 | × | ○ | ○ | ○ | × | × | ○ | × | × |
| 15 | ○ | ○ | ○ | ○ | × | × | ○ | × | × |
| 16 | × | × | × | ○ | ○ | × | ○ | × | × |
| 17 | ○ | × | × | ○ | ○ | × | ○ | × | × |
| 18 | × | ○ | × | ○ | ○ | × | ○ | × | × |
| 19 | ○ | ○ | × | ○ | ○ | × | ○ | × | × |
| 20 | × | × | ○ | ○ | ○ | × | ○ | × | × |
| 21 | ○ | × | ○ | ○ | ○ | × | ○ | × | × |
| 22 | × | ○ | ○ | ○ | ○ | × | ○ | × | × |
| 23 | ○ | ○ | ○ | ○ | ○ | × | ○ | × | × |
| 24 | × | × | × | ○ | ○ | × | ○ | ○ | × |
| 25 | ○ | × | × | ○ | ○ | × | ○ | ○ | × |
| 26 | × | ○ | × | ○ | ○ | × | ○ | ○ | × |
| 27 | ○ | ○ | × | ○ | ○ | × | ○ | ○ | × |
| 28 | × | × | ○ | ○ | ○ | × | ○ | ○ | × |
| 29 | ○ | × | ○ | ○ | ○ | × | ○ | ○ | × |
| 30 | × | ○ | ○ | ○ | ○ | × | ○ | ○ | × |
| 31 | ○ | ○ | ○ | ○ | ○ | × | ○ | ○ | × |
| 32 | × | × | × | ○ | ○ | ○ | ○ | × | × |
| 33 | ○ | × | × | ○ | ○ | ○ | ○ | × | × |
| 34 | × | ○ | × | ○ | ○ | ○ | ○ | × | × |
| 35 | ○ | ○ | × | ○ | ○ | ○ | ○ | × | × |
| 36 | × | × | ○ | ○ | ○ | ○ | ○ | × | × |
| 37 | ○ | × | ○ | ○ | ○ | ○ | ○ | × | × |
| 38 | × | ○ | ○ | ○ | ○ | ○ | ○ | × | × |
| 39 | ○ | ○ | ○ | ○ | ○ | ○ | ○ | × | × |
| 40 | × | × | × | ○ | ○ | ○ | ○ | ○ | × |
| 41 | ○ | × | × | ○ | ○ | ○ | ○ | ○ | × |
| 42 | × | ○ | × | ○ | ○ | ○ | ○ | ○ | × |
| 43 | ○ | ○ | × | ○ | ○ | ○ | ○ | ○ | × |
| 44 | × | × | ○ | ○ | ○ | ○ | ○ | ○ | × |
| 45 | ○ | × | ○ | ○ | ○ | ○ | ○ | ○ | × |
| 46 | × | ○ | ○ | ○ | ○ | ○ | ○ | ○ | × |
| 47 | ○ | ○ | ○ | ○ | ○ | ○ | ○ | ○ | × |
| 48 | × | × | × | ○ | ○ | ○ | ○ | × | ○ |
| 49 | ○ | × | × | ○ | ○ | ○ | ○ | × | ○ |
| 50 | × | ○ | × | ○ | ○ | ○ | ○ | × | ○ |
| 51 | ○ | ○ | × | ○ | ○ | ○ | ○ | × | ○ |
| 52 | × | × | ○ | ○ | ○ | ○ | ○ | × | ○ |
| 53 | ○ | × | ○ | ○ | ○ | ○ | ○ | × | ○ |
| 54 | × | ○ | ○ | ○ | ○ | ○ | ○ | × | ○ |
| 55 | ○ | ○ | ○ | ○ | ○ | ○ | ○ | × | ○ |
| 56 | × | × | × | ○ | ○ | ○ | ○ | ○ | ○ |
| 57 | ○ | × | × | ○ | ○ | ○ | ○ | ○ | ○ |
| 58 | × | ○ | × | ○ | ○ | ○ | ○ | ○ | ○ |
| 59 | ○ | ○ | × | ○ | ○ | ○ | ○ | ○ | ○ |
| 60 | × | × | ○ | ○ | ○ | ○ | ○ | ○ | ○ |
| 61 | ○ | × | ○ | ○ | ○ | ○ | ○ | ○ | ○ |
| 62 | × | ○ | ○ | ○ | ○ | ○ | ○ | ○ | ○ |
| 63 | ○ | ○ | ○ | ○ | ○ | ○ | ○ | ○ | ○ |

○: Lighting

×: non-Lighting

FIG. 19   Overlapping Time Gray Scale Method

| Gray Scale | SF1 / 1 | | | SF21 / 2 | | | SF22 / 2 | | | SF23 / 2 | | | SF24 / 2 | | |
|---|---|---|---|---|---|---|---|---|---|---|---|---|---|---|---|
| | SP1 / 1 | SP2 / 2 | SP3 / 4 | SP1 / 1 | SP2 / 2 | SP3 / 4 | SP1 / 1 | SP2 / 2 | SP3 / 4 | SP1 / 1 | SP2 / 2 | SP3 / 4 | SP1 / 1 | SP2 / 2 | SP3 / 4 |
| | 1 | 2 | 4 | 2 | 4 | 8 | 2 | 4 | 8 | 2 | 4 | 8 | 2 | 4 | 8 |
| 0 | × | × | × | × | × | × | × | × | × | × | × | × | × | × | × |
| 1 | ○ | × | × | × | × | × | × | × | × | × | × | × | × | × | × |
| 2 | × | × | × | ○ | × | × | × | × | × | × | × | × | × | × | × |
| 3 | ○ | × | × | ○ | × | × | × | × | × | × | × | × | × | × | × |
| 4 | × | × | × | ○ | × | × | ○ | × | × | × | × | × | × | × | × |
| 5 | ○ | × | × | ○ | × | × | ○ | × | × | × | × | × | × | × | × |
| 6 | × | × | × | ○ | × | × | ○ | × | × | ○ | × | × | × | × | × |
| 7 | ○ | × | × | ○ | × | × | ○ | × | × | ○ | × | × | × | × | × |
| 8 | × | × | × | ○ | × | × | ○ | × | × | ○ | × | × | ○ | × | × |
| 9 | ○ | × | × | ○ | × | × | ○ | × | × | ○ | × | × | ○ | × | × |
| 10 | × | ○ | × | ○ | × | × | ○ | × | × | ○ | × | × | ○ | × | × |
| 11 | ○ | ○ | × | ○ | × | × | ○ | × | × | ○ | × | × | ○ | × | × |
| 12 | × | × | × | ○ | ○ | × | ○ | × | × | ○ | × | × | ○ | × | × |
| 13 | ○ | × | × | ○ | ○ | × | ○ | × | × | ○ | × | × | ○ | × | × |
| 14 | × | ○ | × | ○ | ○ | × | ○ | × | × | ○ | × | × | ○ | × | × |
| 15 | ○ | ○ | × | ○ | ○ | × | ○ | × | × | ○ | × | × | ○ | × | × |
| 16 | × | × | × | ○ | ○ | × | ○ | ○ | × | ○ | × | × | ○ | × | × |
| 17 | ○ | × | × | ○ | ○ | × | ○ | ○ | × | ○ | × | × | ○ | × | × |
| 18 | × | ○ | × | ○ | ○ | × | ○ | ○ | × | ○ | × | × | ○ | × | × |
| 19 | ○ | ○ | × | ○ | ○ | × | ○ | ○ | × | ○ | × | × | ○ | × | × |
| 20 | × | × | × | ○ | ○ | × | ○ | ○ | × | ○ | ○ | × | ○ | × | × |
| 21 | ○ | × | × | ○ | ○ | × | ○ | ○ | × | ○ | ○ | × | ○ | × | × |
| 22 | × | ○ | × | ○ | ○ | × | ○ | ○ | × | ○ | ○ | × | ○ | × | × |
| 23 | ○ | ○ | × | ○ | ○ | × | ○ | ○ | × | ○ | ○ | × | ○ | × | × |
| 24 | × | × | × | ○ | ○ | × | ○ | ○ | × | ○ | ○ | × | ○ | ○ | × |
| 25 | ○ | × | × | ○ | ○ | × | ○ | ○ | × | ○ | ○ | × | ○ | ○ | × |
| 26 | × | ○ | × | ○ | ○ | × | ○ | ○ | × | ○ | ○ | × | ○ | ○ | × |
| 27 | ○ | ○ | × | ○ | ○ | × | ○ | ○ | × | ○ | ○ | × | ○ | ○ | × |
| 28 | × | × | ○ | ○ | ○ | × | ○ | ○ | × | ○ | ○ | × | ○ | ○ | × |
| 29 | ○ | × | ○ | ○ | ○ | × | ○ | ○ | × | ○ | ○ | × | ○ | ○ | × |
| 30 | × | ○ | ○ | ○ | ○ | × | ○ | ○ | × | ○ | ○ | × | ○ | ○ | × |
| 31 | ○ | ○ | ○ | ○ | ○ | × | ○ | ○ | × | ○ | ○ | × | ○ | ○ | × |
| 32 | × | × | × | ○ | ○ | ○ | ○ | ○ | × | ○ | ○ | × | ○ | ○ | × |
| 33 | ○ | × | × | ○ | ○ | ○ | ○ | ○ | × | ○ | ○ | × | ○ | ○ | × |
| 34 | × | ○ | × | ○ | ○ | ○ | ○ | ○ | × | ○ | ○ | × | ○ | ○ | × |
| 35 | ○ | ○ | × | ○ | ○ | ○ | ○ | ○ | × | ○ | ○ | × | ○ | ○ | × |
| 36 | × | × | ○ | ○ | ○ | ○ | ○ | ○ | × | ○ | ○ | × | ○ | ○ | × |
| 37 | ○ | × | ○ | ○ | ○ | ○ | ○ | ○ | × | ○ | ○ | × | ○ | ○ | × |
| 38 | × | ○ | ○ | ○ | ○ | ○ | ○ | ○ | × | ○ | ○ | × | ○ | ○ | × |
| 39 | ○ | ○ | ○ | ○ | ○ | ○ | ○ | ○ | × | ○ | ○ | × | ○ | ○ | × |
| 40 | × | × | × | ○ | ○ | ○ | ○ | ○ | ○ | ○ | ○ | × | ○ | ○ | × |
| 41 | ○ | × | × | ○ | ○ | ○ | ○ | ○ | ○ | ○ | ○ | × | ○ | ○ | × |
| 42 | × | ○ | × | ○ | ○ | ○ | ○ | ○ | ○ | ○ | ○ | × | ○ | ○ | × |
| 43 | ○ | ○ | × | ○ | ○ | ○ | ○ | ○ | ○ | ○ | ○ | × | ○ | ○ | × |
| 44 | × | × | ○ | ○ | ○ | ○ | ○ | ○ | ○ | ○ | ○ | × | ○ | ○ | × |
| 45 | ○ | × | ○ | ○ | ○ | ○ | ○ | ○ | ○ | ○ | ○ | × | ○ | ○ | × |
| 46 | × | ○ | ○ | ○ | ○ | ○ | ○ | ○ | ○ | ○ | ○ | × | ○ | ○ | × |
| 47 | ○ | ○ | ○ | ○ | ○ | ○ | ○ | ○ | ○ | ○ | ○ | × | ○ | ○ | × |
| 48 | × | × | × | ○ | ○ | ○ | ○ | ○ | ○ | ○ | ○ | ○ | ○ | ○ | × |
| 49 | ○ | × | × | ○ | ○ | ○ | ○ | ○ | ○ | ○ | ○ | ○ | ○ | ○ | × |
| 50 | × | ○ | × | ○ | ○ | ○ | ○ | ○ | ○ | ○ | ○ | ○ | ○ | ○ | × |
| 51 | ○ | ○ | × | ○ | ○ | ○ | ○ | ○ | ○ | ○ | ○ | ○ | ○ | ○ | × |
| 52 | × | × | ○ | ○ | ○ | ○ | ○ | ○ | ○ | ○ | ○ | ○ | ○ | ○ | × |
| 53 | ○ | × | ○ | ○ | ○ | ○ | ○ | ○ | ○ | ○ | ○ | ○ | ○ | ○ | × |
| 54 | × | ○ | ○ | ○ | ○ | ○ | ○ | ○ | ○ | ○ | ○ | ○ | ○ | ○ | × |
| 55 | ○ | ○ | ○ | ○ | ○ | ○ | ○ | ○ | ○ | ○ | ○ | ○ | ○ | ○ | × |
| 56 | × | × | × | ○ | ○ | ○ | ○ | ○ | ○ | ○ | ○ | ○ | ○ | ○ | ○ |
| 57 | ○ | × | × | ○ | ○ | ○ | ○ | ○ | ○ | ○ | ○ | ○ | ○ | ○ | ○ |
| 58 | × | ○ | × | ○ | ○ | ○ | ○ | ○ | ○ | ○ | ○ | ○ | ○ | ○ | ○ |
| 59 | ○ | ○ | × | ○ | ○ | ○ | ○ | ○ | ○ | ○ | ○ | ○ | ○ | ○ | ○ |
| 60 | × | × | ○ | ○ | ○ | ○ | ○ | ○ | ○ | ○ | ○ | ○ | ○ | ○ | ○ |
| 61 | ○ | × | ○ | ○ | ○ | ○ | ○ | ○ | ○ | ○ | ○ | ○ | ○ | ○ | ○ |
| 62 | × | ○ | ○ | ○ | ○ | ○ | ○ | ○ | ○ | ○ | ○ | ○ | ○ | ○ | ○ |
| 63 | ○ | ○ | ○ | ○ | ○ | ○ | ○ | ○ | ○ | ○ | ○ | ○ | ○ | ○ | ○ |

FIG. 21  Overlapping Time Gray Scale Method

| Subframe Lighting Period | | SF1 | | SF2 | | SF3 | | SF41 | | SF42 | |
|---|---|---|---|---|---|---|---|---|---|---|---|
| | | 1 | | 4 | | 16 | | 32 | | 32 | |
| Area of Subpixel | | SP1 | SP2 | SP1 | SP2 | SP1 | SP2 | SP1 | SP2 | SP1 | SP2 |
| | | 1 | 2 | 1 | 2 | 1 | 2 | 1 | 2 | 1 | 2 |
| Light Emission Intensity | | 1 | 2 | 4 | 8 | 16 | 32 | 32 | 64 | 32 | 64 |
| Gray Scale | 0 | × | × | × | × | × | × | × | × | × | × |
| | 1 | O | × | × | × | × | × | × | × | × | × |
| | 2 | × | O | × | × | × | × | × | × | × | × |
| | 3 | O | O | × | × | × | × | × | × | × | × |
| | 4 | × | × | O | × | × | × | × | × | × | × |
| | 5 | O | × | O | × | × | × | × | × | × | × |
| | 6 | × | O | O | × | × | × | × | × | × | × |
| | 7 | O | O | O | × | × | × | × | × | × | × |
| | 8 | × | × | × | O | × | × | × | × | × | × |
| | 9 | O | × | × | O | × | × | × | × | × | × |
| | 10 | × | O | × | O | × | × | × | × | × | × |
| | 11 | O | O | × | O | × | × | × | × | × | × |
| | 12 | × | × | O | O | × | × | × | × | × | × |
| | 13 | O | × | O | O | × | × | × | × | × | × |
| | 14 | × | O | O | O | × | × | × | × | × | × |
| | 15 | O | O | O | O | × | × | × | × | × | × |
| | 16 | × | × | × | × | O | × | × | × | × | × |
| | 17 | O | × | × | × | O | × | × | × | × | × |
| | 18 | × | O | × | × | O | × | × | × | × | × |
| | 19 | O | O | × | × | O | × | × | × | × | × |
| | 20 | × | × | O | × | O | × | × | × | × | × |
| | 21 | O | × | O | × | O | × | × | × | × | × |
| | 22 | × | O | O | × | O | × | × | × | × | × |
| | 23 | O | O | O | × | O | × | × | × | × | × |
| | 24 | × | × | × | O | O | × | × | × | × | × |
| | 25 | O | × | × | O | O | × | × | × | × | × |
| | 26 | × | O | × | O | O | × | × | × | × | × |
| | 27 | O | O | × | O | O | × | × | × | × | × |
| | 28 | × | × | O | O | O | × | × | × | × | × |
| | 29 | O | × | O | O | O | × | × | × | × | × |
| | 30 | × | O | O | O | O | × | × | × | × | × |
| | 31 | O | O | O | O | O | × | × | × | × | × |
| | 32 | × | × | × | × | × | × | O | × | × | × |
| | 33 | O | × | × | × | × | × | O | × | × | × |
| | 34 | × | O | × | × | × | × | O | × | × | × |
| | 35 | O | O | × | × | × | × | O | × | × | × |
| | 36 | × | × | O | × | × | × | O | × | × | × |
| | 37 | O | × | O | × | × | × | O | × | × | × |
| | 38 | × | O | O | × | × | × | O | × | × | × |
| | 39 | O | O | O | × | × | × | O | × | × | × |
| | 40 | × | × | × | O | × | × | O | × | × | × |
| | 41 | O | × | × | O | × | × | O | × | × | × |
| | 42 | × | O | × | O | × | × | O | × | × | × |
| | 43 | O | O | × | O | × | × | O | × | × | × |
| | 44 | × | × | O | O | × | × | O | × | × | × |
| | 45 | O | × | O | O | × | × | O | × | × | × |
| | 46 | × | O | O | O | × | × | O | × | × | × |
| | 47 | O | O | O | O | × | × | O | × | × | × |
| | 48 | × | × | × | × | O | × | O | × | × | × |
| | 49 | O | × | × | × | O | × | O | × | × | × |
| | 50 | × | O | × | × | O | × | O | × | × | × |
| | 51 | O | O | × | × | O | × | O | × | × | × |
| | 52 | × | × | O | × | O | × | O | × | × | × |
| | 53 | O | × | O | × | O | × | O | × | × | × |
| | 54 | × | O | O | × | O | × | O | × | × | × |
| | 55 | O | O | O | × | O | × | O | × | × | × |
| | 56 | × | × | × | O | O | × | O | × | × | × |
| | 57 | O | × | × | O | O | × | O | × | × | × |
| | 58 | × | O | × | O | O | × | O | × | × | × |
| | 59 | O | O | × | O | O | × | O | × | × | × |
| | 60 | × | × | O | O | O | × | O | × | × | × |
| | 61 | O | × | O | O | O | × | O | × | × | × |
| | 62 | × | O | O | O | O | × | O | × | × | × |
| | 63 | O | O | O | O | O | × | O | × | × | × |

O: Lighting
×: non-Lighting

FIG. 23 Overlapping Time Gray Scale Method

FIG. 24

Overlapping Time Gray Scale Method

| Gray Scale | SF1 (1) | | SF2 (4) | | SF3 (16) | | SF41 (32) | | SF42 (32) | |
|---|---|---|---|---|---|---|---|---|---|---|
| | SP1 (1) | SP2 (2) | SP1 (1) | SP2 (2) | SP1 (1) | SP2 (2) | SP1 (1) | SP2 (2) | SP1 (1) | SP2 (2) |
| Light Emission Intensity | 1 | 2 | 4 | 8 | 16 | 32 | 32 | 64 | 32 | 64 |
| 64 | × | × | × | × | × | × | ○ | × | ○ | × |
| 65 | ○ | × | × | × | × | × | ○ | × | ○ | × |
| 66 | × | ○ | × | × | × | × | ○ | × | ○ | × |
| 67 | ○ | ○ | × | × | × | × | ○ | × | ○ | × |
| 68 | × | × | ○ | × | × | × | ○ | × | ○ | × |
| 69 | ○ | × | ○ | × | × | × | ○ | × | ○ | × |
| 70 | × | ○ | ○ | × | × | × | ○ | × | ○ | × |
| 71 | ○ | ○ | ○ | × | × | × | ○ | × | ○ | × |
| 72 | × | × | × | ○ | × | × | ○ | × | ○ | × |
| 73 | ○ | × | × | ○ | × | × | ○ | × | ○ | × |
| 74 | × | ○ | × | ○ | × | × | ○ | × | ○ | × |
| 75 | ○ | ○ | × | ○ | × | × | ○ | × | ○ | × |
| 76 | × | × | ○ | ○ | × | × | ○ | × | ○ | × |
| 77 | ○ | × | ○ | ○ | × | × | ○ | × | ○ | × |
| 78 | × | ○ | ○ | ○ | × | × | ○ | × | ○ | × |
| 79 | ○ | ○ | ○ | ○ | × | × | ○ | × | ○ | × |
| 80 | × | × | × | × | ○ | × | ○ | × | ○ | × |
| 81 | ○ | × | × | × | ○ | × | ○ | × | ○ | × |
| 82 | × | ○ | × | × | ○ | × | ○ | × | ○ | × |
| 83 | ○ | ○ | × | × | ○ | × | ○ | × | ○ | × |
| 84 | × | × | ○ | × | ○ | × | ○ | × | ○ | × |
| 85 | ○ | × | ○ | × | ○ | × | ○ | × | ○ | × |
| 86 | × | ○ | ○ | × | ○ | × | ○ | × | ○ | × |
| 87 | ○ | ○ | ○ | × | ○ | × | ○ | × | ○ | × |
| 88 | × | × | × | ○ | ○ | × | ○ | × | ○ | × |
| 89 | ○ | × | × | ○ | ○ | × | ○ | × | ○ | × |
| 90 | × | ○ | × | ○ | ○ | × | ○ | × | ○ | × |
| 91 | ○ | ○ | × | ○ | ○ | × | ○ | × | ○ | × |
| 92 | × | × | ○ | ○ | ○ | × | ○ | × | ○ | × |
| 93 | ○ | × | ○ | ○ | ○ | × | ○ | × | ○ | × |
| 94 | × | ○ | ○ | ○ | ○ | × | ○ | × | ○ | × |
| 95 | ○ | ○ | ○ | ○ | ○ | × | ○ | × | ○ | × |
| 96 | × | × | × | × | × | ○ | ○ | × | ○ | × |
| 97 | ○ | × | × | × | × | ○ | ○ | × | ○ | × |
| 98 | × | ○ | × | × | × | ○ | ○ | × | ○ | × |
| 99 | ○ | ○ | × | × | × | ○ | ○ | × | ○ | × |
| 100 | × | × | ○ | × | × | ○ | ○ | × | ○ | × |
| 101 | ○ | × | ○ | × | × | ○ | ○ | × | ○ | × |
| 102 | × | ○ | ○ | × | × | ○ | ○ | × | ○ | × |
| 103 | ○ | ○ | ○ | × | × | ○ | ○ | × | ○ | × |
| 104 | × | × | × | ○ | × | ○ | ○ | × | ○ | × |
| 105 | ○ | × | × | ○ | × | ○ | ○ | × | ○ | × |
| 106 | × | ○ | × | ○ | × | ○ | ○ | × | ○ | × |
| 107 | ○ | ○ | × | ○ | × | ○ | ○ | × | ○ | × |
| 108 | × | × | ○ | ○ | × | ○ | ○ | × | ○ | × |
| 109 | ○ | × | ○ | ○ | × | ○ | ○ | × | ○ | × |
| 110 | × | ○ | ○ | ○ | × | ○ | ○ | × | ○ | × |
| 111 | ○ | ○ | ○ | ○ | × | ○ | ○ | × | ○ | × |
| 112 | × | × | × | × | ○ | ○ | ○ | × | ○ | × |
| 113 | ○ | × | × | × | ○ | ○ | ○ | × | ○ | × |
| 114 | × | ○ | × | × | ○ | ○ | ○ | × | ○ | × |
| 115 | ○ | ○ | × | × | ○ | ○ | ○ | × | ○ | × |
| 116 | × | × | ○ | × | ○ | ○ | ○ | × | ○ | × |
| 117 | ○ | × | ○ | × | ○ | ○ | ○ | × | ○ | × |
| 118 | × | ○ | ○ | × | ○ | ○ | ○ | × | ○ | × |
| 119 | ○ | ○ | ○ | × | ○ | ○ | ○ | × | ○ | × |
| 120 | × | × | × | ○ | ○ | ○ | ○ | × | ○ | × |
| 121 | ○ | × | × | ○ | ○ | ○ | ○ | × | ○ | × |
| 122 | × | ○ | × | ○ | ○ | ○ | ○ | × | ○ | × |
| 123 | ○ | ○ | × | ○ | ○ | ○ | ○ | × | ○ | × |
| 124 | × | × | ○ | ○ | ○ | ○ | ○ | × | ○ | × |
| 125 | ○ | × | ○ | ○ | ○ | ○ | ○ | × | ○ | × |
| 126 | × | ○ | ○ | ○ | ○ | ○ | ○ | × | ○ | × |
| 127 | ○ | ○ | ○ | ○ | ○ | ○ | ○ | × | ○ | × |

○: Lighting
×: non-Lighting

| Subframe Lighting Period | SF1 | | SF2 | | SF3 | | SF41 | | SF42 | |
|---|---|---|---|---|---|---|---|---|---|---|
| | 1 | | 4 | | 16 | | 32 | | 32 | |
| Area of Subpixel | SP1 | SP2 | SP1 | SP2 | SP1 | SP2 | SP1 | SP2 | SP1 | SP2 |
| | 1 | 2 | 1 | 2 | 1 | 2 | 1 | 2 | 1 | 2 |
| Light Emission Intensity | 1 | 2 | 4 | 8 | 16 | 32 | 32 | 64 | 32 | 64 |
| Gray Scale | | | | | | | | | | |
| 128 | × | × | × | × | × | × | ○ | ○ | ○ | × |
| 129 | ○ | × | × | × | × | × | ○ | ○ | ○ | × |
| 130 | × | ○ | × | × | × | × | ○ | ○ | ○ | × |
| 131 | ○ | ○ | × | × | × | × | ○ | ○ | ○ | × |
| 132 | × | × | ○ | × | × | × | ○ | ○ | ○ | × |
| 133 | ○ | × | ○ | × | × | × | ○ | ○ | ○ | × |
| 134 | × | ○ | ○ | × | × | × | ○ | ○ | ○ | × |
| 135 | ○ | ○ | ○ | × | × | × | ○ | ○ | ○ | × |
| 136 | × | × | × | ○ | × | × | ○ | ○ | ○ | × |
| 137 | ○ | × | × | ○ | × | × | ○ | ○ | ○ | × |
| 138 | × | ○ | × | ○ | × | × | ○ | ○ | ○ | × |
| 139 | ○ | ○ | × | ○ | × | × | ○ | ○ | ○ | × |
| 140 | × | × | ○ | ○ | × | × | ○ | ○ | ○ | × |
| 141 | ○ | × | ○ | ○ | × | × | ○ | ○ | ○ | × |
| 142 | × | ○ | ○ | ○ | × | × | ○ | ○ | ○ | × |
| 143 | ○ | ○ | ○ | ○ | × | × | ○ | ○ | ○ | × |
| 144 | × | × | × | × | ○ | × | ○ | ○ | ○ | × |
| 145 | ○ | × | × | × | ○ | × | ○ | ○ | ○ | × |
| 146 | × | ○ | × | × | ○ | × | ○ | ○ | ○ | × |
| 147 | ○ | ○ | × | × | ○ | × | ○ | ○ | ○ | × |
| 148 | × | × | ○ | × | ○ | × | ○ | ○ | ○ | × |
| 149 | ○ | × | ○ | × | ○ | × | ○ | ○ | ○ | × |
| 150 | × | ○ | ○ | × | ○ | × | ○ | ○ | ○ | × |
| 151 | ○ | ○ | ○ | × | ○ | × | ○ | ○ | ○ | × |
| 152 | × | × | × | ○ | ○ | × | ○ | ○ | ○ | × |
| 153 | ○ | × | × | ○ | ○ | × | ○ | ○ | ○ | × |
| 154 | × | ○ | × | ○ | ○ | × | ○ | ○ | ○ | × |
| 155 | ○ | ○ | × | ○ | ○ | × | ○ | ○ | ○ | × |
| 156 | × | × | ○ | ○ | ○ | × | ○ | ○ | ○ | × |
| 157 | ○ | × | ○ | ○ | ○ | × | ○ | ○ | ○ | × |
| 158 | × | ○ | ○ | ○ | ○ | × | ○ | ○ | ○ | × |
| 159 | ○ | ○ | ○ | ○ | ○ | × | ○ | ○ | ○ | × |
| 160 | × | × | × | × | × | ○ | ○ | ○ | ○ | × |
| 161 | ○ | × | × | × | × | ○ | ○ | ○ | ○ | × |
| 162 | × | ○ | × | × | × | ○ | ○ | ○ | ○ | × |
| 163 | ○ | ○ | × | × | × | ○ | ○ | ○ | ○ | × |
| 164 | × | × | ○ | × | × | ○ | ○ | ○ | ○ | × |
| 165 | ○ | × | ○ | × | × | ○ | ○ | ○ | ○ | × |
| 166 | × | ○ | ○ | × | × | ○ | ○ | ○ | ○ | × |
| 167 | ○ | ○ | ○ | × | × | ○ | ○ | ○ | ○ | × |
| 168 | × | × | × | ○ | × | ○ | ○ | ○ | ○ | × |
| 169 | ○ | × | × | ○ | × | ○ | ○ | ○ | ○ | × |
| 170 | × | ○ | × | ○ | × | ○ | ○ | ○ | ○ | × |
| 171 | ○ | ○ | × | ○ | × | ○ | ○ | ○ | ○ | × |
| 172 | × | × | ○ | ○ | × | ○ | ○ | ○ | ○ | × |
| 173 | ○ | × | ○ | ○ | × | ○ | ○ | ○ | ○ | × |
| 174 | × | ○ | ○ | ○ | × | ○ | ○ | ○ | ○ | × |
| 175 | ○ | ○ | ○ | ○ | × | ○ | ○ | ○ | ○ | × |
| 176 | × | × | × | × | ○ | ○ | ○ | ○ | ○ | × |
| 177 | ○ | × | × | × | ○ | ○ | ○ | ○ | ○ | × |
| 178 | × | ○ | × | × | ○ | ○ | ○ | ○ | ○ | × |
| 179 | ○ | ○ | × | × | ○ | ○ | ○ | ○ | ○ | × |
| 180 | × | × | ○ | × | ○ | ○ | ○ | ○ | ○ | × |
| 181 | ○ | × | ○ | × | ○ | ○ | ○ | ○ | ○ | × |
| 182 | × | ○ | ○ | × | ○ | ○ | ○ | ○ | ○ | × |
| 183 | ○ | ○ | ○ | × | ○ | ○ | ○ | ○ | ○ | × |
| 184 | × | × | × | ○ | ○ | ○ | ○ | ○ | ○ | × |
| 185 | ○ | × | × | ○ | ○ | ○ | ○ | ○ | ○ | × |
| 186 | × | ○ | × | ○ | ○ | ○ | ○ | ○ | ○ | × |
| 187 | ○ | ○ | × | ○ | ○ | ○ | ○ | ○ | ○ | × |
| 188 | × | × | ○ | ○ | ○ | ○ | ○ | ○ | ○ | × |
| 189 | ○ | × | ○ | ○ | ○ | ○ | ○ | ○ | ○ | × |
| 190 | × | ○ | ○ | ○ | ○ | ○ | ○ | ○ | ○ | × |
| 191 | ○ | ○ | ○ | ○ | ○ | ○ | ○ | ○ | ○ | × |

○ : Lighting
× : non-Lighting

FIG. 25 Overlapping Time Gray Scale Method

FIG. 26

Overlapping Time Gray Scale Method

○: Lighting
×: non-Lighting

| Subframe Lighting Period | SF1 | | SF2 | | SF3 | | SF41 | | SF42 | |
|---|---|---|---|---|---|---|---|---|---|---|
| | 1 | | 4 | | 16 | | 32 | | 32 | |
| Area of Subpixel | SP1 | SP2 | SP1 | SP2 | SP1 | SP2 | SP1 | SP2 | SP1 | SP2 |
| | 1 | 2 | 1 | 2 | 1 | 2 | 1 | 2 | 1 | 2 |
| Light Emission Intensity | 1 | 2 | 4 | 8 | 16 | 32 | 32 | 64 | 32 | 64 |
| Gray Scale | | | | | | | | | | |
| 192 | × | × | × | × | × | × | ○ | ○ | ○ | ○ |
| 193 | ○ | × | × | × | × | × | ○ | ○ | ○ | ○ |
| 194 | × | ○ | × | × | × | × | ○ | ○ | ○ | ○ |
| 195 | ○ | ○ | × | × | × | × | ○ | ○ | ○ | ○ |
| 196 | × | × | ○ | × | × | × | ○ | ○ | ○ | ○ |
| 197 | ○ | × | ○ | × | × | × | ○ | ○ | ○ | ○ |
| 198 | × | ○ | ○ | × | × | × | ○ | ○ | ○ | ○ |
| 199 | ○ | ○ | ○ | × | × | × | ○ | ○ | ○ | ○ |
| 200 | × | × | × | ○ | × | × | ○ | ○ | ○ | ○ |
| 201 | ○ | × | × | ○ | × | × | ○ | ○ | ○ | ○ |
| 202 | × | ○ | × | ○ | × | × | ○ | ○ | ○ | ○ |
| 203 | ○ | ○ | × | ○ | × | × | ○ | ○ | ○ | ○ |
| 204 | × | × | ○ | ○ | × | × | ○ | ○ | ○ | ○ |
| 205 | ○ | × | ○ | ○ | × | × | ○ | ○ | ○ | ○ |
| 206 | × | ○ | ○ | ○ | × | × | ○ | ○ | ○ | ○ |
| 207 | ○ | ○ | ○ | ○ | × | × | ○ | ○ | ○ | ○ |
| 208 | × | × | × | × | ○ | × | ○ | ○ | ○ | ○ |
| 209 | ○ | × | × | × | ○ | × | ○ | ○ | ○ | ○ |
| 210 | × | ○ | × | × | ○ | × | ○ | ○ | ○ | ○ |
| 211 | ○ | ○ | × | × | ○ | × | ○ | ○ | ○ | ○ |
| 212 | × | × | ○ | × | ○ | × | ○ | ○ | ○ | ○ |
| 213 | ○ | × | ○ | × | ○ | × | ○ | ○ | ○ | ○ |
| 214 | × | ○ | ○ | × | ○ | × | ○ | ○ | ○ | ○ |
| 215 | ○ | ○ | ○ | × | ○ | × | ○ | ○ | ○ | ○ |
| 216 | × | × | × | ○ | ○ | × | ○ | ○ | ○ | ○ |
| 217 | ○ | × | × | ○ | ○ | × | ○ | ○ | ○ | ○ |
| 218 | × | ○ | × | ○ | ○ | × | ○ | ○ | ○ | ○ |
| 219 | ○ | ○ | × | ○ | ○ | × | ○ | ○ | ○ | ○ |
| 220 | × | × | ○ | ○ | ○ | × | ○ | ○ | ○ | ○ |
| 221 | ○ | × | ○ | ○ | ○ | × | ○ | ○ | ○ | ○ |
| 222 | × | ○ | ○ | ○ | ○ | × | ○ | ○ | ○ | ○ |
| 223 | ○ | ○ | ○ | ○ | ○ | × | ○ | ○ | ○ | ○ |
| 224 | × | × | × | × | × | ○ | ○ | ○ | ○ | ○ |
| 225 | ○ | × | × | × | × | ○ | ○ | ○ | ○ | ○ |
| 226 | × | ○ | × | × | × | ○ | ○ | ○ | ○ | ○ |
| 227 | ○ | ○ | × | × | × | ○ | ○ | ○ | ○ | ○ |
| 228 | × | × | ○ | × | × | ○ | ○ | ○ | ○ | ○ |
| 229 | ○ | × | ○ | × | × | ○ | ○ | ○ | ○ | ○ |
| 230 | × | ○ | ○ | × | × | ○ | ○ | ○ | ○ | ○ |
| 231 | ○ | ○ | ○ | × | × | ○ | ○ | ○ | ○ | ○ |
| 232 | × | × | × | ○ | × | ○ | ○ | ○ | ○ | ○ |
| 233 | ○ | × | × | ○ | × | ○ | ○ | ○ | ○ | ○ |
| 234 | × | ○ | × | ○ | × | ○ | ○ | ○ | ○ | ○ |
| 235 | ○ | ○ | × | ○ | × | ○ | ○ | ○ | ○ | ○ |
| 236 | × | × | ○ | ○ | × | ○ | ○ | ○ | ○ | ○ |
| 237 | ○ | × | ○ | ○ | × | ○ | ○ | ○ | ○ | ○ |
| 238 | × | ○ | ○ | ○ | × | ○ | ○ | ○ | ○ | ○ |
| 239 | ○ | ○ | ○ | ○ | × | ○ | ○ | ○ | ○ | ○ |
| 240 | × | × | × | × | ○ | ○ | ○ | ○ | ○ | ○ |
| 241 | ○ | × | × | × | ○ | ○ | ○ | ○ | ○ | ○ |
| 242 | × | ○ | × | × | ○ | ○ | ○ | ○ | ○ | ○ |
| 243 | ○ | ○ | × | × | ○ | ○ | ○ | ○ | ○ | ○ |
| 244 | × | × | ○ | × | ○ | ○ | ○ | ○ | ○ | ○ |
| 245 | ○ | × | ○ | × | ○ | ○ | ○ | ○ | ○ | ○ |
| 246 | × | ○ | ○ | × | ○ | ○ | ○ | ○ | ○ | ○ |
| 247 | ○ | ○ | ○ | × | ○ | ○ | ○ | ○ | ○ | ○ |
| 248 | × | × | × | ○ | ○ | ○ | ○ | ○ | ○ | ○ |
| 249 | ○ | × | × | ○ | ○ | ○ | ○ | ○ | ○ | ○ |
| 250 | × | ○ | × | ○ | ○ | ○ | ○ | ○ | ○ | ○ |
| 251 | ○ | ○ | × | ○ | ○ | ○ | ○ | ○ | ○ | ○ |
| 252 | × | × | ○ | ○ | ○ | ○ | ○ | ○ | ○ | ○ |
| 253 | ○ | × | ○ | ○ | ○ | ○ | ○ | ○ | ○ | ○ |
| 254 | × | ○ | ○ | ○ | ○ | ○ | ○ | ○ | ○ | ○ |
| 255 | ○ | ○ | ○ | ○ | ○ | ○ | ○ | ○ | ○ | ○ |

| Gray Scale 5 bit display with gamma correction | 6 bit display | SF1 (Subframe Lighting Period: 1) | | SF2 (4) | | SF31 (8) | | SF32 (8) | |
|---|---|---|---|---|---|---|---|---|---|
| | | SP1 (Area: 1) | SP2 (2) | SP1 (1) | SP2 (2) | SP1 (1) | SP2 (2) | SP1 (1) | SP2 (2) |
| | | 1 | 2 | 4 | 8 | 8 | 16 | 8 | 16 |
| 0 | 0 | × | × | × | × | × | × | × | × |
| 1 | 0 | × | × | × | × | × | × | × | × |
| 2 | 0 | × | × | × | × | × | × | × | × |
| 3 | 0 | × | × | × | × | × | × | × | × |
| 4 | 1 | ○ | × | × | × | × | × | × | × |
| 5 | 1 | ○ | × | × | × | × | × | × | × |
| 6 | 2 | × | ○ | × | × | × | × | × | × |
| 7 | 2 | × | ○ | × | × | × | × | × | × |
| 8 | 3 | ○ | ○ | × | × | × | × | × | × |
| 9 | 4 | × | × | ○ | × | × | × | × | × |
| 10 | 5 | ○ | × | ○ | × | × | × | × | × |
| 11 | 6 | × | ○ | ○ | × | × | × | × | × |
| 12 | 8 | × | × | × | × | ○ | × | × | × |
| 13 | 9 | ○ | × | × | × | ○ | × | × | × |
| 14 | 11 | ○ | ○ | × | × | ○ | × | × | × |
| 15 | 13 | ○ | × | ○ | × | ○ | × | × | × |
| 16 | 15 | ○ | ○ | ○ | × | ○ | × | × | × |
| 17 | 17 | ○ | × | × | × | ○ | × | ○ | × |
| 18 | 19 | ○ | ○ | × | × | ○ | × | ○ | × |
| 19 | 21 | ○ | × | ○ | × | ○ | × | ○ | × |
| 20 | 24 | × | × | × | ○ | ○ | × | ○ | × |
| 21 | 27 | ○ | ○ | × | ○ | ○ | × | ○ | × |
| 22 | 30 | × | ○ | ○ | ○ | ○ | × | ○ | × |
| 23 | 33 | ○ | × | × | × | ○ | ○ | ○ | × |
| 24 | 36 | × | × | ○ | × | ○ | ○ | ○ | × |
| 25 | 39 | ○ | ○ | ○ | × | ○ | ○ | ○ | × |
| 26 | 43 | ○ | ○ | × | ○ | ○ | ○ | ○ | × |
| 27 | 46 | × | ○ | ○ | ○ | ○ | ○ | ○ | × |
| 28 | 50 | × | ○ | × | × | ○ | ○ | ○ | ○ |
| 29 | 54 | × | ○ | ○ | × | ○ | ○ | ○ | ○ |
| 30 | 59 | ○ | ○ | × | ○ | ○ | ○ | ○ | ○ |
| 31 | 63 | ○ | ○ | ○ | ○ | ○ | ○ | ○ | ○ |

○: Lighting
×: non-Lighting

FIG. 28

| Gray Scale 5 bit display with gamma correction | 6 bit display | SF1 (1) SP1 (1) | SF1 (1) SP2 (2) | SF2 (4) SP1 (1) | SF2 (4) SP2 (2) | SF31 (8) SP1 (1) | SF31 (8) SP2 (2) | SF32 (8) SP1 (1) | SF32 (8) SP2 (2) |
|---|---|---|---|---|---|---|---|---|---|
| | | 1 | 2 | 4 | 8 | 8 | 16 | 8 | 16 |
| 0 | 0 | × | × | × | × | × | × | × | × |
| 1 | 1 | ○ | × | × | × | × | × | × | × |
| 2 | 2 | × | ○ | × | × | × | × | × | × |
| 3 | 3 | ○ | ○ | × | × | × | × | × | × |
| 4 | 4 | × | × | ○ | × | × | × | × | × |
| 5 | 5 | ○ | × | ○ | × | × | × | × | × |
| 6 | 6 | × | ○ | ○ | × | × | × | × | × |
| 7 | 7 | ○ | ○ | ○ | × | × | × | × | × |
| 8 | 8 | × | × | × | × | ○ | × | × | × |
| 9 | 9 | ○ | × | × | × | ○ | × | × | × |
| 10 | 10 | × | ○ | × | × | ○ | × | × | × |
| 11 | 11 | ○ | ○ | × | × | ○ | × | × | × |
| 12 | 12 | × | × | ○ | × | ○ | × | × | × |
| 13 | 13 | ○ | × | ○ | × | ○ | × | × | × |
| 14 | 14 | × | ○ | ○ | × | ○ | × | × | × |
| 15 | 15 | ○ | ○ | ○ | × | ○ | × | × | × |
| 16 | 16 | × | × | × | × | ○ | × | ○ | × |
| 17 | 17 | ○ | × | × | × | ○ | × | ○ | × |
| 18 | 19 | ○ | ○ | × | × | ○ | × | ○ | × |
| 19 | 21 | ○ | × | ○ | × | ○ | × | ○ | × |
| 20 | 24 | × | × | × | ○ | ○ | × | ○ | × |
| 21 | 27 | ○ | ○ | × | ○ | ○ | × | ○ | × |
| 22 | 30 | × | ○ | ○ | ○ | ○ | × | ○ | × |
| 23 | 33 | ○ | × | × | × | ○ | ○ | ○ | × |
| 24 | 36 | × | × | ○ | × | ○ | ○ | ○ | × |
| 25 | 39 | ○ | ○ | ○ | × | ○ | ○ | ○ | × |
| 26 | 43 | ○ | ○ | × | ○ | ○ | ○ | ○ | × |
| 27 | 46 | × | ○ | ○ | ○ | ○ | ○ | ○ | × |
| 28 | 50 | × | ○ | × | × | ○ | ○ | ○ | ○ |
| 29 | 54 | × | ○ | ○ | × | ○ | ○ | ○ | ○ |
| 30 | 59 | ○ | ○ | × | ○ | ○ | ○ | ○ | ○ |
| 31 | 63 | ○ | ○ | ○ | ○ | ○ | ○ | ○ | ○ |

FIG. 30

○: Lighting
×: non-Lighting

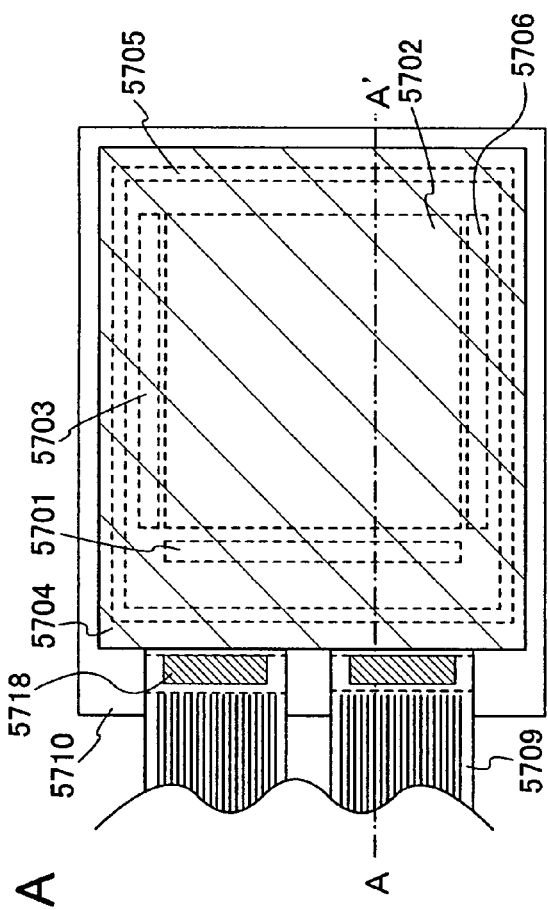
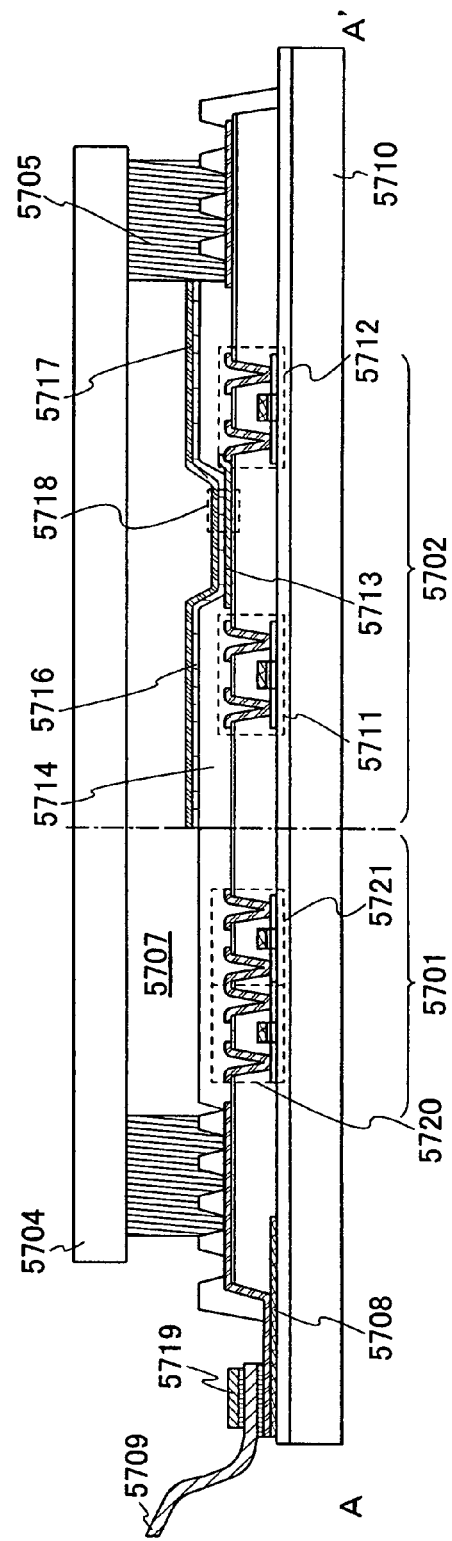
FIG. 57A
FIG. 57B

Extracted Direction of Light Emission

Extracted Direction of Light Emission

Extracted Direction of Light Emission

Extracted Direction of Light Emission

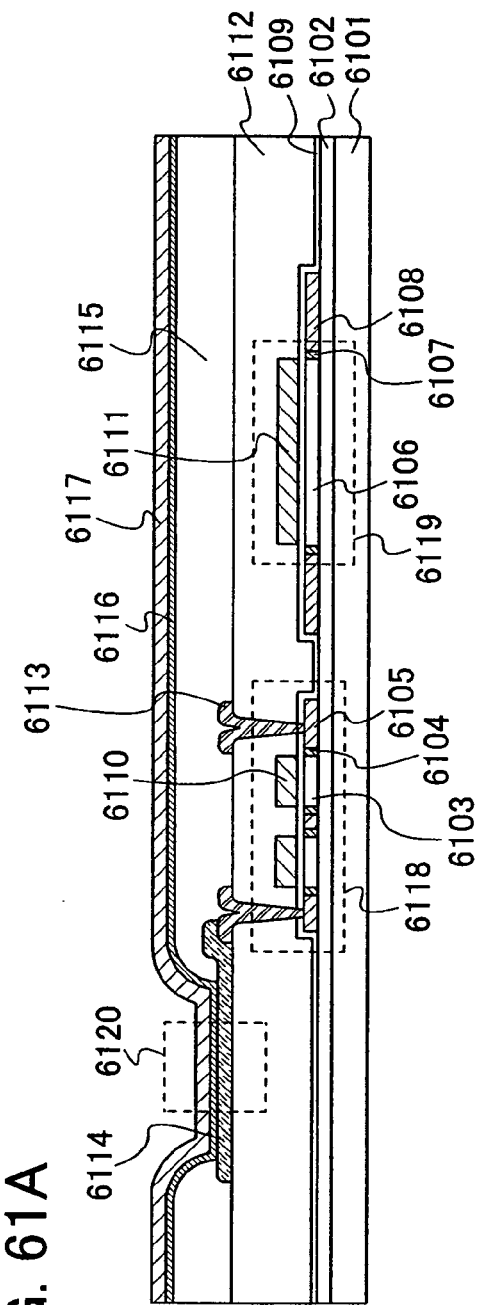
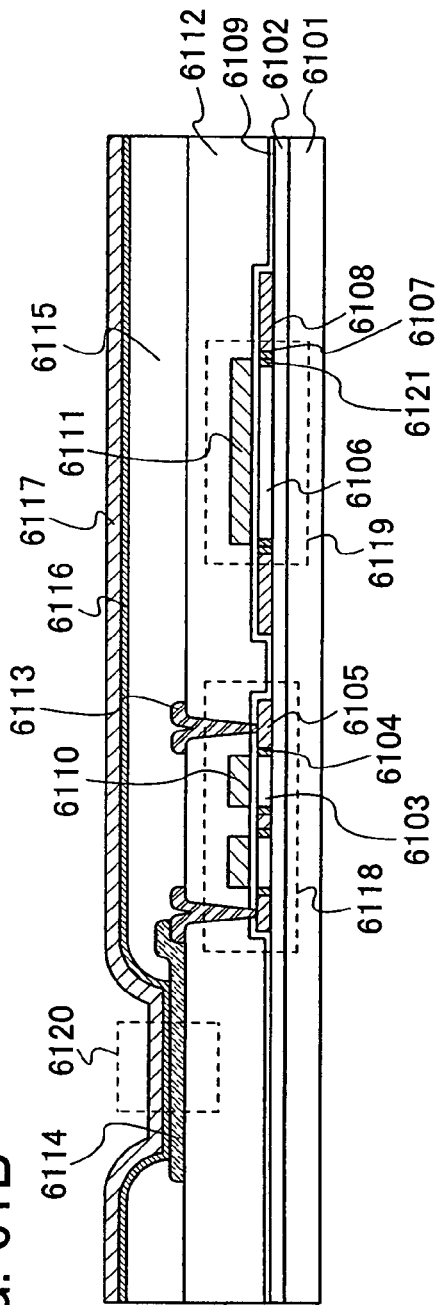

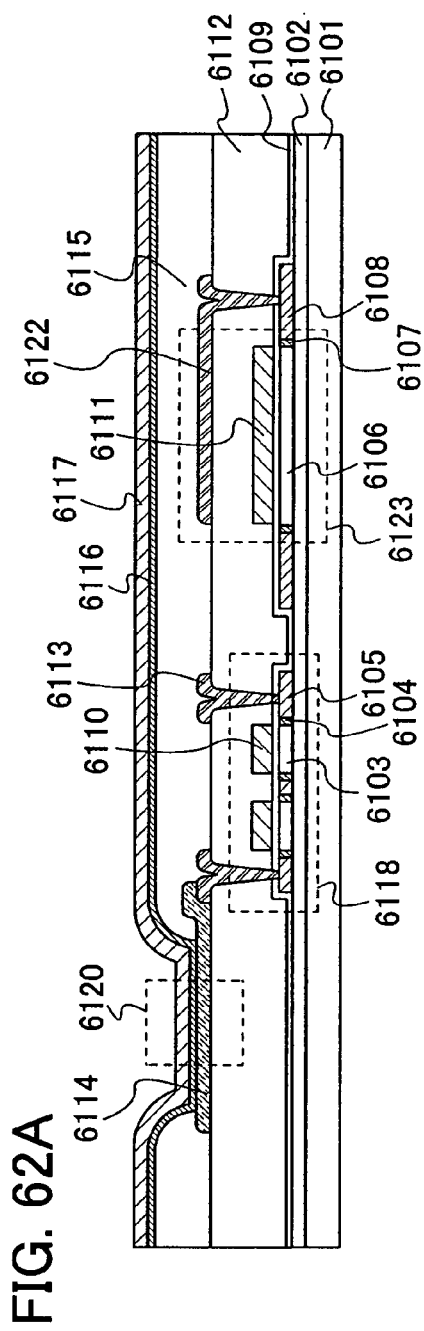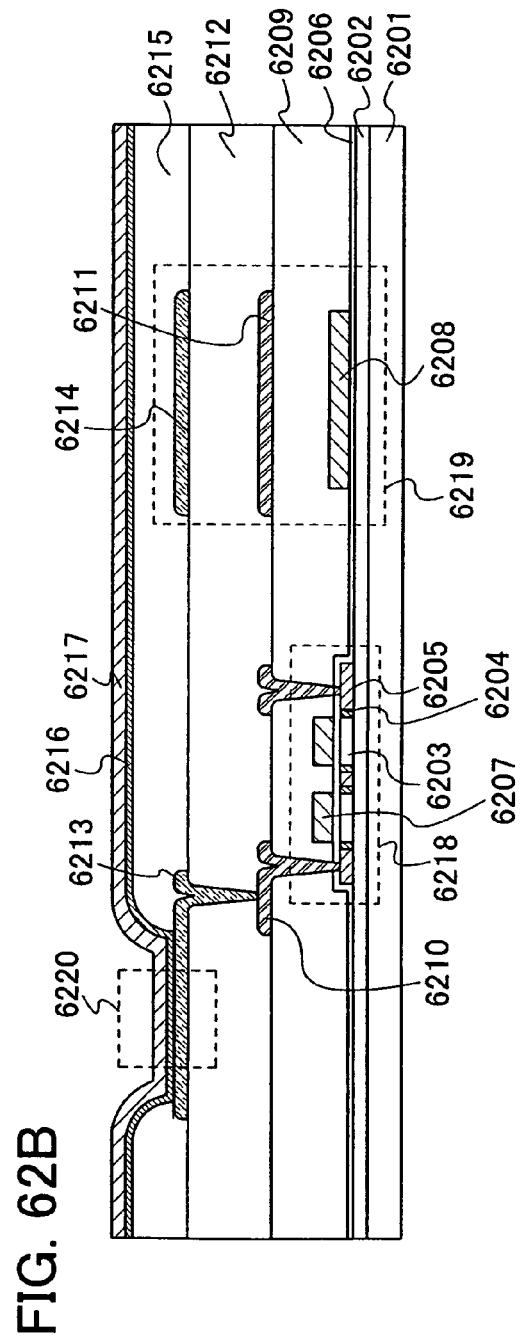
FIG. 62A
FIG. 62B

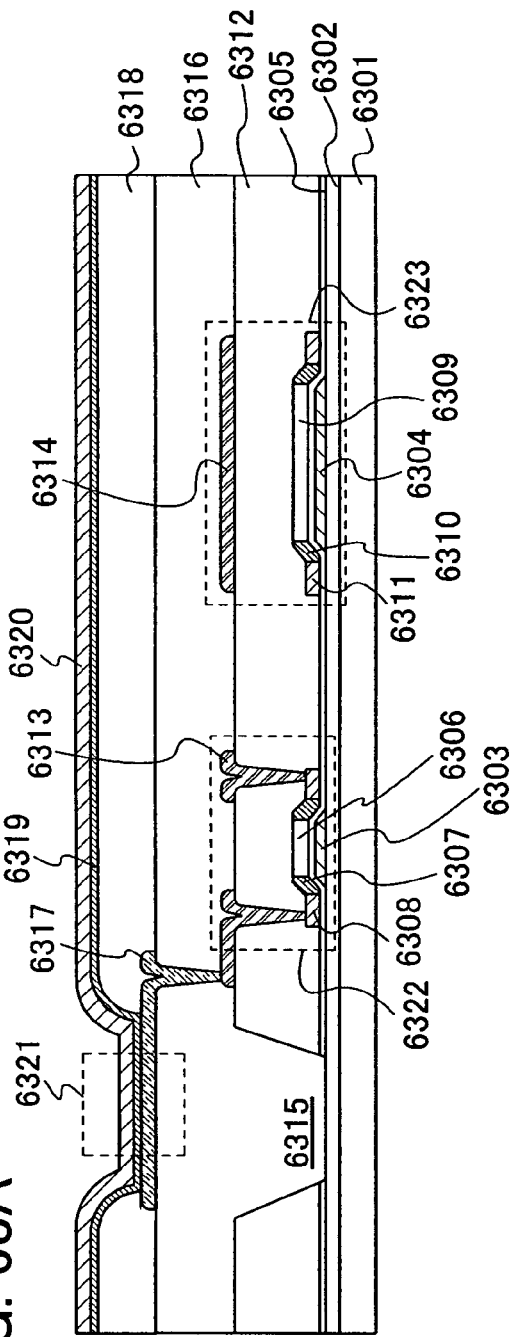
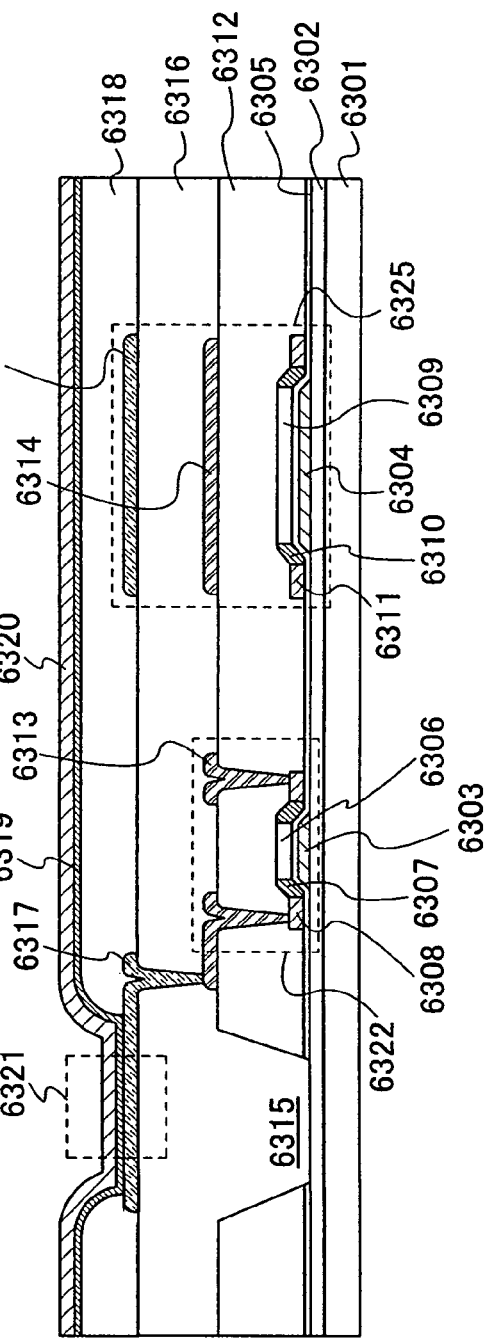
FIG. 63A
FIG. 63B

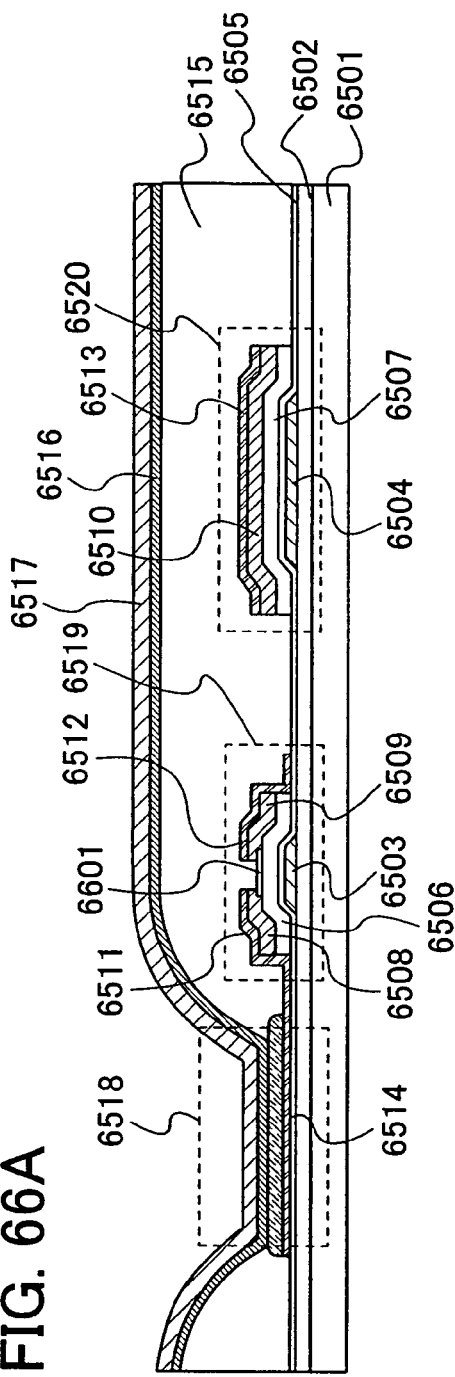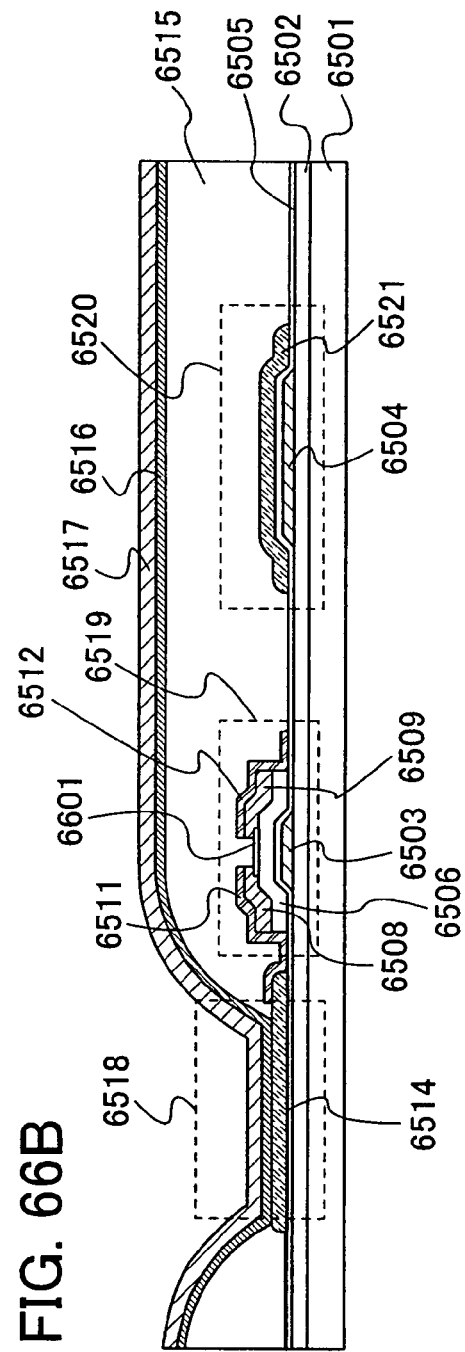

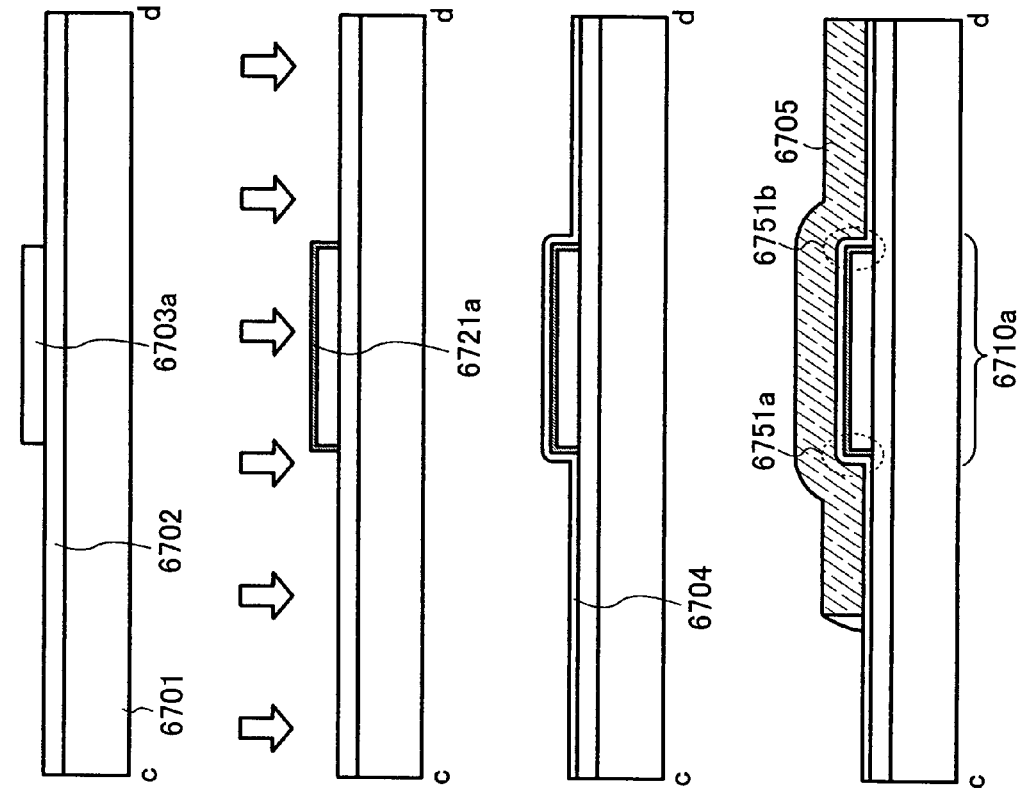

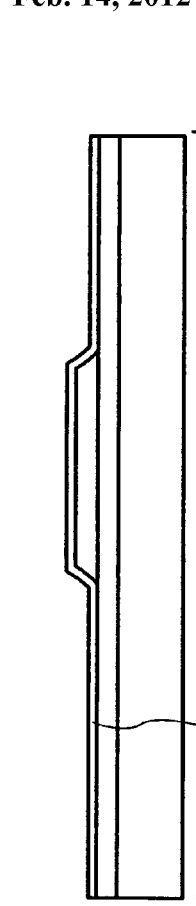
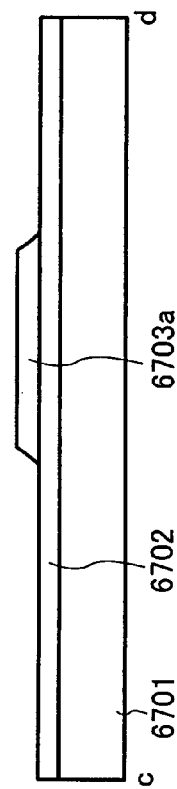
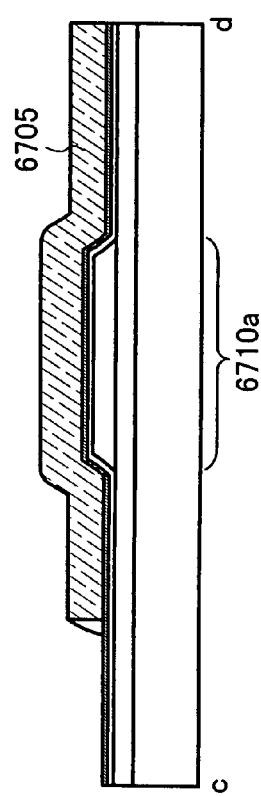
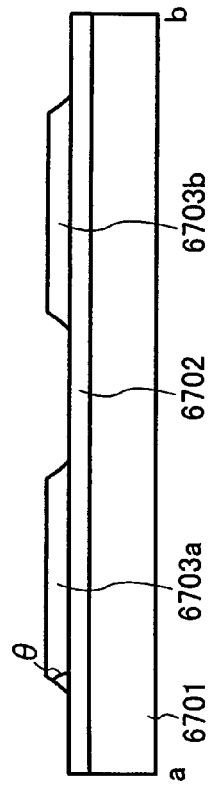
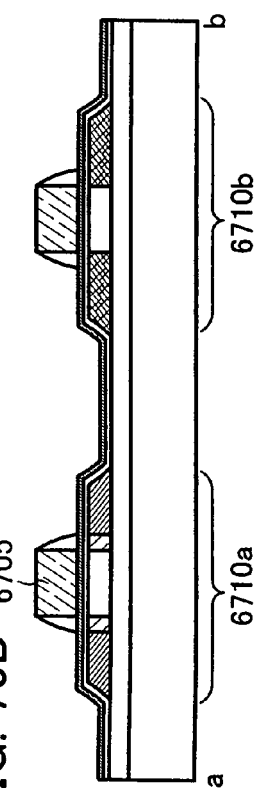
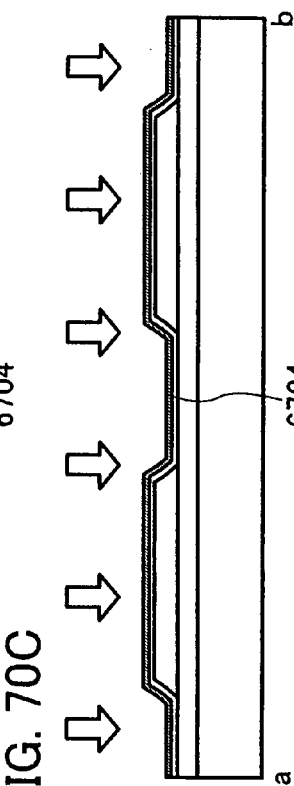

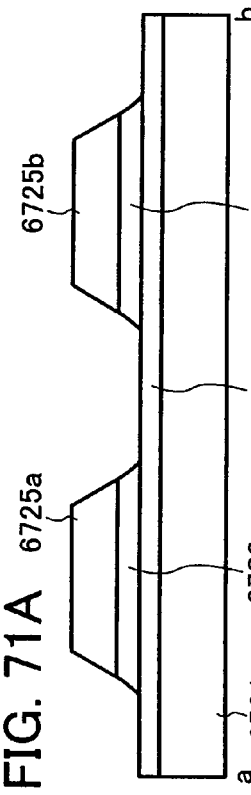
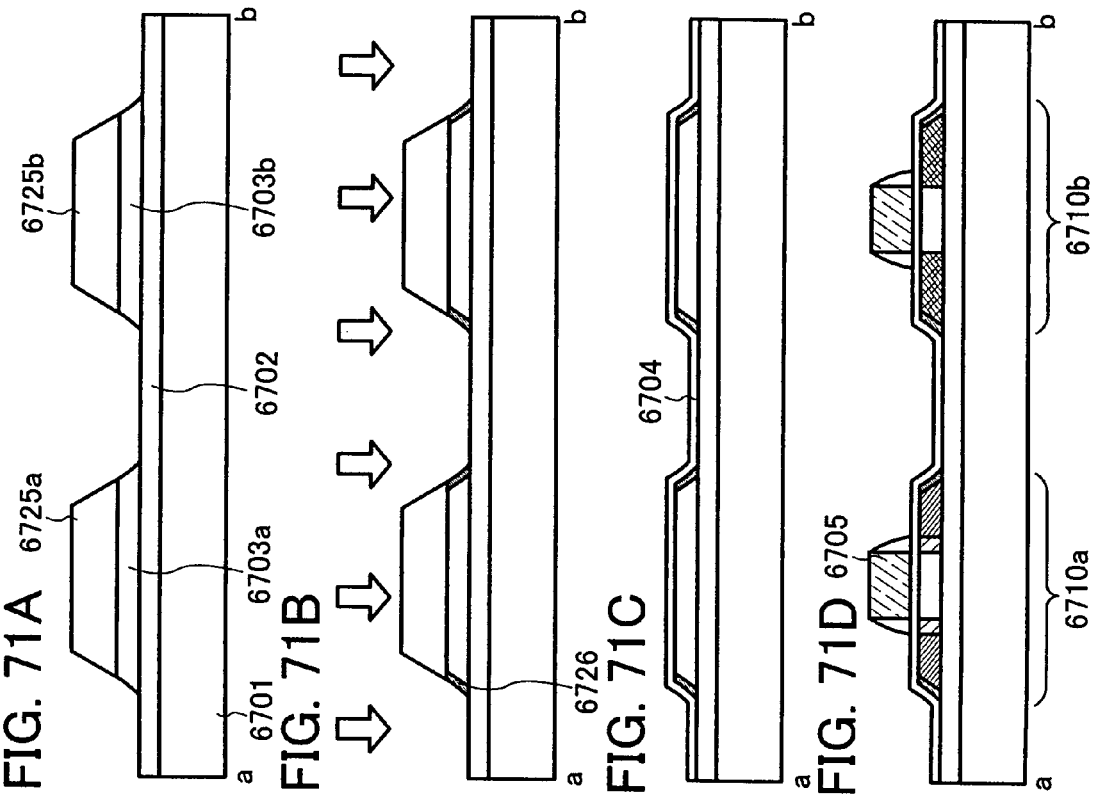

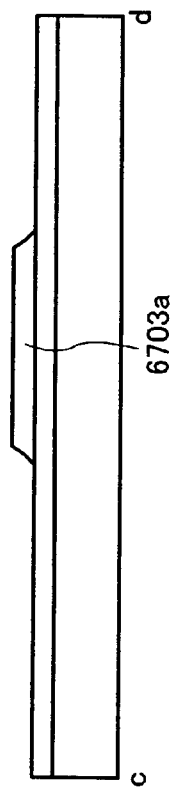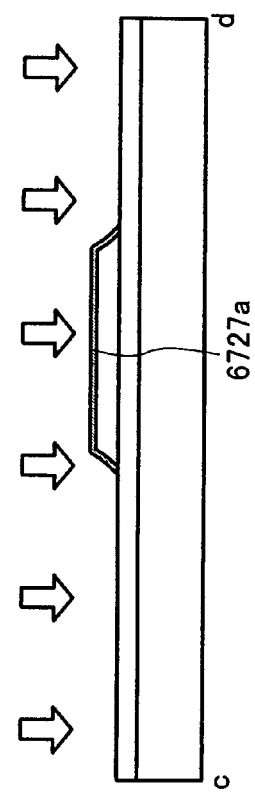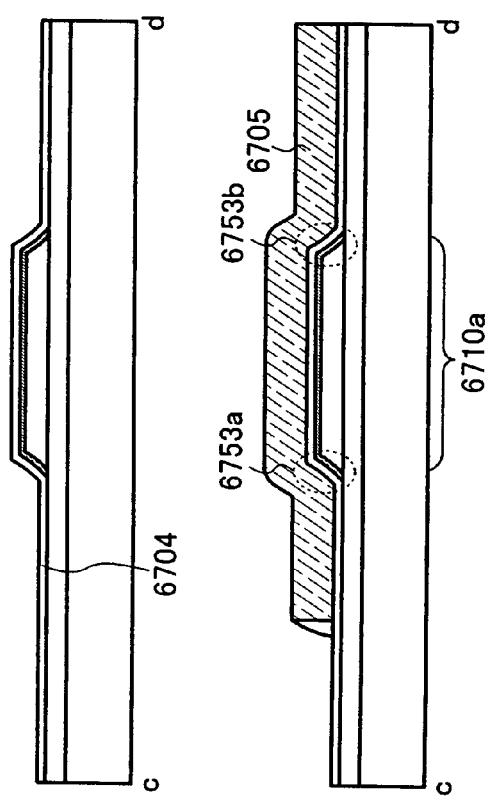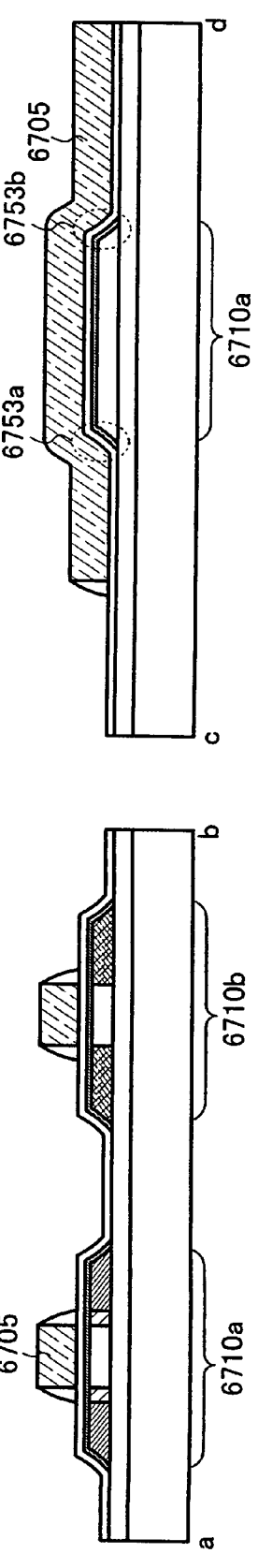

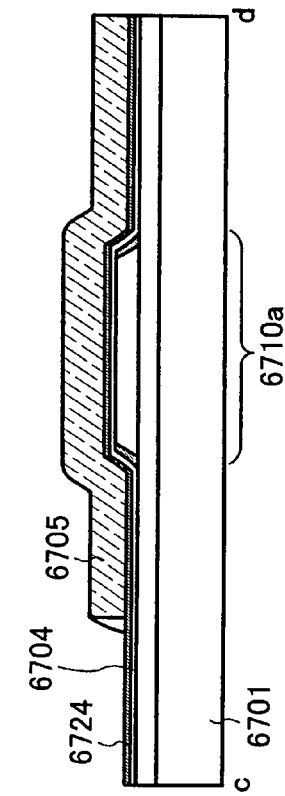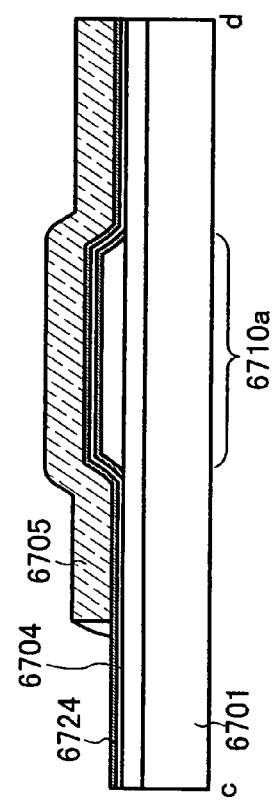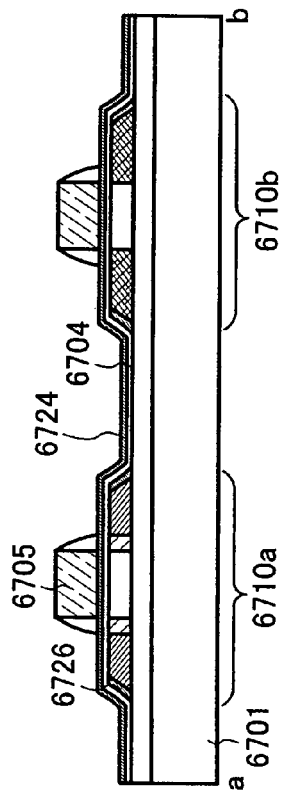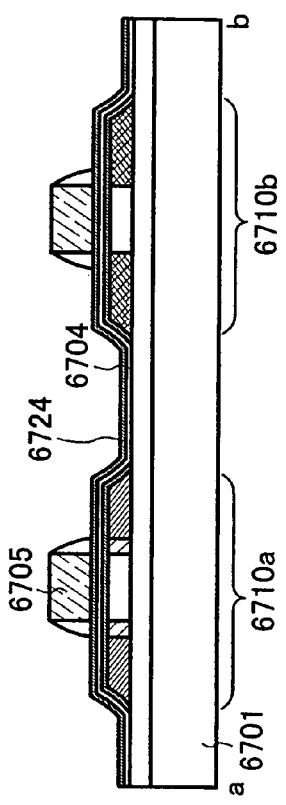
FIG. 73A
FIG. 73B

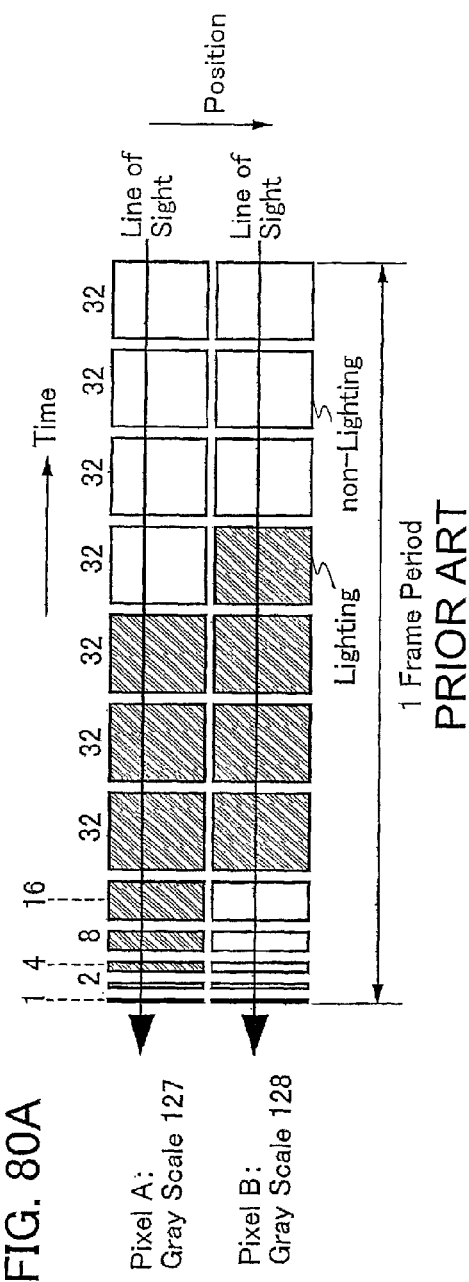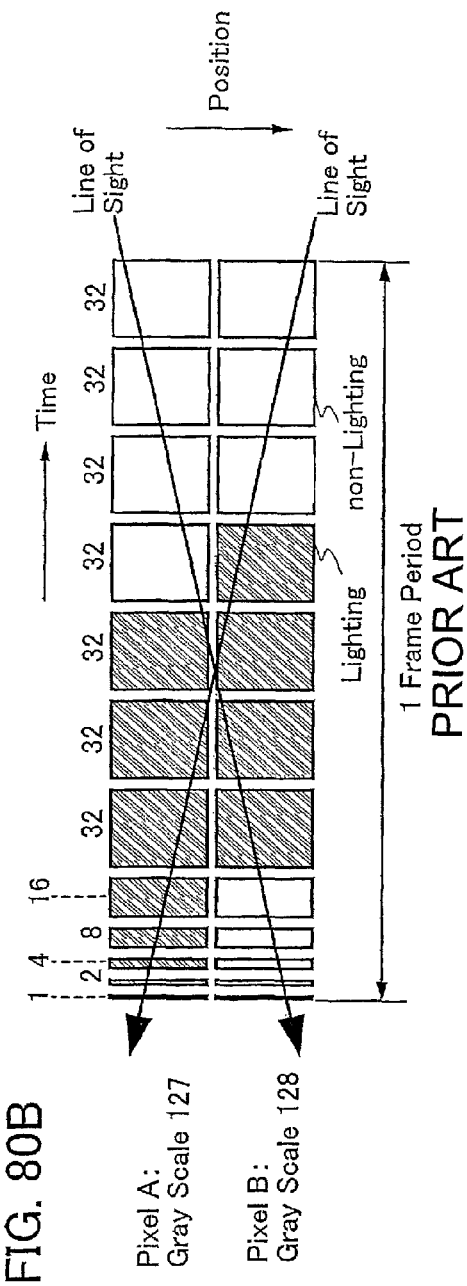

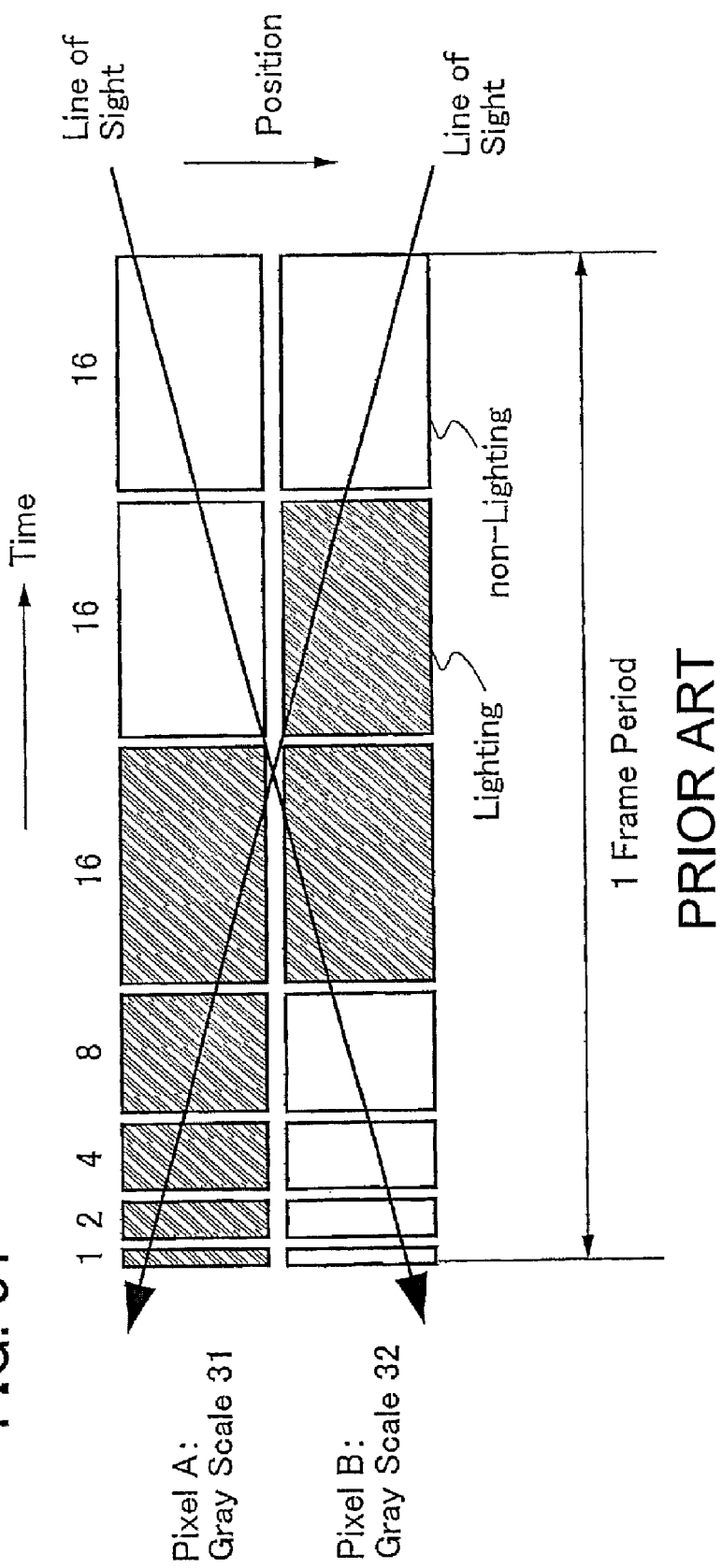

DISPLAY DEVICE, DRIVING METHOD OF DISPLAY DEVICE, AND ELECTRONIC APPLIANCE

BACKGROUND OF THE INVENTION

1. Field of the Invention

The present invention relates to a display device and a driving method thereof, particularly relates to a display device to which an area gray scale method is applied and a driving method thereof.

2. Description of the Related Art

In recent years, a so-called self-light emitting display device of which pixel is formed using a light emitting element such as a light emitting diode (LED) has attracted attention. As a light emitting element used for such a self-light emitting display device, an organic light emitting diode (also referred to as an OLED (Organic Light Emitting Diode), an organic EL element, an electroluminescence (EL) element, or the like) has attracted attention, and has been used for an EL display and the like. Since a light emitting element such as an OLED is a self-light emitting type, it has advantages of high visibility of pixels, no backlight required, high response speed, and the like over a liquid crystal display. Luminance of a light emitting element is controlled by a value of a current flowing through the light emitting element.

As a driving method for controlling a light emitting gray scale of such a display device, there are a digital gray scale method and an analog gray scale method. In the digital gray scale method, a light emitting element is turned on/off by digital control to express a gray scale. On the other hand, the analog gray scale method includes a method for controlling luminance of a light emitting element by an analog manner and a method for controlling a light emitting period of a light emitting element by an analog manner.

In a case of the digital gray scale method, there are only two states: a light emitting state and a non-light emitting state. Therefore, only two gray scales can be expressed if nothing is done. Accordingly, another method is used in combination to realize multiple gray scales. An area gray scale method or a time gray scale method is often used as the method for multiple gray scales.

The area gray scale method is a method for expressing a gray scale by controlling the area of a lighting portion. That is, a gray scale is expressed by dividing one pixel into a plurality of subpixels and controlling the number or the area of lighting subpixels (e.g., see Reference 1: Japanese Published Patent Application No. H11-73158 and Reference 2: Japanese Published Patent Application No. 2001-125526). In the area gray scale method, the number of the subpixels cannot be increased; therefore, it is difficult to realize high definition and multiple gray scales. This is given as a disadvantage of the area gray scale method.

The time gray scale method is a method for expressing a gray scale by controlling the length of a light emitting period or the frequency of light emission.

That is, one frame is divided into a plurality of subframes, each subframe is weighted with respect to the frequency of light emission, the light emitting period, or the like, and then the total weight (the sum of the frequency of light emission or the sum of the light emitting period) is differentiated for each gray scale, thereby expressing a gray scale. It is known that display failure called a pseudo contour (or a false contour) occurs when such a time gray scale method is used, and measures against the failure are considered (e.g., see Reference 3: Japanese Patent No. 2903984, Reference 4: Japanese Patent No. 3075335, Reference 5: Japanese Patent No. 2639311, Reference 6: Japanese Patent No. 3322809, Reference 7: Japanese Published Patent Application No. H10-307561, Reference 8: Japanese Patent No. 3585369, and Reference 9: Japanese Patent No. 3489884).

However, even though various methods for reducing a pseudo contour have been suggested, an effect of reducing a pseudo contour has not been sufficiently obtained.

For example, FIGS. 1A and 1B in Reference 4 are referred to, and it is assumed that a gray scale level of 127 is expressed in a pixel A and a gray scale level of 128 is expressed in a pixel B next to the pixel A. A lighting or non-lighting state in each subframe of this case is shown in FIGS. 80A and 80B.

Here, how to interpret FIGS. 80A and 80B is described. FIGS. 80A and 80B are diagrams showing a lighting or non-lighting state of the pixels in one frame. The horizontal direction of FIGS. 80A and 80B indicates time, and the vertical direction thereof indicates each position of the pixels. The length of the horizontal direction of a square in FIGS. 80A and 80B indicates a relative length of a lighting period in each subframe. The area of each square in FIGS. 80A and 80B indicates brightness of the pixel in each subframe.

For example, FIG. 80A shows a case where only the pixel A or the pixel B is seen without moving the eyes. A pseudo contour does not occur in this case. This is because the eyes sense the brightness in accordance with the sum of the brightness of a place where a line of sight passes. Thus, the eyes sense the gray scale level of the pixel A to be 127 (=1+2+4+ 8+16+32+32+32), and the eyes sense the gray scale level of the pixel B to be 128 (=32+32+32+32). That is, the eyes sense an accurate gray scale.

On the other hand, FIG. 80B shows a case where a line of sight is moved from the pixel A to the pixel B or from the pixel B to the pixel A. In this case, the gray scale level is sometimes perceived as 96 (=32+32+32), and the gray scale level is sometimes perceived as 159 (=1+2+4+8+16+32+32+32+32) depending on a movement of the line of sight. Although the gray scale level is supposed to be perceived as 127 and 128, the gray scale level is perceived to be 96 or 159, and thereby a pseudo contour occurs.

FIGS. 80A and 80B show a case of an 8-bit gray scale (256 gray scales). Next, FIG. 81 shows a case of a 6-bit gray scale (64 gray scales). In this case also, the eyes sometimes sense the gray scale level to be 16 (=16), and sometimes sense the gray scale level to be 47 (=1+2+4+8+16+16) in accordance with the eyes' movement. Although the gray scale level is supposed to be perceived as 31 and 32, the gray scale level is perceived to be 16 or 47, and thereby a pseudo contour occurs.

SUMMARY OF THE INVENTION

As described above, it is difficult to realize high-definition and multiple gray scales only by the conventional area gray scale method; and a pseudo contour occurs only by the conventional time gray scale method, so that deterioration of image quality cannot be sufficiently suppressed.

In view of the foregoing problems, objects of the invention are to provide a display device which can perform multiple gray scale display and in which the number of subframes is small so that a pseudo contour can be reduced; and to provide a driving method of the display device.

One feature of the invention is a driving method of a display device including a plurality of pixels each of which includes m subpixels (m is an integer of $m \geq 2$) each provided with a light emitting element. In the m subpixels, the area of the $(s+1)$th subpixel ($1 \leq s \leq m-1$) is twice the area of the s-th subpixel. In each lighting period of the m subpixels, one frame is divided into n subframes (n is an integer of $n \geq 2$). In the n subframes, a lighting period of the (p+1)th subframe ($1 \leq p \leq n-1$) is $2^m$ times longer than a lighting period of the p-th subframe. At least one subframe of the n subframes is divided into a plurality of subframes each having a lighting period shorter than that of the subframe so that the n subframes are increased to t subframes ($t > n$). In at least one subframe of the t subframes, lighting periods of the subframes in a lighting state are sequentially added by the m subpixels, so that a gray scale of the pixel is expressed.

Note that in the driving method of the invention, a subframe having the longest lighting period among the n subframes may be divided into a plurality of subframes each having a lighting period shorter than that of the subframe.

Note that in the driving method of the invention, at least one subframe of the n subframes may be divided into a plurality of subframes having lighting periods equal to each other.

Note that in the driving method of the invention, the subframes may be arranged in ascending order or descending order of the lighting periods.

Note that in the driving method of the invention, luminance may be changed linearly with respect to the gray scale level in a low gray scale region, while luminance may be changed nonlinearly with respect to the gray scale level in a region other than the low gray scale region.

Another feature of the invention is a display device which performs the driving method of the invention. M subpixels each include a light emitting element, a signal line, a scan line, a first power supply line, a second power supply line, a selection transistor, and a driving transistor. A first electrode of the selection transistor is electrically connected to the signal line and a second electrode thereof is electrically connected to a gate electrode of the driving transistor. A first electrode of the driving transistor is electrically connected to the first power supply line. A first electrode of the light emitting element is electrically connected to a second electrode of the driving transistor and a second electrode thereof is electrically connected to the second power supply line.

Note that in the display device of the invention, the signal line, the scan line, or the first power supply line may be shared in the m subpixels.

Note that in the display device of the invention, the number of the signal lines included in a pixel may be equal to or more than two and equal to or less than m, and the selection transistor included in one of the m subpixels may be electrically connected to the signal line different from that/those connected to the selection transistor(s) included in the other subpixel(s).

Note that in the display device of the invention, the number of the scan lines included in a pixel may be equal to or more than two, and the selection transistor included in one of the m subpixels may be electrically connected to the scan line different from that connected to the selection transistor included in another subpixel.

Note that in the display device of the invention, the number of the first power supply lines included in a pixel may be equal to or more than 2 and equal to or less than m, and the driving transistor included in one of the m subpixels may be electrically connected to the first power supply line different from that connected to the driving transistor included in another subpixel.

Note that division of a subframe means dividing the length of a lighting period included in the subframe.

Note that in the invention, lighting periods (or the frequency of lighting in a predetermined time) in subframes are sequentially added to express a gray scale. That is, the number of lighting subframes is continuously increased in accordance with increase in gray scale level. Therefore, during a lighting subframe in a case of expressing a low gray scale, light emission is also performed in a case of expressing a higher gray scale. In this specification, such a gray scale method is referred to as an overlapping time gray scale method.

Note that in the invention, if at least one of the subpixels is lighted in at least one of the subframes for displaying a gray scale level of i (i denotes is an integer of $i \geq 0$), the one of the subpixels is lighted in the one of the subframes for whenever displaying a gray scale level larger than i.

In the invention, one pixel corresponds to one color element. Thus, in a case of a color display device having color elements of R (Red), G (Green), and B (Blue), a smallest unit of an image includes three pixels of an R pixel, a G pixel, and a B pixel. Note that the color elements are not limited to three colors, and color elements with more than three colors may be used or a color other than RGB may be used. For example, RGBW may be used by adding white (W) to RGB. Alternatively, one or more colors such as yellow, cyan, and magenta, for example, may be added to RGB.

Further, a color similar to one of RGB may be added. For example, four color elements of R, G, B1, and B2 may be employed. Although B1 and B2 are both blue, they are different in wavelength. By using such color elements, display which is closer to life can be performed and power consumption can be reduced. Note that brightness of each color element may be controlled by using a plurality of regions. In this case, one color element corresponds to one pixel, and each region which controls the brightness corresponds to a subpixel. Accordingly, in a case where display is performed by an area gray scale method, for example, one color element has a plurality of regions which control brightness, and all the regions are used for expressing a gray scale. In this case, each region which controls brightness corresponds to a subpixel. Accordingly, in such a case, one color element includes a plurality of subpixels.

Further, each subpixel has a region with a different area, which contributes to display, in some cases. In addition, slightly different signals may be supplied to a plurality of regions provided in one color element, which control brightness, that is, a plurality of subpixels forming one color element, so that a viewing angle may be widened.

In the invention, pixels may be provided (arranged) in matrix. Here, the description that pixels are provided (arranged) in matrix includes a case where pixels are provided straight or jagged linearly in the longitudinal direction or the lateral direction. For example, in a case where full color display is performed with three color elements (e.g., RGB), a case where the three color elements are arranged in stripes; and a case where dots of the three color elements are arranged in delta pattern or the Bayer arrangement are included.

Note that it is difficult to distinguish a source and a drain because of a structure of a transistor. Further, potential level may be switched depending on a circuit operation. Therefore, in this specification, a source and a drain are not particularly specified and referred to as a first electrode and a second electrode. For example, when a first electrode is a source, a second electrode is referred to a drain. On the other hand, when a first electrode is a drain, a second electrode is referred to a source.

Note that in the invention, a transistor can have various modes and is not limited to a specific type. For example, a thin film transistor (TFT) using a non-single crystalline semiconductor film typified by amorphous silicon or polycrystalline silicon can be employed. Accordingly, the following advantages can be obtained: such transistors can be manufactured at a low manufacturing temperature, can be manufactured at low cost, can be formed over a large substrate or a light transmitting substrate, and such transistors can transmit light. In addition, a transistor formed by using a semiconductor substrate or an SOI substrate, a junction transistor, a bipolar transistor, or the like can be employed. Accordingly, the following advantages can be obtained: transistors with few variations can be manufactured, a transistor with a high current supply capability can be manufactured, a small transistor can be manufactured, and a circuit with low power consumption can be formed. Further, a transistor including a compound semiconductor such as ZnO, a-InGaZnO, SiGe, or GaAs, or a thin film transistor obtained by thinning such a transistor can be employed.

Accordingly, the following advantages can be obtained: such transistors can be manufactured at a low manufacturing temperature or at a room temperature, and can be formed directly over a low heat-resistant substrate such as a plastic substrate or a film substrate. A transistor or the like formed by an ink-jet method or a printing method may also be employed. Accordingly, the following advantages can be obtained: transistors can be manufactured at a room temperature or in a low vacuum, and can be formed over a large substrate. Further, since such transistors can be manufactured without using a mask (reticle), a layout of the transistors can be easily changed. A transistor including an organic semiconductor or a carbon nanotube, or any other transistor can be employed as well. Accordingly, transistors can be formed over a substrate which can be bent. Note that a non-single crystalline semiconductor film may include hydrogen or halogen. In addition, a transistor can be formed using various substrates, and a kind of substrate is not particularly limited. For example, a single crystalline substrate, an SOI substrate, a glass substrate, a quartz substrate, a plastic substrate, a paper substrate, a cellophane substrate, a stone substrate, a stainless steel substrate, or the like can be used. In addition, after a transistor is formed using a substrate, the transistor may be transposed onto another substrate. By using such a substrate, the following advantages can be obtained: a transistor with excellent properties can be formed, a transistor with low power consumption can be formed, a device with high durability can be formed, and high heat resistance can be provided.

Note that in the invention, the description of being "connected" is synonymous with being electrically connected. Therefore, in addition to a predetermined connection relation, an element which enables an electrical connection (e.g., another element or a switch) may be provided in a structure disclosed in the invention.

Note that a switch shown in the invention can have various modes, such as an electrical switch and a mechanical switch. That is, any type of switch can be used without being limited to a particular type as long as current flow can be controlled.

For example, a transistor, a diode (such as a PN diode, a PIN diode, a Schottky diode, or a diode-connected transistor), a thyristor, or a logic circuit which is a combination thereof may be used. In a case where a transistor is used as a switch, polarity (conductivity type) of the transistor is not particularly limited because it operates as a mere switch. However, when less off current is preferable, a transistor of polarity with less off current is preferably used. As a transistor with less off current, a transistor having an LDD region, a transistor having a multi-gate structure, and the like are given as an example. Further, an n-channel transistor is preferably used when a potential of a source terminal of the transistor functioning as a switch is close to a low potential side power supply (VSS, GND, 0V, or the like). On the other hand, a p-channel transistor is preferably used when the potential of the source terminal is close to a high potential side power supply (VDD or the like). This is because the transistor can easily function as a switch since an absolute value of a gate-source voltage can be increased. Note that a CMOS switch may also be applied by using both n-channel and p-channel transistors. A CMOS switch can easily function as a switch since a current can flow when either of the n-channel transistor or the p-channel transistor is turned on. For example, a voltage can be output as appropriate whether a voltage of an input signal to the switch is high or low. Further, a voltage amplitude value of a signal for turning on/off a switch can be decreased; thus, power consumption can be reduced.

In the invention, the description that an object is formed on or over a different object does not necessarily mean that the object is in direct contact with the different object. The description includes a case where two objects are not in direct contact with each other, that is, a case where another object is interposed therebetween.

Accordingly, for example, when it is described that a layer B is formed on (or over) a layer A, it means either case where the layer B is formed on and in direct contact with the layer A, or where another layer (e.g., a layer C or a layer D) is formed on and in direct contact with the layer A and the layer B is formed on and in direct contact with the layer C or D. Similarly, when it is described that an object is formed above a different object, it does not necessarily mean that the object is in direct contact with the different object, and another object may be interposed therebetween. Accordingly, for example, when it is described that a layer B is formed above a layer A, it means either case where the layer B is formed on and in direct contact with the layer A, or where another layer (e.g., a layer C or a layer D) is formed on and in direct contact with the layer A and the layer B is formed on and in direct contact with the layer C or D.

Similarly, when it is described that an object is formed under or below a different object, it means either case where the objects are in direct contact with each other or not in contact with each other.

Note that in the invention, a semiconductor device corresponds to a device having a circuit which includes a semiconductor element (such as a transistor or a diode). Further, a semiconductor device may be a general device which can operate by using semiconductor characteristics. A display device corresponds to a device including a display element (such as a liquid crystal element or a light emitting element). Note that a display device may be a main body of a display panel in which a plurality of pixels including a display element such as a liquid crystal element or an EL element and a peripheral driver circuit for driving the pixels are formed over a substrate. A display device may include an element (such as an IC, a resistor, a capacitor, an inductor, or a transistor) which is provided with a flexible printed circuit (FPC) or a printed wiring board (PWB). Further, a display device may include an optical sheet such as a polarizing plate or a retardation film. In addition, a backlight (such as a light guiding plate, a prism sheet, a diffusion sheet, a reflection sheet, or a light source (e.g., an LED, a cold-cathode tube, or the like)) may be included.

Note that a display device of the invention can have various modes or includes various display elements. For example, a display medium of which contrast is changed by electromagnetic action, such as an EL element (an organic EL element, an inorganic EL element, or an EL element containing both organic and inorganic materials), an electron-emissive element, a liquid crystal element, electronic ink, a grating light valve (GLV), a plasma display panel (PDP), a digital micromirror device (DMD), a piezoelectric ceramic display, or a carbon nanotube can be applied. Note that display devices using an EL element include an EL display; display devices using an electron-emissive element include a field emission display (FED), an SED flat panel display (SED: Surface-conduction Electron-emitter Display), and the like; display devices using a liquid crystal element include a liquid crystal display, a transmissive liquid crystal display, a transflective liquid crystal display, and a reflective liquid crystal display; and display devices using electronic ink include electronic paper.

Note that a light emitting element in this specification is referred to an element among display elements, which is capable of controlling luminance depending on a current flowing through the element. Typically, the light emitting element is referred to an EL element. Other than an EL element, an electron-emissive element is also included in the light emitting element, for example.

Note that in this specification, a case of including a light emitting element as a display element is mainly described as an example; however, the display element is not limited to the light emitting element in the content of the invention. Various display elements as described above can be applied.

In the invention, by combination of an area gray scale method and a time gray scale method, multiple gray scale display can be performed and a pseudo contour can be reduced. Accordingly, display quality can be improved and a clear image can be obtained. Further, a duty ratio (a ratio of a lighting period in one frame) can be improved as compared with a conventional time gray scale method, and luminance can be improved. By improvement in the duty ratio, a voltage applied to a light emitting element can be reduced. Therefore, power consumption can be reduced and deterioration of the light emitting element can be suppressed.

BRIEF DESCRIPTION OF THE DRAWINGS

FIG. 1 is a chart showing an example of a selection method of a subpixel and a subframe in a driving method of the invention.

FIG. 2 is a diagram showing a cause of reducing a pseudo contour in a driving method of the invention.

FIG. 3 is a chart showing an example of a selection method of a subpixel and a subframe in a driving method of the invention.

FIG. 4 is a diagram showing a cause of reducing a pseudo contour in a driving method of the invention.

FIG. 5 is a chart showing an example of a selection method of a subpixel and a subframe in a driving method of the invention.

FIG. 7 is a chart showing an example of a selection method of a subpixel and a subframe in a driving method of the invention.

FIG. 9 is a chart showing an example of a selection method of a subpixel and a subframe in a driving method of the invention.

FIG. 11 is a chart showing an example of a selection method of a subpixel and a subframe in a driving method of the invention.

FIG. 13 is a chart showing an example of a selection method of a subpixel and a subframe in a driving method of the invention.

FIG. 15 is a chart showing an example of a selection method of a subpixel and a subframe in a driving method of the invention.

FIG. 17 is a chart showing an example of a selection method of a subpixel and a subframe in a driving method of the invention.

FIG. 19 is a chart showing an example of a selection method of a subpixel and a subframe in a driving method of the invention.

FIG. 21 is a chart showing an example of a selection method of a subpixel and a subframe in a driving method of the invention.

FIG. 23 is a chart showing an example of a selection method of a subpixel and a subframe in a driving method of the invention.

FIG. 24 is a chart showing an example of a selection method of a subpixel and a subframe in a driving method of the invention.

FIG. 25 is a chart showing an example of a selection method of a subpixel and a subframe in a driving method of the invention.

FIG. 26 is a chart showing an example of a selection method of a subpixel and a subframe in a driving method of the invention.

FIG. 28 is a chart showing an example of a selection method of a subpixel and a subframe in a driving method of the invention, in a case where gamma correction is performed.

FIG. 30 is a chart showing an example of a selection method of a subpixel and a subframe in a driving method of the invention, in a case where gamma correction is performed.

FIGS. 57A and 57B are diagrams showing an example of a structure of a display panel used for a display device of the invention.

FIGS. 61A and 61B are diagrams each showing an example of a structure of a display device of the invention.

FIGS. 62A and 62B are diagrams each showing an example of a structure of a display device of the invention.

FIGS. 63A and 63B are diagrams each showing an example of a structure of a display device of the invention.

FIGS. 66A and 66B are diagrams each showing an example of a structure of a display device of the invention.

FIGS. 68A to 68D are diagrams each describing a manufacturing method of a transistor used for a display device of the invention.

FIGS. 70A to 70D are diagrams each describing a manufacturing method of a transistor used for a display device of the invention.

FIGS. 71A to 71D are diagrams each describing a manufacturing method of a transistor used for a display device of the invention.

FIGS. 72A to 72D are diagrams each describing a manufacturing method of a transistor used for a display device of the invention.

FIGS. 73A and 73B are diagrams each describing a manufacturing method of a transistor used for a display device of the invention.

FIGS. 80A and 80B are diagrams showing a cause of generation of a pseudo contour in a conventional driving method.

FIG. 81 is a diagram showing a cause of generation of a pseudo contour in a conventional driving method.

DETAILED DESCRIPTION OF THE INVENTION

Figure 6:
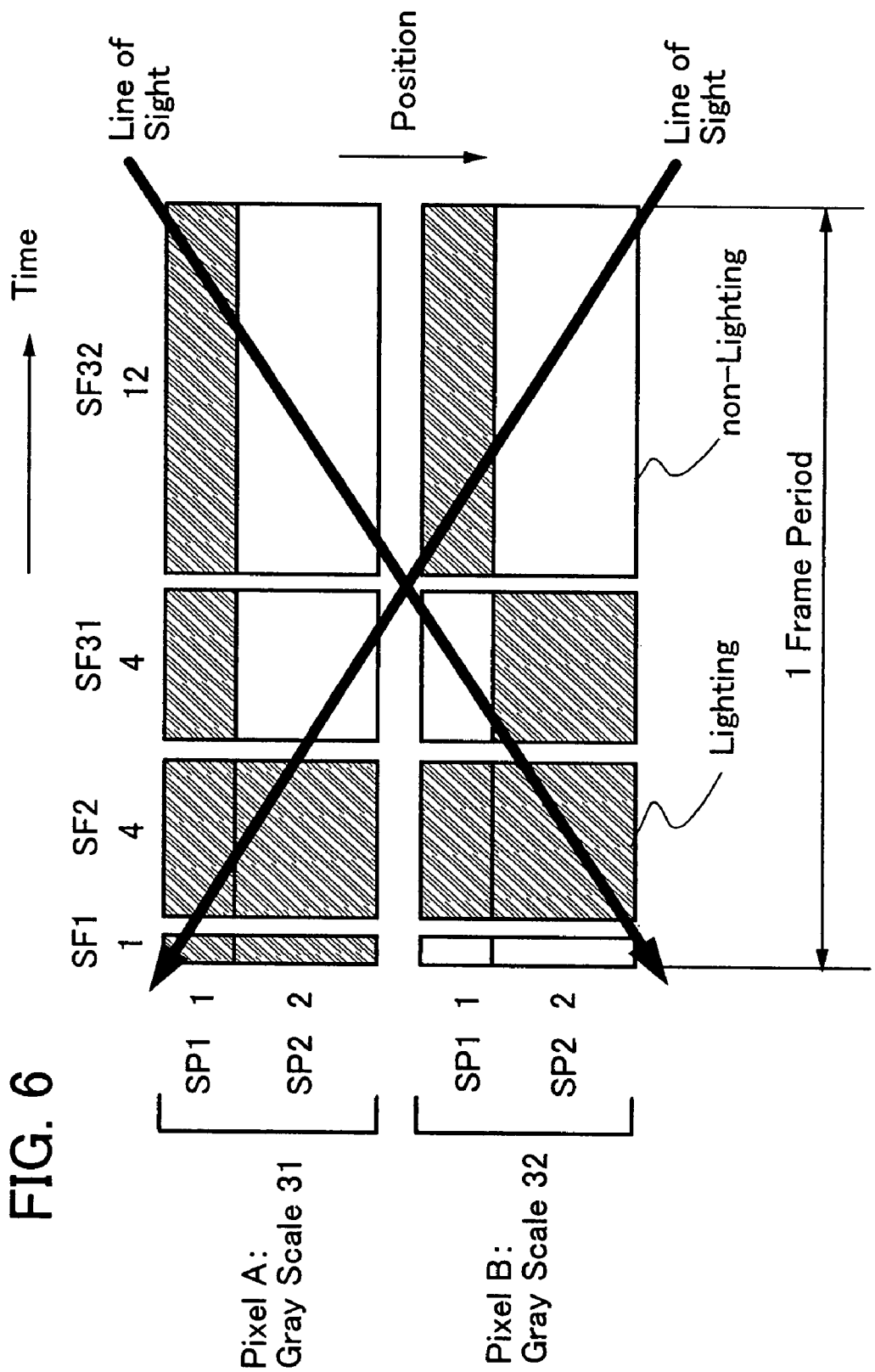
FIG. 6 is a diagram showing a cause of reducing a pseudo contour in a driving method of the invention.

Hereinafter, embodiment modes of the present invention will be described with reference to drawings. However, the present invention can be embodied in many different modes and it is easily understood by those skilled in the art that modes and details can be variously changed without departing from the scope and the spirit of the present invention. Therefore, the present invention is not construed as being limited to description of the embodiment modes.

Embodiment Mode 1

In this embodiment mode, an example where a driving method of the invention is applied to a case of 6-bit display (64 gray scales) is described.

A driving method according to this embodiment mode is a driving method using a combination of an area gray scale method in which one pixel is divided into a plurality of subpixels and a gray scale is expressed by control of the number or the area of lighting subpixels; and a time gray scale method in which one frame is divided into a plurality of subframes, each subframe is weighted with respect to the frequency of light emission, a light emitting period, or the like, and then the total weight is differentiated for each gray scale level, thereby expressing a gray scale. That is, one pixel is divided into m subpixels (m is an integer of m≧2). In the m subpixels, the area of the (s+1)th subpixel (1≦s≦m−1) is twice the area of the s-th subpixel, in other words, a ratio of the area of the s-th subpixel to the area of the (s+1)th subpixel is 1:2. Further, one frame is divided into n subframes (n is an integer of n≧2). In the n subframes, the length of a lighting period of the (p+1)th subframe (1≦p≦n−1) is $2^m$ times the length of a lighting period of the p-th subframe. In other words, a ratio of the length of the lighting period of the p-th subframe to the length of the lighting period of the (p+1)th subframe is $1:2^m$. Further, at least one subframe of the n subframes is divided into a plurality of subframes so that the n subframes are increased to t subframes (t>n), and in each subpixel, an overlapping time gray scale method is applied to subframes of which light emission intensity is equal. That is, the number of lighting subframes is continuously increased in accordance with increase in gray scale level. A gray scale is expressed by controlling lighting of each of the m subpixels in each subframe. Note that in the invention, the product of the area of each subpixel and a lighting period of each subframe is light emission intensity.

First, a method of division of a subpixel and a subframe is described. In this embodiment mode, a case is described as an example, in which one pixel is divided into two subpixels (SP1 and SP2) so that an area ratio of the subpixels is 1:2; one frame is divided into three subframes (SF1, SF2, and SF3) so that a ratio of lighting period between the subframes is 1:4:16; and further, one subframe of the three subframes (SF1 to SF3) is divided into two subframes. Note that in this example, m=2 and n=3.

Here, the subpixels have the following areas: SP1=1 and SP2=2, and the subframes have the following lighting periods: SF1=1, SF2=4, and SF3=16.

In this embodiment mode, one subframe of the subframes (SF1 to SF3) obtained by being divided into three subframes so that a ratio of the lighting periods is 1:4:16, is further divided into two subframes. For example, when SF3 is a subframe to be divided into two subframes, SF3 having the lighting period of 16 is divided into two subframes SF31 and SF32 each having a lighting period of 8.

Thus, one frame is divided into four subframes, and the lighting period of each subframe is SF1=1, SF2=4, SF31=8, and SF32=8.

FIG. 1 shows an example of a selection method of a subpixel and a subframe for expressing each gray scale in this case. In FIG. 1, in each subframe, a subpixel marked by a circle indicates that it is lit and a subpixel marked by a cross indicates that it is not lit.

In the invention, it is considered that the product of the area of each subpixel and a lighting period of each subframe is light emission intensity. In FIG. 1, for example, in SF1 having the lighting period of 1, when only the subpixel 1 (SP1) with the area of 1 is lit, light emission intensity is 1×1=1; and when only the subpixel 2 (SP2) with the area of 2 is lit, light emission intensity is 2×1=2. Similarly in SF2 having the lighting period of 4, when only SP1 is lit, light emission intensity is 4; and when only SP2 is lit, light emission intensity is 8. Similarly in SF31 and SF32 having the lighting period of 8, when only SP1 is lit, light emission intensity is 8; and when only SP2 is lit, light emission intensity is 16. As described above, different light emission intensity can be made depending on a combination of the area of a subpixel and a lighting period of a subframe, and a gray scale is expressed by using this light emission intensity.

Note that in each subpixel, the overlapping time gray scale method is applied to subframes of which light emission intensity is equal. That is, the number of lighting subframes is continuously increased in accordance with increase in gray scale level, and a lighting subframe in a low gray scale level is kept to be used for lighting in a high gray scale level.

In the example shown in FIG. 1, since light emission intensity of SP1 is 8 in SF31 and SF32, the overlapping time gray scale method is applied to SF31 and SF32.

That is, SP1 is always lit in SF31 when a gray scale at a gray scale level of 8 or more is expressed, and always lit in SF32 when a gray scale at a gray scale level of 16 or more is expressed. Similarly, since light emission intensity of SP2 is 16 in SF31 and SF32, the overlapping time gray scale method is applied to SF31 and SF32. That is, SP2 is always lit in SF31 when a gray scale at a gray scale level of 32 or more is expressed, and always lit in SF32 when a gray scale of 48 or more is expressed.

Next, a selection method of a subpixel and a subframe for expressing each gray scale is described.

For example, in the selection method of the subpixel and the subframe shown in FIG. 1, when a gray scale of 1 is expressed, SP1 is lit in SF1. When a gray scale of 2 is expressed, SP2 is lit in SF1. When a gray scale of 3 is expressed, SP1 and SP2 are lit in SF1. When a gray scale of 6 is expressed, SP2 is lit in SF1 and SP1 is lit in SF2. When a gray scale of 32 is expressed, SP1 and SP2 are lit in SF31 and SP1 is lit in SF32. Similarly, when any other gray scale is expressed, each subpixel is selected in each subframe.

As described above, a 6-bit gray scale (64 gray scales) can be expressed by selection of a subpixel lit in each subframe.

By using a driving method of the invention, a pseudo contour can be reduced as compared with a conventional driving method. For example, a pixel A displays an image at a gray scale level of 31 and a pixel B displays an image at a gray scale level of 32 by using the selection method of the subpixel and the subframe shown in FIG. 1. FIG. 2 shows a lighting or non-lighting state of each subpixel in each subframe in this case.

Here, how to interpret FIG. 2 is described. FIG. 2 shows a lighting or non-lighting state of a pixel in one frame. The horizontal direction of FIG. 2 indicates time, and the vertical direction thereof indicates a position of the pixel. The length of the horizontal direction of a square in FIG. 2 indicates an area ratio of each subpixel, and the length of the vertical direction thereof indicates a ratio of the length of a lighting period in each subframe. The area of each square in FIG. 2 indicates light emission intensity.

For example, when a line of sight is moved, a gray scale level is sometimes perceived as 29 (=1+4+8+8+8), and the gray scale level is sometimes perceived as 32 (=16+8+8) depending on a movement of the line of sight. Although the gray scale level is supposed to be perceived as 31 and 32, the gray scale level is perceived to be 29 or 32, and thereby a pseudo contour occurs. However, a gray scale gap is reduced as compared with the conventional driving method; thus, a pseudo contour is reduced.

Note that the length of a lighting period is changed as appropriate in accordance with the total number of gray scales (the number of bits), the total number of subframes, or the like. Therefore, if the total number of gray scales (the number of bits) or the total number of subframes is changed, the length of a period for actually lighting (e.g., the size of μs) may be changed even when the length of the lighting period is the same.

Note that a lighting period is used when a pixel is lit continuously, and the frequency of lighting is used when a pixel is flashed on and off repeatedly in a certain period. A typical display using the frequency of lighting is a plasma display, and a typical display using a lighting period is an organic EL display.

Note that although SF3 is divided into two subframes in the example shown in FIG. 1, SF3 may be divided into three or more subframes. FIG. 3 shows a selection method of a subpixel and a subframe in a case where SF3 in FIG. 1 is divided into four subframes, for example.

In an example shown in FIG. 3, SF3 having a lighting period of 16 among the subframes (SF1 to SF3) obtained by being divided into three subframes so that a ratio of the lighting periods is 1:4:16, is divided into four subframes SF31, SF32, SF33, and SF34 each having a lighting period of 4.

Thus, one frame is divided into six subframes, and the lighting period of each subframe is SF1=1, SF2=4, SF31=4, SF32=4, SF33=4, and SF34=4.

Note that in each subpixel, the overlapping time gray scale method is applied to subframes of which light emission intensity is equal. That is, the number of lighting subframes is continuously increased in accordance with increase in gray scale level, and a lighting subframe in a low gray scale level is kept to be used for lighting in a high gray scale level.

In the example shown in FIG. 3, since light emission intensity of SP1 is 4 in SF2, and SF31 to SF34, the overlapping time gray scale method is applied to SF2, and SF31 to SF33 among these subframes. That is, SP1 is always lit in SF2 when a gray scale at a gray scale level of 4 or more is expressed, always lit in SF31 when a gray scale at a gray scale level of 8 or more is expressed, always lit in SF32 when a gray scale at a gray scale level of 12 or more is expressed, and always lit in SF33 when a gray scale at a gray scale level of 16 or more is expressed. Similarly, since light emission intensity of SP2 is 8 in SF2, and SF31 to SF34, the overlapping time gray scale method is applied to SF2, and SF31 to SF34.

Note that as shown in FIG. 3, when the overlapping time gray scale method is applied to subframes of which light emission intensity is equal in each subpixel, the overlapping time gray scale method is applied to at least one subframe among the corresponding subframes. Therefore, the overlapping time gray scale method may be applied to a plurality or all of the corresponding subframes.

When a driving method shown in FIG. 3 is used, a pseudo contour can be reduced as compared with the conventional driving method. For example, the pixel A displays an image at a gray scale level of 31 and the pixel B displays an image at a gray scale level of 32 by using the selection method of the subpixel and the subframe shown in FIG. 3. FIG. 4 shows a lighting or non-lighting state of each subpixel in each subframe in this case. For example, when a line of sight is moved, a gray scale level is sometimes perceived as 21 (=1+4+8+4+4), and the gray scale level is sometimes perceived as 28 (=8+8+4+4+4) depending on a movement of the line of sight. Although the gray scale level is supposed to be perceived as 31 and 32, the gray scale level is perceived to be 21 or 28, and thereby a pseudo contour occurs. However, a gray scale gap is reduced as compared with the conventional driving method; thus, a pseudo contour is reduced.

As the example shown in FIG. 3, when the number of division of SF3 is increased, the number of subframes having a longest lighting period is increased and the number of subframes without requiring an erasing operation is increased; thus, power consumption for an erasing operation can be reduced. Further, a duty ratio can be improved, and luminance can be improved. By improvement in duty ratio, a voltage applied to a light emitting element can be reduced. Therefore, power consumption can be reduced and deterioration of the light emitting element can be suppressed.

Note that although SF3 is divided into a plurality of subframes each having the same lighting period in FIGS. 1 and 3, the invention is not limited thereto; SF3 may be divided into a plurality of subframes each having a different lighting period. FIG. 5 shows a selection method of a subpixel and a subframe in a case where SF3 in FIG. 1 is divided into two subframes each having a different lighting period.

In FIG. 5, SF3 having the lighting period of 16 among the subframes (SF1 to SF3) obtained by being divided into three subframes so that a ratio of the lighting periods is 1:4:16, is divided into a subframe SF31 having a lighting period of 4 and a subframe SF32 having a lighting period of 12.

Thus, one frame is divided into four subframes, and the lighting period of each subframe is SF1=1, SF2=4, SF31=4, and SF32=12.

Note that in each subpixel, the overlapping time gray scale method is applied to subframes of which light emission intensity is equal. That is, the number of lighting subframes is continuously increased in accordance with increase in gray scale level, and a lighting subframe in a low gray scale level is kept to be used for lighting in a high gray scale level.

In the example shown in FIG. 5, since light emission intensity of SP1 is 4 in SF2 and SF31, the overlapping time gray scale method is applied to SF2 among these subframes. That is, SP1 is always lit in SF2 when a gray scale at a gray scale level of 4 or more is expressed. Similarly, since light emission intensity of SP2 is 8 in SF2 and SF31, the overlapping time gray scale method is applied to SF2 among these subframes.

When a driving method shown in FIG. 5 is used, a pseudo contour can be reduced as compared with the conventional driving method. For example, the pixel A displays an image at a gray scale level of 31 and the pixel B displays an image at a gray scale level of 32 by using the selection method of the subpixel and the subframe shown in FIG. 5. FIG. 6 shows a lighting or non-lighting state of each subpixel in each subframe in this case. For example, when a line of sight is moved, a gray scale level is sometimes perceived as 25 (=1+4+8+12), and the gray scale level is sometimes perceived as 28 (=8+8+12) depending on a movement of the line of sight. Although the gray scale level is supposed to be perceived as 31 and 32, the gray scale level is perceived to be 25 or 28, and thereby a pseudo contour occurs. However, a gray scale gap is reduced as compared with the conventional driving method; thus, a pseudo contour is reduced.

FIGS. 7 and 9 each show a selection method of a subpixel and a subframe in a case where SF3 in FIG. 1 is divided into three subframes each having a different lighting period.

In FIG. 7, SF3 having the lighting period of 16 among the subframes (SF1 to SF3) obtained by being divided into three subframes so that a ratio of the lighting periods is 1:4:16, is divided into subframes SF31 and SF32 each having a lighting period of 4 and a subframe SF33 having a lighting period of 8.

Thus, one frame is divided into five subframes, and the lighting period of each subframe is SF1=1, SF2=4, SF31=4, SF32=4, and SF33=8.

Note that in each subpixel, the overlapping time gray scale method is applied to subframes of which light emission intensity is equal. That is, the number of lighting subframes is continuously increased in accordance with increase in gray scale level, and a lighting subframe in a low gray scale level is kept to be used for lighting in a high gray scale level.

In FIG. 7, since light emission intensity of SP1 is 4 in SF2, SF31, and SF32, the overlapping time gray scale method is applied to SF2 and SF31 among these subframes.

That is, SP1 is always lit in SF2 when a gray scale at a gray scale level of 4 or more is expressed, and always lit in SF31 when a gray scale at a gray scale level of 8 or more is expressed. Similarly, since light emission intensity of SP2 is 8 in SF2, SF31, and SF32, the overlapping time gray scale method is applied to SF2, SF31, and SF32.

Figure 8:
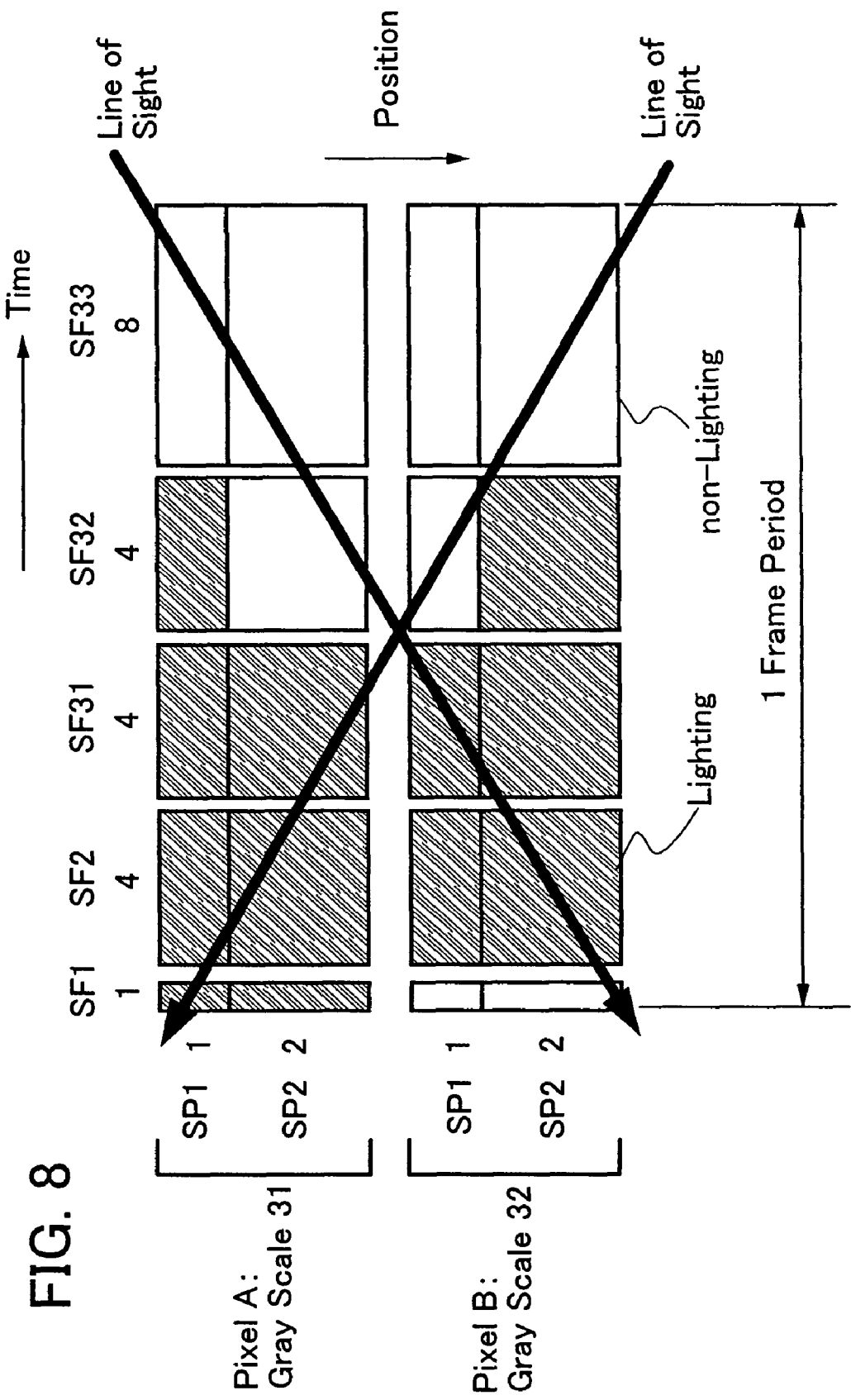
FIG. 8 is a diagram showing a cause of reducing a pseudo contour in a driving method of the invention.

When a driving method shown in FIG. 7 is used, a pseudo contour can be reduced as compared with the conventional driving method. For example, the pixel A displays an image at a gray scale level of 31 and the pixel B displays an image at a gray scale level of 32 by using the selection method of the subpixel and the subframe shown in FIG. 7. FIG. 8 shows a lighting or non-lighting state of each subpixel in each subframe in this case. For example, when a line of sight is moved, a gray scale level is sometimes perceived as 20 (=8+8+4), and the gray scale level is sometimes perceived as 29 (=1+4+8+8+8) depending on a movement of the line of sight. Although the gray scale level is supposed to be perceived as 31 and 32, the gray scale level is perceived to be 20 or 29, and thereby a pseudo contour occurs. However, a gray scale gap is reduced as compared with the conventional driving method; thus, a pseudo contour is reduced.

In FIG. 9, SF3 having the lighting period of 16 among the subframes (SF1 to SF3) obtained by being divided into three subframes so that a ratio of the lighting periods is 1:4:16, is divided into a subframe SF31 having a lighting period of 4 and subframes SF32 and SF33 each having a lighting period of 6.

Thus, one frame is divided into five subframes, and the lighting period of each subframe is SF1=1, SF2=4, SF31=4, SF32=6, and SF33=6.

Note that in each subpixel, the overlapping time gray scale method is applied to subframes of which light emission intensity is equal. That is, the number of lighting subframes is continuously increased in accordance with increase in gray scale level, and a lighting subframe in a low gray scale level is kept to be used for lighting in a high gray scale level.

In the case of the example shown in FIG. 9, since light emission intensity of SP1 is 4 in SF2 and SF31, the overlapping time gray scale method is applied to SF2 among these subframes. Further, since light emission intensity of SP1 is 6 in SF32 and SF33, the overlapping time gray scale method is applied to SF32 and SF33. That is, SP1 is always lit in SF2 when a gray scale at a gray scale level of 4 or more is expressed, always lit in SF32 when a gray scale at a gray scale level of 12 or more is expressed, and always lit in SF33 when a gray scale at a gray scale level of 18 or more is expressed. Similarly, since light emission intensity of SP2 is 8 in SF2 and SF31, the overlapping time gray scale method is applied to SF2 among these subframes. Further, since light emission intensity of SP2 is 12 in SF32 and SF33, the overlapping time gray scale method is applied to SF32 and SF33.

Figure 10:
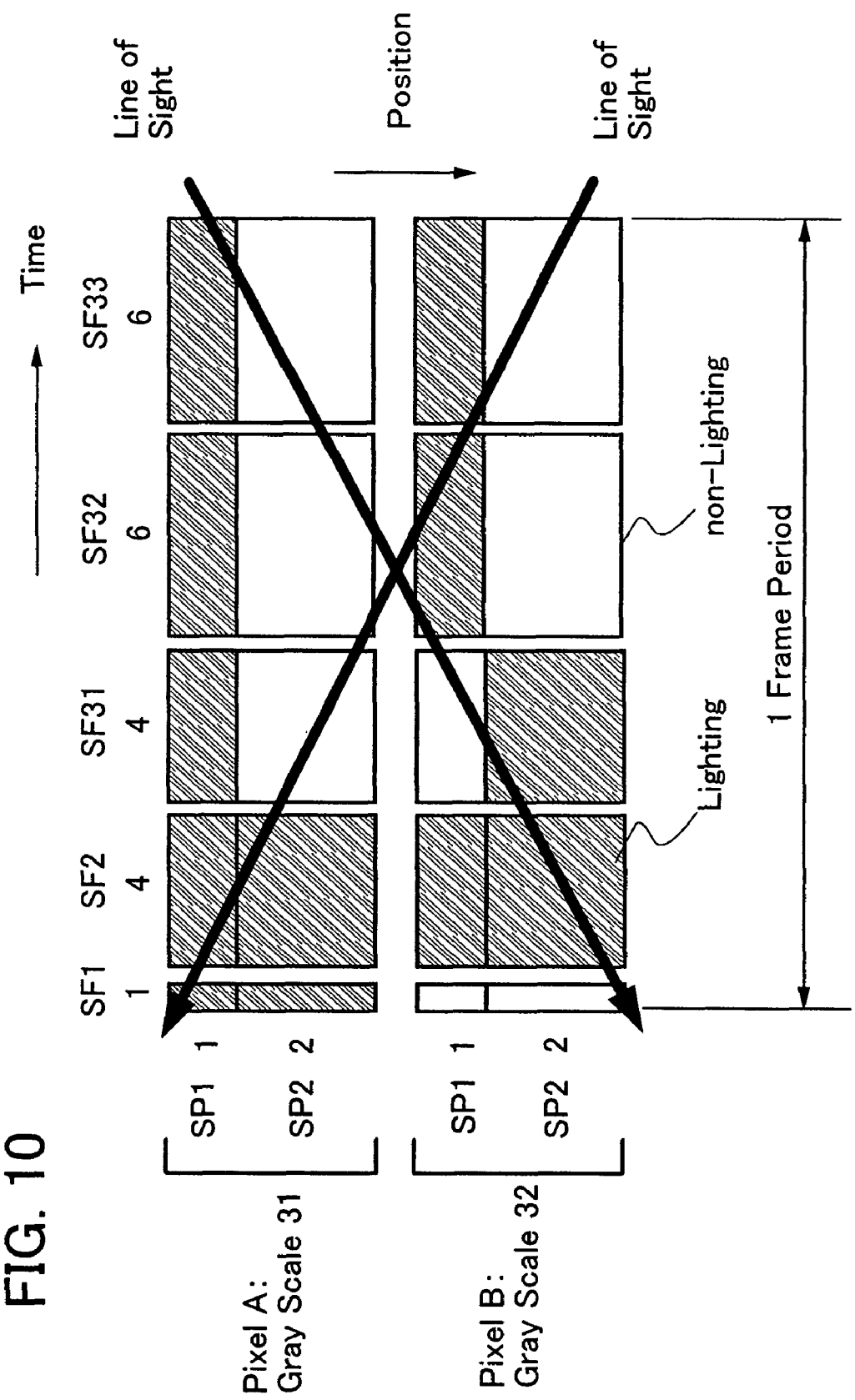
FIG. 10 is a diagram showing a cause of reducing a pseudo contour in a driving method of the invention.

When a driving method shown in FIG. 9 is used, a pseudo contour can be reduced as compared with the conventional driving method. For example, the pixel A displays an image at a gray scale level of 31 and the pixel B displays an image at a gray scale level of 32 by using the selection method of the subpixel and the subframe shown in FIG. 9. FIG. 10 shows a lighting or non-lighting state of each subpixel in each subframe in this case. For example, when a line of sight is moved, a gray scale level is sometimes perceived as 25 (=1+4+8+6+6), and the gray scale level is sometimes perceived as 28 (=8+8+6+6) depending on a movement of the line of sight. Although the gray scale level is supposed to be perceived as 31 and 32, the gray scale level is perceived to be 25 or 28, and thereby a pseudo contour occurs. However, a gray scale gap is reduced as compared with the conventional driving method; thus, a pseudo contour is reduced.

Note that although one subframe (SF3) of SF1 to SF3 is further divided into a plurality of subframes in FIG. 9, the number of subframes to be divided into a plurality of subframes is not limited thereto. A plurality of subframes of SF1 to SF3 may each be divided into a plurality of subpixels.

Figure 11:
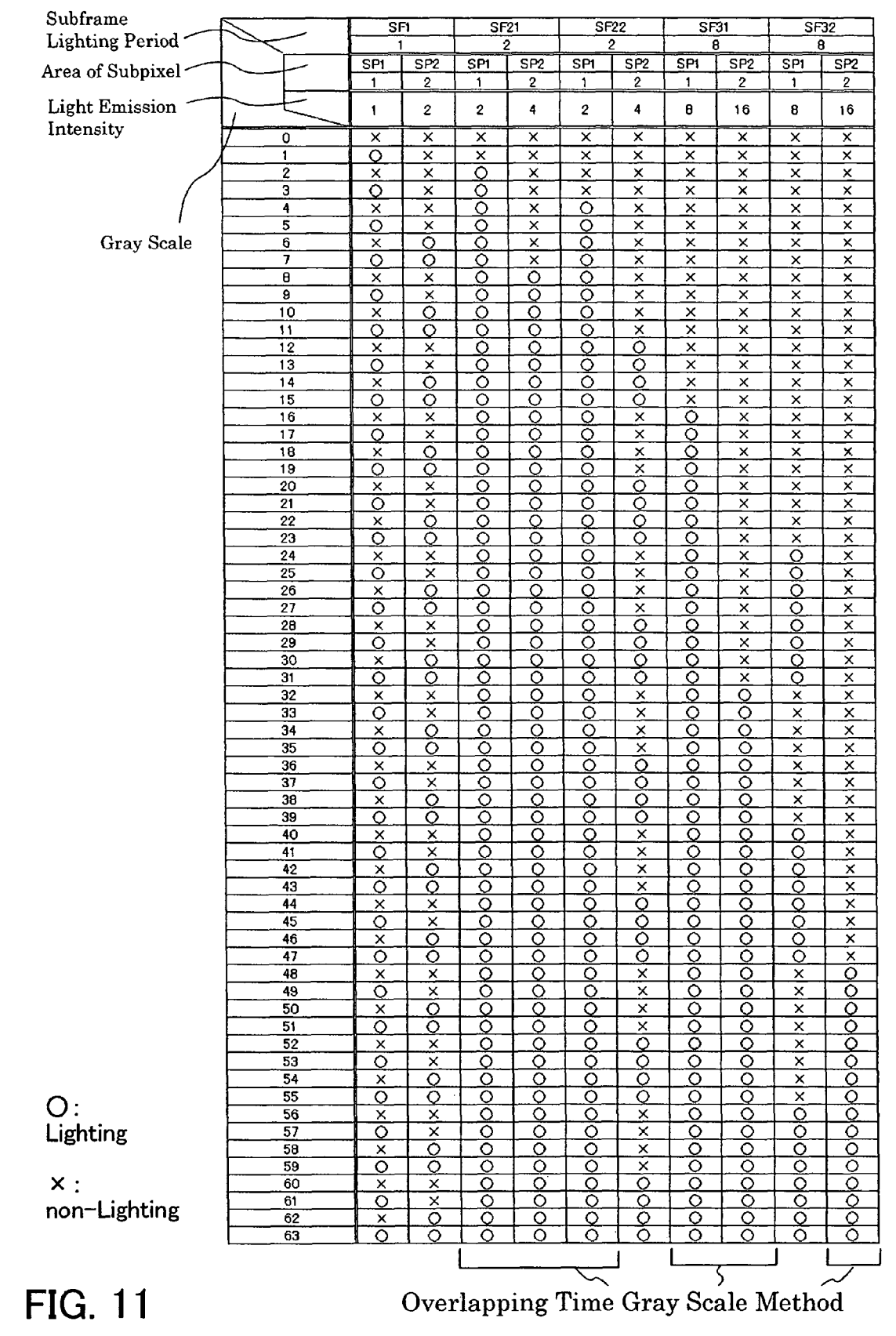

FIGS. 11 and 13 each show a case where two subframes of the subframes (SF1 to SF3) in FIG. 1 obtained by being divided into three subframes so that a ratio of the lighting periods is 1:4:16, are further divided into a plurality of subframes. In FIGS. 11 and 13, subframes to be divided into a plurality of subframes are SF2 and SF3.

FIG. 11 shows a case where SF2 and SF3 each are divided into two subframes. For example, SF2 having a lighting period of 4 is divided into two subframes SF21 and SF22 each having a lighting period of 2. SF3 having a lighting period of 16 is divided into two subframes SF31 and SF32 each having a lighting period of 8.

Thus, one frame is divided into five subframes, and the lighting period of each subframe is SF1=1, SF21=2, SF22=2, SF31=8, and SF32=8.

Note that in each subpixel, the overlapping time gray scale method is applied to subframes of which light emission intensity is equal. That is, the number of lighting subframes is continuously increased in accordance with increase in gray scale level, and a lighting subframe in a low gray scale level is kept to be used for lighting in a high gray scale level.

In the example shown in FIG. 11, since light emission intensity of SP1 is 2 in SF21 and SF22, the overlapping time gray scale method is applied to SF21 and SF22.

Further, since light emission intensity of SP1 is 8 in SF31 and SF32, the overlapping time gray scale method is applied to SF32 among these subframes. That is, SP1 is always lit in SF21 when a gray scale at a gray scale level of 2 or more is expressed, always lit in SF22 when a gray scale at a gray scale level of 4 or more is expressed, and always lit in SF31 when a gray scale at a gray scale level of 16 or more is expressed. Similarly, since light emission intensity of SP2 is 4 in SF21 and SF22, the overlapping time gray scale method is applied to SF21 among these subframes. Further, since light emission intensity of SP2 is 16 in SF31 and SF32, the overlapping time gray scale method is applied to SF31 and SF32.

Figure 12:
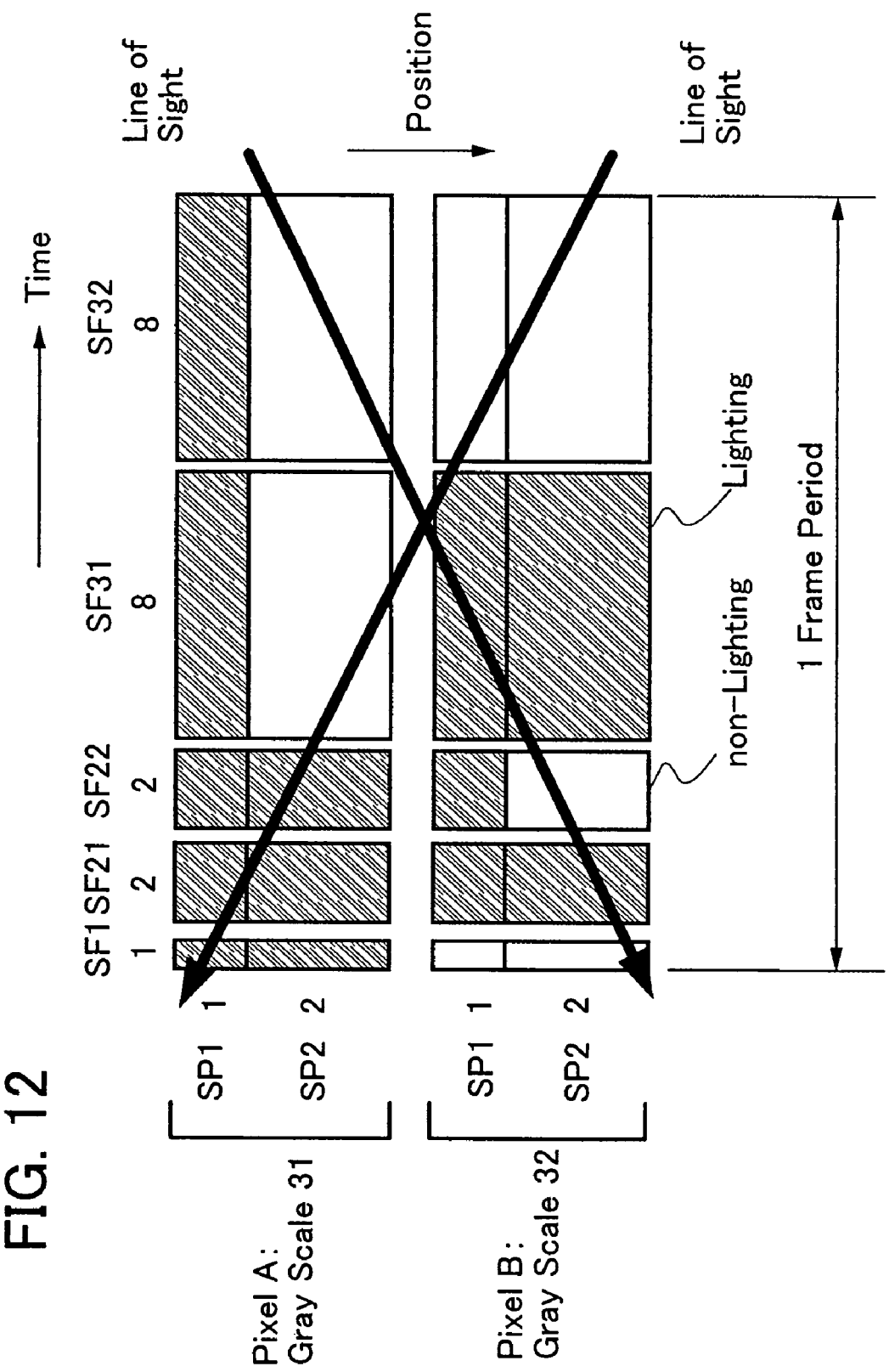
FIG. 12 is a diagram showing a cause of reducing a pseudo contour in a driving method of the invention.

When a driving method shown in FIG. 11 is used, a pseudo contour can be reduced as compared with the conventional driving method. For example, the pixel A displays an image at a gray scale level of 31 and the pixel B displays an image at a gray scale level of 32 by using the selection method of the subpixel and the subframe shown in FIG. 11. FIG. 12 shows a lighting or non-lighting state of each subpixel in each subframe in this case. For example, when a line of sight is moved, a gray scale level is sometimes perceived as 19 (=1+2+4+4+8), and the gray scale level is sometimes perceived as 28 (=4+16+8) depending on a movement of the line of sight. Although the gray scale level is supposed to be perceived as 31 and 32, the gray scale level is perceived to be 19 or 28, and thereby a pseudo contour occurs. However, a gray scale gap is reduced as compared with the conventional driving method; thus, a pseudo contour is reduced.

FIG. 13 shows a case where SF2 is divided into two subframes and SF3 is divided into four subframes. For example, SF2 having a lighting period of 4 is divided into two subframes SF21 and SF22 each having a lighting period of 2. SF3 having a lighting period of 16 is divided into four subframes SF31, SF32, SF33, and SF34 each having a lighting period of 4.

Thus, one frame is divided into seven subframes, and the lighting period of each subframe is SF1=1, SF21=2, SF22=2, SF31=4, SF32=4, SF33=4, and SF34=4.

Note that in each subpixel, the overlapping time gray scale method is applied to subframes of which light emission intensity is equal. That is, the number of lighting subframes is continuously increased in accordance with increase in gray scale level, and a lighting subframe in a low gray scale level is kept to be used for lighting in a high gray scale level.

In the example shown in FIG. 13, since light emission intensity of SP1 is 2 in SF21 and SF22, the overlapping time gray scale method is applied to SF21 and SF22.

Further, since light emission intensity of SP1 is 4 in SF31 to SF34, the overlapping time gray scale method is applied to SF31 to SF34. That is, SP1 is always lit in SF21 when a gray scale at a gray scale level of 2 or more is expressed, always lit in SF22 when a gray scale at a gray scale level of 4 or more is expressed, always lit in SF31 when a gray scale at a gray scale level of 8 or more is expressed, always lit in SF32 when a gray scale at a gray scale level of 12 or more is expressed, always lit in SF33 when a gray scale at a gray scale level of 16 or more is expressed, and always lit in SF34 when a gray scale at a gray scale level of 20 or more is expressed. Similarly, light emission intensity of SP2 is 4 in SF21 and SF22, the overlapping time gray scale method is applied to SF21 among these subframes. Further, since light emission intensity of SP2 is 8 in SF31 to SF34, the overlapping time gray scale method is applied to SF31 to SF34.

Figure 14:
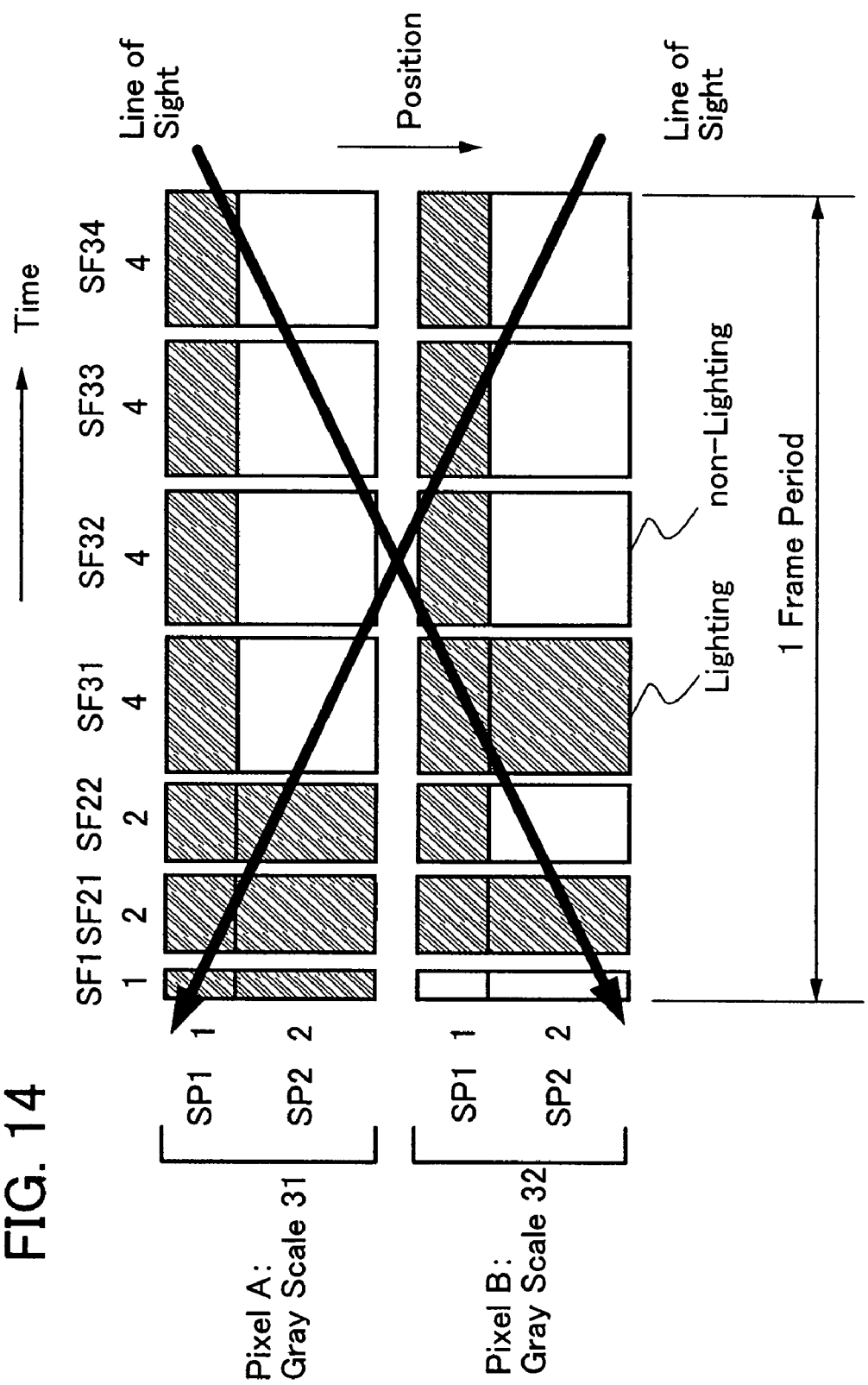
FIG. 14 is a diagram showing a cause of reducing a pseudo contour in a driving method of the invention.

When a driving method shown in FIG. 13 is used, a pseudo contour can be reduced as compared with the conventional driving method. For example, the pixel A displays an image at a gray scale level of 31 and the pixel B displays an image at a gray scale level of 32 by using the selection method of the subpixel and the subframe shown in FIG. 13. FIG. 14 shows a lighting or non-lighting state of each subpixel in each subframe in this case. For example, when a line of sight is moved, a gray scale level is sometimes perceived as 19 (=1+2+4+4+4+4), and the gray scale level is sometimes perceived as 24 (=4+8+4+4+4) depending on a movement of the line of sight. Although the gray scale level is supposed to be perceived as 31 and 32, the gray scale level is perceived to be 19 or 24, and thereby a pseudo contour occurs. However, a gray scale gap is reduced as compared with the conventional driving method; thus, a pseudo contour is reduced.

Note that although in the example described above, SF3 is always selected as a subframe to be divided into a plurality of subframes, it is not limited thereto. A subframe to be divided into a plurality of subframes may be selected from SF1 and SF2.

Note that in this embodiment mode, a subframe having the longest lighting period among the n subframes is preferably selected as a subframe to be divided into a plurality of subframes. This is because by dividing a subframe having the longest lighting period, a pseudo contour can be further reduced; and the number of subframes having the longest lighting period is increased after division and the number of subframes without requiring an erasing operation is increased, so that power consumption for an erasing operation can be reduced. Further, a duty ratio can be improved, and luminance can be improved. By improvement in duty ratio, a voltage applied to the light emitting element can be reduced. Therefore, power consumption can be reduced and deterioration of the light emitting element can be suppressed.

Note that by dividing a subframe into a plurality of subframes, the number of selection methods of a subpixel and a subframe for expressing the same gray scale is increased. Accordingly, a selection method of a subpixel and a subframe is not limited to the examples described above. For example, FIG. 15 shows a case where the selection method of the subpixel and the subframe for expressing gray scales of 31 and 32 in FIG. 1 is changed.

Differences between the selection methods of the subpixel and the subframe in FIGS. 1 and 15 are described. First, when expressing a gray scale of 31, SP1 is lit in SF31 and SF32 in FIG. 1, while SP1 is not lit in SF31 and SF32 and SP2 is lit in SF31 in FIG. 15. Second, when expressing a gray scale of 32, SP1 is lit in SF31 in FIG. 1, while SP1 is not lit in SF31 and SP2 is lit in SF2 in FIG. 15.

The overlapping time gray scale method is applied to SF31 and SF32 in both SP1 and SP2 in FIG. 1, while the overlapping time gray scale method is applied to SF31 and SF32 in SP2 in FIG. 15.

Figure 16:
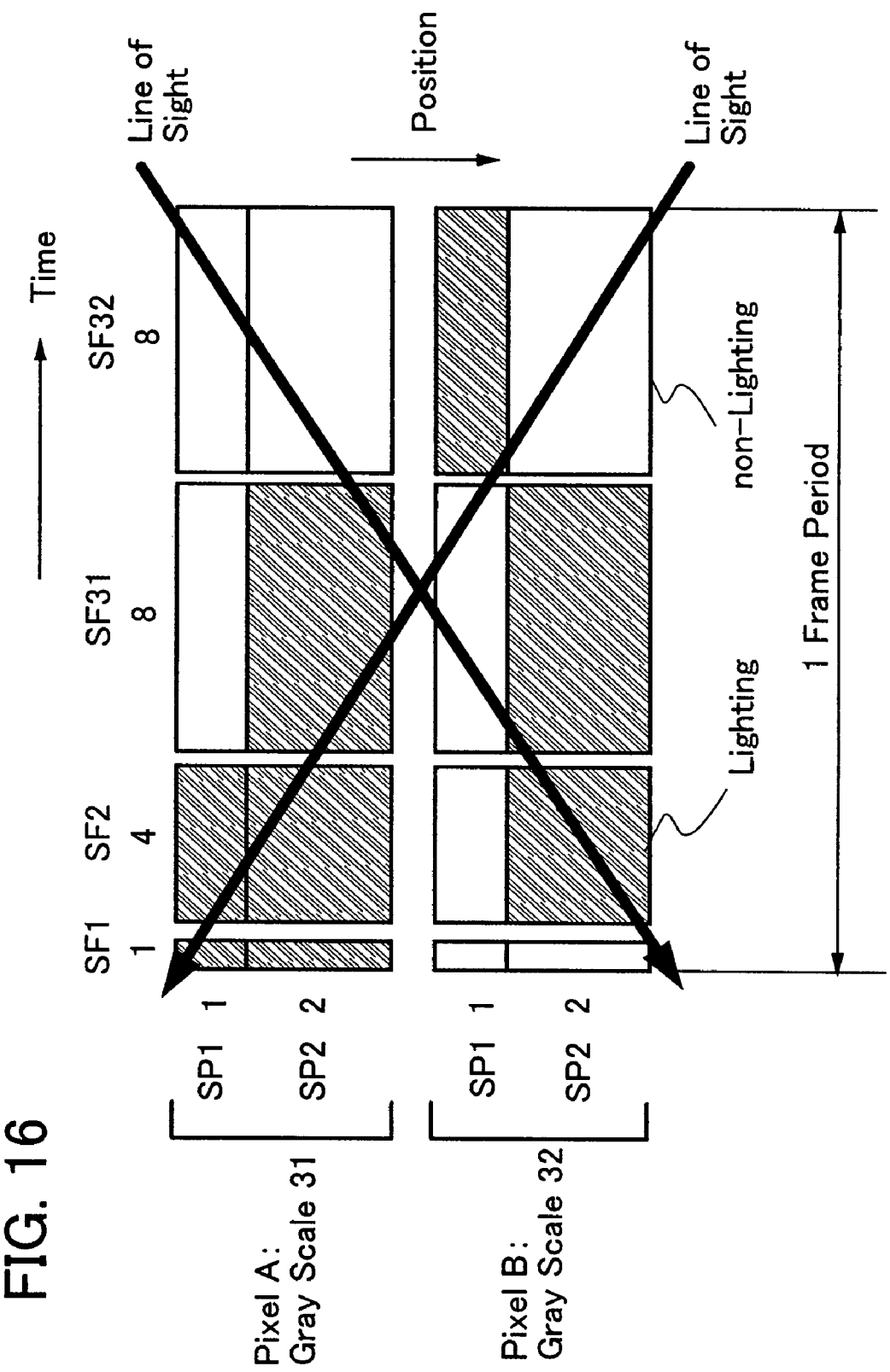
FIG. 16 is a diagram showing a cause of reducing a pseudo contour in a driving method of the invention.

When a driving method shown in FIG. 15 is used, a pseudo contour can be reduced as compared with the conventional driving method. For example, the pixel A displays an image at a gray scale level of 31 and the pixel B displays an image at a gray scale level of 32 by using the selection method of the subpixel and the subframe shown in FIG. 15. FIG. 16 shows a lighting or non-lighting state of each subpixel in each subframe in this case. For example, when a line of sight is moved, a gray scale level is sometimes perceived as 37 (=1+4+8+16+8), and the gray scale level is sometimes perceived as 40 (=8+16+16) depending on a movement of the line of sight. Although the gray scale level is supposed to be perceived as 31 and 32, the gray scale level is perceived to be 37 or 40, and thereby a pseudo contour occurs. However, a gray scale gap is reduced as compared with the conventional driving method; thus, a pseudo contour is reduced.

Note that a gray scale for which a selection method of a subpixel and a subframe is changed is not limited to the gray scales of 31 and 32. A method of a subpixel and a subframe may be changed with respect to other gray scales. Note that by selectively changing a selection method of a subpixel and a subframe with respect to a gray scale at which a pseudo contour is particularly likely to occur, such as the gray scales of 31 and 32, an effect of reducing a pseudo contour can be increased.

Note that in this embodiment mode, although subframes are arranged in ascending order of the lighting periods, order of arrangement of subframes is not limited thereto. For example, FIG. 17 shows a case where order of arrangement of the subframes in FIG. 1 is changed.

In FIG. 17, SF2 having a lighting period of 4 and SF32 having a lighting period of 8 in FIG. 1 are replaced with each other.

Figure 18:
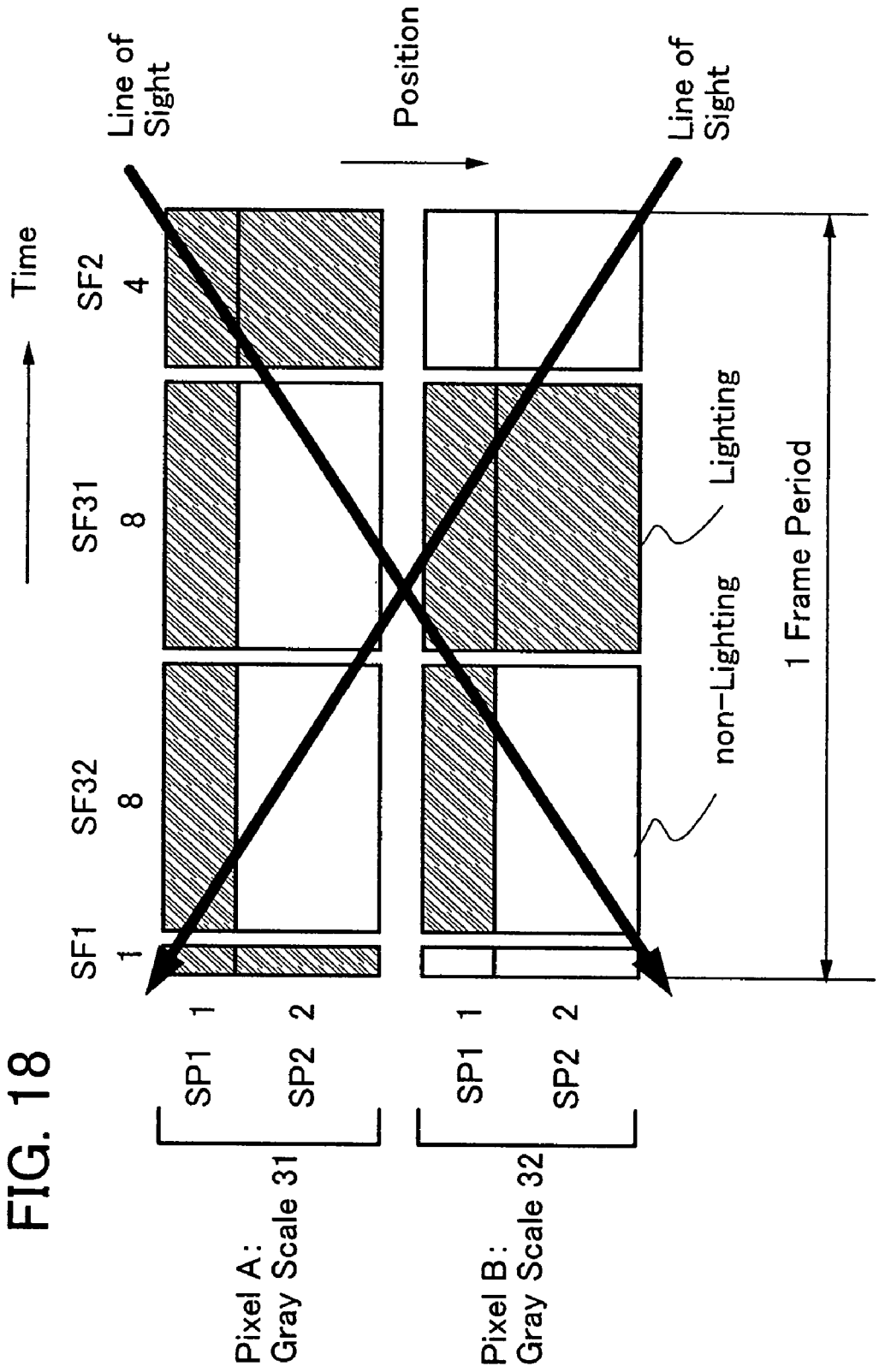
FIG. 18 is a diagram showing a cause of reducing a pseudo contour in a driving method of the invention.

When a driving method shown in FIG. 17 is used, a pseudo contour can be reduced as compared with the conventional driving method. For example, the pixel A displays an image at a gray scale level of 31 and the pixel B displays an image at a gray scale level of 32 by using the selection method of the subpixel and the subframe shown in FIG. 17. FIG. 18 shows a lighting or non-lighting state of each subpixel in each subframe in this case. For example, when a line of sight is moved, a gray scale level is sometimes perceived as 28 (=8+8+8+4), and the gray scale level is sometimes perceived as 33 (=1+8+8+16) depending on a movement of the line of sight. Although the gray scale level is supposed to be perceived as 31 and 32, the gray scale level is perceived to be 28 or 33, and thereby a pseudo contour occurs. However, a gray scale gap is reduced as compared with the conventional driving method; thus, a pseudo contour is reduced.

By changing order of arrangement of the subframes as described above, the eyes are tricked, and a gray scale gap which occurs when a line of sight is moved can be reduced as compared with the conventional driving method. Accordingly, a pseudo contour can be reduced as compared with the conventional driving method.

Note that although SF2 and SF32 are replaced with each other in FIG. 17, subframes to be replaced are not limited thereto. A plurality of subframes may be optionally selected to be replaced. Note that a subframe having the longest lighting period is preferably selected as a subframe to be replaced. This is because by changing the position of the subframe having the longest lighting period, the eyes are tricked; thus, a gray scale gap which occurs when a line of sight is moved can be reduced as compared with the conventional driving method, and a pseudo contour can be reduced as compared with the conventional driving method.

Note that subframes are preferably arranged in ascending order or descending order of the lighting periods. This is because a gray scale gap can be reduced as compared with the conventional driving method, and a pseudo contour can be reduced as compared with the conventional driving method.

Note that in this embodiment mode, an area ratio of subpixels is 1:2; however, the invention is not limited thereto. For example, the area ratio may be 1:4 or 1:8.

For example, if an area ratio of subpixels is 1:1, light emission intensity is the same when either subpixel emits light in the same subframe. Therefore, when the same gray scale is expressed, the subpixel to emit light may be switched. Accordingly, light emission only by a specific subpixel intensively can be prevented, and burn-in can be prevented.

Note that in the m subpixels (m is an integer of m≧2), the area of the (s+1)th subpixel (1≦s≦m−1) is twice the area of the s-th subpixel. In other words, a ratio of the area of the s-th subpixel to the area of the (s+1)th subpixel is 1:2. Further, in the n subframes (n is an integer of n≧2), the lighting period of the (p+1)th subframe (1≦p≦n−1) is $2^m$ times longer than the lighting period of the p-th subframe. In other words, a ratio of the length of the lighting period of the p-th subframe to the length of the lighting period of the (p+1)th subframe is $1:2^m$. Thus, a larger number of gray scales can be expressed with a smaller number of subpixels and a smaller number of subframes. Further, since a gray scale which can be expressed by this method has a constant rate of change, it is possible to perform more smooth gray scale display and to improve image quality.

Note that in this embodiment mode, the number of subpixels is two; however, the invention is not limited thereto.

A case is described as an example, in which one pixel is divided into three subpixels (SP1, SP2, and SP3) so that an area ratio of the subpixels is 1:2:4; one frame is divided into two subframes (SF1 and SF2) so that a ratio of lighting period between the subframes is 1:8; and further, one subframe of the two subframe (SF1 and SF2) is divided into two subframes. FIG. 19 shows a selection method of a subpixel and a subframe in this case. Note that in this example, m=3 and n=2.

Here, the subpixels have the following areas: SP1=1, SP2=2, and SP3=4, and the subframes have the following lighting periods: SF1=1 and SF2=8.

In FIG. 19, one subframe of the subframes (SF1 and SF2) obtained by being divided into two subframes so that a ratio of the lighting periods is 1:8, is further divided into two subframes. For example, when SF2 is a subframe to be divided into two subframes, SF2 having a lighting period of 8 is divided into two subframes SF21 and SF22 each having a lighting period of 4.

Thus, one frame is divided into three subframes, and the lighting period of each subframe is SF1=1, SF21=4, and SF22=4.

Note that in each subpixel, the overlapping time gray scale method is applied to subframes of which light emission intensity is equal. That is, the number of lighting subframes is continuously increased in accordance with increase in gray scale level, and a lighting subframe in a low gray scale level is kept to be used for lighting in a high gray scale level.

In the example shown in FIG. 19, since light emission intensity of SP1 is 4 in SF21 and SF22, the overlapping time gray scale method is applied to SF21 and SF22.

That is, SP1 is always lit in SF21 when a gray scale at a gray scale level of 4 or more is expressed, and always lit in SF22 when a gray scale at a gray scale level of 8 or more is expressed. Similarly, since light emission intensity of SP2 is 8 in SF21 and SF22, the overlapping time gray scale method is applied to SF21 among these subframes.

Similarly, since light emission intensity of SP3 is 16 in SF21 and SF22, the overlapping time gray scale method is applied to SF21 and SF22.

Figure 20:
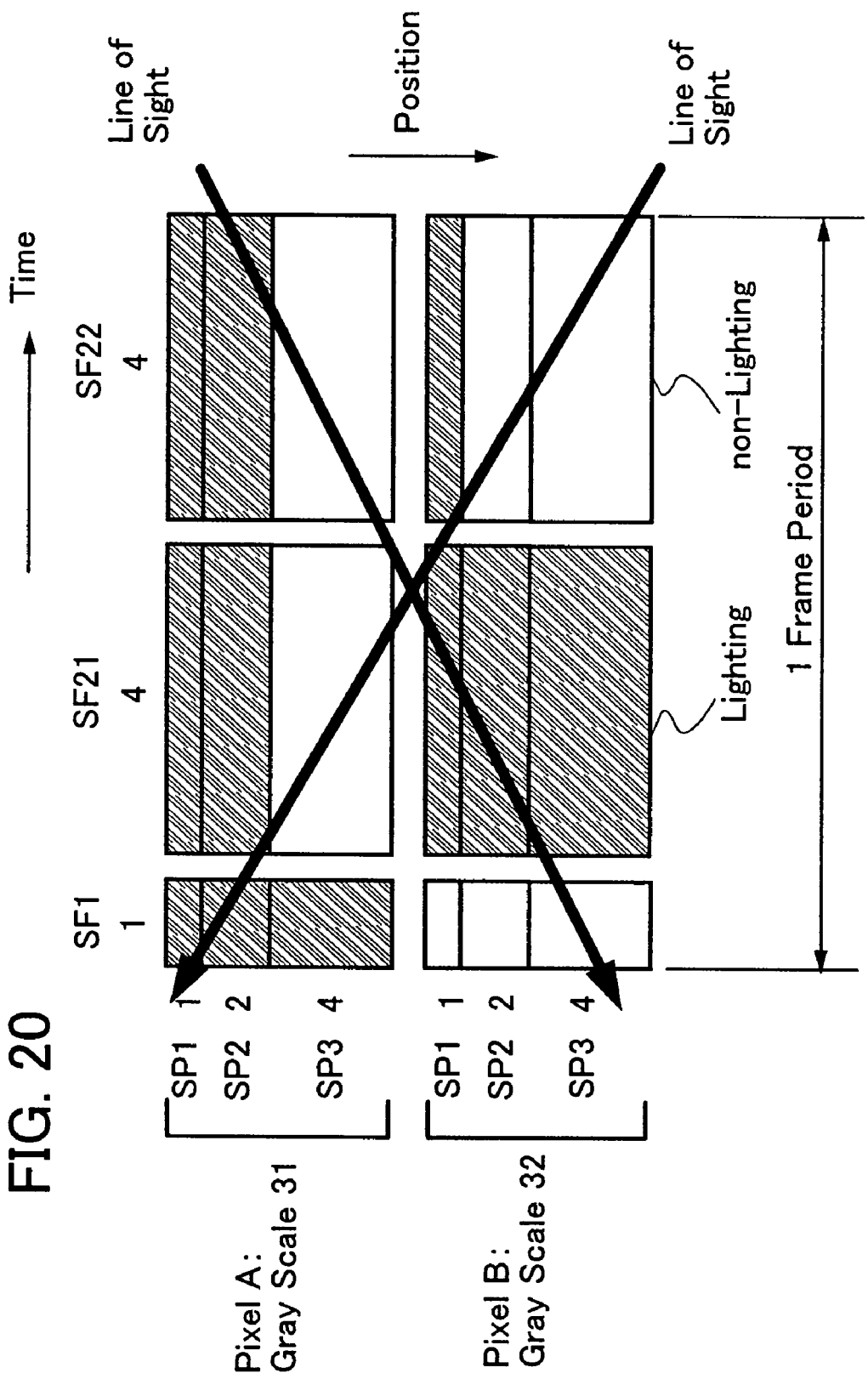
FIG. 20 is a diagram showing a cause of reducing a pseudo contour in a driving method of the invention.

When a driving method shown in FIG. 19 is used, a pseudo contour can be reduced as compared with the conventional driving method. For example, the pixel A displays an image at a gray scale level of 31 and the pixel B displays an image at a gray scale level of 32 by using the selection method of the subpixel and the subframe shown in FIG. 19. FIG. 20 shows a lighting or non-lighting state of each subpixel in each subframe in this case. For example, when a line of sight is moved, a gray scale level is sometimes perceived as 19 (=1+2+8+4+4), and the gray scale level is sometimes perceived as 36 (=16+8+4+8) depending on a movement of the line of sight. Although the gray scale level is supposed to be perceived as 31 and 32, the gray scale level is perceived to be 19 or 36, and thereby a pseudo contour occurs. However, a gray scale gap is reduced as compared with the conventional driving method; thus, a pseudo contour is reduced.

Note that although SF2 is divided into two substrates in FIG. 19, SF2 may be divided into three or more subframes. FIG. 21 shows a selection method of a subpixel and a subframe in a case where SF2 in FIG. 19 is divided into four subframes.

In FIG. 21, SF2 having a lighting period of 8 among the subframes (SF1 and SF2) obtained by being divided into two subframes so that a ratio of the lighting periods is 1:8, is further divided into four subframes SF21, SF22, SF23, and SF24 each having a lighting period of 2.

Thus, one frame is divided into five subframes, and the lighting period of each subframe is SF1=1, SF21=2, SF22=2, SF23=2, and SF24=2.

Note that in each subpixel, the overlapping time gray scale method is applied to subframes of which light emission intensity is equal. That is, the number of lighting subframes is continuously increased in accordance with increase in gray scale level, and a lighting subframe in a low gray scale level is kept to be used for lighting in a high gray scale level.

In the example shown in FIG. 21, since light emission intensity of SP1 is 2 in SF21 to SF24, the overlapping time gray scale method is applied to SF21 to SF24.

That is, SP1 is always lit in SF21 when a gray scale at a gray scale level of 2 or more is expressed, always lit in SF22 when a gray scale at a gray scale level of 4 or more is expressed, always lit in SF23 when a gray scale at a gray scale level of 6 or more is expressed, and always lit in SF24 when a gray scale at a gray scale level of 8 or more is expressed. Similarly, since light emission intensity of SP2 is 4 in SF21 to SF24, the overlapping time gray scale method is applied to SF21 to SF24. Similarly, since light emission intensity of SP3 is 8 in SF21 to SF24, the overlapping time gray scale method is applied to SF21 to SF24.

Figure 22:
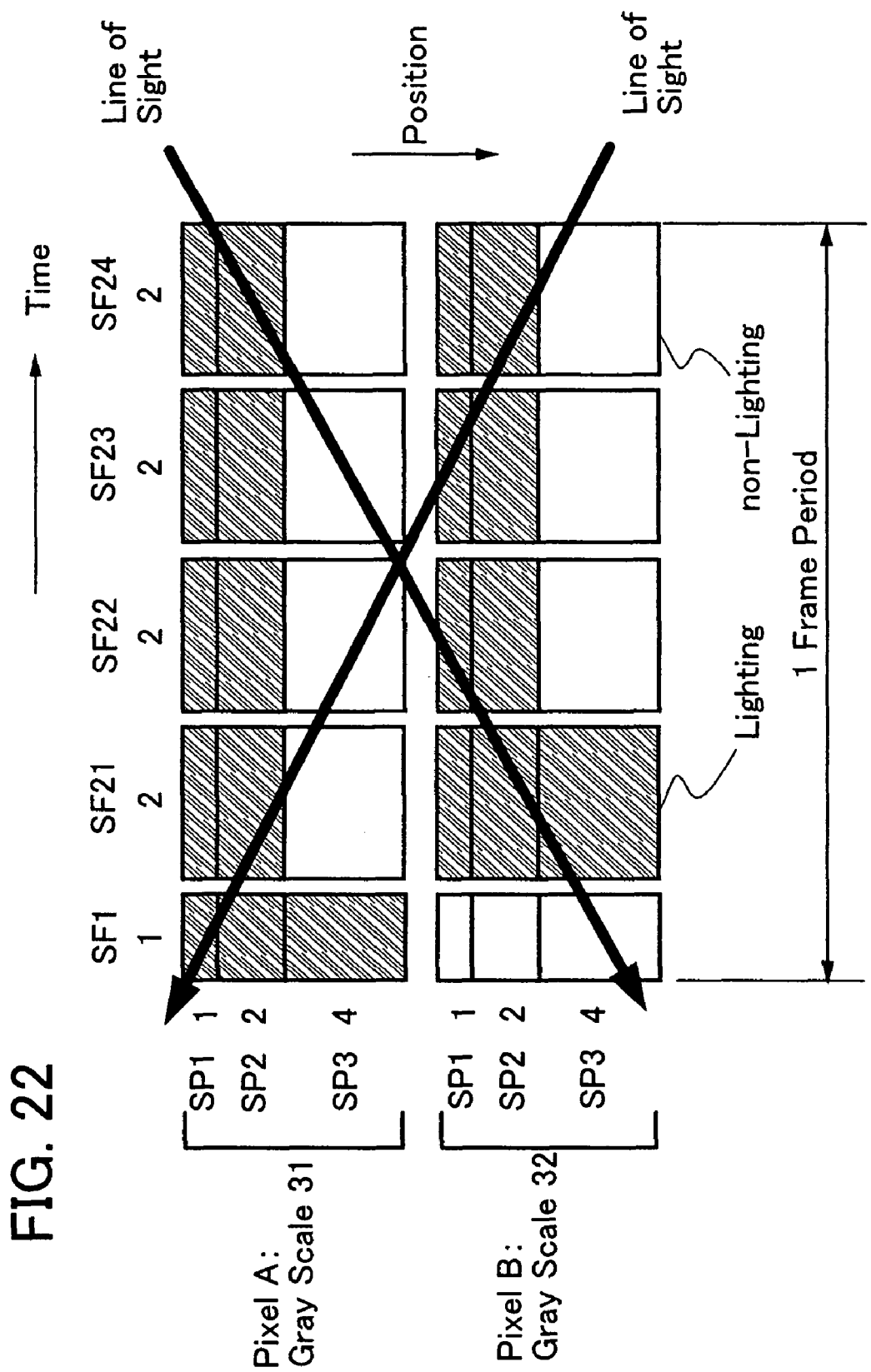
FIG. 22 is a diagram showing a cause of reducing a pseudo contour in a driving method of the invention.

When a driving method shown in FIG. 21 is used, a pseudo contour can be reduced as compared with the conventional driving method. For example, the pixel A displays an image at a gray scale level of 31 and the pixel B displays an image at a gray scale level of 32 by using the selection method of the subpixel and the subframe shown in FIG. 21. FIG. 22 shows a lighting or non-lighting state of each subpixel in each subframe in this case. For example, when a line of sight is moved, a gray scale level is sometimes perceived as 17 (=1+2+4+2+4+4), and the gray scale level is sometimes perceived as 24 (=8+4+4+2+4+2) depending on a movement of the line of sight. Although the gray scale level is supposed to be perceived as 31 and 32, the gray scale level is perceived to be 17 or 24, and thereby a pseudo contour occurs. However, a gray scale gap is reduced as compared with the conventional driving method; thus, a pseudo contour is reduced.

As the example shown in FIG. 21, when the number of division of SF2 is increased, the number of subframes having the longest lighting period is increased and the number of subframes without requiring an erasing operation is increased; therefore, power consumption for an erasing operation can be reduced. Further, a duty ratio can be improved, and luminance can be improved. By improvement in duty ratio, a voltage applied to the light emitting element can be reduced. Therefore, power consumption can be reduced and deterioration of the light emitting element can be suppressed.

Note that a selection method of a subpixel and a subframe may be changed in a certain gray scale in accordance with time or place. In other words, a selection method of a subpixel and a subframe may be changed depending on time or a pixel.

Alternatively, a selection method of a subpixel and a subframe may be changed depending on time and a pixel.

For example, when a certain gray scale is expressed, a selection method of a subpixel in each subframe may be different in the odd-numbered frame and the even-numbered frame. For example, a gray scale may be expressed by the selection method of the subpixel and the subframe shown in FIG. 1 in the odd-numbered frame, while a gray scale may be expressed by the selection method of the subpixel and the subframe shown in FIG. 15 in the even-numbered frame.

By changing a selection method of a subpixel and a subframe between the odd-numbered frame and the even-numbered frame when expressing a gray scale at which a pseudo contour is particularly likely to occur as described above, a pseudo contour can be reduced.

Further, when a certain gray scale is expressed, a selection method of a subpixel and a subframe may be changed between a case of displaying pixels in the odd-numbered row and a case of displaying pixels in the even-numbered row. Further, when a certain gray scale is expressed, a selection method of a subpixel and a subframe may be changed between a case of displaying pixels in the odd-numbered column and a case of displaying in the even-numbered column.

Further, when a certain gray scale is expressed, the number of subframes or a ratio of lighting periods may be changed between the odd-numbered frame and the even-numbered frame. For example, a gray scale may be expressed by the selection method of the subpixel shown in FIG. 1 in the odd-numbered frame, while a gray scale may be expressed by the selection method of the subpixel shown in FIG. 3 in the even-numbered frame.

Further, when a certain gray scale is expressed, the number of subframes or a ratio of lighting periods may be changed between a case of displaying pixels in the odd-numbered row and a case of displaying pixels in the even-numbered row.

Further, when a certain gray scale is expressed, the number of subframes or a ratio of lighting periods may be changed between a case of displaying pixels in the odd-numbered column and a case of displaying pixels in the even-numbered column.

Further, when a certain gray scale is expressed, order of arrangement of subframes may be changed between the odd-numbered frame and the even-numbered frame. For example, a gray scale may be expressed by the selection method of the subpixel and the subframe shown in FIG. 1 in the odd-numbered frame, while a gray scale may be expressed by the selection method of the subpixel and the subframe shown in FIG. 17 in the even-numbered frame.

Further, when a certain gray scale is expressed, order of arrangement of subframes may be changed between a case of displaying pixels in the odd-numbered row and a case of displaying pixels in the even-numbered row. Further, when a certain gray scale is expressed, order of arrangement of subframes may be changed between a case of displaying pixels in the odd-numbered column and a case of displaying pixels in the even-numbered column.

As described above, by changing a selection method of a subpixel and a subframe, the number of subframes, a ratio of lighting periods, or order of arrangement of subframes in a certain gray scale in accordance with time or place, the eyes are tricked and a gray scale gap can be reduced, and thereby a pseudo contour can be reduced as compared with the conventional driving method.

Note that although this embodiment mode shows a case of a 6-bit gray scale (64 gray scales), the number of gray scale levels to be displayed is not limited thereto. For example, an 8-bit gray scale (256 gray scales) can be expressed by using a driving method of the invention. FIGS. 23 to 26 show this case. FIG. 23 shows a selection method of a subpixel at gray scales of 0 to 63. FIG. 24 shows a selection method of a subpixel at gray scales of 64 to 127. FIG. 25 shows a selection method of a subpixel at gray scales of 128 to 191. FIG. 26 shows a selection method of a subpixel at gray scales of 192 to 255.

In FIGS. 23 to 26, one pixel is divided into two subpixels (SP1 and SP2) so that an area ratio of the subpixels is 1:2; one frame is divided into four subframes (SF1 to SF4) so that a ratio of lighting period between the subframes is 1:4:16:64; and further, one subframe of the four subframes (SF1 to SF4) is divided into two subframes. Note that in this example, m=2 and n=4.

Here, the subpixels have the following areas: SP1=1 and SP2=2, and the subframes have the following lighting periods: SF1=1, SF2=4, SF3=16, and SF4=64.

In FIGS. 23 to 26, SF4 is a subframe to be divided into two subframes, and SF4 having a lighting period of 64 is divided into two subframes SF41 and SF42 each having a lighting period of 32.

Thus, one frame is divided into five subframes, and the lighting period of each subframe is SF1=1, SF2=4, SF3=16, SF41=32, and SF42=32.

Note that in each subpixel, the overlapping time gray scale method is applied to subframes of which light emission intensity is equal. That is, the number of lighting subframes is continuously increased in accordance with increase in gray scale level, and a lighting subframe in a low gray scale level is kept to be used for lighting in a high gray scale level.

In the example shown in FIGS. 23 to 26, since light emission intensity of SP1 is 32 in SF41 and SF42, the overlapping time gray scale method is applied to SF41 and SF42. That is, SP1 is always lit in SF41 when a gray scale at a gray scale level of 32 or more is expressed, and always lit in SF42 when a gray scale at a gray scale level of 64 or more is expressed. Similarly, since light emission intensity of SP2 is 64 in SF41 and SF42, the overlapping time gray scale method is applied to SF41 and SF42.

As described above, each subpixel to be lit in each subframe is selected, so that an 8-bit gray scale (256 gray scales) can be expressed.

Figure 27:
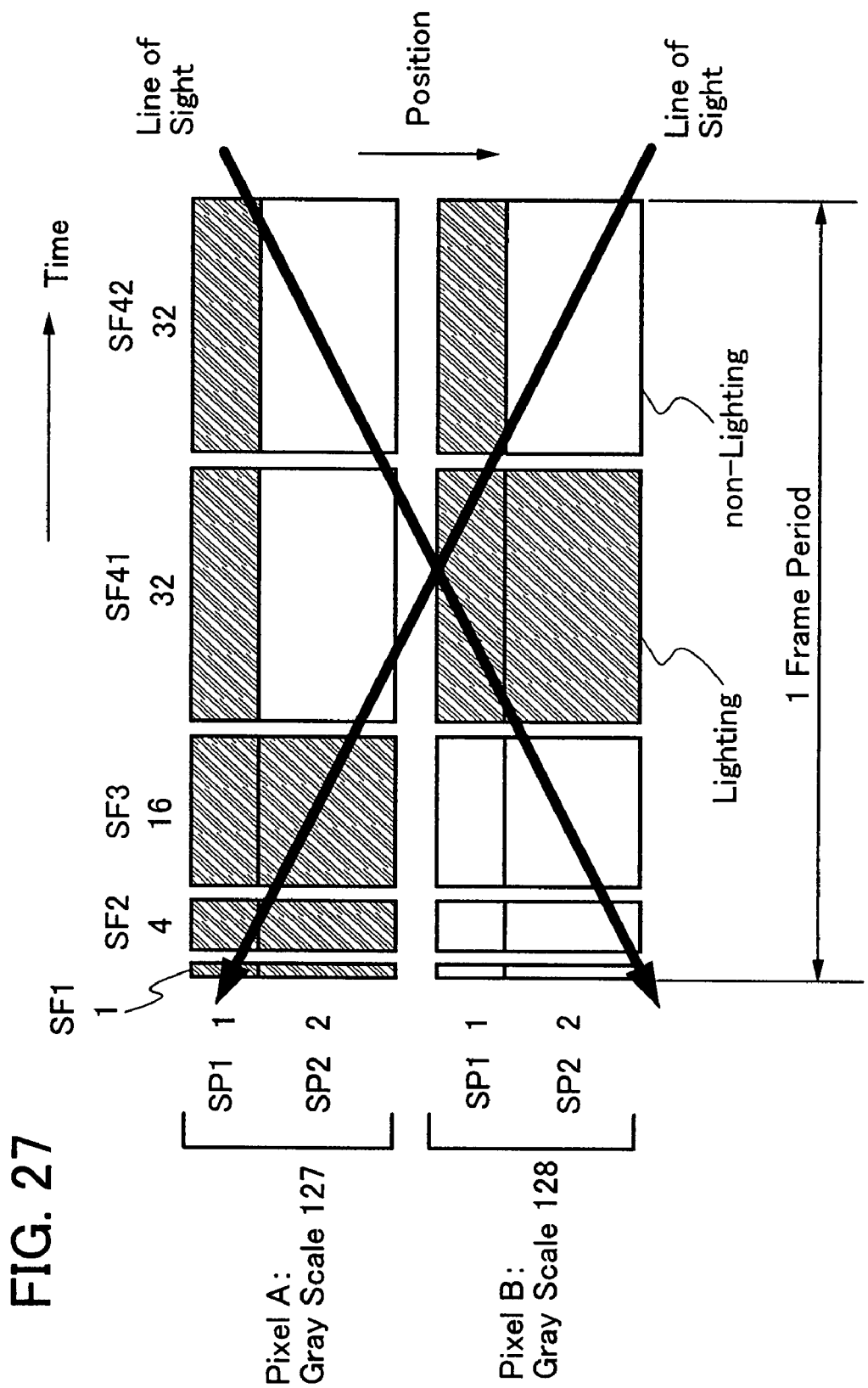
FIG. 27 is a diagram showing a cause of reducing a pseudo contour in a driving method of the invention.

When a driving method shown in FIGS. 23 to 26 is used, a pseudo contour can be reduced as compared with the conventional driving method. For example, the pixel A displays an image at a gray scale level of 127 and the pixel B displays an image at a gray scale level of 128 by using the selection methods of the subpixel and the subframe shown in FIGS. 23 to 26. FIG. 27 shows a lighting or non-lighting state of each subpixel in each subframe in this case. For example, when a line of sight is moved, a gray scale level is sometimes perceived as 109 (=1+4+8+32+32+32), and the gray scale level is sometimes perceived as 128 (=64+32+32) depending on a movement of the line of sight. Although the gray scale level is supposed to be perceived as 127 and 128, the gray scale level is perceived to be 109 or 128, and thereby a pseudo contour occurs. However, a gray scale gap is reduced as compared with the conventional driving method; thus, a pseudo contour is reduced.

As described above, by using the driving method of this embodiment mode, a pseudo contour can be reduced as compared with the conventional driving method.

Further, a duty ratio can be improved, and luminance can be improved. By improvement in duty ratio, power consumption can be reduced and deterioration of the light emitting element can be suppressed.

Note that the content described above, such as gray scale levels to be displayed, the ratio and division of lighting period of a subframe, order of arrangement of subframes, the area ratio and the number of subpixels, and change of a selection method of a subpixel and a subframe in accordance with a gray scale level can be used in combination.

Embodiment Mode 2

In Embodiment Mode 1, a case where a lighting period increases in linear proportion to the increase of a gray scale level is described. In this embodiment mode, a case where gamma correction is performed is described.

Gamma correction is referred to a method by which a lighting period increases nonlinearly as a gray scale level increases. Human eyes cannot sense that luminance increases in proportion even when luminance increases in linear proportion. As luminance increases, difference of brightness is less visible to human eyes. Therefore, in order to sense the difference of brightness by human eyes, it is necessary to increase a lighting period as a gray scale level increases, that is, gamma correction is necessary to be performed. When a gray scale level is represented by x and luminance is represented by y, a relation between the luminance and the gray scale level is expressed by Formula 1.

[Formula 1] $y = Ax^\gamma$ (1)

Note that in Formula 1, A is a constant for normalizing the luminance y to be within a range of $0 \leq y \leq 1$, and γ which is an exponent of the gray scale level x is a parameter indicating the degree of gamma correction.

As the simplest method, there is a method where display can be performed with a larger number of bits (higher gray scale levels) than the number of bits (gray scale levels) which are actually displayed. For example, in a case where display is performed with a 6-bit gray scale (64 gray scales), an 8-bit gray scale (256 gray scales) is actually set to be displayed. When an image is actually displayed, display is performed with a 6-bit gray scale (64 gray scales) so that the luminance at the gray scale levels has a nonlinear shape. Thus, gamma correction can be performed.

As an example, FIG. 28 shows a selection method of a subpixel and a subframe in a case where a 6-bit gray scale (64 gray scales) is set to be displayed so that gamma correction is performed when a 5-bit gray scale (32 gray scales) is displayed.

In this embodiment mode, a case is described as an example, in which one pixel is divided into two subpixels (SP1 and SP2) so that an area ratio of the subpixels is 1:2; one frame is divided into three subframes (SF1, SF2, and SF3) so that a ratio of lighting period between the subframes is 1:4:16; and further, one subframe of the three subframes (SF1 to SF3) is divided into two subframes. As a specific example, a case of using the selection method of the subpixel and the subframe shown in FIG. 1 is described.

Figure 29A:
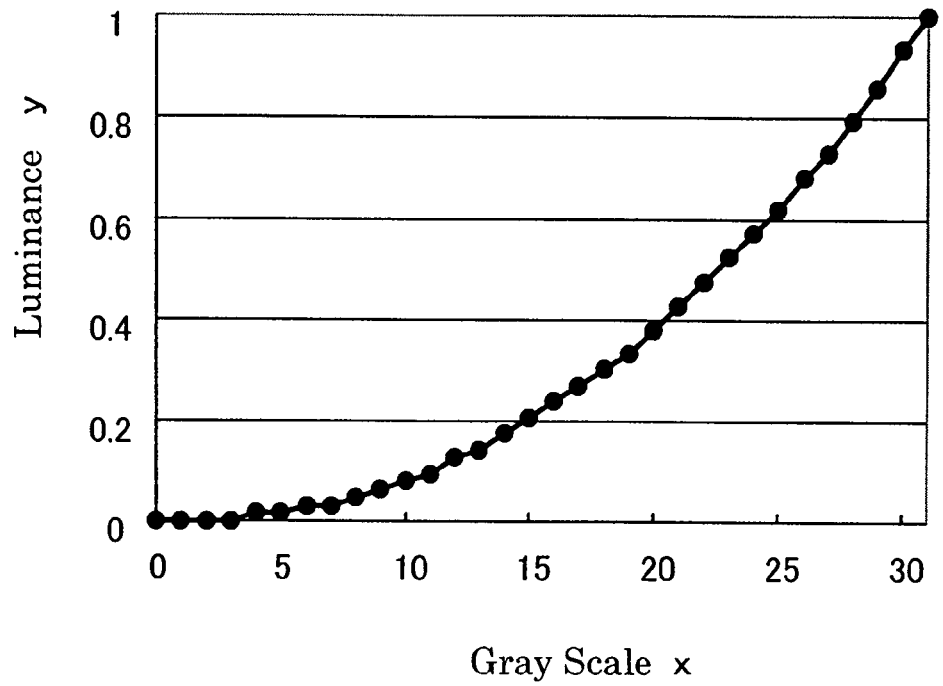
FIGS. 29A and 29B are charts showing a relation between a gray scale level and luminance in a driving method of the invention, in a case where gamma correction is performed.
Figure 29B:
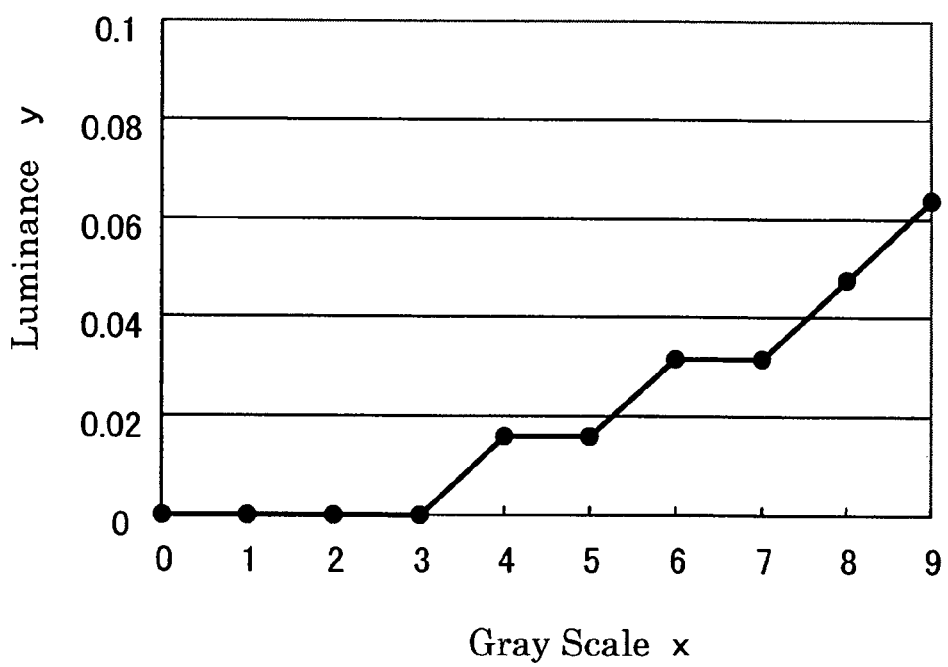

FIG. 28 shows a selection method of a subpixel and a subframe in a case where a 5-bit gray scale (32 gray scales) is expressed by performing gamma correction so that γ=2.2 is satisfied at all the gray scale levels. Note that γ=2.2 is a value which can best correct characteristics of human visual perception, with which human eyes can perceive the most appropriate difference in brightness even when the luminance becomes higher. In FIG. 28, up to a gray scale of 3 in the 5-bit gray scale with gamma correction, display is actually performed by the selection method of the subpixel and the subframe for displaying a gray scale of 0 in a 6-bit gray scale. Similarly, in a case of a gray scale of 4 in the 5-bit gray scale with gamma correction, display is actually performed by displaying a gray scale of 1 in the 6-bit gray scale; and in a case of a gray scale of 6 in the 5 bit-gray scale with gamma correction, display is actually performed by displaying a gray scale of 2 in the 6 bit-gray scale. FIGS. 29A and 29B are graphs showing the relation between the gray scale x and the luminance y. FIG. 29A is a graph showing the relation between the gray scale x and the luminance y at all the gray scales, while FIG. 29B is a graph showing the relation between the gray scale x and the luminance y at a low gray scale region. In this manner, a subpixel and a subframe are selected in accordance with a correspondence table between the 5-bit gray scale with gamma correction and the 6-bit gray scale, and display is performed. Accordingly, gamma correction which can satisfy γ=2.2 can be realized.

However, as is apparent from FIG. 29B, display can be performed at the same luminance at the gray scale levels of 0 to 3, 4 and 5, and 6 and 7 in the case of FIG. 28. This is because difference in luminance cannot be expressed since the gray scale levels are not enough in the case of 6-bit display. As measures against this, the following two methods are considered.

The first method is a method of further increasing the number of bits which can be displayed. In other words, display is performed with not 6 bits but 7 bits or more, and preferably 8 bits or more. As a result, a smooth image can be displayed even in the low gray scale region.

Figure 31A:
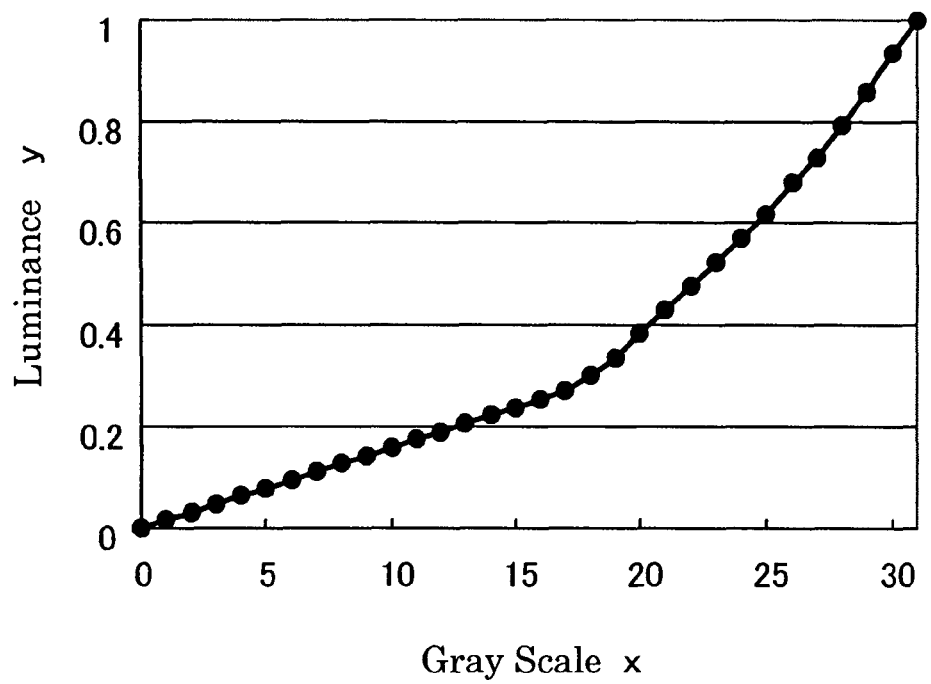
FIGS. 31A and 31B are charts showing a relation between a gray scale level and luminance in a driving method of the invention, in a case where gamma correction is performed.
Figure 31B:
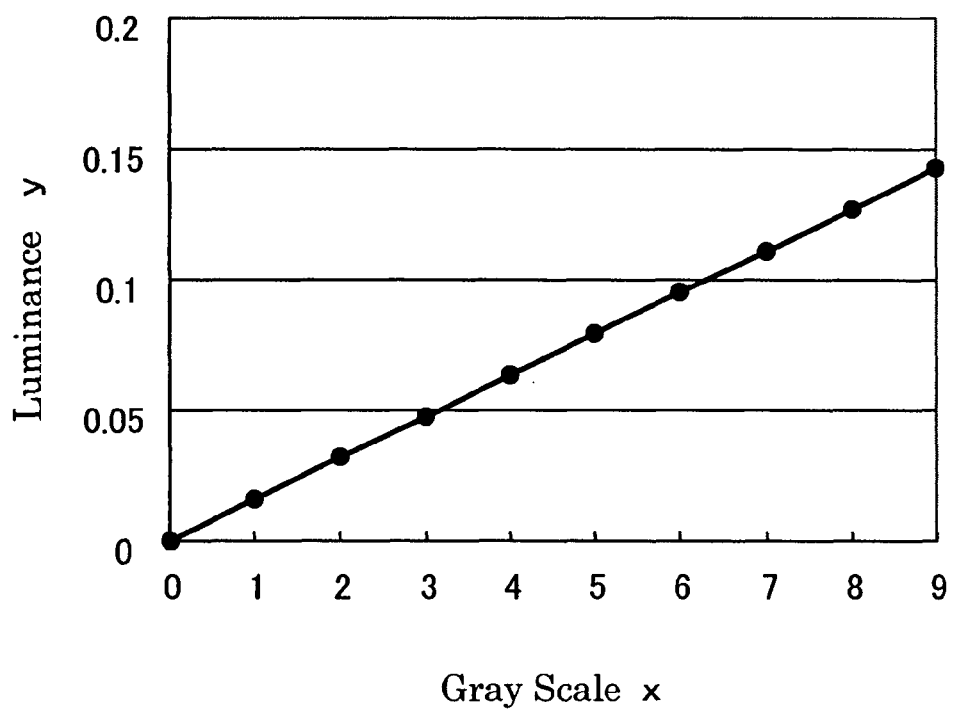

The second method is a method of displaying a smooth image by not satisfying γ=2.2 in the low gray scale region but by linearly changing the luminance. FIG. 30 shows a selection method of a subpixel and a subframe in this case. In FIG. 30, gray scale levels up to a gray scale level of 17 in the 5-bit gray scale are the same as those in the 6-bit gray scale. However, at a gray scale level of 18 in the 5-bit gray scale with gamma correction, lighting is actually performed by a selection method of a subpixel and a subframe at a gray scale level of 19 in the 6-bit gray scale. Similarly, at a gray scale level of 19 in the 5-bit gray scale with gamma correction, display is actually performed by a selection method of a subpixel and a subframe at a gray scale level of 21 in the 6-bit gray scale, and at a gray scale level of 20 in the 5-bit gray scale with gamma correction, display is actually performed by a selection method of a subpixel and a subframe at a gray scale level of 24 in the 6-bit gray scale. Here, FIGS. 31A and 31B are graphs of the gray scale level x and the luminance y. FIG. 31A shows the relation between the gray scale level x and the luminance y at all the gray scale levels, while FIG. 31B shows the relation between the gray scale level x and the luminance y in the low gray scale region. In the low gray scale region, the luminance changes linearly. By performing such gamma correction, a smoother image can be displayed in the low gray scale region.

That is, the luminance is changed in linear proportion to the gray scales in the low gray scale region, while the luminance is changed in nonlinear proportion to the gray scale levels in the other gray scale region; thus, a smoother image can be displayed in the low gray scale region.

Note that the correspondence table between the 5-bit gray scale levels with gamma correction and the 6-bit gray scale levels may be changed as appropriate. Thus, by changing the correspondence table, the degree of gamma correction (i.e., the value of $\gamma$) can be easily changed. Accordingly, the invention is not limited to $\gamma=2.2$.

Further, the number of bits (e.g., p bits where p is an integer) set to be displayed and the number of bits (e.g., q bits where q is an integer) with gamma correction to be displayed are not particularly limited thereto. When display is performed with gamma correction, the number of bits p is preferably set as large as possible in order to express gray scales smoothly. However, if the number of bits p is set too large, a problem may arise such that the number of subframes becomes too large. Thus, the relation between the number of bits q and p preferably satisfies $q+2 \leq p \leq q+5$. Accordingly, gray scales can be smoothly expressed while suppressing the number of subframes.

In this manner, by performing gamma correction using the method described in this embodiment mode, an image with higher image quality can be displayed.

Note that the content described in this embodiment mode can be freely implemented in combination with the content described in Embodiment Mode 1.

Embodiment Mode 3

In Embodiment Mode 1, the overlapping time gray scale method is applied to subframes of which light emission intensity is the same in each subpixel; however, the invention is not limited thereto. In this embodiment mode, a case is described, in which the overlapping time gray scale method is applied to all subframes in each subpixel.

Figure 32:
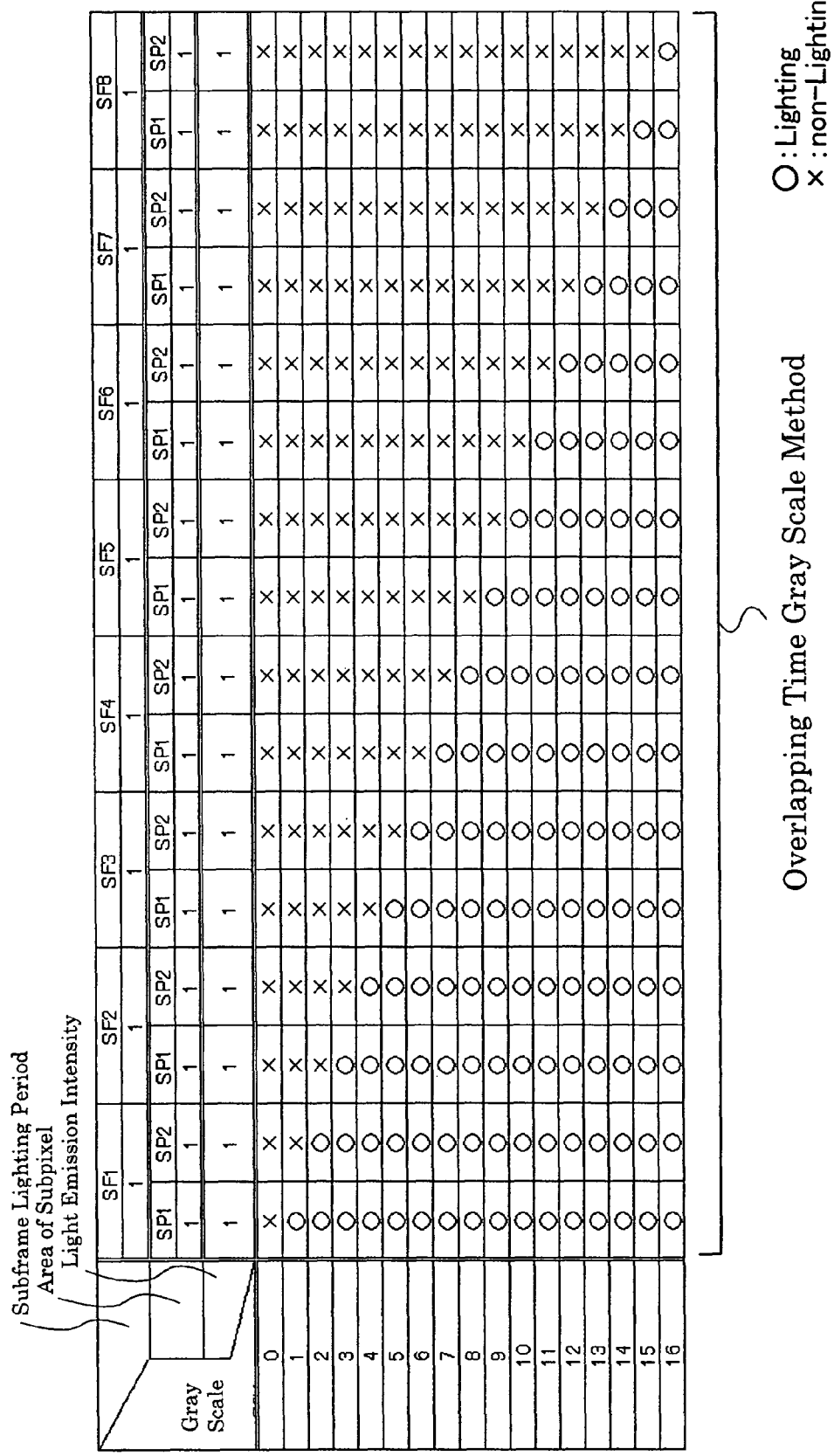
FIG. 32 is a chart showing an example of a selection method of a subpixel and a subframe in a driving method of the invention.

In this embodiment mode, a case is described, in which one pixel is divided into two subpixels (SP1 and SP2) each having the same area; and one frame is divided into eight subframes (SF1 to SF8) each having the same lighting period. FIG. 32 shows a selection method of a subpixel and a subframe in this case.

Here, the subpixels have the following areas: SP1=SP2=1, and the subframes have the following lighting periods: SF1=SF2=SF3=SF4=SF5=SF6=SF7=SF8=1.

In FIG. 32, since the area of each subpixel is the same and the lighting period of each subframe is the same, light emission intensity is equal in all the subpixels and in all the subframes. Specifically, since the area of each subpixel is 1 and the lighting period of each subframe is 1, light emission intensity is 1×1=1.

Note that in each subpixel, the overlapping time gray scale method is applied to all subpixels in each subframe. That is, the number of lighting subframes is continuously increased in accordance with increase in gray scale level, and a lighting subframe in a low gray scale level is kept to be used for lighting in a high gray scale level.

In the example shown in FIG. 32, SP1 is always lit in SF1 when a gray scale at a gray scale level of 1 or more is expressed, always lit in SF2 when a gray scale of 3 or more is expressed, always lit in SF3 when a gray scale of 5 or more is expressed, always lit in SF4 when a gray scale of 7 or more is expressed, always lit in SF5 when a gray scale of 9 or more is expressed, always lit in SF6 when a gray scale of 11 or more is expressed, always lit in SF7 when a gray scale of 13 or more is expressed, and always lit in SF8 when a gray scale of 15 or more is expressed. SP2 is similar thereto.

As described above, each subpixel to be lit in each subframe is selected, so that 17 gray scales can be expressed.

Figure 33:
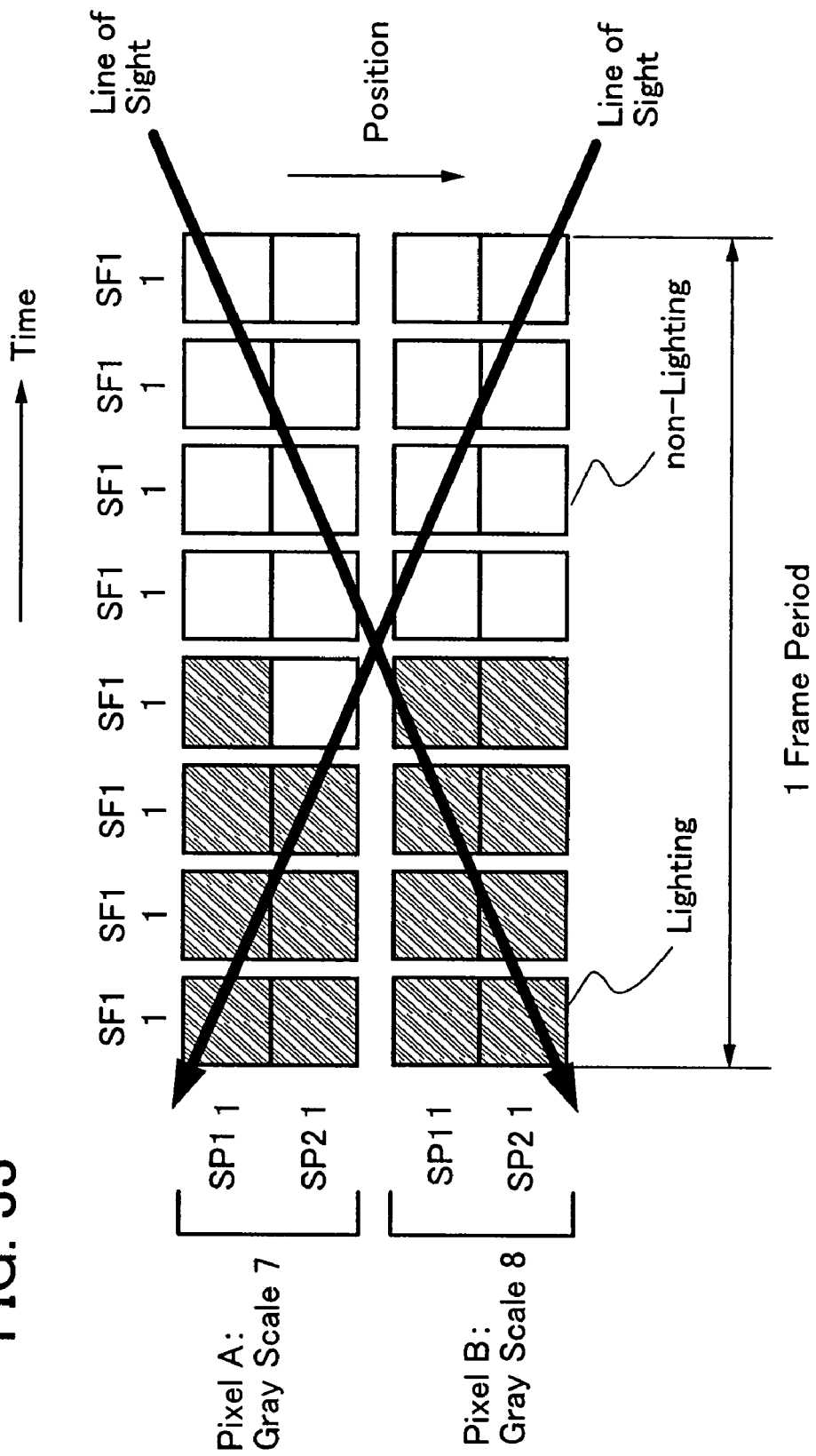
FIG. 33 is a diagram showing a cause of reducing a pseudo contour in a driving method of the invention.

By using a driving method shown in FIG. 32, a pseudo contour can be reduced as compared with the conventional driving method. For example, the pixel A displays an image at a gray scale level of 7 and the pixel B displays an image at a gray scale level of 8 by using the selection method of the subpixel and the subframe shown in FIG. 32. FIG. 33 shows a lighting or non-lighting state of each subpixel in each subframe in this case. For example, when a line of sight is moved, a gray scale level is sometimes perceived as 4 (=1+1+1+1), and the gray scale level is sometimes perceived as 5 (=1+1+1+1+1) depending on a movement of the line of sight. Although the gray scale level is supposed to be perceived as 7 and 8, the gray scale level is perceived to be 4 or 5, and thereby a pseudo contour occurs. However, a gray scale gap is reduced as compared with the conventional driving method; thus, a pseudo contour is reduced.

Note that more gray scales may be expressed by using image processing technology such as error diffusion or dither diffusion.

Note that although the area of each subpixel is the same and the lighting period of each subframe is the same in FIG. 32, the invention is not limited thereto.

Figure 34:
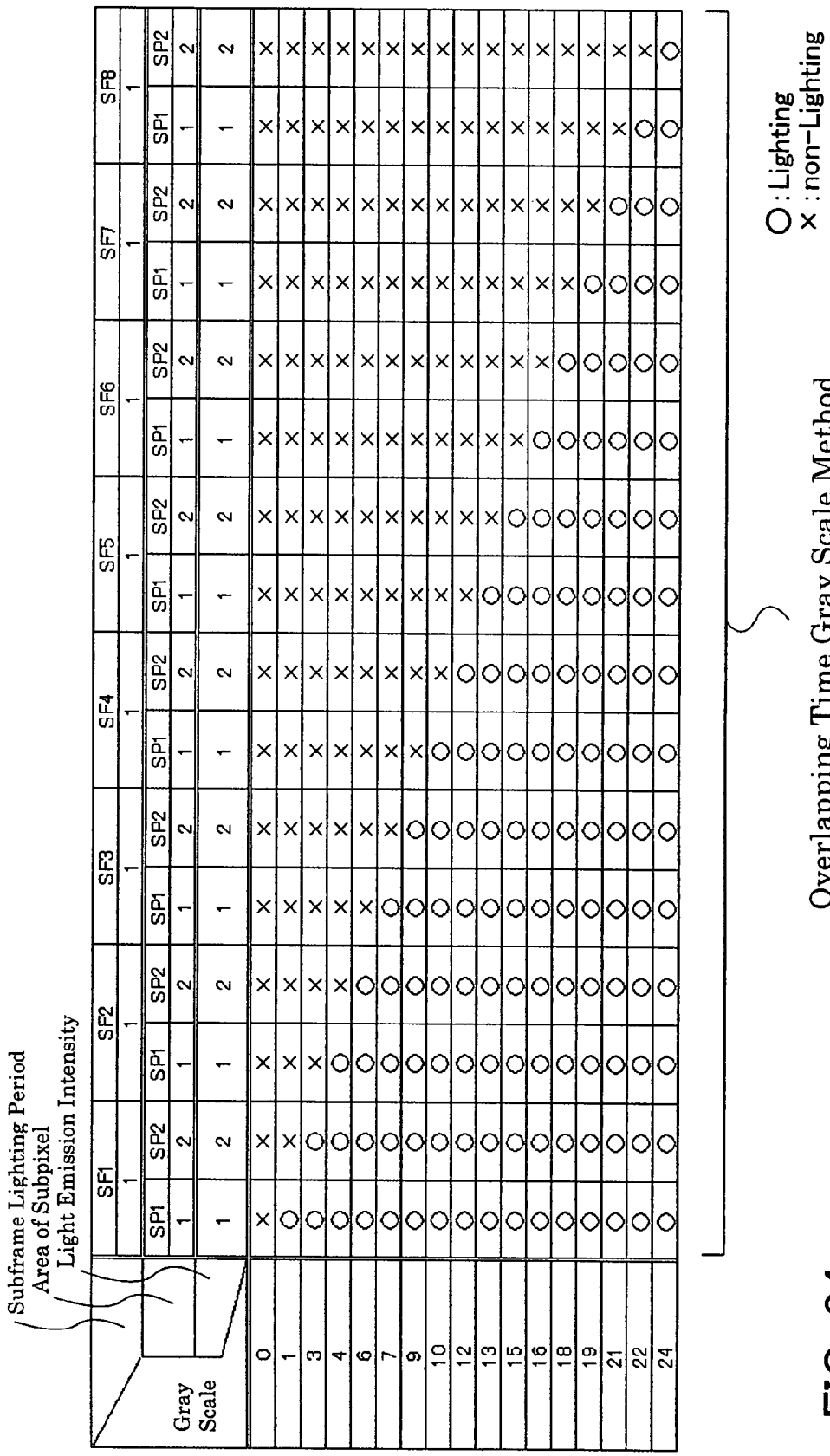
FIG. 34 is a chart showing an example of a selection method of a subpixel and a subframe in a driving method of the invention.

A case is described as an example, in which one pixel is divided into two subpixels (SP1 and SP2) so that an area ratio of subpixels is 1:2; and one frame is divided into eight subframes (SF1 to SF8) each having the same lighting period. FIG. 34 shows a selection method of a subpixel and a subframe in this case.

Here, the subpixels have the following areas: SP1=1 and SP2=2, and the subframes have the following lighting periods: SF1=SF2=SF3=SF4=SF5=SF6=SF7=SF8=1.

Note that in each subpixel, the overlapping time gray scale method is applied to all subpixels in each subframe. That is, the number of lighting subframes is continuously increased in accordance with increase in gray scale level, and a lighting subframe in a low gray scale level is kept to be used for lighting in a high gray scale level.

In the example shown in FIG. 34, SP1 is always lit in SF1 when a gray scale at a gray scale level of 1 or more is expressed, always lit in SF2 when a gray scale at a gray scale level of 4 or more is expressed, always lit in SF3 when a gray scale at a gray scale level of 7 or more is expressed, always lit in SF4 when a gray scale at a gray scale level of 10 or more is expressed, always lit in SF5 when a gray scale at a gray scale level of 13 or more is expressed, always lit in SF6 when a gray scale at a gray scale level of 16 or more is expressed, always lit in SF7 when a gray scale at a gray scale level of 19 or more is expressed, and always lit in SF8 when a gray scale at a gray scale level of 22 or more is expressed. SP2 is similar thereto.

As described above, each subpixel to be lit in each subframe is selected, so that 17 gray scales among gray scale levels of 0 to 24 can be expressed. Note that the other gray scales among the gray scale levels of 0 to 24, which cannot be expressed, are expressed by using image processing technology such as error diffusion or dither diffusion. Thus, 25e gray scales at the gray scale levels of 0 to 24 can be expressed.

Figure 35:
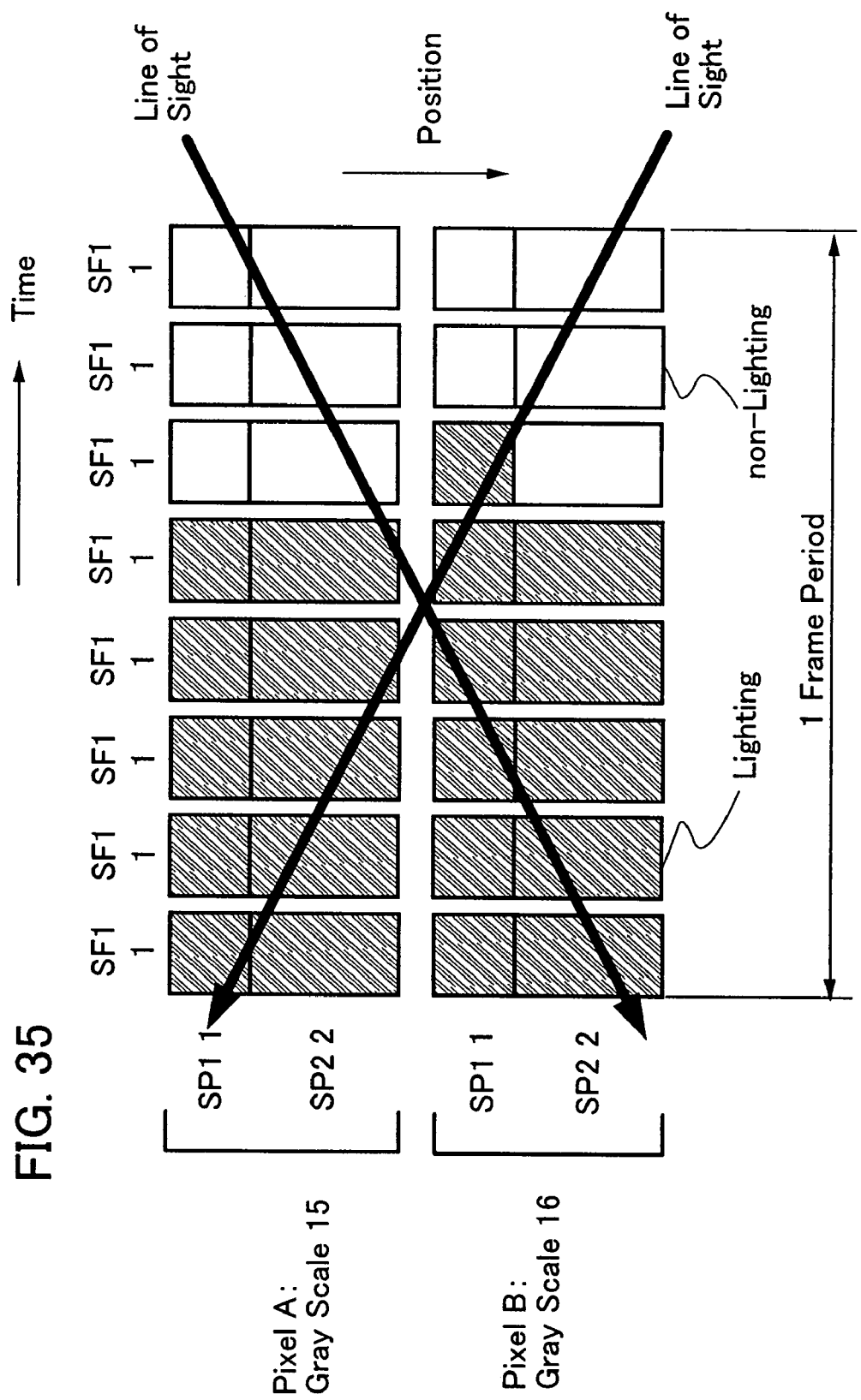
FIG. 35 is a diagram showing a cause of reducing a pseudo contour in a driving method of the invention.

By using a driving method shown in FIG. 34, a pseudo contour can be reduced as compared with the conventional driving method. For example, the pixel A displays an image at a gray scale level of 15 and the pixel B displays an image at a gray scale level of 16 by using the selection method of the subpixel and the subframe shown in FIG. 34. FIG. 35 shows a lighting or non-lighting state of each subpixel in each subframe in this case. For example, when a line of sight is moved, a gray scale level is sometimes perceived as 10 (=2+2+2+1+1+2), and the gray scale level is sometimes perceived as 11 (=1+2+2+2+2+1+1) depending on a movement of the line of sight. Although the gray scale level is supposed to be perceived as 15 and 16, the gray scale level is perceived to be 10 or 11, and thereby a pseudo contour occurs. However, a gray scale gap is reduced as compared with the conventional driving method; thus, a pseudo contour is reduced.

Note that more gray scales may be expressed by using image processing technology such as error diffusion or dither diffusion.

Figure 36:
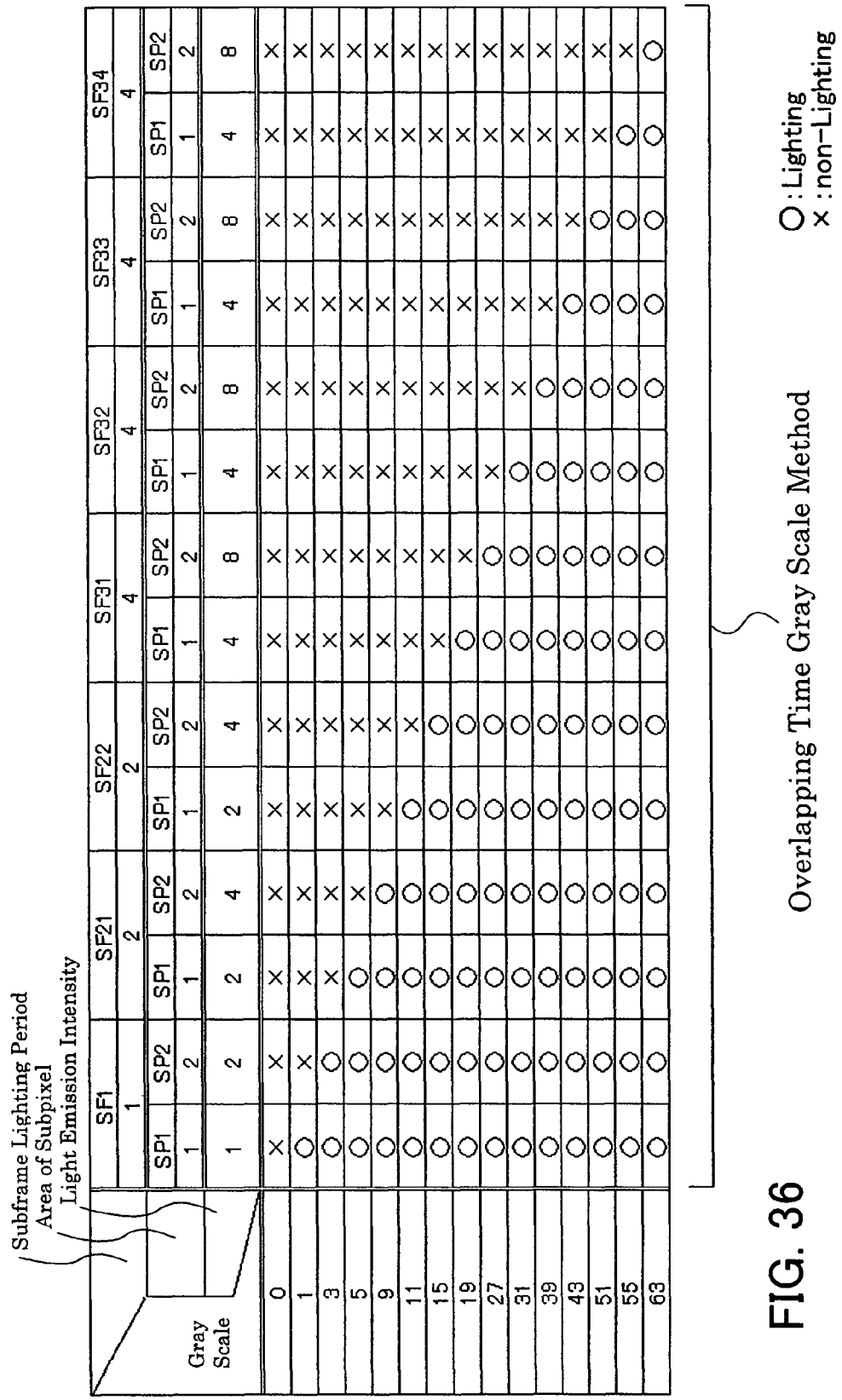
FIG. 36 is a chart showing an example of a selection method of a subpixel and a subframe in a driving method of the invention.

As another example, a case is described, in which one pixel is divided into two subpixels (SP1 and SP2) so that an area ratio of the subpixels is 1:2; one frame is divided into three subframes (SF1, SF2, and SF3) so that a ratio of lighting period between the subframes is 1:4:16; and further, two subframes of the three subframe (SF1 to SF3) are divided into a plurality of subframes. FIG. 36 shows a selection method of a subpixel and a subframe in this case. In FIG. 36, SF2 and SF3 are subframes to be divided into a plurality of subframes.

Here, the subpixels have the following areas: SP1=1 and SP2=2, and the subframes have the following lighting periods: SF1=1, SF2=4, and SF3=16.

FIG. 36 shows a case where SF2 is divided into two subframes and SF3 is divided into four subframes. For example, SF2 having a lighting period of 4 is divided into two subframes SF21 and SF22 each having a lighting period of 2. SF3 having a lighting period of 16 is divided into four subframes SF31, SF32, SF33, and SF34 each having a lighting period of 4.

Thus, one frame is divided into seven subframes, and the lighting period of each subframe is SF1=1, SF21=2, SF22=2, SF31=4, SF32=4, SF33=4, and SF34=4.

Note that in each subpixel, the overlapping time gray scale method is applied to all subpixels in each subframe. That is, the number of lighting subframes is continuously increased in accordance with increase in gray scale level, and a lighting subframe in a low gray scale level is kept to be used for lighting in a high gray scale level.

In the example shown in FIG. 36, SP1 is always lit in SF1 when a gray scale at a gray scale level of 1 or more is expressed, always lit in SF21 when a gray scale at a gray scale level of 5 or more is expressed, always lit in SF22 when a gray scale at a gray scale level of 11 or more is expressed, always lit in SF31 when a gray scale at a gray scale level of 19 or more is expressed, always lit in SF32 when a gray scale at a gray scale level of 31 or more is expressed, always lit in SF33 when a gray scale at a gray scale level of 43 or more is expressed, and always lit in SF34 when a gray scale at a gray scale level of 55 or more is expressed. SP2 is similar thereto.

As described above, each subpixel to be lit in each subframe is selected, so that 17 gray scales among gray scale levels of 0 to 63 can be expressed. Note that the other gray scales among the gray scale levels of 0 to 63, which cannot be expressed, are expressed by using image processing technology such as error diffusion or dither diffusion. Thus, 64 gray scales at the gray scale levels of 0 to 63 can be expressed.

Note that more gray scales may be expressed by using image processing technology such as error diffusion or dither diffusion.

Thus, a pseudo contour can be reduced as compared with the conventional driving method by using the driving method in this embodiment mode.

As the examples shown in FIGS. 32 and 34, when the length of lighting periods of all subframes is the same, an erasing operation is not necessary to be performed on the all subframes; thus, power consumed for an erasing operation can be eliminated.

Further, a duty ratio can be improved, and luminance can be improved. By improvement in duty ratio, a voltage applied to the light emitting element can be reduced. Therefore, power consumption can be reduced and deterioration of the light emitting element can be suppressed.

Note that the content described in this embodiment mode can be freely implemented in combination with the content described in Embodiment Modes 1 and 2.

Embodiment Mode 4

In this embodiment mode, an operation of a display device of the invention is described with reference to the timing charts.

In this embodiment mode, a case is described as an example, in which one pixel is divided into two subpixels (SP1 and SP2) so that an area ratio of the subpixels is 1:2; one frame is divided into three subframes (SF1, SF2, and SF3) so that a ratio of lighting period between the subframes is 1:4:16; and further, one subframe of the three subframes (SF1 to SF3) is divided into two subframes. As a specific example, a case of using the selection method of the subpixel and the subframe shown in FIG. 1 is described.

Figure 37:
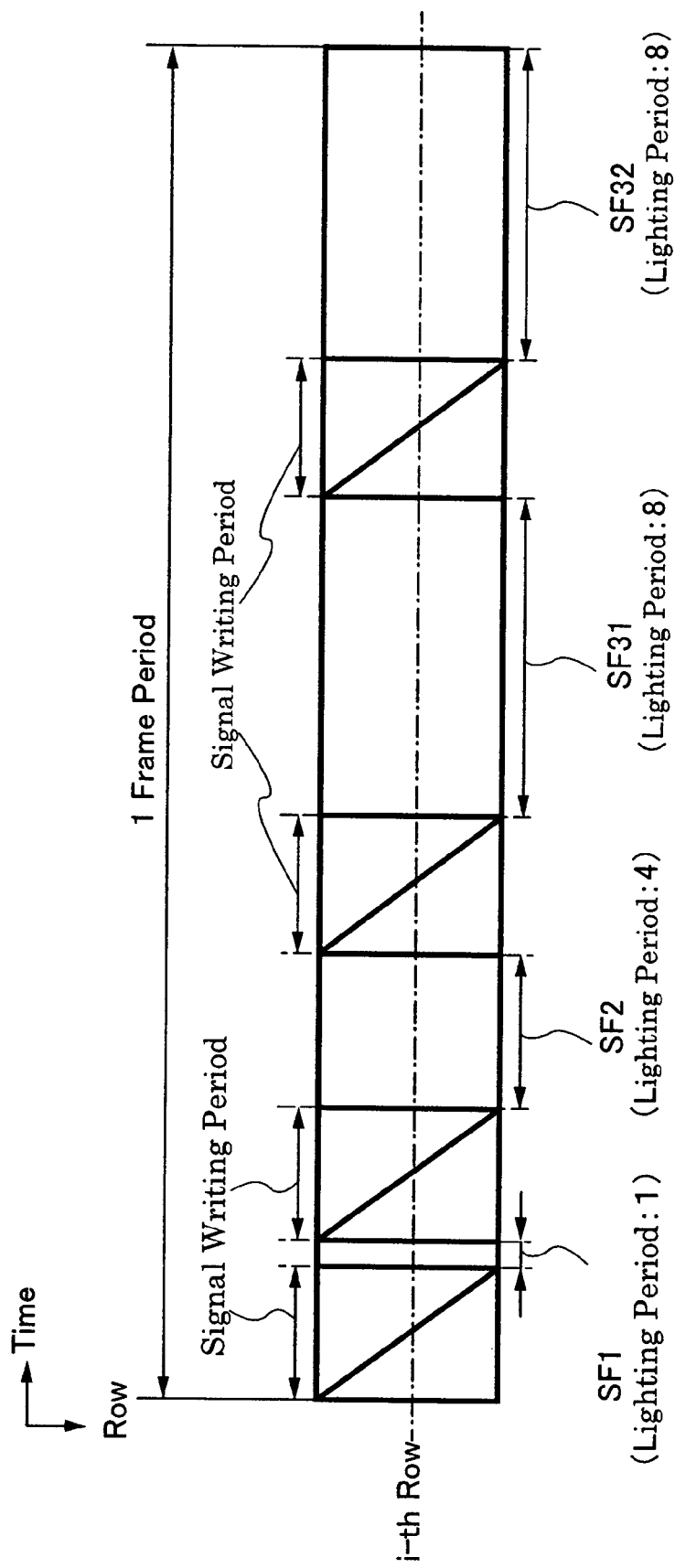
FIG. 37 is a diagram showing an example of a timing chart in a case where a period for writing a signal to a pixel and a lighting period are separated.

FIG. 37 is a timing chart in a case where a period for writing a signal to a pixel and a lighting period are separated.

Note that a timing chart shows timing of light emission of a pixel in one frame; and the horizontal direction of FIG. 37 indicates time, and the vertical direction thereof indicates a row in which pixels are arranged.

First, signals for one screen are input to all pixels in a signal writing period. During this period, the pixels are not lit. After the signal writing period, a lighting period starts and the pixels are lit. The length of the lighting period at this time is 1. Next, a subsequent subframe starts and signals for one screen are input to all the pixels in the signal writing period. During this period, the pixels are not lit. After the signal writing period, the lighting period starts and the pixels are lit. The length of the lighting period at this time is 4.

By repeating similar operations, the length of the lighting periods is arranged in order of 1, 4, 8, and 8.

Such a driving method where a period for writing a signal to a pixel and a lighting period are separated is preferably applied to a plasma display. Note that when the driving method is used for a plasma display, an initialization operation or the like is necessary, which is omitted in FIG. 37 for simplicity.

In addition, this driving method is also preferably applied to an EL display (e.g. an organic EL display, an inorganic EL display, or a display formed of elements including an inorganic substance and an organic substance), a field emission display, a display using a digital micromirror device (DMD), and the like.

Figure 38:
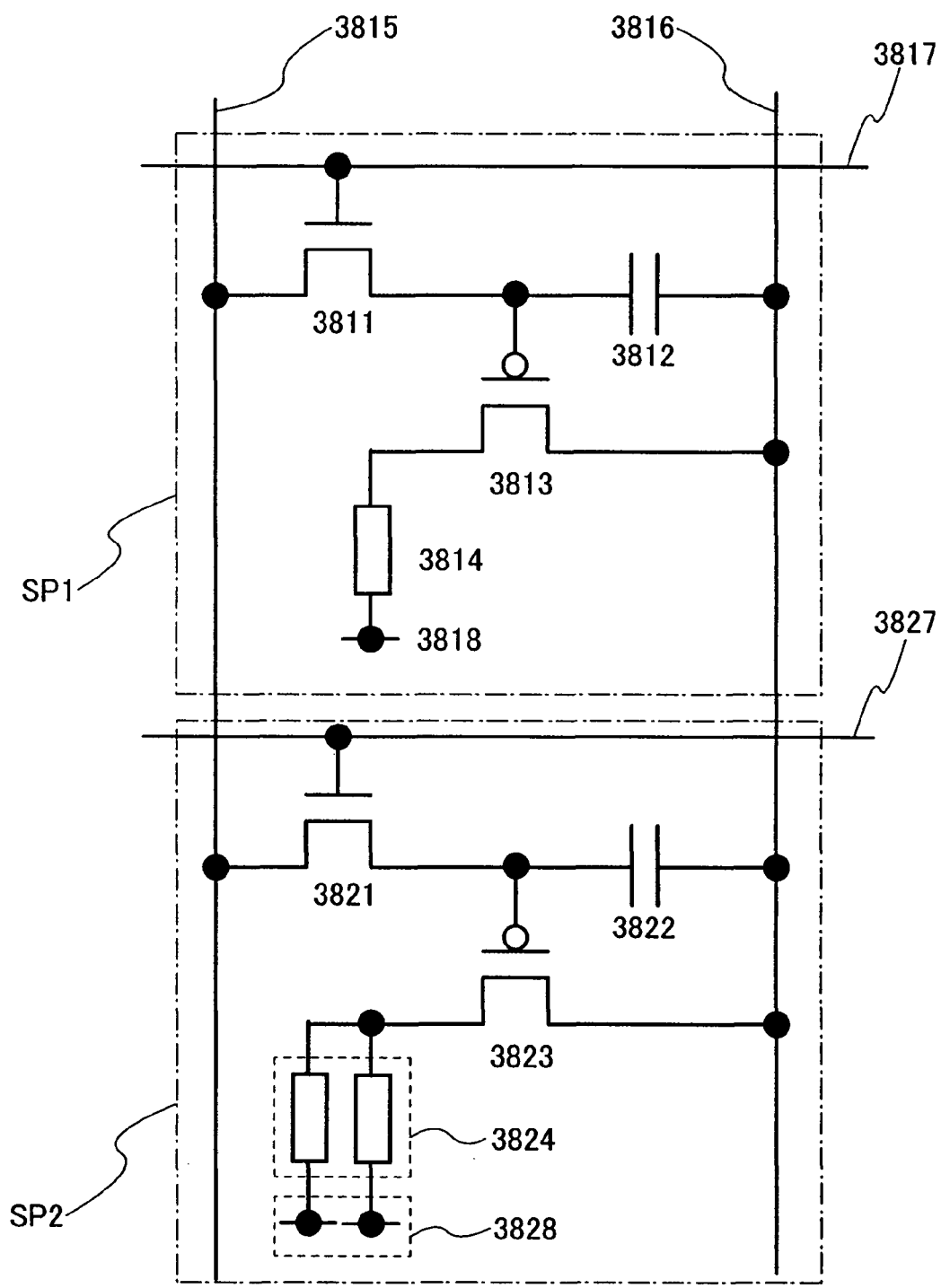
FIG. 38 is a diagram showing an example of a pixel configuration in a case where a period for writing a signal to a pixel and a lighting period are separated.

FIG. 38 shows a pixel configuration for realizing the driving method in which a period for writing a signal to a pixel and a lighting period are separated. Note that in FIG. 38, the number of light emitting elements indicates the area of each pixel. Therefore, one light emitting element is provided in the subpixel 1 (SP1) and two light emitting elements are provided in the subpixel 2 (SP2).

First, the pixel configuration shown in FIG. 38 is described. SP1 includes a first selection transistor 3811, a first driving transistor 3813, a first storage capacitor 3812, a signal line 3815, a first power supply line 3816, a first scan line 3817, a first light emitting element 3814, and a second power supply line 3818.

A gate electrode of the first selection transistor 3811 is connected to the first scan line 3817, a first electrode thereof is connected to the signal line 3815, and a second electrode thereof is connected to a second electrode of the first storage capacitor 3812 and a gate electrode of the first driving transistor 3813. A first electrode of the first storage capacitor 3812 is connected to the first power supply line 3816. A first electrode of the first driving transistor 3813 is connected to the first power supply line 3816, and a second electrode thereof is connected to a first electrode of the first light emitting element 3814. A second electrode of the first light emitting element 3814 is connected to the second power supply line 3818.

SP2 includes a second selection transistor 3821, a second driving transistor 3823, a second storage capacitor 3822, the signal line 3815, the first power supply line 3816, a second scan line 3827, a second light emitting element 3824, and a third power supply line 3828. Note that connections of each element and each wiring in SP2 are similar to those in SP1; therefore, description thereof is omitted.

Next, an operation of the pixel shown in FIG. 38 is described. Here, an operation of SP1 is described. By increasing a potential of the first scan line 3817, the first scan line 3817 is selected, the first selection transistor 3811 is turned on, and a signal is input from the signal line 3815 to the first storage capacitor 3812. Thus, a current of the first driving transistor 3813 is controlled in accordance with the signal, and a current flows from the first power supply line 3816 to the first light emitting element 3814. Note that an operation of SP2 is similar to that of SP1; therefore, description thereof is omitted.

In this case, the number of light emitting elements to emit light is changed depending on which scan line of the first and second scan lines is selected. For example, when only the first scan line 3817 is selected, only the first selection transistor 3811 is turned on, and only the current of the first driving transistor 3813 is controlled; thus, only the first light emitting element 3814 emits light. That is, only SP1 emits light. On the other hand, when only the second scan line 3827 is selected, only the second selection transistor 3821 is turned on, and only a current of the second driving transistor 3823 is controlled; thus, only the second light emitting element 3824 emits light. That is, only SP2 emits light. Further, when both the first and second scan lines 3817 and 3827 are selected, the first and second selection transistors 3811 and 3821 are turned on, and the currents of the first and second driving transistors 3813 and 3823 is controlled; thus, both the first and second light emitting elements 3814 and 3824 emit light. That is, both SP1 and SP2 emit light.

Note that in the signal writing period, potentials of the second and third power supply lines 3818 and 3828 are controlled so that a voltage is not applied to the light emitting elements 3814 and 3824. For example, in a case of SP1, the second power supply line 3818 may be set in a floating state. Alternatively, the potential of the second power supply line 3818 may be made lower than a potential of the signal line 3815 by a threshold voltage of the first driving transistor 3813. Further alternatively, the potential of the second power supply line 3818 may be made equal to or higher than that of the signal line 3815. As a result, the light emitting element 3814 can be prevented from lighting in the signal writing period. Note that SP2 is similar thereto.

Note that the second power supply line 3818 and the third power supply line 3828 may be either different wirings or the same wiring.

Note that when one pixel is divided into m subpixels (m is an integer of m≦2), in order to realize the pixel configuration shown in FIG. 38, the number of scan lines included in one pixel may be 2 or more and m or less, and a selection transistor included in at least one subpixel among the m subpixels may be connected to a scan line different from that connected to a selection transistor included in another subpixel.

Figure 39:
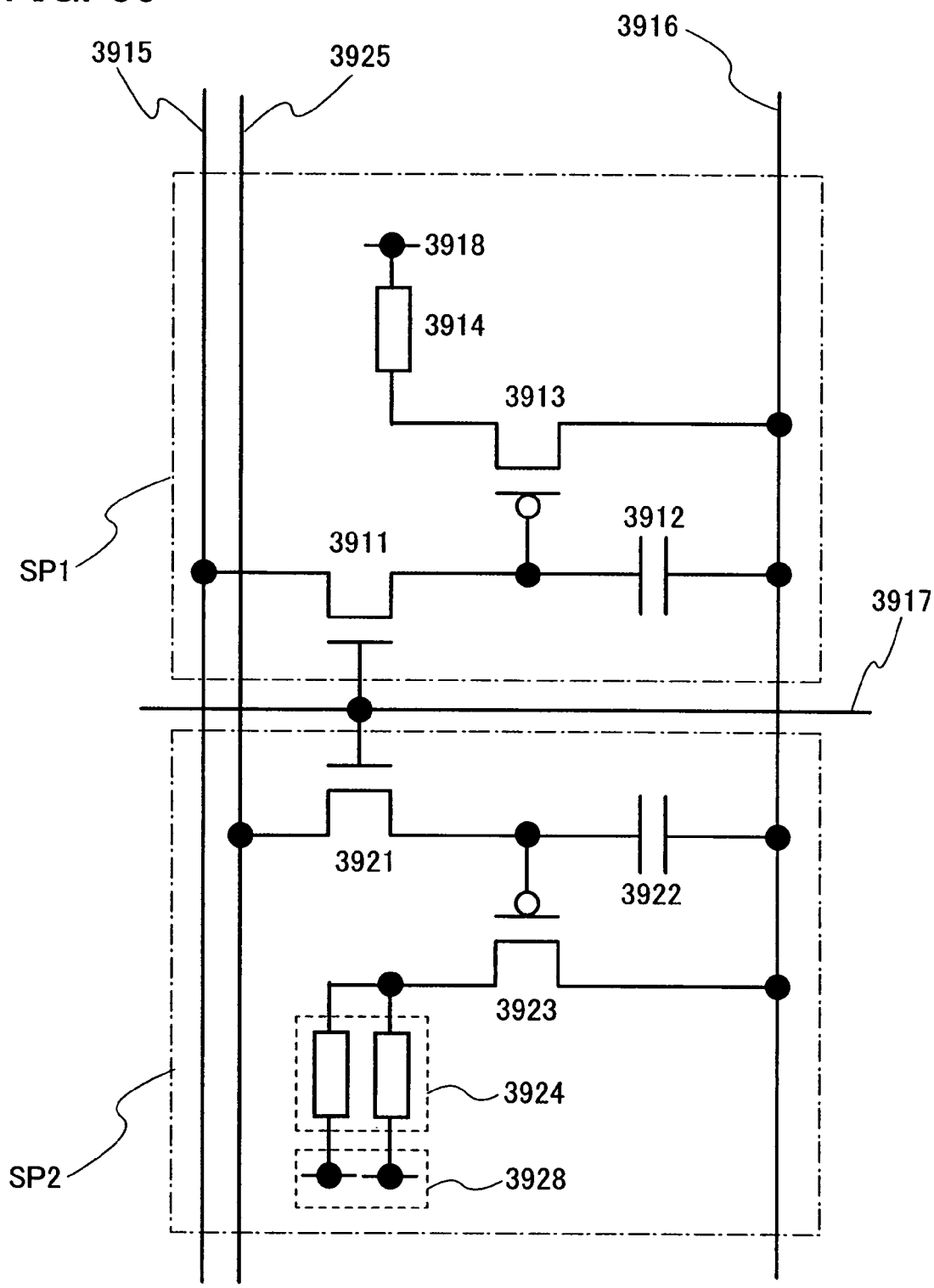
FIG. 39 is a diagram showing an example of a pixel configuration in a case where a period for writing a signal to a pixel and a lighting period are separated.

FIG. 38 shows a configuration example in a case where a plurality of scan lines is provided, and the number of light emitting elements to emit light is changed by controlling which scan line is selected, and thereby a gray scale is expressed. It is also possible that a plurality of signal lines is provided, and the number of light emitting elements to emit light is changed by controlling what kind of signal is input to which signal line, and thereby a gray scale is expressed. FIG. 39 shows a configuration example of the this case.

First, a pixel configuration shown in FIG. 39 is described. SP1 includes a first selection transistor 3911, a first driving transistor 3913, a first storage capacitor 3912, a first signal line 3915, a first power supply line 3916, a scan line 3917, a first light emitting element 3914, and a second power supply line 3918.

A gate electrode of the first selection transistor 3911 is connected to the scan line 3917, a first electrode thereof is connected to the first signal line 3915, and a second electrode thereof is connected to the a second electrode of the first storage capacitor 3912 and a gate electrode of the first driving transistor 3913. A first electrode of the first storage capacitor 3912 is connected to the first power supply line 3916. A first electrode of the first driving transistor 3913 is connected to the first power supply line 3916, and a second electrode thereof is connected to a first electrode of the first light emitting element 3914. A second electrode of the first light emitting element 3914 is connected to the second power supply line 3918.

SP2 includes a second selection transistor 3921, a second driving transistor 3923, a second storage capacitor 3922, a second signal line 3925, the first power supply line 3916, the scan line 3917, a second light emitting element 3924, and a third power supply line 3928. Note that connections of each element and each wiring in SP2 are similar to those in SP1; therefore, description thereof is omitted.

Next, an operation of the pixel shown in FIG. 39 is described. Here, an operation of SP1 is described. By increasing a potential of the scan line 3917, the scan line 3917 is selected, the first selection transistor 3911 is turned on, and a video signal is input from the first signal line 3915 to the first storage capacitor 3912. Thus, a current of the first driving transistor 3913 is controlled in accordance with the video signal, and a current flows from the first power supply line 3916 to the first light emitting element 3914. Note that an operation of SP2 is similar to that of SP1; therefore, description thereof is omitted.

In this case, the number of light emitting elements to emit light is changed in accordance with the video signals input to the first and second signal lines. For example, when a low-level signal is input to the first signal line 3915 and a high-level signal is input to the second signal line 3925, only the first driving transistor 3913 is turned on; thus, only the first light emitting element 3914 emits light. That is, only SP1 emits light. On the other hand, when a high-level signal is input to the first signal line 3915 and a low-level signal is input to the second signal line 3925, only the second driving transistor 3923 is turned on; thus, only the second light emitting element 3924 emits light. That is, only SP2 emits light. Further, when low-level signals are input to the first and second signal lines 3915 and 3925, both the first and second driving transistors 3913 and 3923 are turned on; thus, both the first and second light emitting elements 3914 and 3924 emit light. That is, both SP1 and SP2 emit light.

The currents flowing to the first and second light emitting elements 3914 and 3924 can be controlled by controlling voltages of the video signals input to the first and second signal lines 3915 and 3925. As a result, luminance of each subpixel can be changed, and a gray scale can be expressed. For example, when SP1 with the area of 1 is lit in SF1 having a lighting period of 1, light emission intensity is 1; however, when a voltage level of the video signal input to the first signal line 3915 is changed, luminance of the first light emitting element 3914 can be changed. Thus, gray scales much more than those which can be expressed by using the area of the subpixel and the length of the lighting period of the subframe can be expressed. Further, by expressing a gray scale by a voltage applied to the light emitting element included in each subpixel in addition to the area of the subpixel and the length of the lighting period of the subframe, the number of subpixels and subframes necessary to express the same gray scale can be reduced. Thus, an aperture ratio of a pixel portion can be increased. In addition, a duty ratio can be improved, and luminance can be improved. By improvement in duty ratio, a voltage applied to the light emitting element can be reduced. Therefore, power consumption can be reduced and deterioration of the light emitting element can be suppressed.

Note that when one pixel is divided into m subpixels (m is an integer of m≦2), in order to realize the pixel configuration shown in FIG. 39, the number of signal lines included in one pixel may be 2 or more and m or less, and a selection transistor included in at least one subpixel among the m subpixels may be connected to a signal line different from that connected to a selection transistor included in another subpixel.

Figure 40:
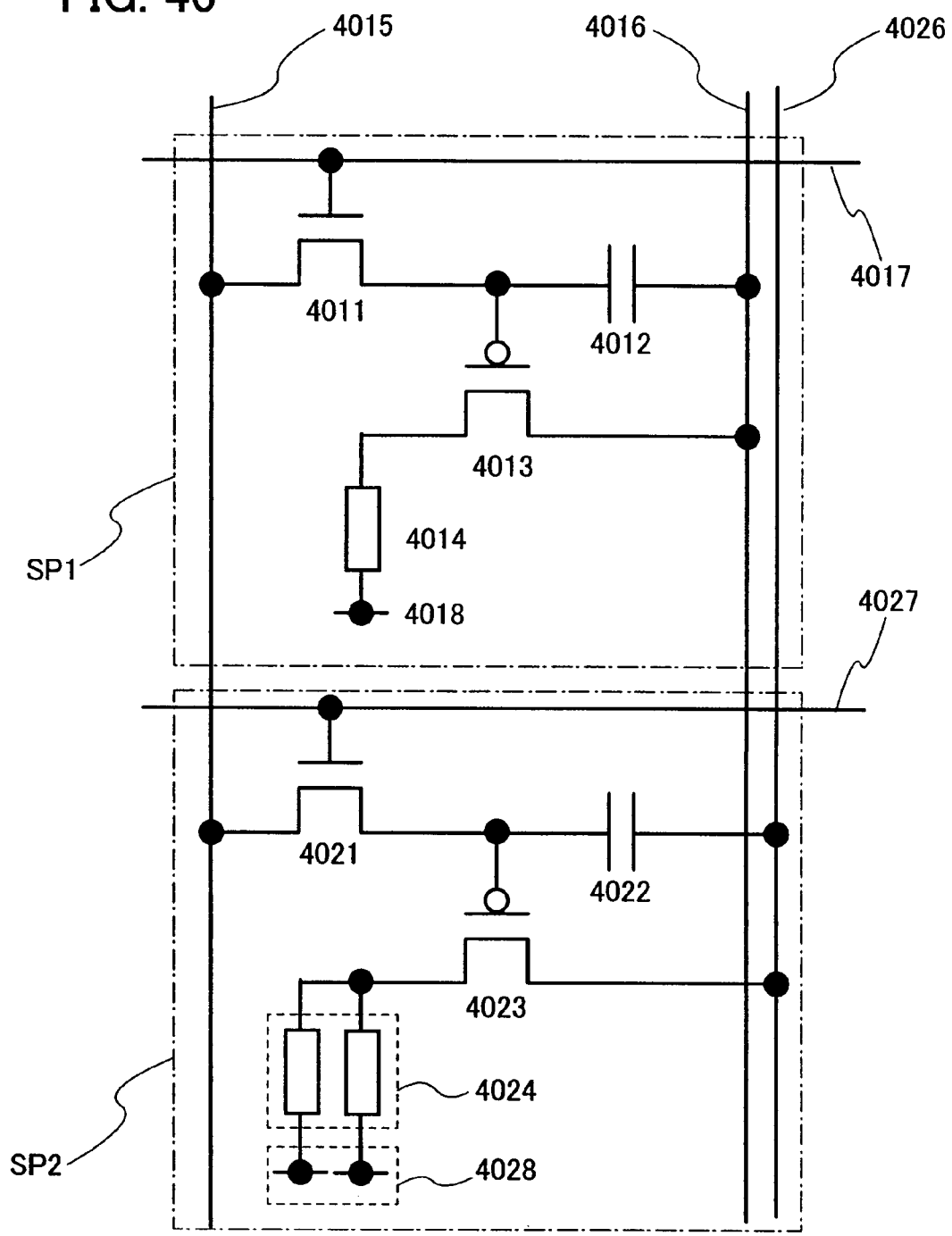
FIG. 40 is a diagram showing an example of a pixel configuration in a case where a period for writing a signal to a pixel and a lighting period are separated.

Note that a common power supply line (each of the first power supply lines 3816 and 3916) is connected to each subpixel in FIGS. 38 and 39; however, a plurality of power supply lines corresponding to the first power supply line in each of FIGS. 38 and 39 may be provided, and a power supply voltage applied to the subpixel may be changed. FIG. 40 shows a configuration example in a case where two power supply lines corresponding to the first power supply line in FIG. 38 are provided.

First, a pixel configuration shown in FIG. 40 is described. SP1 includes a first selection transistor 4011, a first driving transistor 4013, a first storage capacitor 4012, a signal line 4015, a first power supply line 4016, a first scan line 4017, a first light emitting element 4014, and a second power supply line 4018.

A gate electrode of the first selection transistor 4011 is connected to the first scan line 4017, a first electrode thereof is connected to the signal line 4015, and a second electrode thereof is connected to a second electrode of the first storage capacitor 4012 and a gate electrode of the first driving transistor 4013. A first electrode of the first storage capacitor 4012 is connected to the first power supply line 4016. A first electrode of the first driving transistor 4013 is connected to the first power supply line 4016, and a second electrode thereof is connected to a first electrode of the first light emitting element 4014. A second electrode of the first light emitting element 4014 is connected to the second power supply line 4018.

SP2 includes a second selection transistor 4021, a second driving transistor 4023, a second storage capacitor 4022, the signal line 4015, a second scan line 4027, a second light emitting element 4024, a third power supply line 4028, and a fourth power supply line 4026. Note that connections of each element and each wiring in SP2 are similar to those in SP1; therefore, description thereof is omitted.

Currents flowing to the first and second light emitting elements 4014 and 4024 can be controlled by controlling voltages applied to the first and fourth power supply lines 4016 and 4026. As a result, luminance of each subpixel can be changed, and a gray scale can be expressed. For example, when SP1 with the area of 1 is lit in SF1 having a lighting period of 1, light emission intensity is 1; however, when a voltage level applied to the first power supply line 4016 is changed, luminance of the first light emitting element 4014 can be changed. Thus, gray scales much more than those which can be expressed by using the area of the subpixel and the length of the lighting period of the subframe can be expressed. Further, by expressing a gray scale by a voltage applied to the light emitting element included in each subpixel in addition to the area of the subpixel and the length of the lighting period of the subframe, the number of subpixels and subframes necessary to express the same gray scale can be reduced.

Thus, an aperture ratio of a pixel portion can be increased. In addition, a duty ratio can be improved, and luminance can be improved. By improvement in duty ratio, a voltage applied to the light emitting element can be reduced. Therefore, power consumption can be reduced and deterioration of the light emitting element can be suppressed.

Note that when one pixel is divided into m subpixels (m is an integer of m≦2), in order to realize the pixel configuration shown in FIG. 40, the number of power supply lines, which correspond to the first power supply line in FIG. 38 or 39, included in one pixel may be 2 or more and m or less, and a selection transistor included in at least one subpixel among the m subpixels may be connected to the power supply line different from that connected to a selection transistor included in another subpixel.

Figure 41:
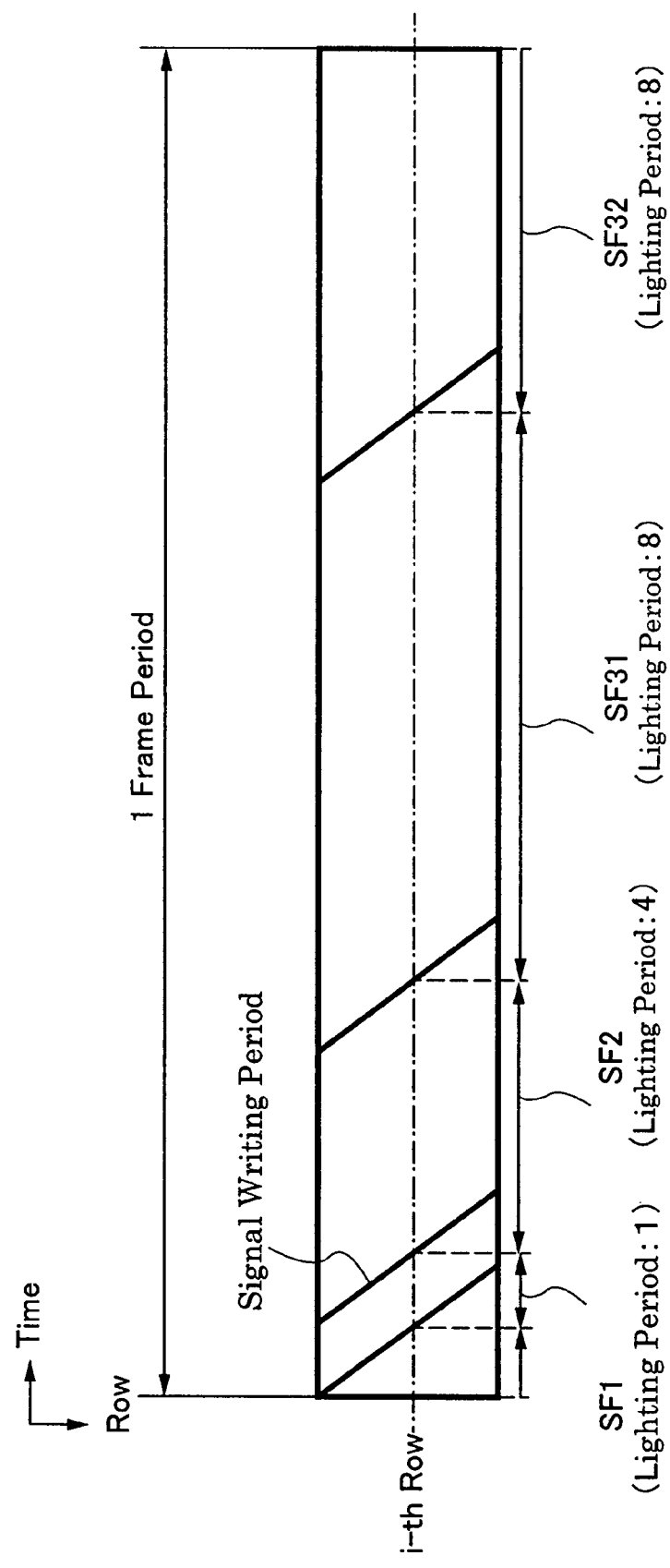
FIG. 41 is a diagram showing an example of a timing chart in a case where a period for writing a signal to a pixel and a lighting period are not separated.

Next, FIG. 41 shows a timing chart in a case where a period for writing a signal to a pixel and a lighting period are not separated. In each row, immediately after each signal is written, a lighting period starts.

In a certain row, after each signal is written and a predetermined lighting period is finished, a signal writing operation starts in a subsequent subframe. By repeating such operations, the length of the lighting periods is arranged in order of 1, 4, 8, and 8.

In such a manner, a plurality of subframes can be arranged in one frame even when signal writing operation is slow.

Such a driving method is preferably applied to a plasma display. Note that when the driving method is used for a plasma display, an initialization operation or the like is necessary, which is omitted in FIG. 41 for simplicity.

In addition, this driving method is also preferably applied to an EL display, a field emission display, a display using a digital micromirror device (DMD), and the like.

Figure 42:
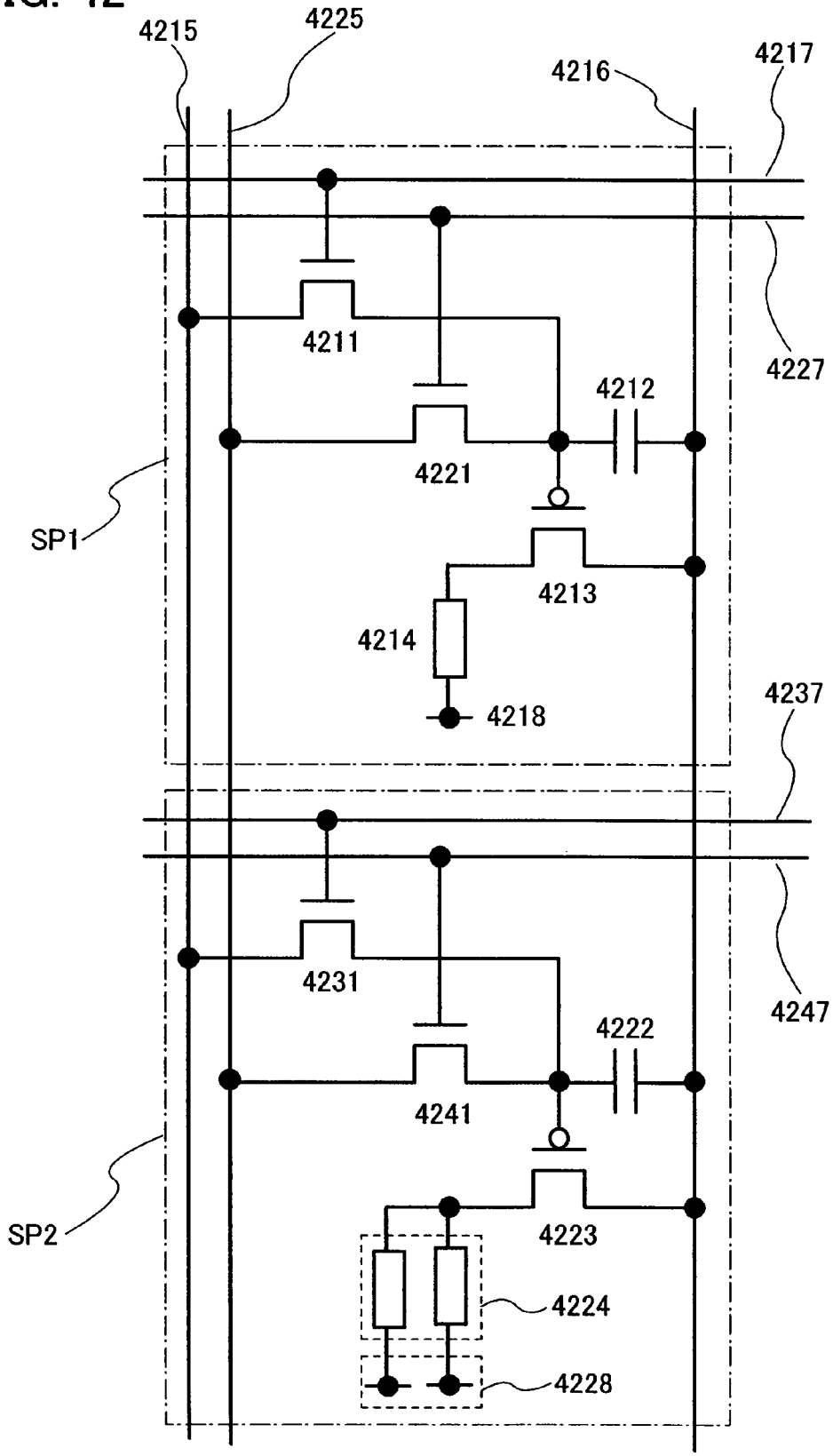
FIG. 42 is a diagram showing an example of a pixel configuration in a case where a period for writing a signal to a pixel and a lighting period are not separated.

FIG. 42 shows a pixel configuration for realizing the driving method in which a period for writing a signal to a pixel and a lighting period are not separated. Note that in order to realize such a driving method, a plurality of rows is necessary to be able to be selected at the same time.

First, a pixel configuration shown in FIG. 42 is described. SP1 includes a first selection transistor 4211, a second selection transistor 4221, a first driving transistor 4213, a first storage capacitor 4212, a first signal line 4215, a second signal line 4225, a first power supply line 4216, a first scan line 4217, a second scan line 4227, a first light emitting element 4214, and a second power supply line 4218.

A gate electrode of the first selection transistor 4211 is connected to the first scan line 4217, a first electrode thereof is connected to the first signal line 4215, and a second electrode thereof is connected to a second electrode of the second selection transistor 4221, a second electrode of the first storage capacitor 4212, and a gate electrode of the first driving transistor 4213. A gate electrode of the second selection transistor 4221 is connected to the second scan line 4227, and a first electrode thereof is connected to the second signal line 4225. A first electrode of the first storage capacitor 4212 is connected to the first power supply line 4216. A first electrode of the first driving transistor 4213 is connected to the first power supply line 4216, and a second electrode thereof is connected to a first electrode of the first light emitting element 4214. A second electrode of the first light emitting element 4214 is connected to the second power supply line 4218.

SP2 includes a third selection transistor 4231, a fourth selection transistor 4241, a second driving transistor 4223, a second storage capacitor 4222, the first signal line 4215, the second signal line 4225, the first power supply line 4216, a third scan line 4237, a fourth scan line 4247, a second light emitting element 4224, and a third power supply line 4228. Note that connections of each element and each wiring in SP2 are similar to those in SP1; therefore, description thereof is omitted.

Next, an operation of the pixel shown in FIG. 42 is described. Here, an operation of SP1 is described. By increasing a potential of the first scan line 4217, the first scan line 4217 is selected, the first selection transistor 4211 is turned on, and a signal is input from the first signal line 4215 to the first storage capacitor 4212. Thus, a current of the first driving transistor 4213 is controlled in accordance with the signal, and a current flows from the first power supply line 4216 to the first light emitting element 4214. Similarly, by increasing a potential of the second scan line 4227, the second scan line 4227 is selected, the second selection transistor 4221 is turned on, and a signal is input from the second signal line 4225 to the first storage capacitor 4212. Thus, the current of the first driving transistor 4213 is controlled in accordance with the signal, and a current flows from the first power supply line 4216 to the first light emitting element 4214. Note that an operation of SP2 is similar to that of SP1; therefore, description thereof is omitted.

The first scan line 4217 and the second scan line 4227 can be separately controlled. Similarly, the third scan line 4237 and the fourth scan line 4247 can be separately controlled. Further, the first signal line 4215 and the second signal line 4225 can be separately controlled. Thus, signals can be input to pixels of two rows at the same time, and thereby the driving method shown in FIG. 41 can be realized.

The driving method shown in FIG. 41 can also be realized by using the pixel configuration of FIG. 38. In this case, a method where one gate selection period is divided into a plurality of subgate selection periods is used. First, as shown in FIG. 41, one gate selection period is divided into a plurality of (two in FIG. 43) subgate selection periods. Then, each scan line is selected by increasing a potential of each scan line, and a corresponding signal is input to the signal line 3815. For example, in one gate selection period, the i-th row is selected in the first half of the subgate selection period, and the j-th row is selected in the latter half of the subgate selection period. Thus, the operation can be performed as if the two rows are selected at the same time in one gate selection period.

Note that details of such a driving method are described in, for example, Japanese Published Patent Application No. 2001-324958 and the like, which can be applied in combination with this application.

Note that FIG. 42 shows an example where a plurality of scan lines is provided; however, one signal line may be provided and first electrodes of the first to fourth selection transistors may be connected to the signal line. Further, a plurality of power supply lines corresponding to the first power supply line in FIG. 42 may be provided.

Figure 44:
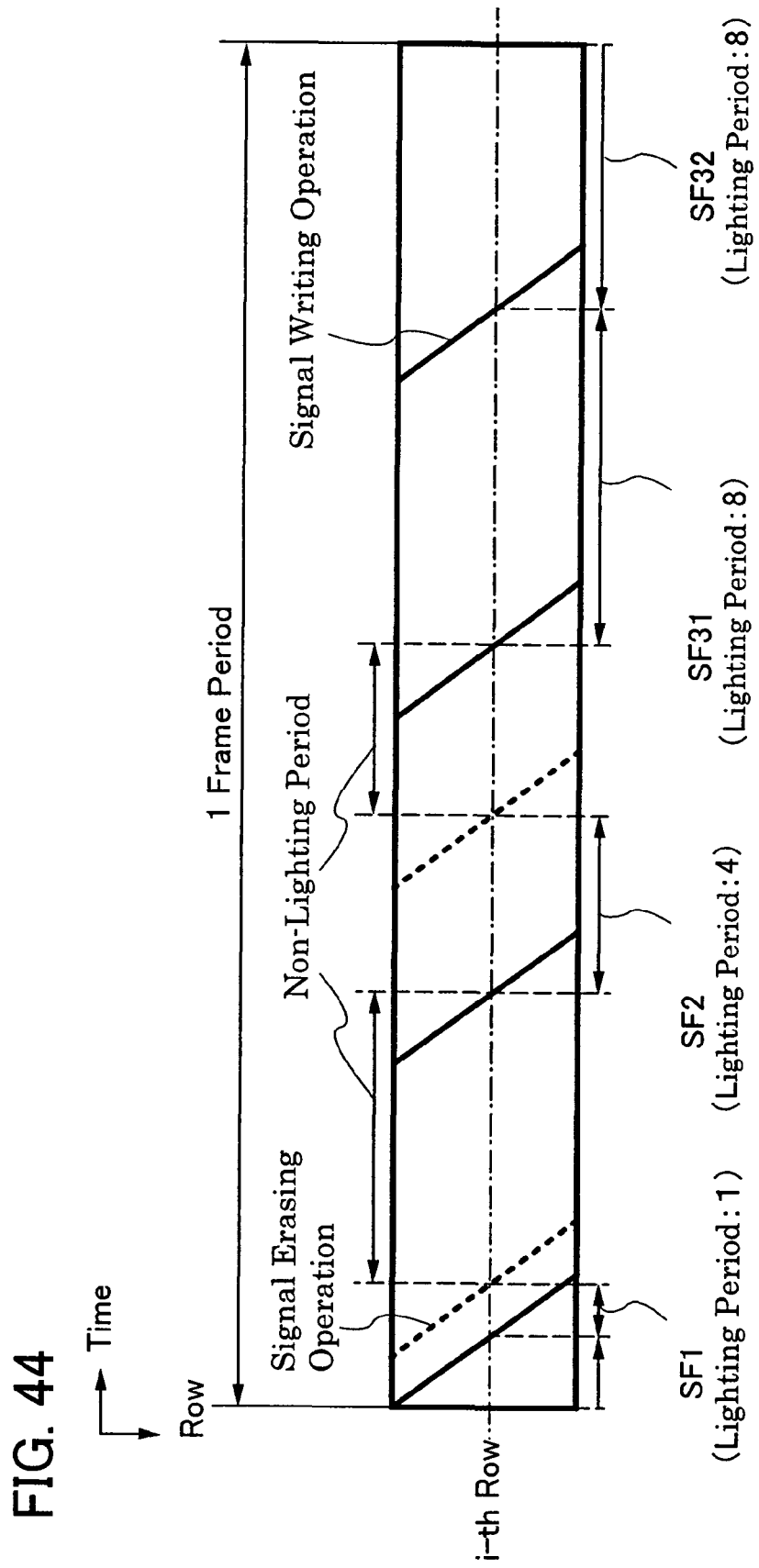
FIG. 44 is a diagram showing an example of a timing chart in a case where an operation of erasing a signal of a pixel is performed.

Next, FIG. 44 shows a timing chart in a case where an operation of erasing a signal of a pixel is performed. In each row, signal writing operation is performed, and the signal of each pixel is erased before a subsequent signal writing operation. Thus, the length of a lighting period can be easily controlled.

In a certain row, after each signal is written and a predetermined lighting period is finished, a signal writing operation starts in a subsequent subframe. If the lighting period is short, a signal erasing operation is performed to forcibly provide a non-lighting state. By repeating such operations, the length of the lighting periods is arranged in order of 1, 4, 8, and 8.

Note that the signal erasing operation is performed in the lighting periods of 1 and 4 in FIG. 44; however, the invention is not limited thereto. The erasing operation may be performed in another lighting period.

In such a manner, a plurality of subframes can be arranged in one frame even when a signal writing operation is slow. Further, in a case where the erasing operation is performed, data for erasing is not necessary to be obtained as well as a video signal; thus, the driving frequency of a signal line driver circuit can also be reduced.

Such a driving method is preferably applied to a plasma display. Note that when the driving method is used for a plasma display, an initialization operation or the like is necessary, which is omitted in FIG. 44 for simplicity.

In addition, this driving method is also preferably applied to an EL display, a field emission display, a display using a digital micromirror device (DMD), and the like.

Figure 45:
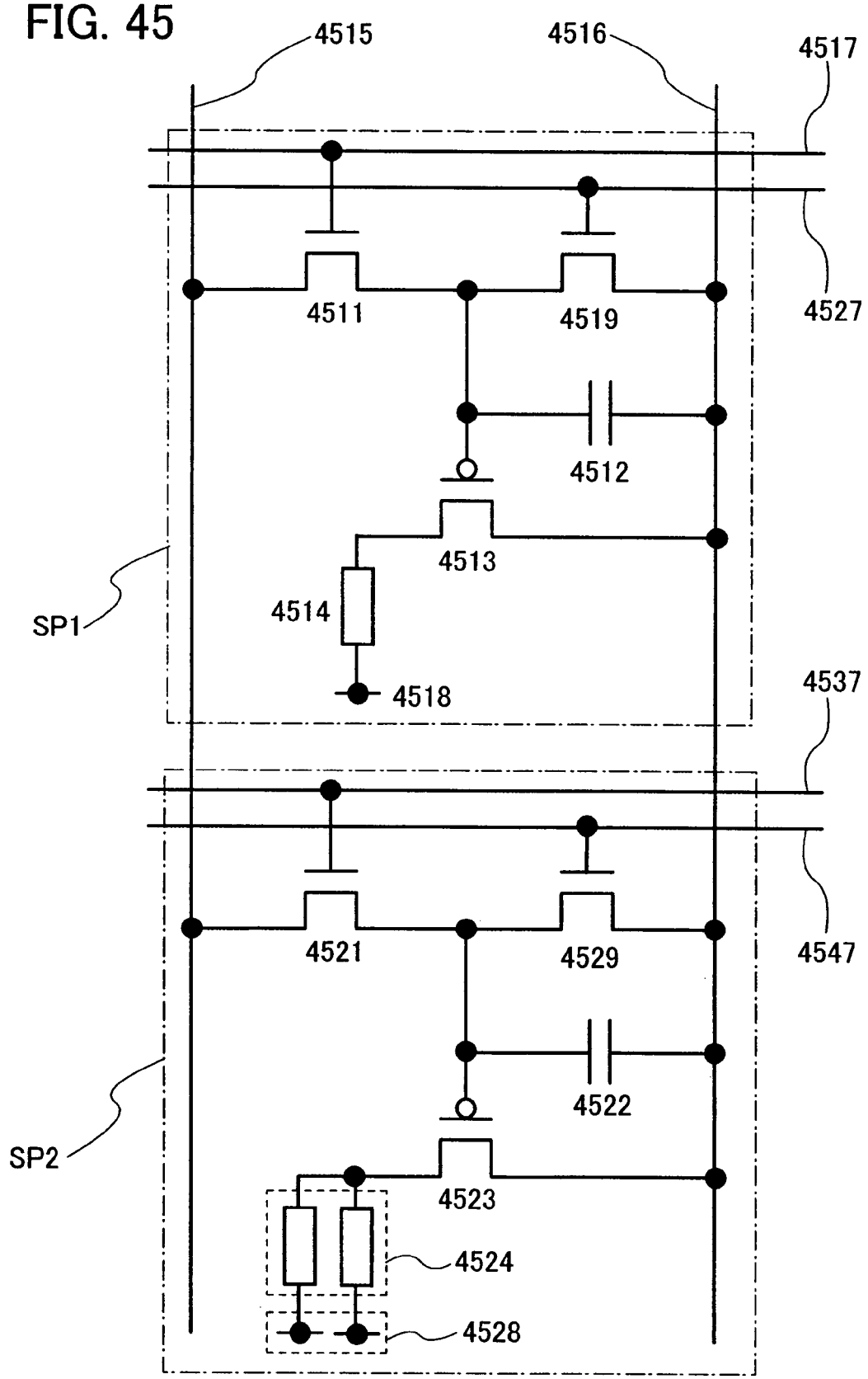
FIG. 45 is a diagram showing an example of a pixel configuration in a case where an operation of erasing a signal of a pixel is performed.

FIG. 45 shows a pixel configuration in a case where the erasing operation is performed. A pixel shown in FIG. 45 is a configuration example in a case where the erasing operation is performed by using an erasing transistor.

First, the pixel configuration shown in FIG. 45 is described. SP1 includes a first selection transistor 4511, a first driving transistor 4513, a first erasing transistor 4519, a first storage capacitor 4512, a signal line 4515, a first power supply line 4516, a first scan line 4517, a second scan line 4527, a first light emitting element 4514, and a second power supply line 4518.

A gate electrode of the first selection transistor 4511 is connected to the first scan line 4517, a first electrode thereof is connected to the signal line 4515, and a second electrode thereof is connected to a second electrode of the first erasing transistor 4519, a second electrode of the first storage capacitor 4512, and a gate electrode of the first driving transistor 4513. A gate electrode of the first erasing transistor 4519 is connected to the second scan line 4527, and a first electrode thereof is connected to the first power supply line 4516. A first electrode of the first storage capacitor 4512 is connected to the first power supply line 4516. A first electrode of the first driving transistor 4513 is connected to the first power supply line 4516, and a second electrode thereof is connected to a first electrode of the first light emitting element 4514. A second electrode of the first light emitting element 4514 is connected to the second power supply line 4518.

SP2 includes a second selection transistor 4521, a second driving transistor 4523, a second erasing transistor 4529, a second storage capacitor 4522, the signal line 4515, the first power supply line 4516, a third scan line 4537, a fourth scan line 4547, a second light emitting element 4524, and a third power supply line 4528. Note that connections of each element and each wiring in SP2 are similar to those in SP1; therefore, description thereof is omitted.

Next, an operation of the pixel shown in FIG. 45 is described. Here, an operation of SP1 is described. By increasing a potential of the first scan line 4517, the first scan line 4517 is selected, the first selection transistor 4511 is turned on, and a signal is input from the signal line 4515 to the first storage capacitor 4512. Thus, a current of the first driving transistor 4513 is controlled in accordance with the signal, and a current flows from the first power supply line 4516 to the first light emitting element 4514.

In order to erase a signal, by increasing a potential of the second scan line 4527, the second scan line 4527 is selected, the first erasing transistor 4519 is turned on, and the first driving transistor 4513 is turned off. Thus, no current flows to the first light emitting element 4514. As a result, a non-lighting period can be provided, and the length of the lighting period can be freely controlled.

Note that an operation of SP2 is similar to that of SP1; therefore, description thereof is omitted.

Although the erasing operation is performed by using the erasing transistors 4519 and 4529 in FIG. 45, another method can also be used as long as a non-lighting period is forcibly provided so that no current flows to the light emitting elements 4514 and 4524. Accordingly, a switch may be provided in a path where a current flows from the first power supply line 4516 to the second and third power supply lines 4518 and 4528 through the light emitting elements 4514 and 4524, and on/off of the switch may be controlled to provide a non-lighting period. Alternatively, a gate-source voltage of each of the driving transistors 4513 and 4523 may be controlled to forcibly turn off the driving transistor.

Figure 46:
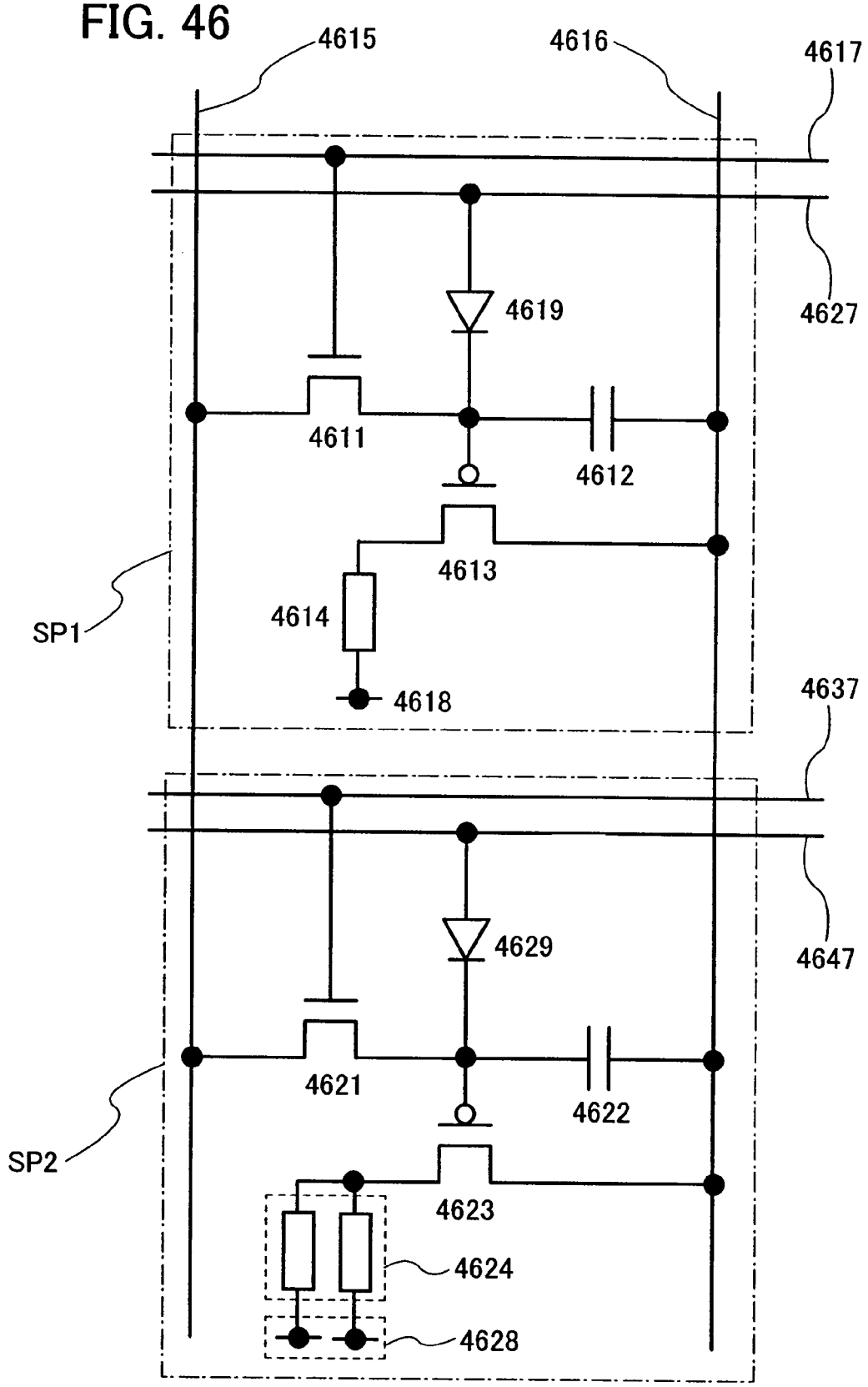
FIG. 46 is a diagram showing an example of a pixel configuration in a case where an operation of erasing a signal of a pixel is performed.

FIG. 46 shows an example of a pixel configuration in a case where a driving transistor is forcibly turned off. A pixel shown in FIG. 46 is a configuration example in a case where a driving transistor is forcibly turned off by using an erasing diode.

First, the pixel configuration shown in FIG. 46 is described. SP1 includes a first selection transistor 4611, a first driving transistor 4613, a first storage capacitor 4612, a signal line 4615, a first power supply line 4616, a first scan line 4617, a second scan line 4627, a first light emitting element 4614, a second power supply line 4618, and a first erasing diode 4619.

A gate electrode of the first selection transistor 4611 is connected to the first scan line 4617, a first electrode thereof is connected to the signal line 4615, and a second electrode thereof is connected to a second electrode of the first erasing diode 4619, a second electrode of the first storage capacitor 4612, and a gate electrode of the first driving transistor 4613. A first electrode of the first erasing diode 4619 is connected to the second scan line 4627. A first electrode of the first storage capacitor 4612 is connected to the first power supply line 4616. A first electrode of the first driving transistor 4613 is connected to the first power supply line 4616, and a second electrode thereof is connected to a first electrode of the first light emitting element 4614. A second electrode of the first light emitting element 4614 is connected to the second power supply line 4618.

SP2 includes a second selection transistor 4621, a second driving transistor 4623, a second storage capacitor 4622, the signal line 4615, the first power supply line 4616, a third scan line 4637, a fourth scan line 4647, a second light emitting element 4624, a third power supply line 4628, and a second erasing diode 4629. Note that connections of each element and each wiring in SP2 are similar to those in SP1; therefore, description thereof is omitted.

Next, an operation of the pixel shown in FIG. 46 is described. Here, an operation of SP1 is described. BY increasing a potential of the first scan line 4617, the first scan line 4617 is selected, the first selection transistor 4611 is turned on, and a signal is input from the signal line 4615 to the first storage capacitor 4612. Thus, a current of the first driving transistor 4613 is controlled in accordance with the signal, and a current flows from the first power supply line 4616 to the first light emitting element 4614.

In order to erase a signal, by increasing a potential of the second scan line 4627, the second scan line 4627 is selected, the first erasing diode 4619 is turned on, and a current is made to flow from the second scan line 4627 to the gate electrode of the first driving transistor 4613. Accordingly, the first driving transistor 4613 is turned off. Thus, no current flows from the first power supply line 4616 to the first light emitting element 4614. As a result, a non-lighting period can be provided, and the length of the lighting period can be freely controlled.

In order to hold a signal, the potential of the second scan line 4627 is decreased so that the second scan line 4627 is not selected. Thus, the first erasing diode 4619 is turned off, and a gate potential of the first driving transistor 4613 is held.

Note that an operation of SP2 is similar to that in SP1; therefore, description thereof is omitted.

Note that the erasing diodes 4619 and 4629 may be any element as long as a rectifying property is provided. The erasing diode may be a PN diode, a PIN diode, a Schottky diode, or a zener diode.

Figure 47:
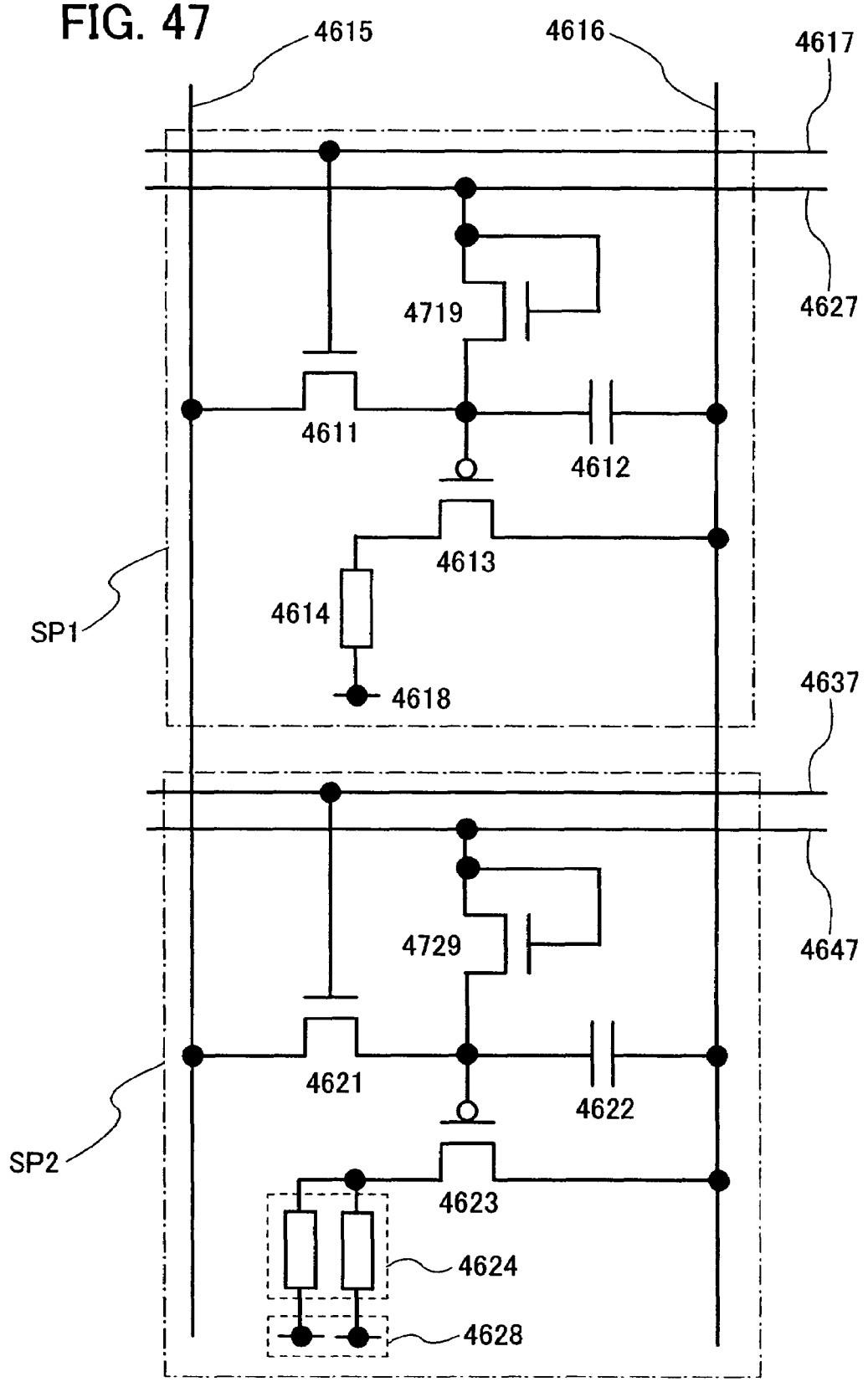
FIG. 47 is a diagram showing an example of a pixel configuration in a case where an operation of erasing a signal of a pixel is performed.

Alternatively, a diode-connected transistor (a gate and a drain thereof are connected) may be used. FIG. 47 is a circuit diagram of this case. As the first and second erasing diodes 4619 and 4629, diode-connected transistors 4719 and 4729 are used. Although n-channel transistors are used as the diode-connected transistors in FIG. 47, the invention is not limited thereto and a p-channel transistor may also be used.

Figure 43:
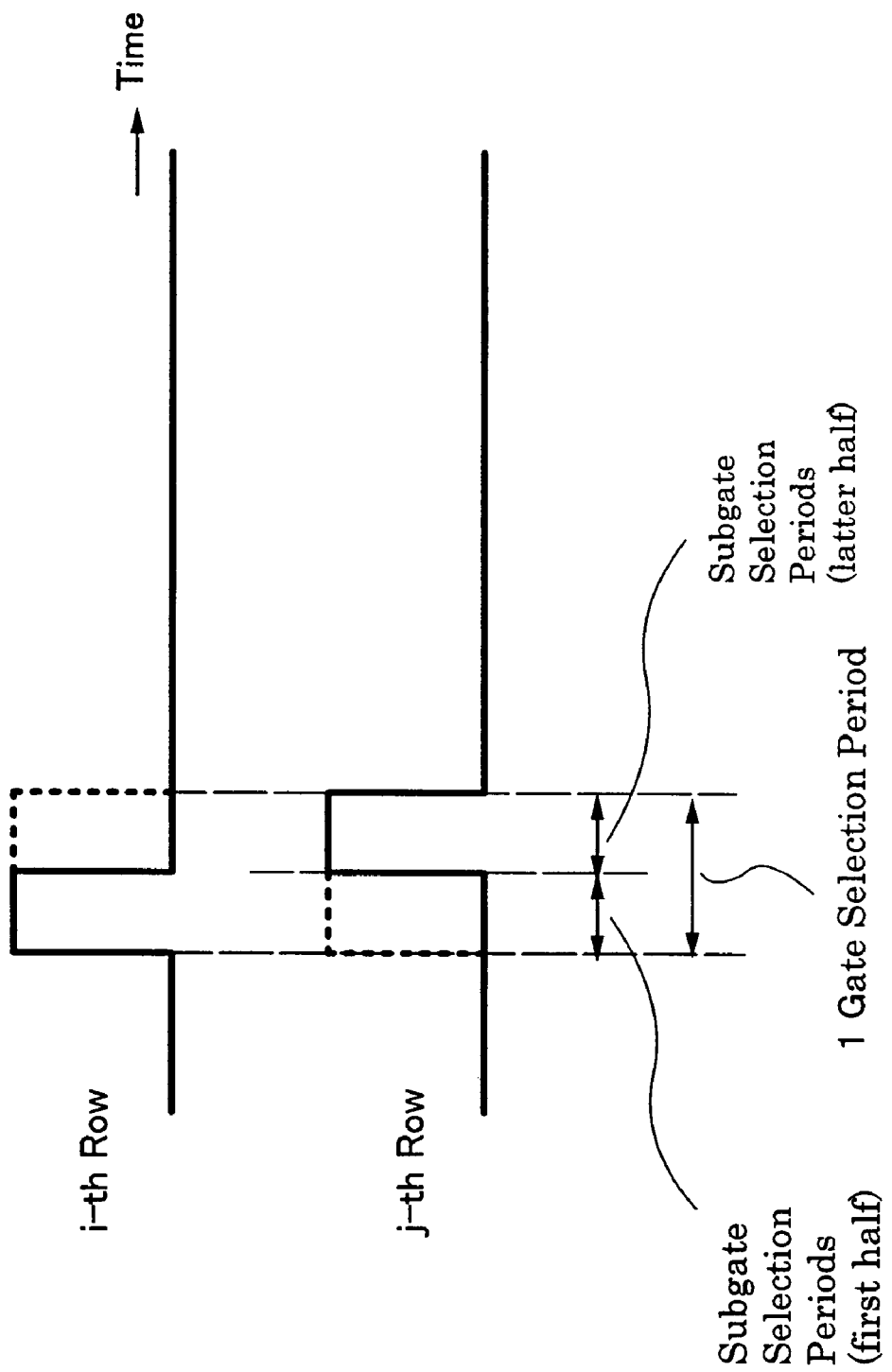
FIG. 43 is a diagram showing an example of a timing chart for selecting two rows in one gate selection period.

As another method, the driving method such as shown in FIG. 44 can be realized by using the pixel configuration of FIG. 38. In this case, a method where one gate selection period is divided into a plurality of subgate selection periods is used. First, as shown in FIG. 43, one gate selection period is divided into a plurality of (two in FIG. 43) subgate selection periods. Then, each scan line is selected by increasing a potential of each scan line in each subgate selection period, and each corresponding signal (either a video signal or an erase signal) is input to the signal line 3815. For example, when signals are input to pixels in the i-th row and signals are erased from pixels in the j-th row, in one gate selection period, the i-th row is selected in the first half of the subgate selection period, and the j-th row is selected in the latter half of the subgate selection period. When the i-th row is selected, video signals to be input to the pixels in the i-th row are input to the signal line 3815. On the other hand, when the j-th row is selected, signals for turning off each driving transistor of the pixels in the j-th row are input to the signal line 3815. Thus, the operation can be performed as if the two rows are selected at the same time and the signal writing operation and the signal erasing operation are performed in one gate selection period.

Note that details of such a driving method are described in, for example, Japanese Published Patent Application No. 2001-324958 and the like, which can be applied in combination with this application.

Note that FIGS. 45 to 47 show examples where a plurality of scan lines is provided; however, a plurality of signal lines may be provided, or a plurality of power supply lines corresponding to the first power supply line in each of FIGS. 45 to 47 may be provided.

Note that the timing charts, the pixel configurations, and the driving methods shown in this embodiment mode are examples, and the invention is not limited thereto.

The invention can be applied to various timing charts, pixel configurations, and driving methods. Further, in the pixel configuration shown in this embodiment mode, polarity of each transistor is not limited.

Note that in this embodiment mode, a lighting period, a signal writing period, and a non-lighting period are provided in one frame; however, the invention is not limited thereto and another operation period may be provided. For example, a so-called reverse bias period, which is a period when a voltage having polarity opposite to normal polarity is applied to a light emitting element, may be provided. By provision of the reverse bias period, reliability of the light emitting element is improved in some cases.

Note that in the pixel configuration shown in this embodiment mode, a storage capacitor can be omitted by substituting parasitic capacitance of a transistor.

Note that the content described in this embodiment mode can be freely implemented in combination with the content described in Embodiment Modes 1 to 3.

Embodiment Mode 5

Figure 48:
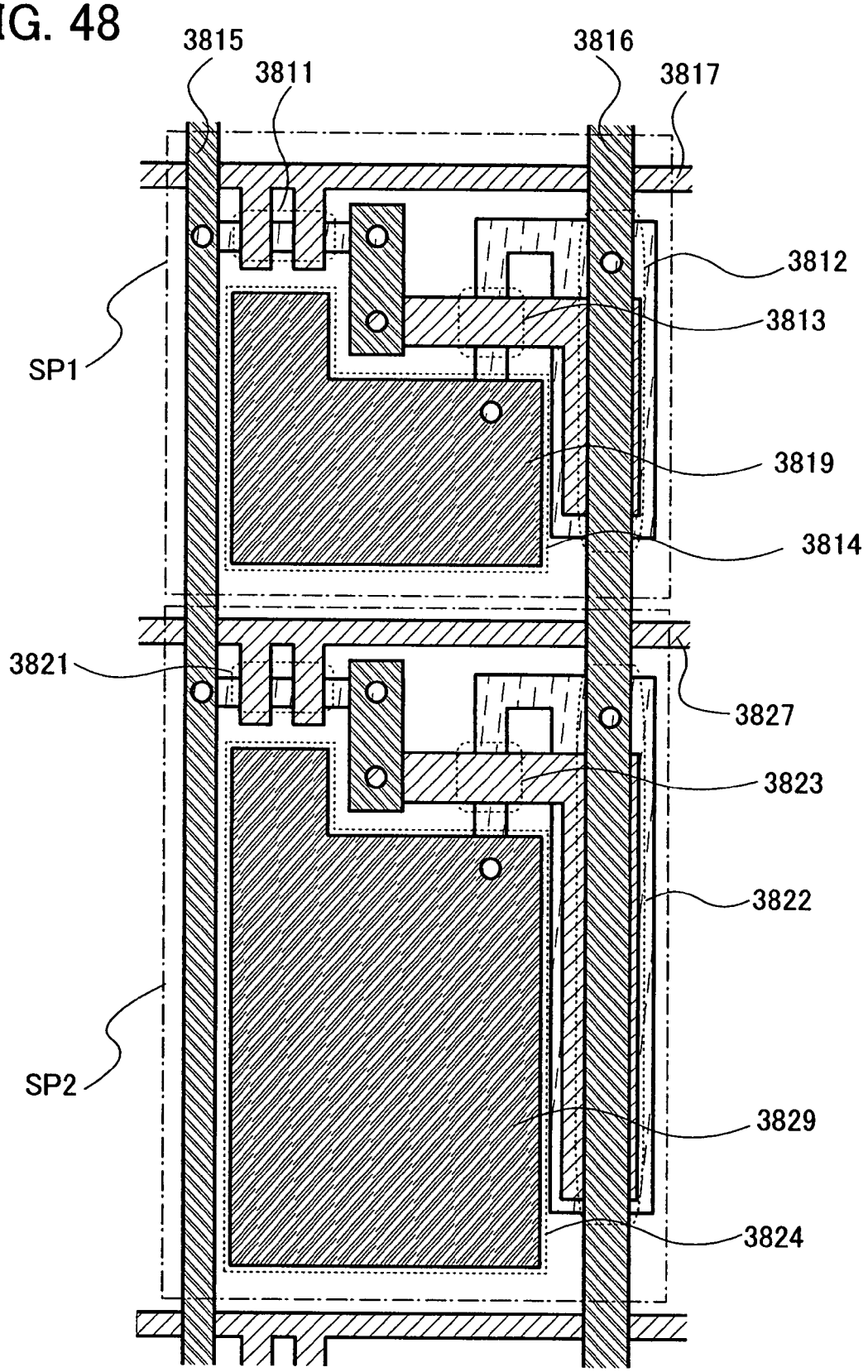
FIG. 48 is a diagram showing an example of a layout of a pixel portion of a display device using a driving method of the invention.

In this embodiment mode, a layout of a pixel in a display device of the invention is described. As an example, FIG. 48 shows a layout diagram of the pixel configuration shown in FIG. 38. Note that reference numerals used in FIG. 48 correspond to the reference numerals used in FIG. 38. Note that the invention is not limited to the layout of FIG. 48.

In the layout diagram shown in FIG. 48, the first and second selection transistors 3811 and 3821, the first and second driving transistors 3813 and 3823, the first and second storage capacitors 3812 and 3822, an electrode 3819 of the first light emitting element 3814, an electrode 3829 of the second light emitting element 3824, the signal line 3815, the first power supply line 3816, and the first and second scan lines 3817 and 3827 are provided. An area ratio of the electrode 3819 of the first light emitting element 3814 to the electrode 3829 of the second light emitting element 3824 is 1:2.

The signal line 3815 and the first power supply line 3816 are formed of a second wiring. The first and second scan lines 3817 and 3827 are formed of a first wiring.

When a transistor has a top gate structure, films are formed in order of a substrate, a semiconductor layer, a gate insulating film, a first wiring, an interlayer insulating film, and a second wiring. When a transistor has a bottom gate structure, films are formed in order of a substrate, a first wiring, a gate insulating film, a semiconductor layer, an interlayer insulating film, and a second wiring.

Figure 49:
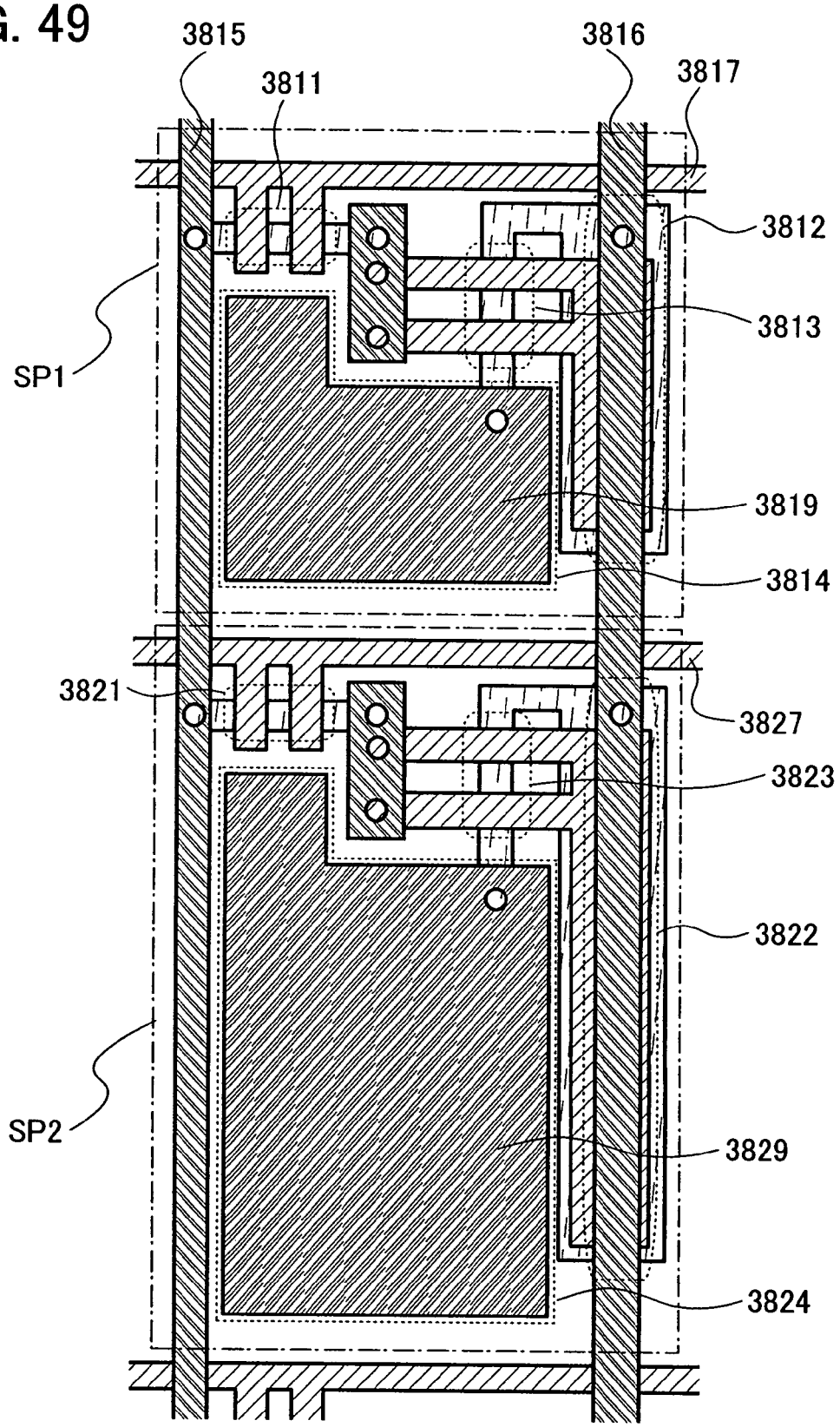
FIG. 49 is a diagram showing an example of a layout of a pixel portion of a display device using a driving method of the invention.

Note that the first and second selection transistors 3811 and 3821, and the first and second driving transistors 3813 and 3823 can have various structures. For example, a multi-gate structure may be used in which two or more gate electrodes are provided. In a multi-gate structure, a structure is such that channel regions are connected in series; therefore, the structure is such that a plurality of transistors is connected in series. FIG. 49 shows a layout diagram of the first and second driving transistors 3813 and 3823 having a multi-gate structure. By having a multi-gate structure, an off current can be reduced, reliability can be improved by improvement in withstand voltage of the transistors, and the transistors can have flat characteristics even if a drain-source voltage changes when operating in a saturation region, since a drain-source current does not change much. Alternatively, the transistors may have a structure where gate electrodes are provided over and under a channel. By having a structure where gate electrodes are provided over and under a channel, the amount of current is increased since the number of channel regions is increased, and an S-value can be reduced since a depletion layer is easily formed. When gate electrodes are provided over and under a channel, the structure is such that a plurality of transistors is connected in parallel. Alternatively, the transistor may have a structure where a gate electrode is provided over or under a channel; a forward staggered structure; a reverse staggered structure; or a structure where a channel region is divided into a plurality of regions and the divided regions may be connected in parallel or in series. Further alternatively, a source electrode or a drain electrode may overlap with the channel (or a part thereof). By having a structure where a source electrode or a drain electrode overlaps with the channel (or a part thereof), an unstable operation due to accumulation of electric charge in a part of the channel can be prevented. Further, an LDD region may be provided. By providing an LDD region, an off current can be reduced, reliability can be improved by improvement in withstand voltage of the transistors, and the transistors can have flat characteristics even if a drain-source voltage changes when operating in a saturation region, since a drain-source current does not change much.

Note that a wiring and an electrode are formed to contain one or a plurality of elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); a compound or an alloy material containing one or a plurality of elements selected from the foregoing group (e.g., indium tin oxide (ITO), indium zinc oxide (IZO), indium tin oxide to which silicon oxide is added (in this specification, referred to as ITSO), zinc oxide (ZnO), aluminum-neodymium (Al—Nd), magnesium-silver (Mg—Ag), or the like); a substance in which two or more of these compounds are combined; or the like. Alternatively, a wiring and an electrode are formed to include a compound (silicide) of the aforementioned elements and silicon (e.g., aluminum-silicon, molybdenum-silicon, nickel-silicide, or the like), or a compound of the aforementioned elements and nitrogen (e.g., titanium nitride, tantalum nitride, molybdenum nitride, or the like). Note that silicon (Si) may contain a large amount of n-type impurities (such as phosphorous) or p-type impurities (such as boron). By containing such impurities, conductivity can be improved and silicon can be easily used as a wiring or an electrode since it acts in a similar manner to a regular conductor. In addition, silicon may be single crystalline, polycrystalline (polysilicon), or amorphous (amorphous silicon). By using single crystalline silicon or polycrystalline silicon, resistance can be decreased. By using amorphous silicon, a manufacturing process can be simplified. Note that since aluminum and silver have high conductivity, signal delay can be reduced and microfabrication can be performed since etching is easily performed. Since copper has high conductivity, signal delay can be reduced. Molybdenum is preferable since it can be manufactured without causing defective materials even if it is in contact with an oxide semiconductor such as ITO or IZO, or silicon, and also, etching is easily performed, and molybdenum has high heat resistance. Note that titanium is preferable since titanium can be manufactured without causing defective materials even if it is in contact with an oxide semiconductor such as ITO or IZO, or silicon, and it has high heat resistance. Further, tungsten and neodymium are preferable since they have high heat resistance. In particular, an alloy of neodymium and aluminum is preferable since heat resistance is improved and hillocks are not easily formed in aluminum. Silicon is preferable since it can be formed at the same time as a semiconductor layer included in a transistor, and it has high heat resistance. Note that indium tin oxide (ITO), indium zinc oxide (IZO), indium tin oxide to which silicon oxide is added (ITSO), zinc oxide (ZnO), and silicon (Si) have light transmitting properties; therefore, they are preferable since they can be used in a portion where light is transmitted. For example, they can be used for a pixel electrode and a common electrode.

Note that the aforementioned materials may have a single-layer structure or a stacked-layer structure to form a wiring and an electrode. By forming a wiring and an electrode in a single-layer structure, a manufacturing process can be simplified, the number of days required for the process can be reduced, and cost can be reduced. By having a stacked-layer structure, a wiring and an electrode with good performance can be formed by using the advantage and reducing the disadvantage of each material. For example, when a material with low resistance (such as aluminum) is included in a stacked-layer structure, low resistance of a wiring can be realized. When a material having high heat resistance is included, for example, a stacked-layer structure is employed, in which a material having low heat resistance but having another advantage is interposed between the materials having high heat resistance, and thereby, heat resistance of a wiring or an electrode as a whole can be increased. For example, a stacked-layer structure where a layer containing aluminum is interposed between layers containing molybdenum or titanium is preferable. Further, when there is a portion of the wiring or the electrode in direct contact with a wiring or an electrode of a different material, the wirings or electrodes may adversely affect each other. For example, if one material goes into the other material and changes properties of the other material, an intended purpose is prevented from being achieved, or a problem which may inhibit normal manufacturing is caused in some cases. In such a case, the problems can be solved by interposing a certain layer between other layers or by covering the certain layer with another layer. For example, in order to make contact between indium tin oxide (ITO) and aluminum, it is preferable to interpose titanium or molybdenum therebetween. Further, in order to make contact between silicon and aluminum, it is preferable to interpose titanium or molybdenum therebetween.

Figure 50:
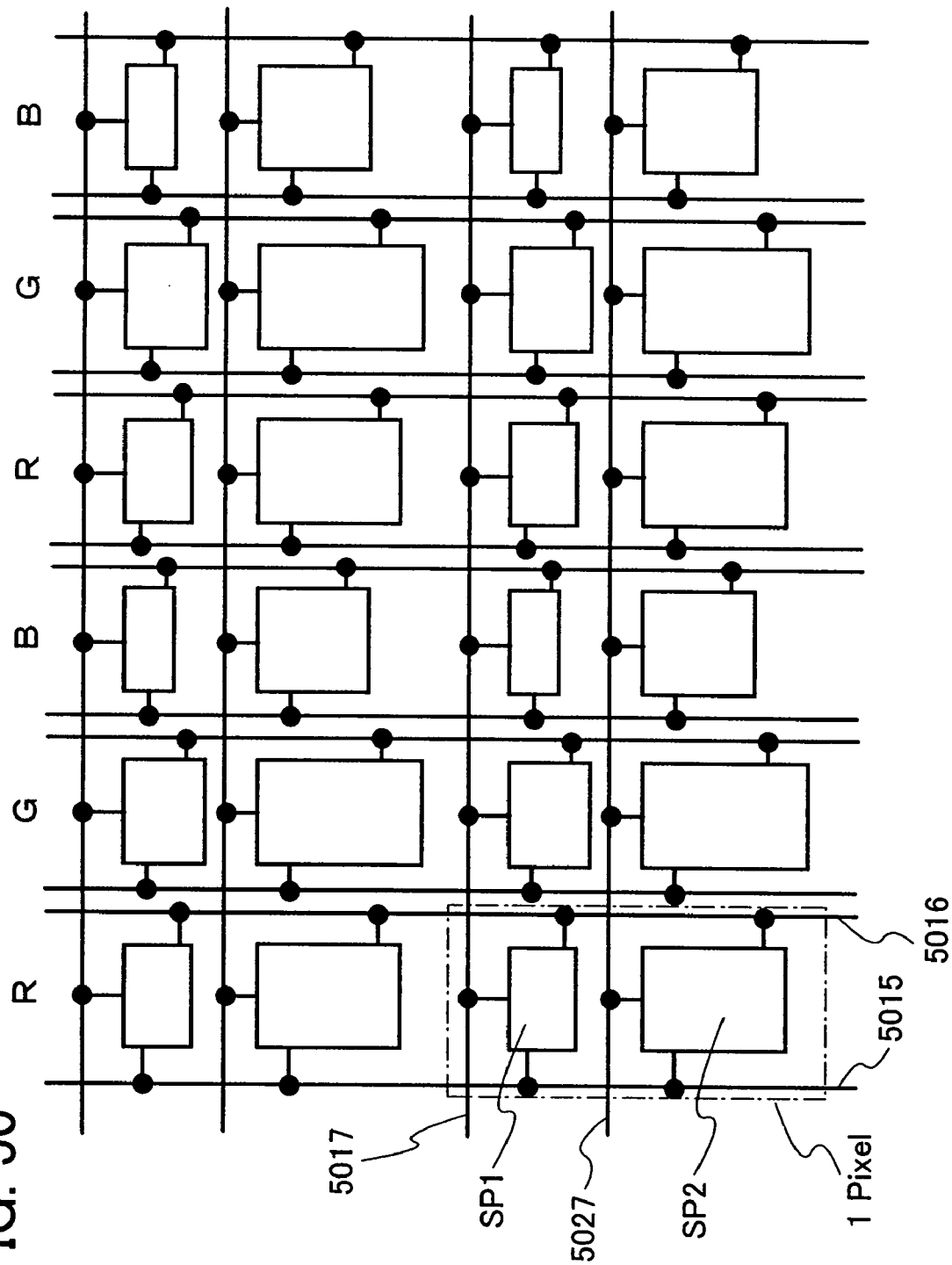
FIG. 50 is a diagram showing an example of a layout of a pixel portion of a display device using a driving method of the invention.

Note that the total light emission area of a pixel may be changed for each pixel of R (red), G (green), and B (blue). FIG. 50 shows an embodiment of this case.

In an example shown in FIG. 50, each pixel includes two subpixels and also includes a signal line 5015, a first power supply line 5016, and first and second scan lines 5017 and 5027. In FIG. 50, the size of the area of each subpixel corresponds to a light emission area of each subpixel.

In FIG. 50, the order of the total light emission area of a pixel, from largest to smallest, is G, R, and B. Accordingly, appropriate color balance of R, G and B can be realized; thus, it is possible to perform color display with higher definition. Further, power consumption can be reduced, and the life of a light emitting element can be extended.

Figure 51:
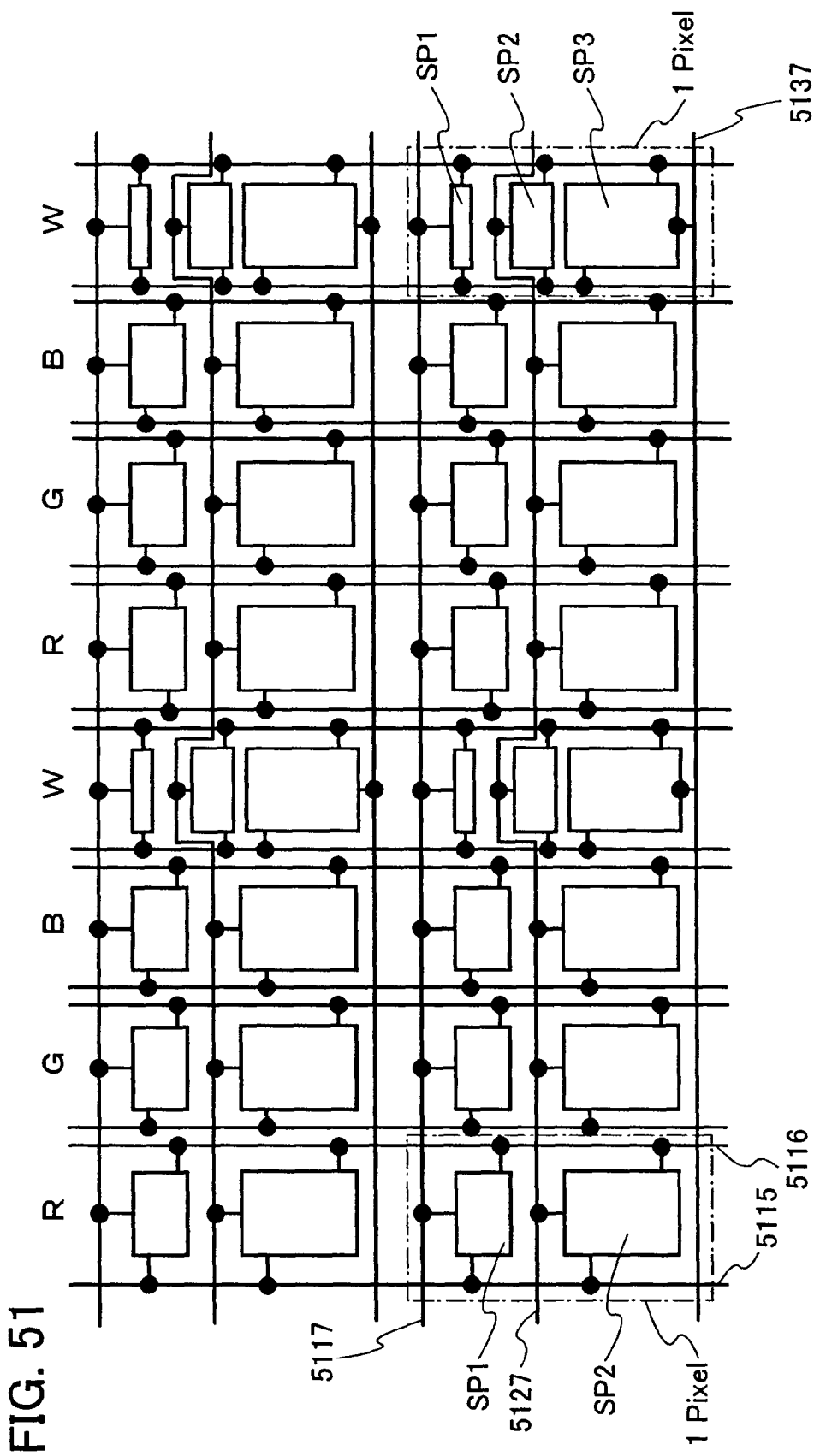
FIG. 51 is a diagram showing an example of a layout of a pixel portion of a display device using a driving method of the invention.

In addition, in a structure with R, G, B, and W (white) pixels, the number of subpixels in an RGB portion and the number of subpixels in a W portion may be different. FIG. 51 shows an embodiment of this case.

In an example shown in FIG. 51, the RGB portion is divided into two subpixels, and the W portion is divided into three subpixels. A signal line 5115, a first power supply line 5116, a first scan line 5117, a second scan line 5127, and a third scan line 5137 are included.

As shown in FIG. 51, the number of subpixels in the RGB portion and the number of subpixels in the W portion are different; thus, it is possible to perform white color display with higher definition.

Note that the content described in this embodiment mode can be freely implemented in combination with the content described in Embodiment Modes 1 to 4.

Embodiment Mode 6

In this embodiment mode, structures and operations of a signal line driver circuit, a scan line driver circuit, or the like in a display device are described. In this embodiment mode, a case where one pixel is divided into two subpixels (SP1, SP2) is described as an example.

Figure 52:
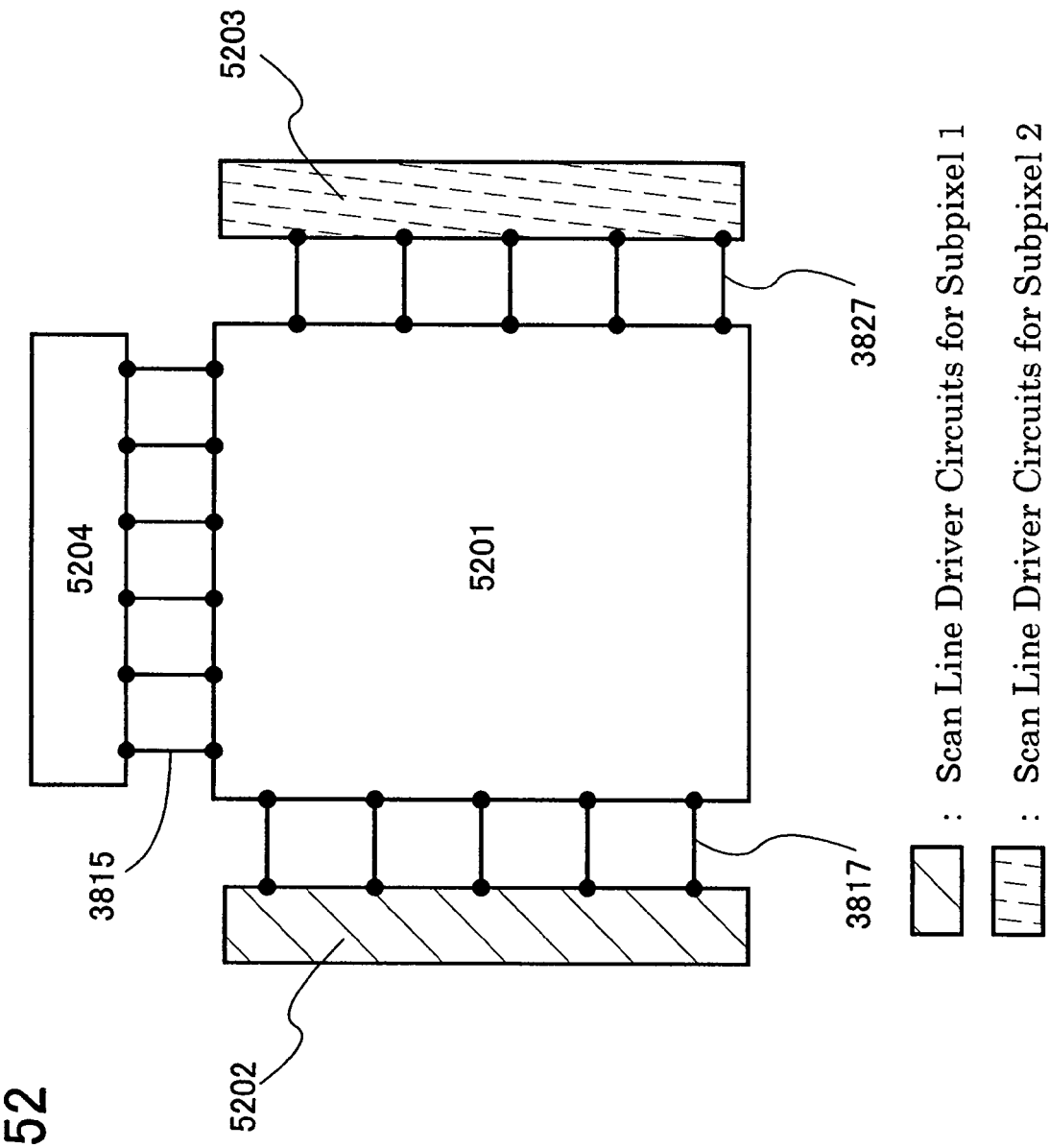
FIG. 52 is a diagram showing an example of a display device using a driving method of the invention.

First, a case where a period for writing a signal to a pixel and a lighting period are separated is described. Here, a case of using the pixel configuration of FIG. 38 is described as an example. FIG. 52 shows a structure example of a display device in this case.

The display device shown in FIG. 52 includes a pixel portion 5201, first and second scan line driver circuits 5202 and 5203, and a signal line driver circuit 5204.

The first scan line driver circuit 5202 and the first scan line 3817 are connected. The second scan line driver circuit 5203 and the second scan line 3827 are connected. The signal line driver circuit 5204 and the signal line 3815 are connected. Note that reference numerals which denote the first and second scan lines and the signal line correspond to the reference numerals used in FIG. 38.

First, the scan line driver circuit is described. The first scan line driver circuit 5202 sequentially outputs selection signals to the first scan line 3817 connected to the subpixel 1 (SP1). The second scan line driver circuit 5203 sequentially outputs selection signals to the second scan line 3827 connected to the subpixel 2 (SP2). Thus, the selection signals are written to SP1 and SP2. Note that, in general, when one pixel is divided into m subpixels (m is an integer of m≧2), m scan line driver circuits may be provided.

Figure 53:
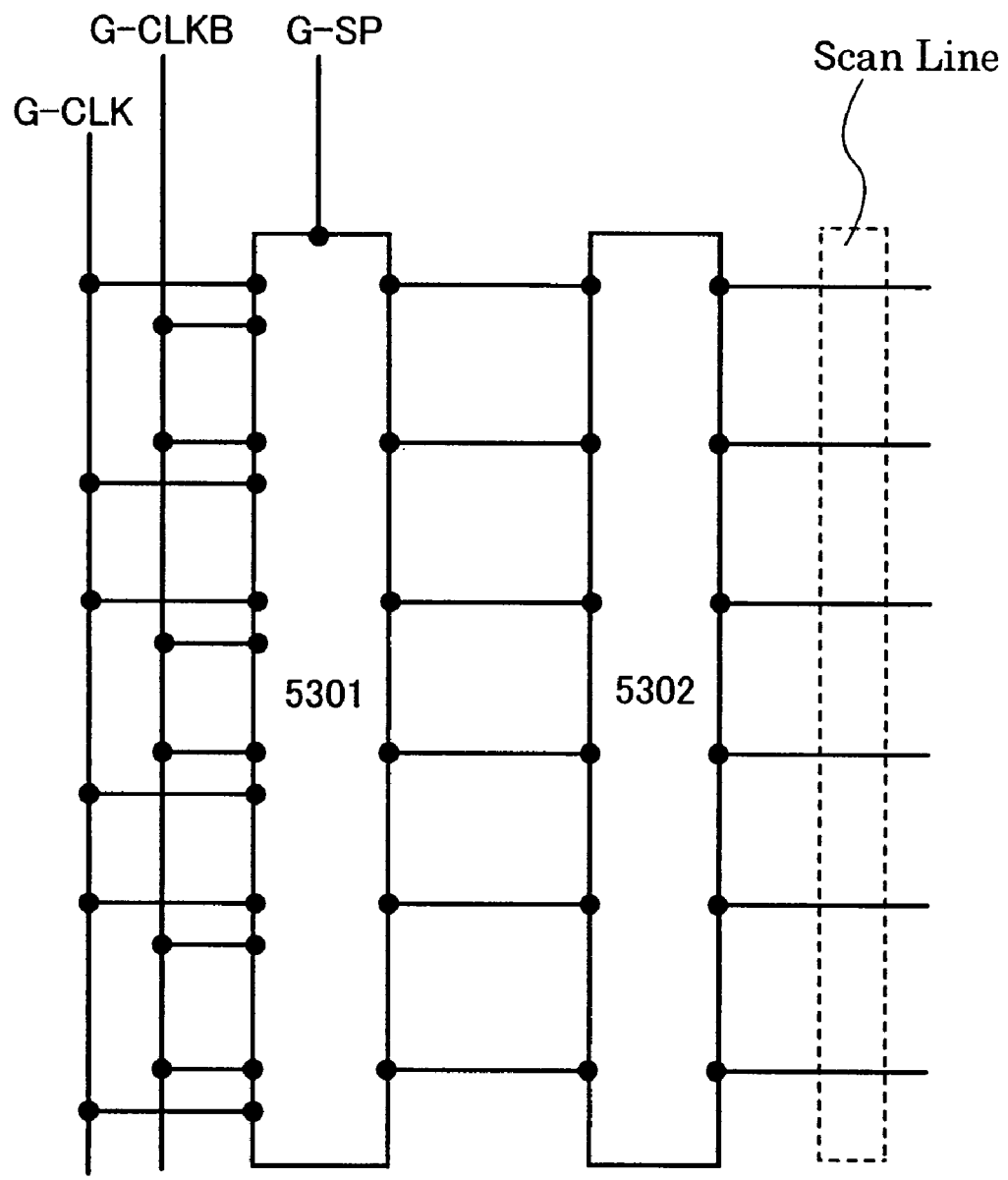
FIG. 53 is a diagram showing an example of a display device using a driving method of the invention.

FIG. 53 shows a structure example of the first and second scan line driver circuits 5202 and 5203. The scan line driver circuits 5202 and 5203 each include a shift register 5301, an amplifier circuit 5302, and the like.

Next, operations of the first and second scan line driver circuits 5202 and 5203 shown in FIG. 53 are briefly described. A clock signal (G-CLK), a start pulse (G-SP), and a clock inverted signal (G-CLKB) are input to the shift register 5301, and sampling pulses are sequentially output in accordance with the timing of these signals. The output sampling pulses are amplified by the amplifier circuit 5302 and input from each scan line to the pixel portion 5201.

Note that a buffer circuit or a level shifter circuit may be included in the amplifier circuit 5302. Further, a pulse width control circuit and the like may be included in the scan line driver circuit in addition to the shift register 5301 and the amplifier circuit 5302.

Next, the signal line driver circuit is described. The signal line driver circuit 5204 sequentially outputs video signals to the signal line 3815 connected to SP1 and SP2. The video signals output from the signal line driver circuit 5204 are input to the pixel portion 5201. An image is displayed in the pixel portion 5201 by control of a light emitting state of a pixel in accordance with the video signals.

Figure 54A:
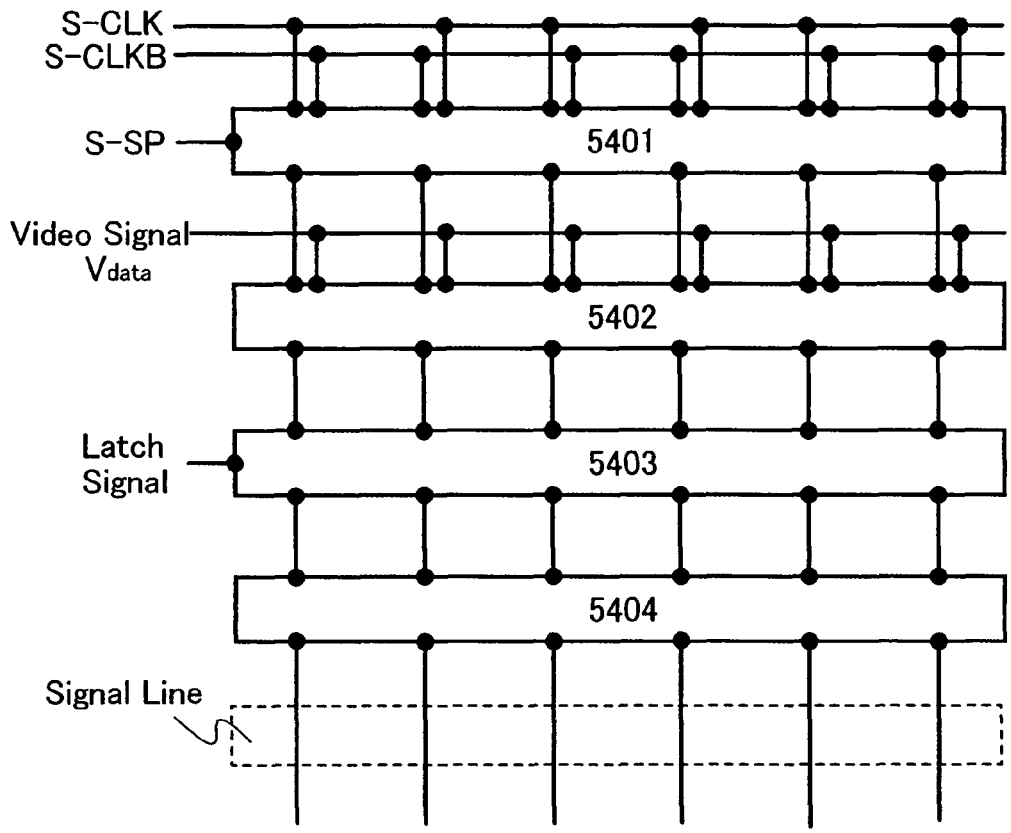
FIGS. 54A and 54B are diagrams each showing an example of a display device using a driving method of the invention.
Figure 54B:
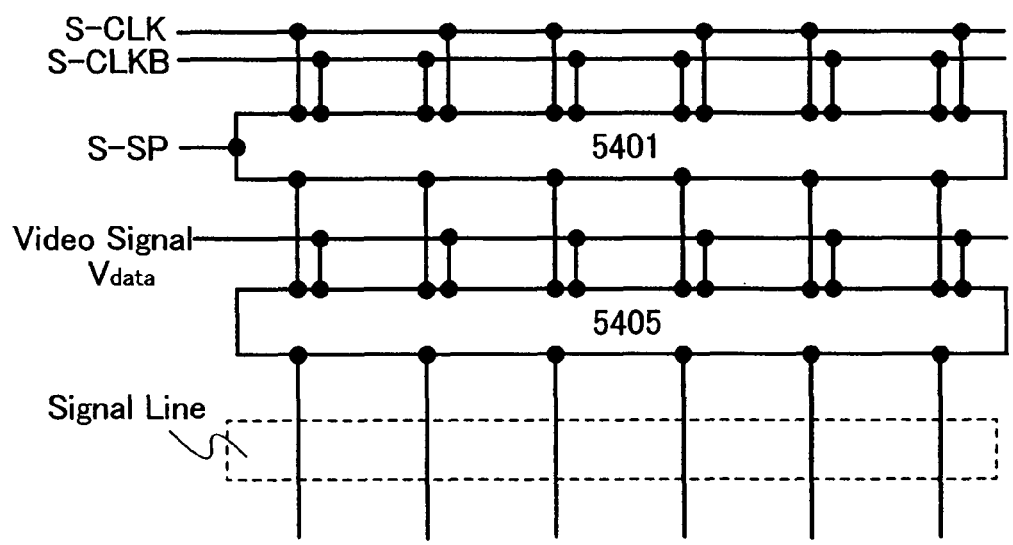

FIGS. 54A and 54B show a structure example of the signal line driver circuit 5204. FIG. 54A shows an example of the signal line driver circuit 5204 in a case where a signal is supplied to a pixel by line sequential driving. The signal line driver circuit 5204 in this case mainly includes a shift register 5401, a first latch circuit 5402, a second latch circuit 5403, an amplifier circuit 5404, and the like. Note that, the amplifier circuit 5404 may include a buffer circuit, a level shifter circuit, a circuit having a function of converting a digital signal into an analog signal, or a circuit having a function of performing gamma correction.

Further, the pixel may include a circuit which outputs a current (a video signal) to a light emitting element included in the pixel, in other words, a current source circuit.

Next, an operation of the signal line driver circuit 5204 shown in FIG. 54A is briefly described. A clock signal (S-CLK), a start pulse (S-SP), and a clock inverted signal (S-CLKB) are input to the shift register 5401, and sampling pulses are sequentially output in accordance with the timing of these signals.

The sampling pulses output from the shift register 5401 are input to the first latch circuit 5402. A voltage $V_{data}$ as a video signal is input to the first latch circuit 5402 from a video signal line, and the video signal is stored in each column in accordance with the timing of when the sampling pulses are input.

After storage of the video signal is completed to the last column in the first latch circuit 5402, a latch signal is input from a latch control line in a horizontal retrace period, and the video signal stored in the first latch circuit 5402 is transferred to the second latch circuit 5403 all at once. Thereafter, the video signals of one row, which have been stored in the second latch circuit 5403, are input to the amplifier circuit 5404 all at once. The amplitude of the video signal voltage $V_{data}$ is amplified by the amplifier circuit 5404, and the video signals are input from each signal line to the pixel portion 5201.

The video signal held in the second latch circuit 5403 is input to the amplifier circuit 5404, and while the video signal is input to the pixel portion 5201, the shift register 5401 outputs a sampling pulse again. In other words, two operations are performed at the same time. Thus, line sequential driving can be realized. Thereafter, the above operations is repeated.

Note that a signal is supplied to a pixel by dot sequential driving in some cases.

FIG. 54B shows an example of the signal line driver circuit 5204 in this case. The signal line driver circuit 5204 in this case includes the shift register 5401, a sampling circuit 5405, and the like. Sampling pulses are output from the shift register 5401 to the sampling circuit 5405. A voltage $V_{data}$ as a video signal is input to the sampling circuit 5405 from a video signal line, and the video signals are sequentially output to the pixel portion 5201 in accordance with the sampling pulses. Thus, dot sequential driving can be realized.

Note that the signal line driver circuit or a part thereof (such as the current source circuit or the amplifier circuit) is not provided over the same substrate as the pixel portion 5201 in some cases, and may be formed using, for example, an external IC chip.

By using the scan line driver circuit and the signal line driver circuit as described above, the driving in the case where a period for writing a signal to a pixel and a lighting period are separated can be realized.

Note that a plurality of scan line driver circuits is provided in the display device shown in FIG. 52; however, a plurality of signal line driver circuits may be provided depending on a pixel configuration. For example, FIG. 55 shows a structure example of a display device in a case where the pixel configuration shown in FIG. 39 is used.

Figure 55:
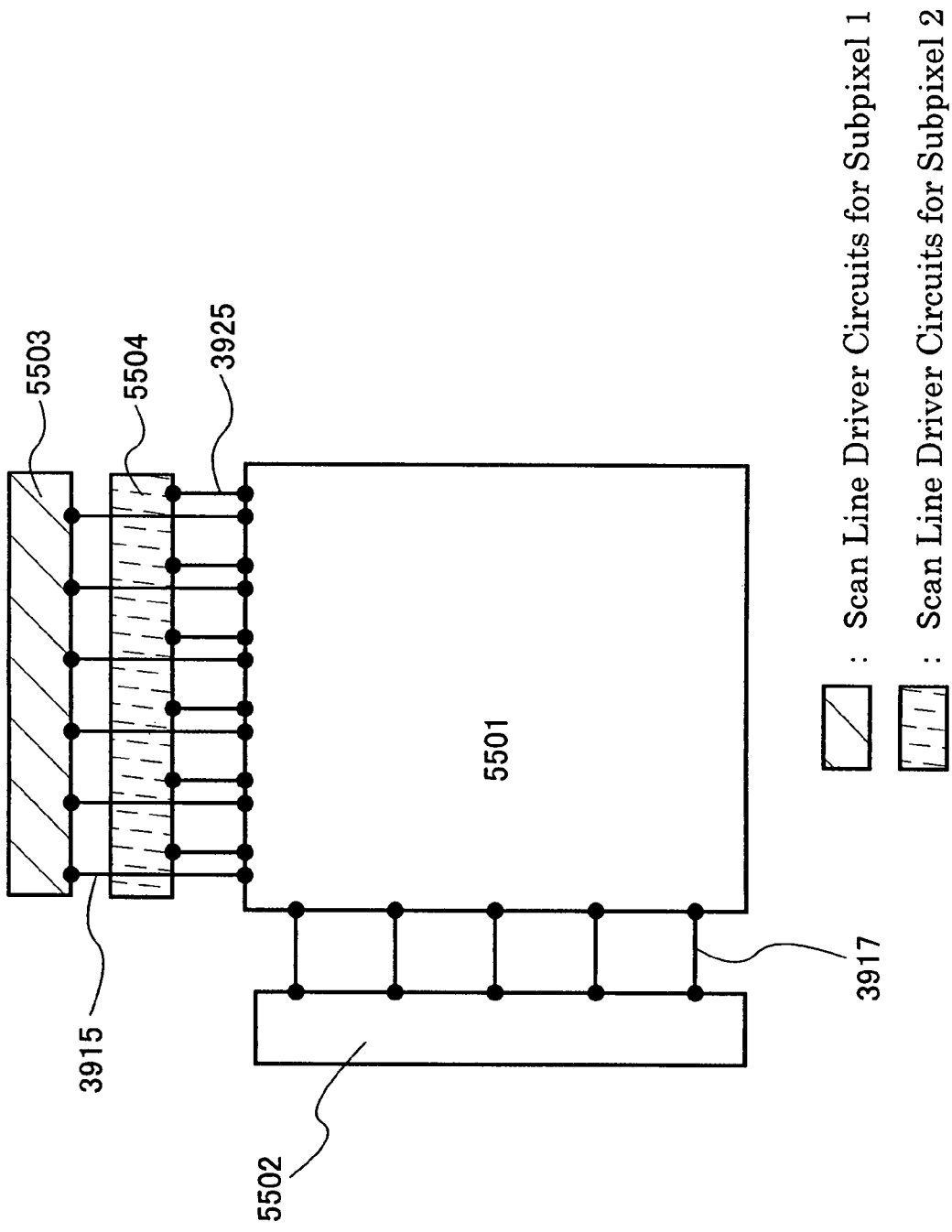
FIG. 55 is a diagram showing an example of a display device using a driving method of the invention.

The display device shown in FIG. 55 includes a pixel portion 5501, a scan line driver circuit 5502, and first and second signal line driver circuits 5503 and 5504. The scan line driver circuit 5502 is connected to the scan line 3917. The first signal line driver circuit 5503 and the first signal line 3915 are connected. The second signal line driver circuit 5504 and the second signal line 3925 are connected. Note that reference numerals which denote the first and second signal lines and the scan line correspond to the reference numerals used in FIG. 39. In addition, structures of the first and second signal line driver circuits 5503 and 5504 and the scan line driver circuit 5502 are similar to those described in FIGS. 53 and 54; therefore, description thereof is omitted.

The scan line driver circuit 5502 sequentially outputs selection signals to the first scan line 3917 connected to SP1 and SP2. Thus, the selection signals are written to SP1 and SP2.

The first signal line driver circuit 5503 sequentially outputs video signals to the first signal line 3915 connected to SP1. The video signals output from the first signal line driver circuit 5503 are input to SP1. Further, the second signal line driver circuit 5504 sequentially outputs video signals to the second signal line 3925 connected to SP2. The video signals output from the second signal line driver circuit 5504 are input to SP2. An image is displayed in the pixel portion 5501 by control of a light emitting state of a pixel in accordance with the video signals. Note that, in general, when one pixel is divided into m subpixels (m is an integer of m≧2), m signal line driver circuits may be provided.

By using the scan line driver circuit and the signal line driver circuit as described above, the driving in the case where a period for writing a signal to a pixel and a lighting period are separated can be realized.

Figure 56:
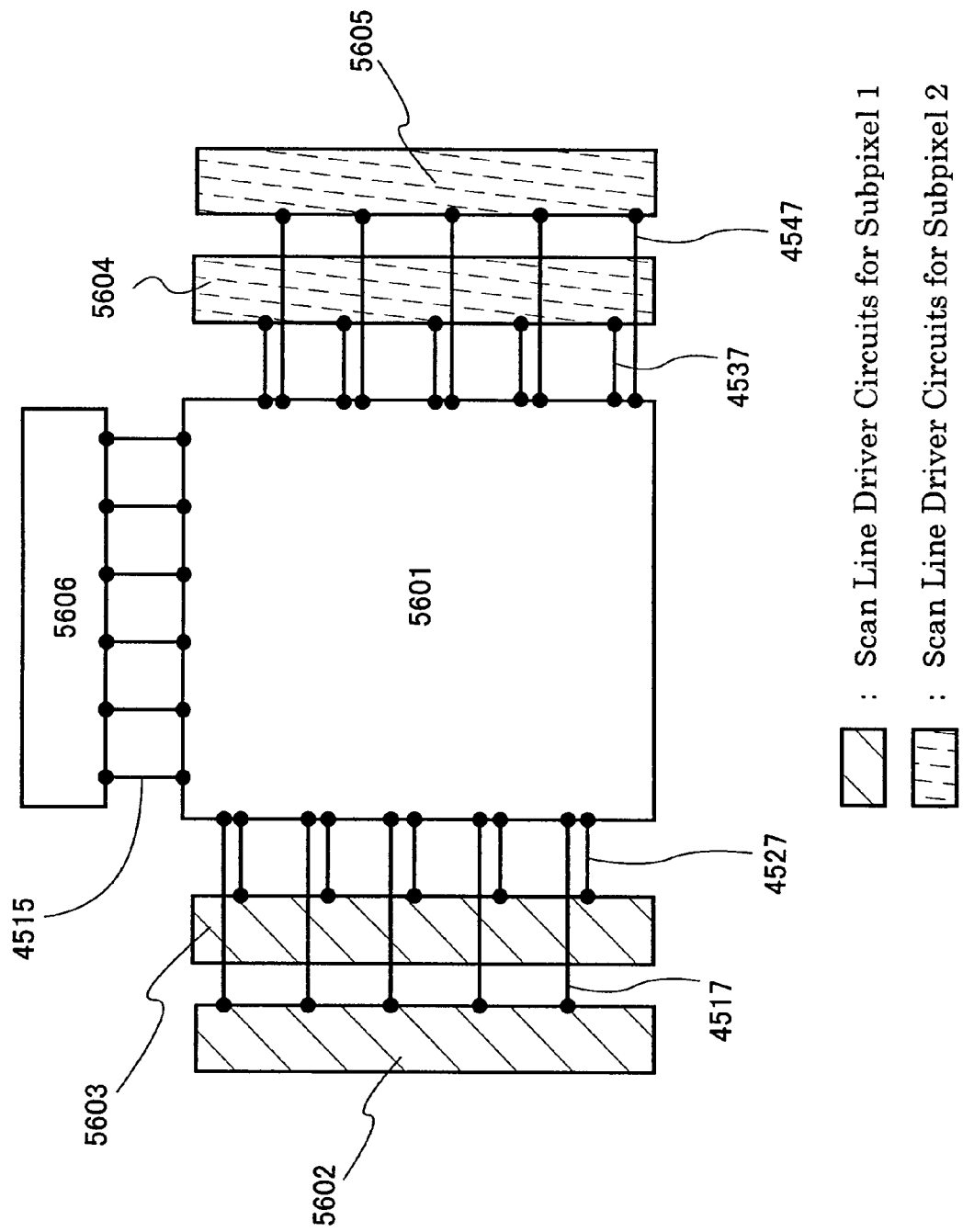
FIG. 56 is a diagram showing an example of a display device using a driving method of the invention.

Next, a case is described in which an operation of erasing a signal of a pixel is performed. Here, for a pixel configuration, a case of using the pixel configuration shown in FIG. 45 is described as an example. FIG. 56 shows a structure example of a display device in this case.

The display device shown in FIG. 56 includes a pixel portion 5601, first to fourth scan line driver circuits 5602 to 5605, and a signal line driver circuit 5606. The first scan line driver circuit 5602 and the first scan line 4517 are connected. The second scan line driver circuit 5603 and the second scan line 4527 are connected. The third scan line driver circuit 5604 and the third scan line 4537 are connected. The fourth scan line driver circuit 5605 and the fourth scan line 4547 are connected. The signal line driver circuit 5606 and the signal line 4515 are connected. Note that reference numerals which denote the first to fourth scan lines and the signal line correspond to the reference numerals used in FIG. 45. In addition, structures of the first to fourth scan line driver circuits 5602 to 5605 and the signal line driver circuit 5606 are similar to those described in FIGS. 53 and 54; therefore, description thereof is omitted.

The first and second scan line driver circuits 5602 and 5603 drive the first and second scan lines 4517 and 4527 connected to SP1. The first scan line driver circuit 5602 sequentially outputs selection signals to the first scan line 4517 connected to SP1. The second scan line driver circuit 5603 sequentially outputs erase signals to the second scan line 4527 connected to SP1. Thus, the selection signals and the erase signals are written to SP1.

Similarly, the third and fourth scan line driver circuits 5604 and 5605 drive the third and fourth scan lines 4537 and 4547 connected to SP2. The third scan line driver circuit 5604 sequentially outputs selection signals to the third scan line 4537 connected to SP2. The fourth scan line driver circuit 5605 sequentially outputs erase signals to the fourth scan line 4547 connected to SP2. Thus, the selection signals and the erase signals are written to SP2.

The scan line driver circuit 5606 sequentially outputs video signals to the signal line 4515 connected to SP1 and SP2. The video signals output from the signal line driver circuit 5606 are input to the pixel portion 5601.

By using the scan line driver circuits and the signal line driver circuit described above, the driving in the case where the operation of erasing a signal of a pixel is performed can be realized.

Note that structures of a display device, a signal line driver circuit, a scan line driver circuit, and the like are not limited to those shown in FIGS. 52 to 56.

Note that a transistor in the invention can be any type of transistors and formed over any substrate. Therefore, all the circuits shown in FIGS. 52 to 56 may be formed over a glass substrate or a plastic substrate, using a single crystalline substrate or an SOI substrate, or the like. Alternatively, a part of the circuits in FIGS. 52 to 56 may be formed over one substrate, and the other part of the circuits in FIGS. 52 to 56 may be formed over another substrate. In other words, it is not necessary that all the circuits in FIGS. 52 to 56 are formed over the same substrate. For example, in FIGS. 52 to 56, the pixel portion and the scan line driver circuit may be formed over a glass substrate by using transistors, and the signal line driver circuit (or a part thereof) may be formed using a single crystalline substrate, and then an IC chip may be connected by COG (Chip On Glass) to be provided over a glass substrate. Alternatively, the IC chip may be connected to the glass substrate by TAB (Tape Auto Bonding) or using a printed wiring board. In this manner, when a part of the circuits is formed over the same substrate, the number of components can be reduced to reduce cost, and the number of connections to circuit components can be reduced to improve reliability. In addition, when a portion with a high driving voltage or a portion with high driving frequency which consumes large power is formed over another substrate, power consumption can be suppressed.

Note that the content described in this embodiment mode can be freely implemented in combination with the content described in Embodiment Modes 1 to 5.

Embodiment Mode 7

In this embodiment mode, a display panel used for a display device of the invention is described with reference to FIGS. 57A and 57B and the like. FIG. 57A is a top view showing a display panel. FIG. 57B is a cross-sectional view along a line A-A' of FIG. 57A. A signal line driver circuit 5701, a pixel portion 5702, a first scan line driver circuit 5703, and a second scan line driver circuit 5706, which are indicated by dotted lines, are included. A sealing substrate 5704 and a sealing material 5705 are also included, and a space surrounded by the sealing material 5705 is a space 5707.

A wiring 5708 transmits signals input to the first scan line driver circuit 5703, the second scan line driver circuit 5706, and the signal line driver circuit 5701, and receives video signals, clock signals, start signals, and the like from an FPC 5709 to be an external input terminal. An IC chip (a semiconductor chip in which a memory circuit, a buffer circuit, and the like are formed) 5719 is mounted over a junction of the FPC 5709 and the display panel by COG (Chip On Glass) or the like. Note that only the FPC is shown in the figure; however, a printed wiring board (PWB) may be attached to the FPC.

Next, a cross-sectional structure is described with reference to FIG. 57B. The pixel portion 5702 and peripheral driver circuits (the first scanning line driver circuit 5703, the second scanning line driver circuit 5706, and the signal line driver circuit 5701) are formed over a substrate 5710. Here, the signal line driver circuit 5701 and the pixel portion 5702 are shown.

Note that the signal line driver circuit 5701 is formed using a plurality of transistors such as a transistor 5720 and a transistor 5721. In this embodiment mode, a display panel in which the peripheral driver circuits are formed over the same substrate is described; however, it is not always necessary, and all or a part of the peripheral driver circuits may be formed in an IC chip or the like and mounted by COG or the like.

In addition, the pixel portion 5702 includes a plurality of circuits forming a pixel including a selection transistor 5711 and a driving transistor 5712. Note that a source electrode of the driving transistor 5712 is connected to a first electrode 5713. An insulator 5714 is formed to cover an end portion of the first electrode 5713. Here, a positive photosensitive acrylic resin film is used.

In addition, for good coverage, a curved surface having curvature is formed at an upper end portion or a lower end portion of the insulator 5714. For example, when positive photosensitive acrylic is used as a material for the insulator 5714, a curved surface having a curvature radius (0.2 to 3 μm) is preferably provided only at the upper end portion of the insulator 5714. Further, as the insulator 5714, either negative photosensitive acrylic to be insoluble in etchant by light irradiation or positive photosensitive acrylic to be soluble in etchant by light irradiation can be used.

A layer 5716 containing an organic compound and a second electrode 5717 are formed over the first electrode 5713. Here, as a material used for the first electrode 5713 functioning as an anode, a material with a high work function is preferably used.

For example, a single layer film such as an ITO (indium tin oxide) film, an indium zinc oxide (IZO) film, a titanium nitride film, a chromium film, a tungsten film, a Zn film, or a Pt film; a stacked-layer structure of a titanium nitride film and a film containing aluminum as its main component; a three-layer structure of a titanium nitride film, a film containing aluminum as its main component, and a titanium nitride film, and the like can be used. Note that in a case of a stacked-layer structure, resistance for a wiring is low, good ohmic contact is obtained, and a function as an anode can be obtained.

The layer 5716 containing the organic compound is formed by a vapor deposition method using a vapor deposition mask or by an ink-jet method. A metal complex using a metal from group 4 of the periodic table is used for a part of the layer 5716 containing the organic compound, and a low molecular weight material or a high molecular weight material may be used in combination. Further, for a material used for the layer containing the organic compound, a single layer or a stacked layer of an organic compound is often used; however, in this embodiment, an inorganic compound may be used in a part of a film formed of an organic compound. Moreover, a known triplet material can also be used.

Further, as a material used for the second electrode 5717, which is a cathode, formed over the layer 5716 containing the organic compound, a material with a low work function (Al, Ag, Li, Ca, or an alloy thereof such as MgAg, MgIn, AlLi, $CaF_2$, or calcium nitride) may be used. Note that when light generated in the layer 5716 containing the organic compound is transmitted through the second electrode 5717, a stacked-layer structure of a metal thin film and a transparent conductive film (ITO (indium tin oxide), an indium oxide-zinc oxide alloy ($In_2O_3$—ZnO), zinc oxide (ZnO), or the like) is preferably used as the second electrode 5717.

In addition, the sealing substrate 5704 is attached to the substrate 5710 by the sealing material 5705 to have a structure provided with a light emitting element 5718 in the space 5707 surrounded by the substrate 5710, the sealing substrate 5704, and the sealing material 5705. Note that the space 5707 may be filled with the sealing material 5705 or with an inert gas (such as nitrogen or argon).

Note that an epoxy-based resin is preferably used for the sealing material 5705.

Further, it is preferable that these materials transmit as little moisture or oxygen as possible. In addition, as a material used for the sealing substrate 5704, a plastic substrate formed using FRP (Fiberglass-Reinforced Plastics), PVF (polyvinyl fluoride), Mylar (a registered trademark), polyester, acrylic, or the like as well as a glass substrate or a quartz substrate can be used.

As described above, a display panel having a pixel configuration of the invention can be obtained.

As shown in FIGS. 57A and 57B, the signal line driver circuit 5701, the pixel portion 5702, the first scan line driver circuit 5703, and the second scan line driver circuit 5706 are formed over the same substrate, and thereby, reduction in cost of the display device can be realized. Further, when unipolar transistors are used for the signal line driver circuit 5701, the pixel portion 5702, the first scan line driver circuit 5703, and the second scan line driver circuit 5706, simplification of a manufacturing process can be realized, and thereby, further cost reduction can be realized. When amorphous silicon is employed as semiconductor layers of transistors used for the signal line driver circuit 5701, the pixel portion 5702, the first scan line driver circuit 5703, and the second scan line driver circuit 5706, further cost reduction can be realized.

Note that the structure of the display panel is not limited to the structure shown in FIG. 57A, in which the signal line driver circuit 5701, the pixel portion 5702, the first scan line driver circuit 5703, and the second scan line driver circuit 5706 are formed over the same substrate, and a signal line driver circuit corresponding to the signal line driver circuit 5701 may be formed over an IC chip and mounted on the display panel by COG or the like.

That is, only the signal line driver circuit of which high speed operation is required is formed into an IC chip using a CMOS or the like, and thereby, lower power consumption is realized. Further, when a semiconductor chip formed of a silicon wafer or the like is used as the IC chip, higher speed operation and lower power consumption can be achieved.

Cost reduction can be realized by forming the scan line driver circuits and the pixel portion over the same substrate. Note that when unipolar transistors are used for the scan line driver circuits and the pixel portion, further cost reduction can be realized. As a structure of a pixel included in the pixel portion, the structures shown in Embodiment Mode 4 can be employed. When amorphous silicon is used for semiconductor layers of transistors, the manufacturing process can be simplified, and further cost reduction can be realized.

As described above, cost reduction of a high-definition display device can be realized. Further, by mounting an IC chip including a functional circuit (memory or buffer) over the junction of the FPC 5709 and the substrate 5710, a substrate area can be effectively utilized.

Further, a signal line driver circuit, first and second scan line driver circuits which correspond to the signal line driver circuit 5701, and the first scan line driver circuit 5703, and the second scan line driver circuit 5706 in FIG. 57A may be formed over an IC chip and mounted on a display panel by COG or the like. In this case, reduction in power consumption of a high-definition display device can be realized.

Accordingly, in order to obtain a display device with less power consumption, polysilicon is preferably used for semiconductor layers of transistors used in the pixel portion.

In addition, when amorphous silicon is used for semiconductor layers of transistors in the pixel portion 5702, further cost reduction can be realized. Moreover, a large display panel can be manufactured as well.

Note that the signal line driver circuit and the scan line driver circuit are not limited to being provided in a row direction and a column direction of the pixels.

Figure 58:
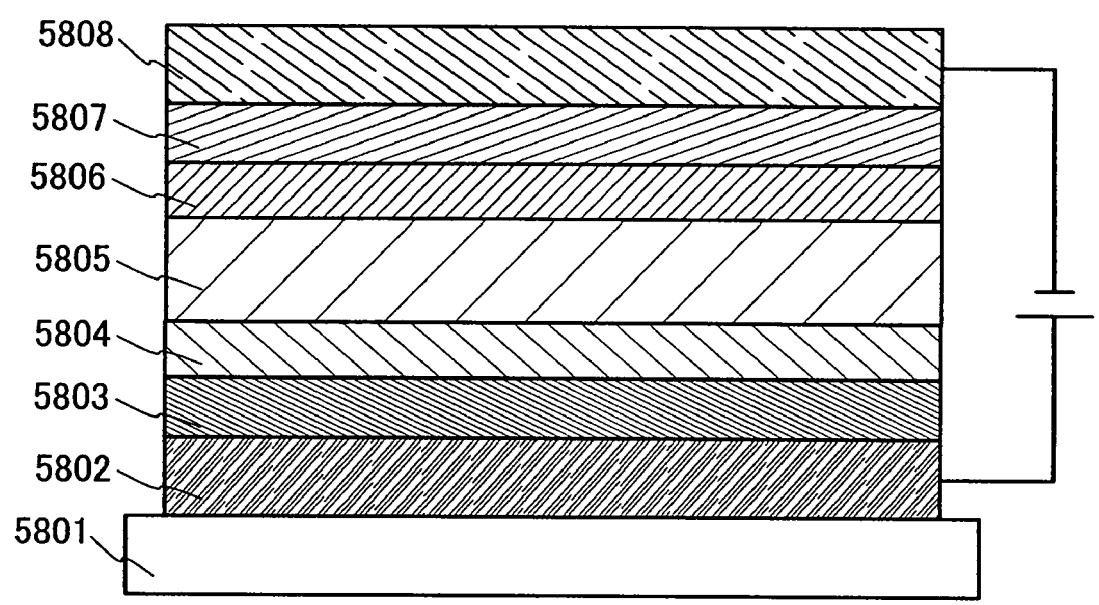
FIG. 58 is a diagram showing an example of a structure of a light emitting element used for a display device of the invention.

Next, FIG. 58 shows an example of a light emitting element which can be applied to the light emitting element 5718.

An element structure is such that an anode 5802, a hole injecting layer 5803 formed of a hole injecting material, a hole transporting layer 5804 formed of a hole transporting material, a light emitting layer 5805, an electron transporting layer 5806 formed of an electron transporting material, an electron injecting layer 5807 formed of an electron injecting material, and a cathode 5808 are stacked over a substrate 5801.

Here, the light emitting layer 5805 is formed of only one kind of a light emitting material in some cases and formed of two or more kinds of materials in other cases. A structure of the element of the invention is not limited thereto.

In addition to the stacked-layer structure shown in FIG. 58, in which functional layers are stacked, there are wide variations such as an element formed using a high molecular compound and a high efficiency element utilizing a triplet light emitting material which emits light from a triplet excitation state in a light emitting layer.

These variations can also be applied to a white light emitting element which can be obtained by dividing a light emitting region into two regions by control of a recombination region of carriers using a hole blocking layer and the like.

Next, a manufacturing method of the element of the invention shown in FIG. 58 is described. First, a hole injecting material, a hole transporting material, and a light emitting material are sequentially deposited over the substrate 5801 including the anode 5802 (ITO (indium tin oxide)). Next, an electron transporting material and an electron injecting material are deposited, and finally, the cathode 5808 is formed by evaporation.

Next, materials suitable for the hole injecting material, the hole transporting material, the electron transporting material, the electron injecting material, and the light emitting material are described as follows.

As the hole injecting material, an organic compound such as a porphyrin-based compound, phthalocyanine (hereinafter referred to as $H_2Pc$), copper phthalocyanine (hereinafter referred to as CuPc), or the like is effective. A material which has a lower ionization potential than that of the hole transporting material to be used and has a hole transporting function can also be used as the hole injecting material. Further, a material, such as polyaniline and polyethylene dioxythiophene (hereinafter referred to as PEDOT) doped with polystyrene sulfonate (hereinafter referred to as PSS), obtained by chemically doping a conductive high molecular compound may also employed.

Further, an insulating high molecular compound is effective in planarization of the anode, and polyimide (hereinafter referred to as PI) is often used. Further, an inorganic compound which includes an ultrathin film of aluminum oxide (hereinafter referred to as "alumina") as well as a thin film of a metal such as gold or platinum is also used.

As the hole transporting material, an aromatic amine-based compound (that is, a compound having a benzene ring-nitrogen bond) is most widely used. A material which is widely used as the hole transporting material includes 4,4'-bis(diphenylamino)-biphenyl (hereinafter referred to as TAD), derivatives thereof such as 4,4'-bis[N-(3-methylphenyl)-N-phenyl-amino]-biphenyl (hereinafter referred to as TPD), and 4,4'-bis[N-(1-naphthyl)-N-phenyl-amino]-biphenyl (hereinafter referred to as α-NPD), and starburst aromatic amine compounds such as 4,4',4''-tris(N,N-diphenyl-amino)-triphenylamine (hereinafter referred to as TDATA) and 4,4',4''-tris[N-(3-methylphenyl)-N-phenyl-amino]-triphenylamine (hereinafter referred to as MTDATA).

As the electron transporting material, a metal complex is often used, which includes a metal complex having a quinoline skeleton or a benzoquinoline skeleton, such as tris(8-quinolinolato)aluminum (hereinafter referred to as $Alq_3$), BAlq, tris(4-methyl-8-quinolinolato)aluminum (hereinafter referred to as Almq), or bis(10-hydroxybenzo[h]-quinolinato)beryllium (hereinafter referred to as Bebq). In addition, a metal complex having an oxazole-based or a thiazole-based ligand such as bis[2-(2-hydroxyphenyl)-benzoxazolato]zinc (hereinafter referred to as $Zn(BOX)_2$) or bis[2-(2-hydroxyphenyl)-benzothiazolato]zinc (hereinafter referred to as $Zn(BTZ)_2$) may be employed. Further, in addition to the metal complexes, oxadiazole derivatives such as 2-(4-biphenylyl)-5-(4-tert-butylphenyl)-1,3,4-oxadiazole (hereinafter referred to as PBD) and OXD-7, triazole derivatives such as TAZ and 3-(4-tert-butylphenyl)-4-(4-ethylphenyl)-5-(4-biphenylyl)-1,2,4-triazole (hereinafter referred to as p-EtTAZ), and phenanthroline derivatives such as bathophenanthroline (hereinafter referred to as BPhen) and BCP have electron transporting properties As the electron injecting material, the above-mentioned electron transporting materials can be used. In addition, an ultrathin film of an insulator, for example, metal halide such as calcium fluoride, lithium fluoride, or cesium fluoride or alkali metal oxide such as lithium oxide is often used. Further, an alkali metal complex such as lithium acetyl acetonate (hereinafter referred to as Li(acac)) or 8-quinolinolato-lithium (hereinafter referred to as Liq) is also effective.

As the light emitting material, in addition to the above-mentioned metal complexes such as $Alq_3$, Almq, BeBq, BAlq, $Zn(BOX)_2$, and $Zn(BTZ)_2$, various fluorescent pigments are effective. The fluorescent pigments include 4,4'-bis(2,2-diphenyl-vinyl)-biphenyl, which is blue, and 4-(dicyanomethylene)-2-methyl-6-p-dimethylaminostyryl)-4H-pyran, which is red-orange, and the like. In addition, a triplet light emitting material which mainly includes a complex with platinum or iridium as a central metal is available. As the triplet light emitting material, tris(2-phenylpyridine)iridium, bis(2-(4'-tolyl)pyridinato-N,$C^{2'}$)acetylacetonato iridium (hereinafter referred to as acacIr(tpy)$_2$), 2,3,7,8,12,13,17,18-octaethyl-21H,23Hporphyrin-platinum, and the like are known.

By using the materials having each function as described above in combination, a highly reliable light emitting element can be formed.

A light emitting element of which layers are formed in reverse order of that in FIG. 58 can also be used. That is, the cathode 5808, the electron injecting layer 5807 formed of the electron injecting material, the electron transporting layer 5806 formed of the electron transporting material, the light emitting layer 5805, the hole transporting layer 5804 formed of the hole transporting material, the hole injecting layer 5803 formed of the hole injecting material, and the anode 5802 are sequentially stacked over the substrate 5801.

In addition, at least one of the anode and the cathode of the light emitting element is necessary to be transparent in order to extract light emission. A transistor and a light emitting element are formed over a substrate; and there are light emitting elements having a top emission structure where light emission is extracted from a surface on the side opposite to the substrate, having a bottom emission structure where light emission is extracted from a surface on the substrate side, and having a dual emission structure where light emission is extracted from both the surface on the side opposite to the substrate and the surface on the substrate side. A pixel configuration of the invention can be applied to a light emitting element having any emission structure.

A light emitting element having a top emission structure is described with reference to FIG. 59A.

A driving transistor 5901 is formed over a substrate 5900. A first electrode 5902 is formed in contact with a source electrode of the driving TFT 5901, and a layer 5903 containing an organic compound and a second electrode 5904 are formed thereover.

The first electrode 5902 is an anode of the light emitting element. The second electrode 5904 is a cathode of the light emitting element. That is, a region where the layer 5903 containing the organic compound is interposed between the first electrode 5902 and the second electrode 5904 functions as the light emitting element.

As a material used for the first electrode 5902 which functions as the anode, a material having a high work function is preferably used. For example, a single layer of a titanium nitride film, a chromium film, a tungsten film, a Zn film, a Pt film, or the like, a stacked-layer structure of a titanium nitride film and a film containing aluminum as its main component, a three-layer structure of a titanium nitride film, a film containing aluminum as its main component, and a titanium nitride film, or the like can be used.

Note that in a case of a stacked-layer structure, the resistance as a wiring is low, a good ohmic contact can be obtained, and further, a function as an anode can be achieved.

By using a metal film which reflects light, an anode which does not transmit light can be formed.

As a material used for the second electrode 5904 which functions as the cathode, a stacked layer of a thin metal film formed of a material having a low work function (Al, Ag, Li, Ca, or an alloy thereof such as MgAg, MgIn, AlLi, $CaF_2$, or calcium nitride) and a transparent conductive film (ITO (indium tin oxide), indium zinc oxide (IZO), zinc oxide (ZnO), or the like) is preferably used. By using a thin metal film and a transparent conductive film having light transmitting properties, a cathode which can transmit light can be formed.

Figure 59A:
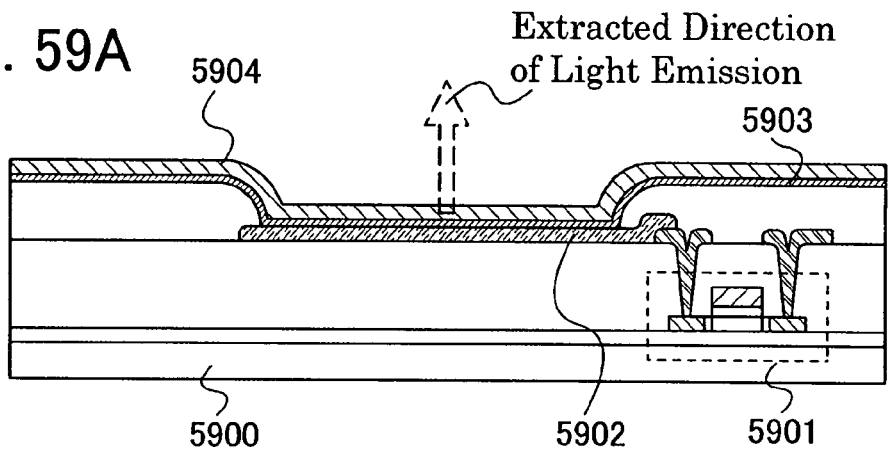
FIGS. 59A to 59C are diagrams each showing an example of a structure of a display device of the invention.

As described above, light from the light emitting element can be extracted from a top surface as shown by an arrow in FIG. 59A. That is, when the display panel shown in FIGS.

57A and 57B is employed, light is emitted toward the sealing substrate 5704 side. Therefore, when a light emitting element having a top emission structure is employed in a display device, a substrate having light transmitting properties is used as the sealing substrate 5704.

When an optical film is provided, the sealing substrate 5704 is provided with an optical film.

Note that a metal film formed of a material such as MgAg, MgIn, or AlLi, which functions as a cathode and has a low work function can be used for the first electrode 5902. In this case, a transparent conductive film, such as an ITO (indium tin oxide) film or an indium zinc oxide (IZO) film, can be used for the second electrode 5904. Therefore, the transmittance of the top light emission can be improved with this structure.

Next, a light emitting element having a bottom emission structure is described with reference to FIG. 59B. The same reference numerals as those in FIG. 59A are used since the structure of the light emitting element is the same except for the light emission structure.

Here, as a material used for the first electrode 5902 which functions as the anode, a material having a high work function is preferably used. For example, a transparent conductive film such as an ITO (indium tin oxide) film or an indium zinc oxide (IZO) film can be used. By using a transparent conductive film having light transmitting properties, an anode which can transmit light can be formed.

As a material used for the second electrode 5904 which functions as the cathode, a metal film formed of a material having a low work function (Al, Ag, Li, Ca, or an alloy thereof such as MgAg, MgIn, AlLi, CaF$_2$, or calcium nitride) can be used. By using a metal film which reflects light, a cathode which does not transmit light can be formed.

Figure 59B:
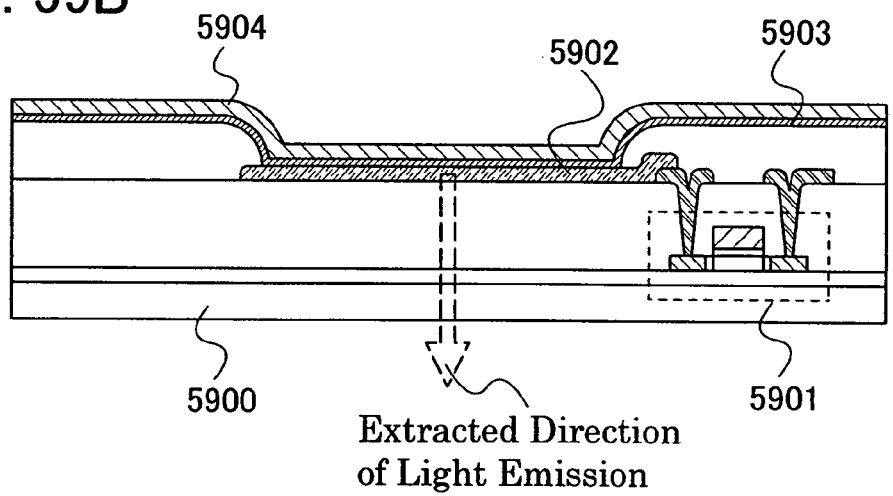

As described above, light from the light emitting element can be extracted from a bottom surface as shown by an arrow in FIG. 59B. That is, when the display panel shown in FIGS. 57A and 57B is employed, light is emitted toward the substrate 5710 side. Therefore, when a light emitting element having a bottom emission structure is employed in a display device, a substrate having light transmitting properties is used as the substrate 5710.

When an optical film is provided, the substrate 5710 is provided with an optical film.

Next, a light emitting element having a dual emission structure is described with reference to FIG. 59C. The same reference numerals as those in FIG. 59A are used since the structure of the light emitting element is the same except for the light emission structure.

Here, as a material used for the first electrode 5902 which functions as the anode, a material having a high work function is preferably used. For example, a transparent conductive film such as an ITO (indium tin oxide) film or an indium zinc oxide (IZO) film can be used. By using a transparent conductive film having light transmitting properties, an anode which can transmit light can be formed.

As a material used for the second electrode 5904 which functions as the cathode, a stacked layer of a thin metal film formed of a material having a low work function (Al, Ag, Li, Ca, or an alloy thereof such as MgAg, MgIn, AlLi, CaF$_2$, or calcium nitride) and a transparent conductive film (ITO (indium tin oxide), indium oxide zinc-oxide alloy (In$_2$O$_3$—ZnO), zinc oxide (ZnO), or the like) can be used. By using a thin metal film and a transparent conductive film having light transmitting properties, a cathode which can transmit light can be formed.

Figure 59C:
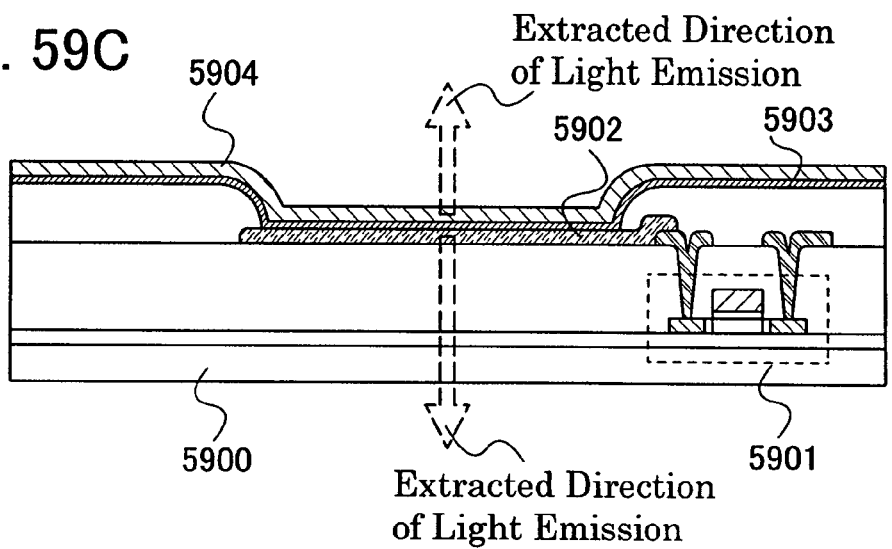

As described above, light from the light emitting element can be extracted from both sides as shown by arrows in FIG. 59C. That is, when the display panel shown in FIGS. 57A and 57B is employed, light is emitted toward the substrate 5710 side and the sealing substrate 5704 side. Therefore, when a light emitting element having a dual emission structure is employed in a display device, substrate having light transmitting properties are used for both the substrate 5710 and the sealing substrate 5704.

When an optical film is provided, both the substrate 5710 and the sealing substrate 5704 is provided with an optical film.

In addition, the invention can be applied to a display device in which full color display is realizing by using a white light emitting element and a color filter.

Figure 60:
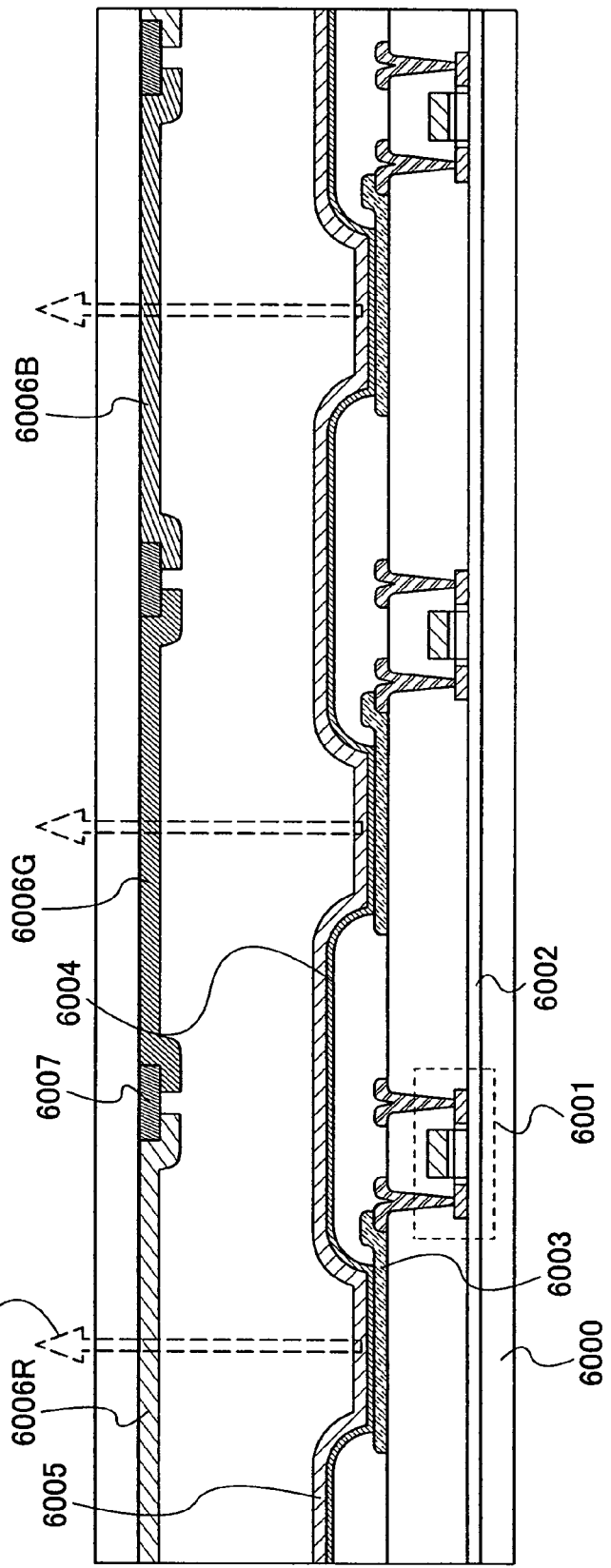
FIG. 60 is a diagram showing an example of a structure of a display device of the invention.

As shown in FIG. 60, a base film 6002 is formed over a substrate 6000, and a driving transistor 6001 is formed over the base film 6002. A first electrode 6003 is formed in contact with a source electrode of the driving transistor 6001, and a layer 6004 containing an organic compound and a second electrode 6005 are formed thereover.

The first electrode 6003 is an anode of a light emitting element. The second electrode 6005 is a cathode of the light emitting element. That is, a region where the layer 6004 containing the organic compound is interposed between the first electrode 6003 and the second electrode 6005 functions as the light emitting element. In the structure shown in FIG. 60, white light is emitted. A red color filter 6006R, a green color filter 6006G, and a blue color filter 6006B are provided over the light emitting elements; thus, full color display can be performed. Further, a black matrix (also referred to as a BM) 6007 which separates these color filters is provided.

The aforementioned structures of the light emitting element can be used in combination and can be applied to the display device of the invention as appropriate.

The structures of the display panel and the light emitting elements which are described above are only examples, and the invention can be applied to a display device having another structure.

Next, a partial cross-sectional view of a pixel portion of a display panel is shown.

First, a case where a polysilicon (p-Si) film is used as a semiconductor layer of a transistor is described with reference to FIGS. 61A to 63B.

Here, the semiconductor layer is obtained by forming an amorphous silicon (a-Si) film over a substrate by a known film formation method, for example. Note that it is not limited to the amorphous silicon film, and any semiconductor film having an amorphous structure (including a microcrystalline semiconductor film) may be used.

Further, a compound semiconductor film having an amorphous structure, such as an amorphous silicon germanium film, may be used.

Then, the amorphous silicon film is crystallized by a laser crystallization method, a thermal crystallization method using RTA or an annealing furnace, a thermal crystallization method using a metal element which promotes crystallization, or the like. It is needless to say that such crystallization methods may be performed in combination.

As a result of the aforementioned crystallization, a crystallized region is formed in a part of the amorphous semiconductor film.

Further, the crystalline semiconductor film in which part is made more crystallized is patterned into a desired shape, and an island-shaped semiconductor film is formed using the crystallized region. This semiconductor film is used as the semiconductor layer of the transistor.

As shown in FIG. 61A, a base film 6102 is formed over a substrate 6101, and a semiconductor layer is formed thereover. The semiconductor layer includes a channel forming region 6103, an LDD region 6104, and an impurity region 6105 to be a source region or drain region of a driving transistor 6118; and a channel forming region 6106, an LDD region 6107, and an impurity region 6108 to be a lower electrode of a capacitor 6119. Note that channel doping may be performed on the channel forming region 6103 and the channel forming region 6106.

As the substrate, a glass substrate, a quartz substrate, a ceramic substrate, or the like can be used. As the base film 6102, a single layer of aluminum nitride (AlN), silicon oxide (SiO$_2$), silicon oxynitride (SiOxNy), or the like, or stacked layers thereof can be used.

A gate electrode 6110 and an upper electrode 6111 of the capacitor 6119 are formed over the semiconductor layer with a gate insulating film 6109 interposed therebetween.

An interlayer insulating film 6112 is formed to cover the capacitor 6119 and the driving transistor 6118. A wiring 6113 is in contact with the impurity region 6105 over the interlayer insulating film 6112 through a contact hole. A pixel electrode 6114 is formed in contact with the wiring 6113. An insulator 6115 is formed to cover end portions of the pixel electrode 6114 and the wiring 6113. Here, the insulator 6115 is formed using a positive photosensitive acrylic resin film. Then, a layer 6116 containing an organic compound and an opposite electrode 6117 are formed over the pixel electrode 6114. A light emitting element 6120 is formed in a region where the layer 6116 containing the organic compound is interposed between the pixel electrode 6114 and the opposite electrode 6117.

Alternatively, as shown in FIG. 61B, a region 6121 may be provided so that the LDD region which forms a part of the lower electrode of the capacitor 6119 overlaps with the upper electrode 6111 of the capacitor 6119. Note that portions in common with those in FIG. 61A are denoted by the same reference numerals, and description thereof is omitted.

Alternatively, as shown in FIG. 62A, a capacitor 6123 may include a second upper electrode 6122 which is formed in the same layer as the wiring 6113 in contact with the impurity region 6105 of the driving transistor 6118. Note that portions in common with those in FIG. 61A are denoted by the same reference numerals, and description thereof is omitted. Since the second upper electrode 6122 is in contact with the impurity region 6108, a first capacitor having a structure where the gate insulating film 6109 is interposed between the upper electrode 6111 and the channel forming region 6106, and a second capacitor having a structure where the interlayer insulating film 6112 is interposed between the upper electrode 6111 and the second upper electrode 6122 are connected in parallel, so that the capacitor 6123 including the first capacitor and the second capacitor is formed. Since the capacitor 6123 has the total capacitance of the first capacitor and the second capacitor, a capacitor having a large capacitance can be formed in a small area. That is, an aperture ratio can be improved by using the capacitor having the pixel configuration of the invention.

Alternatively, a capacitor may have a structure shown in FIG. 62B. A base film 6202 is formed over a substrate 6201, and a semiconductor layer is formed thereover. The semiconductor layer includes a channel forming region 6203, an LDD region 6204, and an impurity region 6205 to be a source region or drain region of a driving transistor 6218. Note that channel doping may be performed on the channel forming region 6203.

As the substrate, a glass substrate, a quartz substrate, a ceramic substrate, or the like can be used. As the base film 6202, a single layer of aluminum nitride (AlN), silicon oxide (SiO$_2$), silicon oxynitride (SiOxNy), or the like, or stacked layers thereof can be used.

A gate electrode 6207 and a first electrode 6208 are formed over the semiconductor layer with a gate insulating film 6206 interposed therebetween.

A first interlayer insulating film 6209 is formed to cover the driving transistor 6218 and the first electrode 6208. A wiring 6210 is in contact with the impurity region 6205 over the first interlayer insulating film 6209 through a contact hole. A second electrode 6211 is formed in the same layer and of the same material as the wiring 6210.

Further, a second interlayer insulating film 6212 is formed to cover the wiring 6210 and the second electrode 6211. A pixel electrode 6213 is formed in contact with the wiring 6210 over the second interlayer insulating film 6212 through a contact hole. A third electrode 6214 is formed in the same layer and of the same material as the pixel electrode 6213. An insulator 6215 is formed to cover end portions of the pixel electrode 6213 and the third electrode 6214. The insulator 6215 is formed using, for example, a positive photosensitive acrylic resin film. Here, a capacitor 6219 is formed of the first electrode 6208, the second electrode 6211, and the third electrode 6214.

A layer 6216 containing an organic compound and an opposite electrode 6217 are formed over the pixel electrode 6213. A light emitting element 6220 is formed in a region where the layer 6216 containing the organic compound is interposed between the pixel electrode 6213 and the opposite electrode 6217.

As described above, the structures shown in FIGS. 61A to 62B can be given as examples of a structure of a transistor in which a crystalline semiconductor film is used for its semiconductor layer. Note that the structures of the transistor shown in FIGS. 61A to 62B are examples of a top gate transistor. That is, the LDD region may overlap with the gate electrode or not, or a part of the LDD region may overlap with the gate electrode. Further, the gate electrode may have a tapered shape, and the LDD region may be provided below the tapered portion of the gate electrode in a self-aligned manner. In addition, the number of gate electrodes is not limited to two, and a multi-gate structure with three or more gate electrodes may be employed, or a single gate structure may also be employed.

When a crystalline semiconductor film is used for a semiconductor layer (a channel forming region, a source region, a drain region, and the like) of a transistor included in the pixel of the invention, the scan line driver circuit and the signal line driver circuit are easily formed over the same substrate as the pixel portion. Further, a part of the scan line driver circuit may be formed over the same substrate as the pixel portion, and the other part of the scan line driver circuit may be formed over an IC chip and mounted by COG or the like as shown in FIGS. 57A and 57B. By such a structure, reduction in manufacturing cost can be realized.

As a structure of a transistor which uses polysilicon (p-Si: H) for its semiconductor layer, a structure where a gate electrode is interposed between a substrate and a semiconductor layer, in other words, a bottom gate structure where a gate electrode is located below a semiconductor layer may be applied. FIGS. 63A and 63B each show a partial cross-sectional view of a pixel portion of a display panel in which a bottom gate transistor is employed.

As shown in FIG. 63A, a base film 6302 is formed over a substrate 6301. A gate electrode 6303 is formed over the base film 6302. A first electrode 6304 is formed in the same layer and of the same material as the gate electrode 6303. As a material for the gate electrode 6303, polycrystalline silicon to which phosphorus is added can be used. In addition to polycrystalline silicon, silicide, which is a compound of a metal and silicon, may be employed.

A gate insulating film 6305 is formed to cover the gate electrode 6303 and the first electrode 6304. As the gate insulating film 6305, a silicon oxide film, a silicon nitride film, or the like is used.

A semiconductor layer is formed over the gate insulating film 6305. The semiconductor layer includes a channel forming region 6306, an LDD region 6307, and an impurity region 6308 to be a source region or drain region of a driving transistor 6322, and a channel forming region 6309, an LDD region 6310, and an impurity region 6311 to be a second electrode of a capacitor 6323. Note that channel doping may be performed on the channel forming region 6306 and the channel forming region 6309.

As the substrate, a glass substrate, a quartz substrate, a ceramic substrate, or the like can be used. As the base film 6302, a single layer of aluminum nitride (AlN), silicon oxide ($SiO_2$), silicon oxynitride (SiOxNy), or the like, or stacked layers thereof can be used.

A first interlayer insulating film 6312 is formed to cover the semiconductor layer. A wiring 6313 is in contact with the impurity region 6308 over the first interlayer insulating film 6312 through a contact hole. A third electrode 6314 is formed in the same layer and of the same material as the wiring 6313. The capacitor 6323 is formed of the first electrode 6304, the second electrode, and the third electrode 6314.

In addition, an opening 6315 is formed in the first interlayer insulating film 6312. A second interlayer insulating film 6316 is formed to cover the driving transistor 6322, the capacitor 6323, and the opening 6315. A pixel electrode 6317 is formed over the second interlayer insulating film 6316 through a contact hole. Then, an insulator 6318 is formed to cover end portions of the pixel electrode 6317. As the insulator, a positive photosensitive acrylic resin film can be used, for example. A layer 6319 containing an organic compound and an opposite electrode 6320 are formed over the pixel electrode 6317. A light emitting element 6321 is formed in a region where the layer 6319 containing the organic compound is interposed between the pixel electrode 6317 and the opposite electrode 6320. The opening 6315 is located below the light emitting element 6321. That is, when light emitted from the light emitting element 6321 is extracted from the substrate side, the transmittance can be improved since the opening 6315 is provided.

Alternatively, a structure shown in FIG. 63B, in which a fourth electrode 6324 is formed in the same layer and of the same material as the pixel electrode 6317 in FIG. 63A, may be employed. Thus, a capacitor 6325 can be formed of the first electrode 6304, the second electrode, the third electrode 6314, and the fourth electrode 6324.

Next, the case where an amorphous silicon (a-Si:H) film is used for a semiconductor layer of a transistor is described with reference to FIGS. 64A to 66B.

Figure 64A:
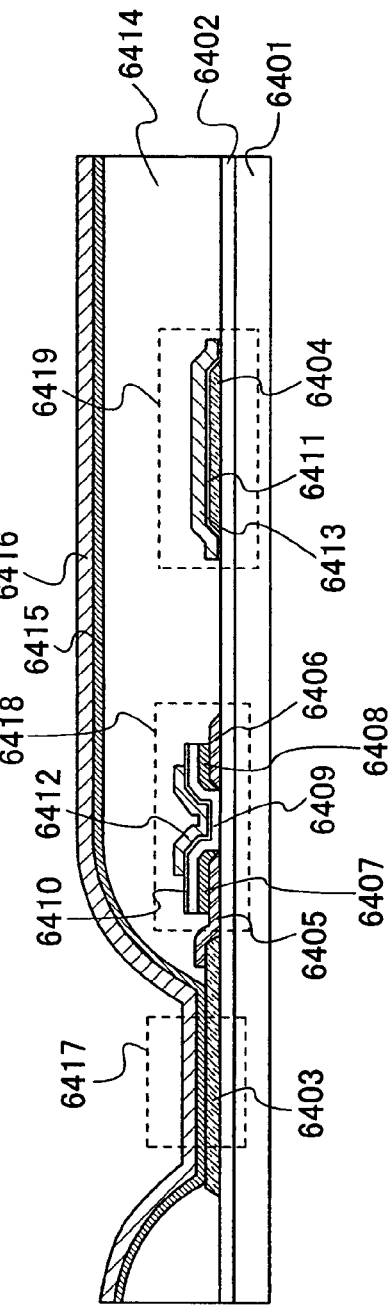
FIGS. 64A and 64B are diagrams each showing an example of a structure of a display device of the invention.
Figure 64B:
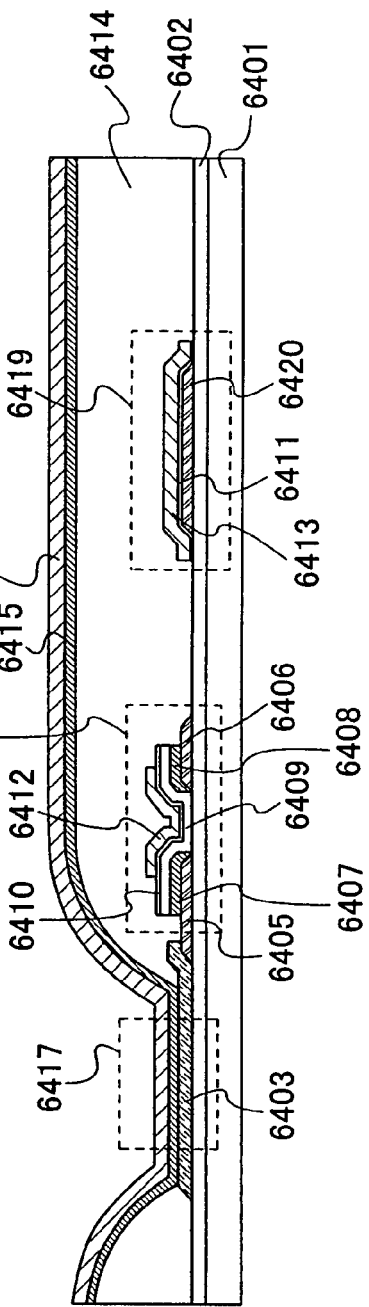

FIGS. 64A and 64B show partial cross-sectional views of a transistor having a top gate structure, which uses amorphous silicon for its semiconductor layer. As shown in FIG. 64A, a base film 6402 is formed over a substrate 6401. A pixel electrode 6403 is formed over the base film 6402. A first electrode 6404 is formed in the same layer and of the same material as the pixel electrode 6403.

As the substrate, a glass substrate, a quartz substrate, a ceramic substrate, or the like can be used. As the base film 6402, a single layer of aluminum nitride (AlN), silicon oxide ($SiO_2$), silicon oxynitride (SiOxNy), or the like, or stacked layers thereof can be used.

A wiring 6405 and a wiring 6406 are formed over the base film 6402, and an end portion of the pixel electrode 6403 is covered with the wiring 6405. An n-type semiconductor layer 6407 and an n-type semiconductor layer 6408 each having n-type conductivity are formed over the wiring 6405 and the wiring 6406, respectively. In addition, a semiconductor layer 6409 is formed between the wiring 6405 and the wiring 6406 and over the base film 6402. A part of the semiconductor layer 6409 extends over the n-type semiconductor layers 6407 and 6408. Note that this semiconductor layer is formed of a semiconductor film having non-crystallinity, such as of amorphous silicon (a-Si:H) or a microcrystalline semiconductor (μc-Si:H).

A gate insulating film 6410 is formed over the semiconductor layer 6409. An insulating film 6411 formed in the same layer and of the same material as the gate insulating film 6410 is also formed over the first electrode 6404. Note that as the gate insulating film 6410, a silicon oxide film, a silicon nitride film, or the like is used.

A gate electrode 6412 is formed over the gate insulating film 6410. A second electrode 6413 which is formed in the same layer and of the same material as the gate electrode 6412 is formed over the first electrode 6404 with the insulating film 6411 interposed therebetween. Thus, a capacitor 6419 in which the insulating film 6411 is interposed between the first electrode 6404 and the second electrode 6413 is formed.

An interlayer insulating film 6414 is formed to cover an end portion of the pixel electrode 6403, a driving transistor 6418, and the capacitor 6419.

A layer 6415 containing an organic compound and an opposite electrode 6416 are formed over the interlayer insulating film 6414 and the pixel electrode 6403 located in an opening of the interlayer insulator 6414. A light emitting element 6417 is formed in a region where the layer 6415 containing the organic compound is interposed between the pixel electrode 6403 and the opposite electrode 6416.

As shown in FIG. 64B, a first electrode 6420 may be formed instead of the first electrode 6404 shown in FIG. 64A. Note that the first electrode 6420 is formed in the same layer and of the same material as the wirings 6405 and 6406.

Next, FIGS. 65A to 66B show partial cross-sectional views of a display panel including a bottom gate transistor which uses amorphous silicon for its semiconductor layer.

Figure 65A:
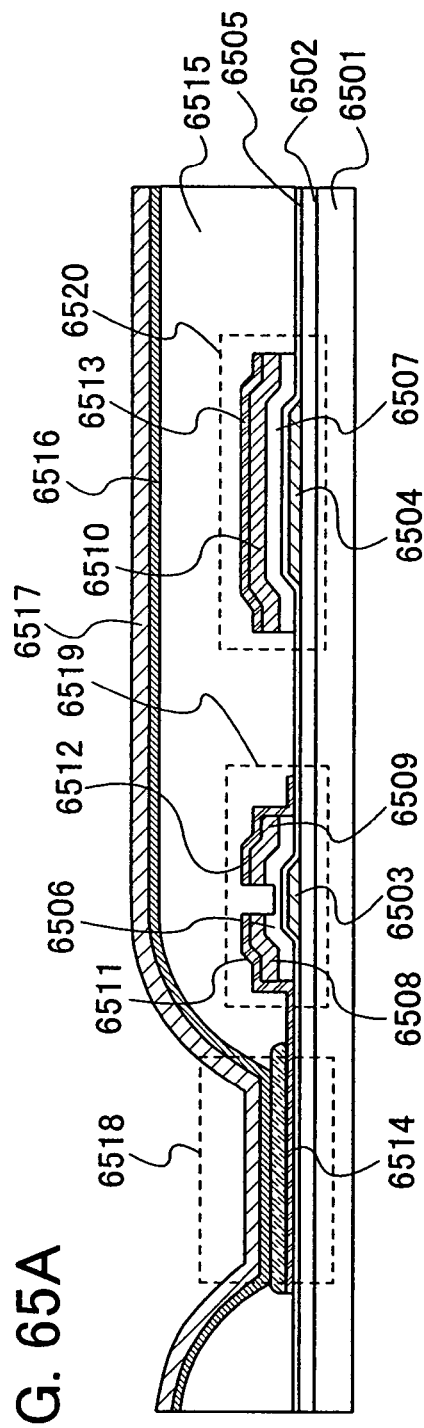
FIGS. 65A and 65B are diagrams each showing an example of a structure of a display device of the invention.

As shown in FIG. 65A, a base film 6502 is formed over a substrate 6501. A gate electrode 6503 is formed over the base film 6502. A first electrode 6504 is formed in the same layer and of the same material as the gate electrode 6503. As a material for the gate electrode 6503, polycrystalline silicon to which phosphorus is added can be used. In addition to polycrystalline silicon, silicide, which is a compound of a metal and silicon, may be used.

A gate insulating film 6505 is formed to cover the gate electrode 6503 and the first electrode 6504. As the gate insulating film 6505, a silicon oxide film, a silicon nitride film, or the like is used.

A semiconductor layer 6506 is formed over the gate insulating film 6505.

Further, a semiconductor layer 6507 is formed in the same layer and of the same material as the semiconductor layer 6506.

As the substrate, a glass substrate, a quartz substrate, a ceramic substrate, or the like can be used. As the base film

6502, a single layer of aluminum nitride (AlN), silicon oxide (SiO$_2$), silicon oxynitride (SiOxNy), or the like, or stacked layers thereof can be used.

N-type semiconductor layers 6508 and 6509 each having n-type conductivity are formed over the semiconductor layer 6506. An n-type semiconductor layer 6510 is formed over the semiconductor layer 6507.

Wirings 6511 and 6512 are formed over the n-type semiconductor layers 6508 and 6509, respectively. A conductive layer 6513, which is formed in the same layer and of the same material as the wirings 6511 and 6512, is formed over the n-type semiconductor layer 6510.

Thus, a second electrode is formed of the semiconductor layer 6507, the n-type semiconductor layer 6510, and the conductive layer 6513. Note that a capacitor 6520 in which the gate insulating film 6505 is interposed between the second electrode and the first electrode 6504 is formed.

One end portion of the wiring 6511 is extended, and a pixel electrode 6514 is formed to be in contact with an upper portion of the extended wiring 6511.

An insulator 6515 is formed to cover an end portion of the pixel electrode 6514, a driving transistor 6519, and the capacitor 6520.

A layer 6516 containing an organic compound and an opposite electrode 6517 are formed over the pixel electrode 6514 and the insulator 6515. A light emitting element 6518 is formed in a region where the layer 6516 containing the organic compound is interposed between the pixel electrode 6514 and the opposite electrode 6517.

Note that the semiconductor layer 6507 and the n-type semiconductor layer 6510 to be a part of the second electrode of the capacitor 6520 are not necessary to be formed. That is, the second electrode of the capacitor 6520 may be the conductive layer 6513 so that the capacitor 6520 has a structure where the gate insulating film is interposed between the first electrode 6504 and the conductive layer 6513.

Figure 65B:
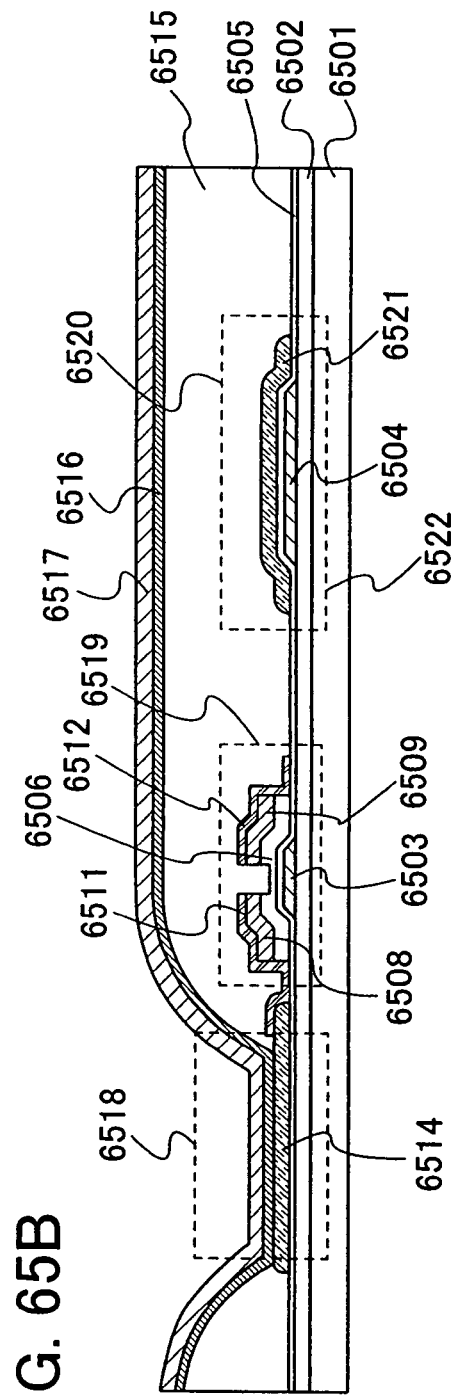

Note that in FIG. 65A, the pixel electrode 6514 may be formed before the wiring 6511 is formed, whereby a second electrode 6521 can be formed in the same layer and of the same material as the pixel electrode 6514, as shown in FIG. 65B. Thus, a capacitor 6522 in which the gate insulating film 6505 is interposed between the second electrode 6521 and the first electrode 6504 can be formed.

Note that although FIGS. 65A and 65B each show an example where an inverted staggered channel-etched transistor is applied, a channel protective transistor may also be used. A case where a channel protective transistor is applied is described with reference to FIGS. 66A and 66B.

A channel protective transistor shown in FIG. 66A is different from the driving transistor 6519 having a channel-etched structure shown in FIG. 65A in that an insulator 6601 to be an etching mask is provided over a region where a channel of the semiconductor layer 6506 is to be formed. Common portions are denoted by the same reference numerals.

Similarly, a channel protective transistor shown in FIG. 66B is different from the driving transistor 6519 having a channel-etched structure shown in FIG. 65B in that an insulator 6601 to be an etching mask is provided over the region where a channel of the semiconductor layer 6506 is to be formed. Common portions except that point are denoted by the same reference numerals.

When an amorphous semiconductor film is used for a semiconductor layer (a channel forming region, a source region, a drain region, and the like) of a transistor included in the pixel of the invention, manufacturing cost can be reduced.

Note that structures of the transistor and the capacitor which can be used in the pixel portion in the display device of the invention are not limited to those described above, and transistors and capacitors with various structures can be used.

Note that the content described in this embodiment mode can be freely implemented in combination with the content described in Embodiment Modes 1 to 6.

Embodiment Mode 8

In this embodiment mode, a method for manufacturing a semiconductor device by using plasma treatment is described as a method for manufacturing a semiconductor device including a transistor.

Figure 67A:
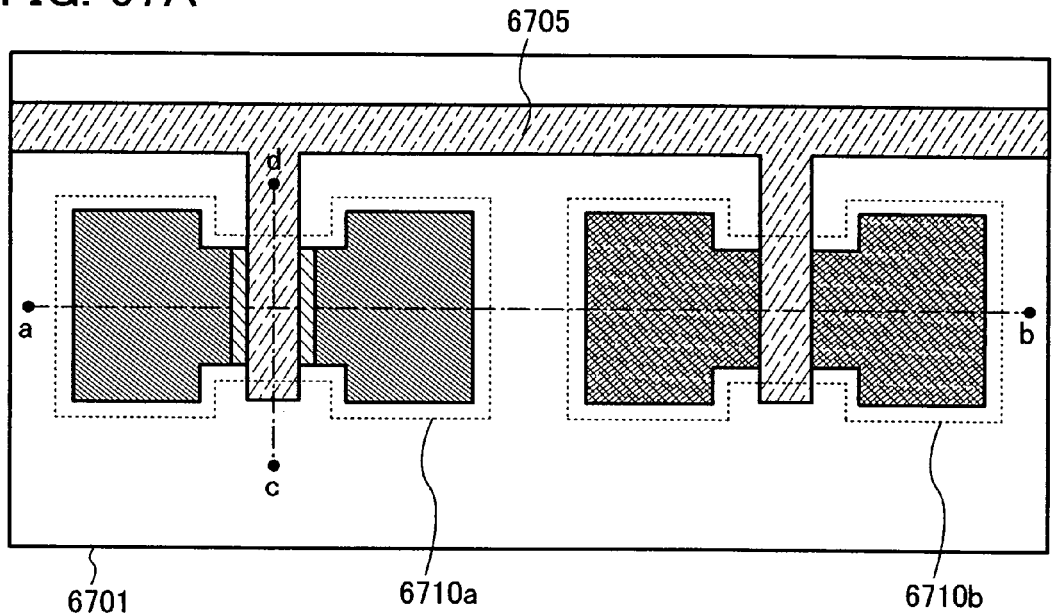
FIGS. 67A to 67C are diagrams showing a structure of a transistor used for a display device of the invention.
Figure 67B:
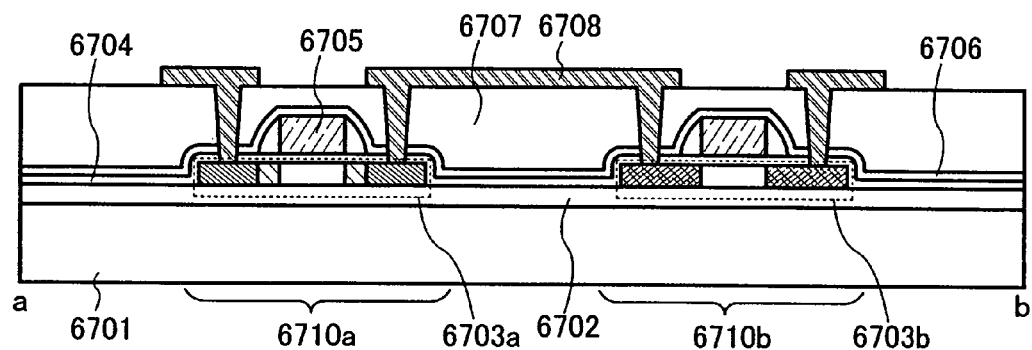
Figure 67C:
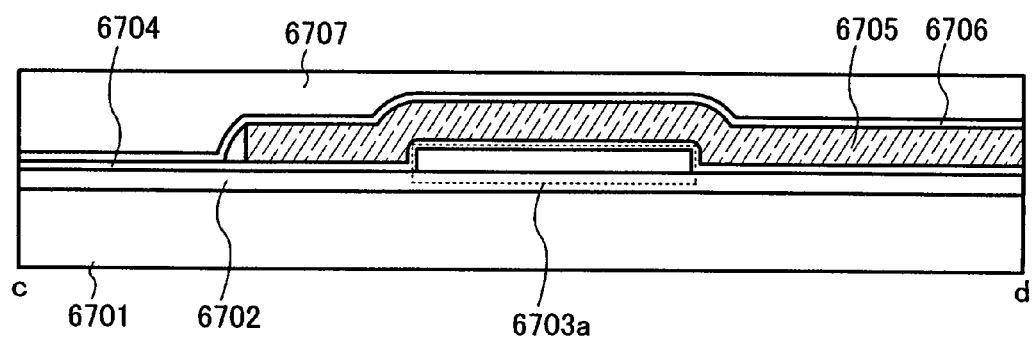

FIGS. 67A to 67C show diagrams showing a structure example of a semiconductor device including a transistor. FIG. 67B corresponds to a cross-sectional view along a line a-b in FIG. 67A, and FIG. 67C corresponds to a cross-sectional view along a line c-d in FIG. 67A.

A semiconductor device shown in FIGS. 67A to 67C includes semiconductor films 6703a and 6703b which are formed over a substrate 6701 with an insulating film 6702 interposed therebetween, a gate electrode 6705 which is formed over the semiconductor films 6703a and 6703b with a gate insulating film 6704 interposed therebetween, insulating films 6706 and 6707 which are formed to cover the gate electrode, and a conductive film 6708 which is connected to a source region or drain region of the semiconductor films 6703a and 6703b and formed over the insulating film 6707. Note that FIGS. 67A to 67C show a case where an n-channel transistor 6710a which uses a part of the semiconductor film 6703a as a channel region and a p-channel transistor 6710b which uses a part of the semiconductor film 6703b as a channel region are provided; however, the structure is not limited thereto. For example, in FIGS. 67A to 67C, although an LDD region is provided in the n-channel transistor 6710a and no LDD region is provided in the p-channel transistor 6710b, a structure where LDD regions are provided in both transistors or a structure where an LDD region is provided in neither of the transistors can be applied.

Note that in this embodiment mode, at least one of the substrate 6701, the insulating film 6702, the semiconductor films 6703a and 6703b, the gate insulating film 6704, the insulating film 6706 and the insulating film 6707 is oxidized or nitrided by plasma treatment to oxidize or nitride the semiconductor film or the insulating film, so that the semiconductor device shown in FIGS. 67A to 67C is manufactured. By oxidizing or nitriding the semiconductor film or the insulating film by plasma treatment in such a manner, a surface of the semiconductor film or the insulating film is modified, and the insulating film can be formed to be denser than an insulating film formed by a CVD method or a sputtering method; thus, a defect such as a pinhole can be suppressed, and characteristics and the like of the semiconductor device can be improved.

In this embodiment mode, a method is described with reference to drawings, in which a semiconductor device is manufactured by performing plasma treatment on the semiconductor films 6703a and 6703b or the gate insulating film 6704 in FIGS. 67A to 67C and oxidizing or nitriding the semiconductor films 6703a and 6703b or the gate insulating film 6704.

First, a case is shown in which an island-shaped semiconductor film of which end portion is formed at an angle of about 90 degrees is provided over a substrate.

First, the island-shaped semiconductor films 6703a and 6703b are formed over the substrate 6701 (FIG. 68A). An amorphous semiconductor film is formed using a material containing silicon (Si) (such as $Si_xGe_{1-x}$) as its main component or the like, by using a known method (such as a sputtering method, an LPCVD method, or a plasma CVD method) over the insulating film 6702, which is formed in advance over the substrate 6701; the amorphous semiconductor film is crystallized; and the semiconductor film is selectively etched; thus, the island-shaped semiconductor films 6703a and 6703b can be provided. Note that crystallization of the amorphous semiconductor film can be performed by a crystallization method such as a laser crystallization method, a thermal crystallization method using RTA or an annealing furnace, a thermal crystallization method using a metal element which promotes crystallization, or a combination thereof. Note that in FIGS. 68A to 68D, end portions of the island-shaped semiconductor films 6703a and 6703b are provided to have an angle of about 90 degrees (θ=85 to 100 degrees).

Next, the semiconductor films 6703a and 6703b are oxidized or nitrided by plasma treatment, so that semiconductor oxide films or semiconductor nitride films 6721a and 6721b are formed on surfaces of the semiconductor films 6703a and 6703b, respectively (FIG. 68B). For example, when Si is used for the semiconductor films 6703a and 6703b, silicon oxide (SiOx) or silicon nitride (SiNx) is formed as the insulating film 6721a and the insulating film 6721b. Alternatively, the semiconductor films 6703a and 6703b may be oxidized by plasma treatment and then may be nitrided by performing plasma treatment again. In this case, silicon oxide (SiOx) is formed in contact with the semiconductor films 6703a and 6703b, and silicon nitride oxide (SiNxOy) (x>y) is formed on the surface of the silicon oxide. Note that when the semiconductor film is oxidized by plasma treatment, the plasma treatment is performed in an oxygen atmosphere (e.g., in an atmosphere of oxygen ($O_2$) and an inert gas (including at least one of He, Ne, Ar, Kr, and Xe), in an atmosphere of oxygen, hydrogen ($H_2$), and an inert gas, or in an atmosphere of dinitrogen monoxide and an inert gas). On the other hand, when the semiconductor film is nitrided by plasma treatment, the plasma treatment is performed in a nitrogen atmosphere (e.g., in an atmosphere of nitrogen ($N_2$) and an inert gas (including at least one of He, Ne, Ar, Kr, and Xe), in an atmosphere of nitrogen, hydrogen, and an inert gas, or in an atmosphere of $NH_3$ and an inert gas). As an inert gas, Ar may be used, for example. Further, a gas mixture of Ar and Kr may be used as well. Therefore, the insulating films 6721a and 6721b contain an inert gas (including as least one of He, Ne, Ar, Kr, and Xe) used for plasma treatment. When Ar is used, the insulating films 6721a and 6721b contain Ar.

In addition, the plasma treatment is performed in the atmosphere containing the aforementioned gas, with conditions of an electron density ranging from $1\times10^{11}$ to $1\times10^{13}$ $cm^{-3}$ and a plasma electron temperature ranging from 0.5 to 1.5 eV. Since the plasma electron density is high and the electron temperature in the vicinity of an object to be treated (here, the semiconductor films 6703a and 6703b) formed over the substrate 6701 is low, damage by plasma to the object to be treated can be prevented. Further, since the plasma electron density is high at $1\times10^{11}$ $cm^{-3}$ or more, an oxide film or a nitride film formed by oxidizing or nitriding the object to be treated by plasma treatment is superior in its uniformity of thickness and the like as well as being dense, as compared with a film formed by a CVD method, a sputtering method, or the like.

Further, since the plasma electron temperature is low at 1 eV or less, oxidation or nitridation can be performed at a lower temperature as compared with a conventional plasma treatment or thermal oxidation. For example, oxidation or nitridation can be performed sufficiently even when plasma treatment is performed at a temperature lower than a strain point of a glass substrate by 100 degrees or more. Note that for frequency for generating plasma, high frequency waves such as microwaves (2.45 GHz) can be used. Note that hereinafter, the plasma treatment is performed using the aforementioned conditions unless otherwise specified.

Next, the gate insulating film 6704 is formed to cover the insulating films 6721a and 6721b (FIG. 68C). The gate insulating film 6704 can be formed by a known method (such as a sputtering method, an LPCVD method, or a plasma CVD method) and provided with a single-layer structure or a stacked-layer structure of an insulating film containing oxygen or nitrogen, such as silicon oxide (SiOx), silicon nitride (SiNx), silicon oxynitride (SiOxNy) (x>y), or silicon nitride oxide (SiNxOy) (x>y). For example, when Si is used for the semiconductor films 6703a and 6703b and Si is oxidized by plasma treatment to form silicon oxide as the insulating films 6721a and 6721b on the surfaces of the semiconductor films 6703a and 6703b, silicon oxide (SiOx) is formed as the gate insulating film over the insulating films 6721a and 6721b. Alternatively, in FIG. 68B, when the insulating films 6721a and 6721b which are formed by oxidizing or nitriding the semiconductor films 6703a and 6703b by plasma treatment are sufficiently thick, the insulating films 6721a and 6721b can be used as gate insulating films.

Next, the gate electrode 6705 and the like are formed over the gate insulating film 6704, so that a semiconductor device including the n-channel transistor 6710a and the p-channel transistor 6710b which use the island-shaped semiconductor films 6703a and 6703b as channel regions can be manufactured (FIG. 68D).

In this manner, the surfaces of the semiconductor films 6703a and 6703b are oxidized or nitrided by plasma treatment before the gate insulating film 6704 is provided over the semiconductor films 6703a and 6703b; thus, short circuits between the gate electrode and the semiconductor films, which may be caused by a coverage defect of the gate insulating film 6704 at end portions 6751a and 6751b of the channel regions, or the like can be prevented. That is, when the end portions of the island-shaped semiconductor films have an angle of about 90 degrees (θ=85 to 100 degrees), the edges of the semiconductor films might not be properly covered with a gate insulating film when the gate insulating film is formed to cover the semiconductor film by a CVD method, a sputtering method, or the like. However, such a coverage defect and the like of the gate insulating film at the edges of the semiconductor films can be prevented by oxidizing or nitriding the surfaces of the semiconductor films by plasma treatment in advance.

Alternatively, in FIGS. 68A to 68D, plasma treatment may be performed after the gate insulating film 6704 is formed, whereby the gate insulating film 6704 is oxidized or nitrided. In this case, plasma treatment is performed on the gate insulating film 6704 (FIG. 69A), which is formed to cover the semiconductor films 6703a and 6703b, and the gate insulating film 6704 is oxidized or nitrided, whereby an insulating film 6723 which is an insulating oxide film or an insulating nitride film is formed on the surface of the gate insulating film 6704 (FIG. 69B). The plasma treatment can be performed under similar conditions to those in FIG. 68B. In addition, the insulating film 6723 contains an inert gas which is used for the plasma treatment, and for example, includes Ar when Ar is used for the plasma treatment.

Alternatively, in FIG. 69B, after the gate insulating film 6704 is oxidized by performing plasma treatment in an oxygen atmosphere once, plasma treatment may be performed again in a nitrogen atmosphere to nitride the gate insulating film 6704. In this case, silicon oxide (SiOx) or silicon oxynitride (SiOxNy) (x>y) is formed on the side on which semiconductor films 6703a and 6703b are, and silicon nitride oxide (SiNxOy) (x>y) is formed to be in contact with the gate electrode 6705. Thereafter, the gate electrode 6705 and the like are formed over the gate insulating film 6704, whereby a semiconductor device including the n-channel transistor 6710a and the p-channel transistor 6710b which have the island-shaped semiconductor films 6703a and 6703b used as channel regions can be manufactured (FIG. 69C). In this manner, when plasma treatment is performed on the gate insulating film, the surface of the gate insulating film can be modified to form a dense film by oxidizing or nitriding the surface of the gate insulating film. The insulating film obtained by plasma treatment is denser and has fewer defects such as a pinhole, as compared with an insulating film formed by a CVD method or a sputtering method. Thus, characteristics of the transistors can be improved.

Figure 69A:
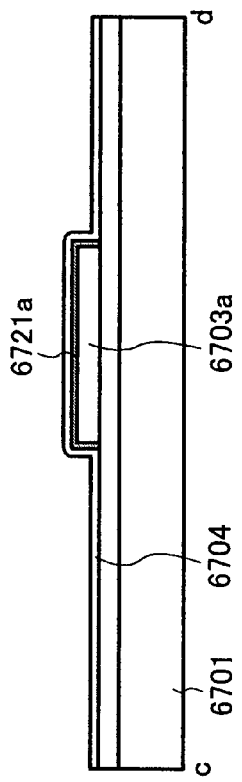
FIGS. 69A to 69C are diagrams each describing a manufacturing method of a transistor used for a display device of the invention.
Figure 69B:
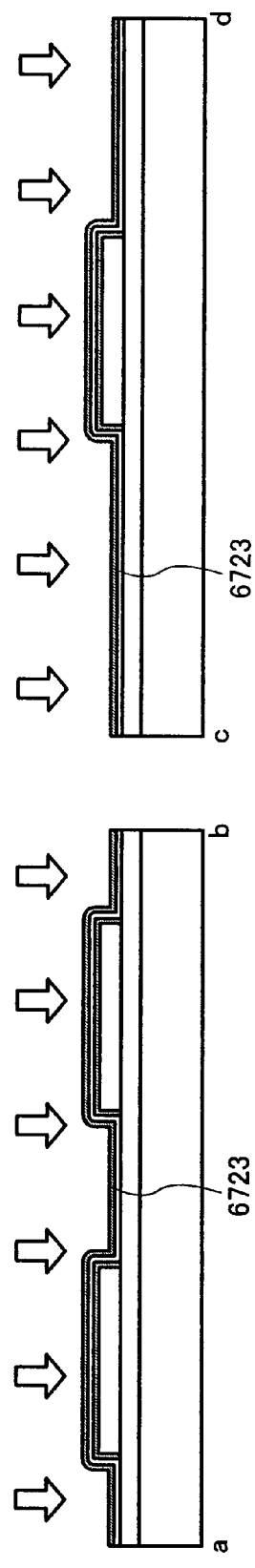
Figure 69C:
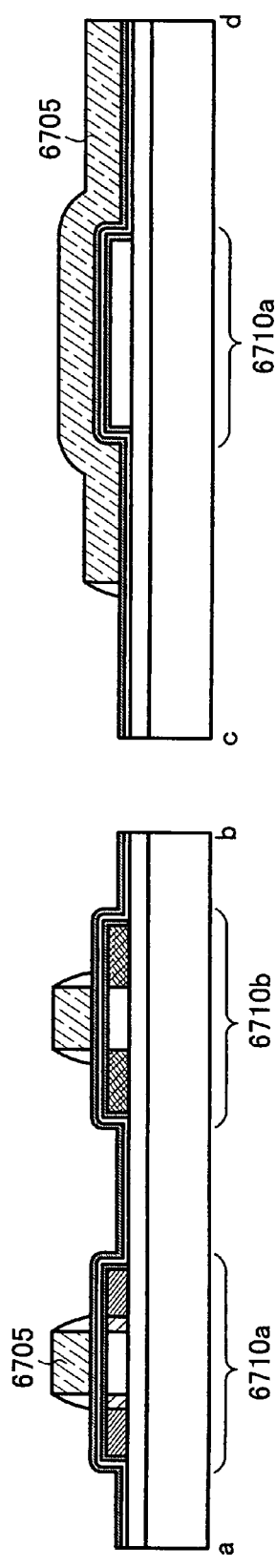

Note that FIGS. 69A to 69C show the case where the surfaces of the semiconductor films 6703a and 6703b are oxidized or nitrided by performing plasma treatment on the semiconductor films 6703a and 6703b in advance; however, a method may also be applied in which plasma treatment is not performed on the semiconductor films 6703a and 6703b but performed after the gate insulating film 6704 is formed. In this manner, by performing plasma treatment before formation of the gate electrode, an exposed portion of the semiconductor film due to a coverage defect can be oxidized or nitrided even if a coverage defect such as breaking of a gate insulating film is caused at end portions of the semiconductor film; thus, short circuits between the gate electrode and the semiconductor film, which may be caused by a coverage defect of the gate insulating film at the edges of the semiconductor film, or the like can be prevented.

In this manner, even when the island-shaped semiconductor films are formed to have edges at an angle of about 90 degrees, a short circuit between the gate electrodes and the semiconductor films, which are caused by a coverage defect of the gate insulating film at the edges of the semiconductor films, or the like can be prevented by oxidizing or nitriding the semiconductor films or the gate insulating film by plasma treatment.

Next, a case is shown in which the island-shaped semiconductor film provided over the substrate has an end portion with a tapered shape (θ=30 to 85 degrees).

First, the island-shaped semiconductor films 6703a and 6703b are formed over the substrate 6701 (FIG. 70A). An amorphous semiconductor film is formed using a material containing silicon (Si) (such as $Si_xGe_{1-x}$) as its main component or the like, using a known method (such as a sputtering method, an LPCVD method, or a plasma CVD method) over the insulating film 6702, which is formed in advance over the substrate 6701; the amorphous semiconductor film is crystallized by a known crystallization method such as a laser crystallization method, a thermal crystallization method using RTA or an annealing furnace, or a thermal crystallization method using a metal element which promotes crystallization; and the semiconductor film is selectively etched and removed; thus, the island-shaped semiconductor films 6703a and 6703b can be provided. Note that in FIGS. 70A to 70D, the end portions of the island-shaped semiconductor films 6703a and 6703b are provided to have a tapered shape (θ=30 to 85 degrees).

Next, the gate insulating film 6704 is formed to cover the semiconductor films 6703a and 6703b (FIG. 70B). The gate insulating film 6704 can be provided to have a single-layer structure or a stacked-layer structure of an insulating film containing oxygen or nitrogen, such as silicon oxide (SiOx), silicon nitride (SiNx), silicon oxynitride (SiOxNy) (x>y), or silicon nitride oxide (SiNxOy) (x>y), by a known method (such as a sputtering method, an LPCVD method, or a plasma CVD method).

Next, the gate insulating film 6704 is oxidized or nitrided by plasma treatment, so that an insulating film 6724 which is an insulating oxide film or an insulating nitride film is formed on the surface of the gate insulating film 6704 (FIG. 70C). The plasma treatment can be performed under similar conditions to the aforementioned description.

For example, when silicon oxide (SiOx) or silicon oxynitride (SiOxNy) (x>y) is used as the gate insulating film 6704, the gate insulating film 6704 is oxidized by performing plasma treatment in an oxygen atmosphere, whereby a dense insulating film with few defects, such as a pinhole, can be formed on the surface of the gate insulating film as compared with a gate insulating film formed by a CVD method, a sputtering method, or the like. On the other hand, when the gate insulating film 6704 is nitrided by plasma treatment in a nitrogen atmosphere, silicon nitride oxide (SiNxOy) (x>y) can be provided as the insulating film 6724 on the surface of the gate insulating film 6704.

Alternatively, after the gate insulating film 6704 is oxidized by performing plasma treatment in an oxygen atmosphere once, plasma treatment may be performed again in a nitrogen atmosphere to nitride the gate insulating film 6704. Further, the insulating film 6724 contains an inert gas used for the plasma treatment, and for example, contains Ar when Ar is used.

Next, the gate electrode 6705 and the like are formed over the gate insulating film 6704, whereby a semiconductor device including the n-channel transistor 6710a and the p-channel transistor 6710b which have the island-shaped semiconductor films 6703a and 6703b used as channel regions can be manufactured (FIG. 70D).

In this manner, by performing plasma treatment on the gate insulating film, the insulating film formed of an oxide film or a nitride film can be provided on the surface of the gate insulating film, and the surface of the gate insulating film can be modified. The insulating film obtained by oxidation or nitridation with plasma treatment is denser and has fewer defects, such as a pinhole, as compared with a gate insulating film formed by a CVD method or a sputtering method; therefore, the characteristics of the transistors can be improved. In addition, since short circuits between the gate electrodes and the semiconductor films, which are caused by a coverage defect of the gate insulating film at the edges of the semiconductor films, or the like can be suppressed by forming the semiconductor films to have a tapered shape, short circuits or the like between the gate electrodes and the semiconductor films can be prevented more effectively by performing plasma treatment after the gate insulating film is formed.

Next, a manufacturing method of a semiconductor device which is different from that in FIGS. 70A to 70D is described with reference to drawings. Specifically, a case is shown where plasma treatment is selectively performed on an end portion of a semiconductor film having a tapered shape.

First, the island-shaped semiconductor films 6703a and 6703b are formed over the substrate 6701 (FIG. 71A). An amorphous semiconductor film is formed using a material containing silicon (Si) (such as $Si_xGe_{1-x}$) as its main component or the like, using a known method (such as a sputtering method, an LPCVD method, or a plasma CVD method), over the insulating film 6702, which is formed in advance over the substrate 6701; the amorphous semiconductor film is crystallized; and the semiconductor film is selectively etched using resists 6725a and 6725b as masks; thus, the island-shaped semiconductor films 6703a and 6703b can be provided. Note that crystallization of the amorphous semiconductor film can be performed by a known method such as a laser crystallization method, a thermal crystallization method using RTA or an annealing furnace, a thermal crystallization method using metal elements which promote crystallization, or a combination thereof.

Next, the end portions of the island-shaped semiconductor films 6703a and 6703b are selectively oxidized or nitrided by plasma treatment before the resists 6725a and 6725b which are used for etching the semiconductor films are removed, whereby an insulating film 6726 which is a semiconductor oxide film or a semiconductor nitride film is formed in each end portion of the semiconductor films 6703a and 6703b (FIG. 71B). The plasma treatment is performed under the aforementioned conditions. In addition, the insulating film 6726 contains an inert gas used for the plasma treatment.

Next, the gate insulating film 6704 is formed to cover the semiconductor films 6703a and 6703b (FIG. 71C). The gate insulating film 6704 can be formed in a similar manner to the above description.

Next, the gate electrodes 6705 and the like are formed over the gate insulating film 6704, whereby a semiconductor device including the n-channel transistor 6710a and the p-channel transistor 6710b which have the island-shaped semiconductor films 6703a and 6703b used as channel regions can be manufactured (FIG. 71D).

When the end portions of the semiconductor films 6703a and 6703b have tapered shapes, end portions 6752a and 6752b of the channel regions, which are formed in a part of the semiconductor films 6703a and 6703b, are also tapered, and the thickness of the semiconductor films and the gate insulating film in that portion are different from that in a central portion, which may adversely affect the characteristics of the transistors. Here, insulating films are formed in the end portions of the semiconductor films, which are formed by selectively oxidizing or nitriding the end portions of the channel regions by plasma treatment; thus, such an effect on the transistors due to the end portions of the channel regions can be reduced.

Although FIGS. 71A to 71D show an example where only the end portions of the semiconductor films 6703a and 6703b are oxidized or nitrided by plasma treatment, the gate insulating film 6704 can also be oxidized or nitrided by plasma treatment as shown in FIGS. 70A to 70D (FIG. 73A).

Next, a manufacturing method of a semiconductor device which is different from the aforementioned manufacturing method is described with reference to drawings.

Specifically, a case is shown where plasma treatment is performed on semiconductor films with tapered shapes.

First, the island-shaped semiconductor films 6703a and 6703b are formed over the substrate 6701 in a similar manner to the above description (FIG. 72A).

Next, the semiconductor films 6703a and 6703b are oxidized or nitrided by plasma treatment, whereby insulating films 6727a and 6727b which are semiconductor oxide films or semiconductor nitride films are formed on the surfaces of the semiconductor films 6703a and 6703b, respectively (FIG. 72B). The plasma treatment can be performed in a manner similar to that performed under the aforementioned conditions. For example, when Si is used for the semiconductor films 6703a and 6703b, silicon oxide (SiOx) or silicon nitride (SiNx) is formed as the insulating films 6727a and 6727b. In addition, after the semiconductor films 6703a and 6703b are oxidized by plasma treatment, plasma treatment may be performed again on the semiconductor films 6703a and 6703b to nitride the semiconductor films 6703a and 6703b. In this case, silicon oxide (SiOx) or silicon oxynitride (SiOxNy) (x>y) is formed in contact with the semiconductor films 6703a and 6703b, and silicon nitride oxide (SiNxOy) (x>y) is formed on the surface of the silicon oxide. Therefore, the insulating films 6727a and 6727b contain an inert gas used for the plasma treatment. Note that the end portions of the semiconductor films 6703a and 6703b are simultaneously oxidized or nitrided by performing plasma treatment.

Next, the gate insulating film 6704 is formed to cover the insulating films 6727a and 6727b (FIG. 72C). The gate insulating film 6704 can be formed to have a single-layer structure or a stacked-layer structure of an insulating film containing oxygen or nitrogen, such as silicon oxide (SiOx), silicon nitride (SiNx), silicon oxynitride (SiOxNy) (x>y), or silicon nitride oxide (SiNxOy) (x>y), by a known method (such as a sputtering method, an LPCVD method, or a plasma CVD method).

For example, when Si is used for the semiconductor films 6703a and 6703b and the surfaces of the semiconductor films 6703a and 6703b are oxidized by plasma treatment to form silicon oxide as the insulating films 6727a and 6727b, silicon oxide (SiOx) is formed as a gate insulating film over the insulating films 6727a and 6727b.

Next, the gate electrodes 6705 and the like are formed over the gate insulating film 6704, whereby a semiconductor device including the n-channel transistor 6710a and the p-channel transistor 6710b which have the island-shaped semiconductor films 6703a and 6703b used as channel regions can be manufactured (FIG. 72D).

When the end portions of the semiconductor films have tapered shape, end portions 6753a and 6753b of the channel regions, which are formed in a part of the semiconductor films, are also tapered, which may adversely affect characteristics of semiconductor elements. When semiconductor films are oxidized or nitrided by plasma treatment, the end portions of the channel regions are also oxidized or nitrided; thus, such an effect on the semiconductor elements can be reduced.

Although FIGS. 72A to 72D show an example where only the semiconductor films 6703a and 6703b are oxidized or nitrided by plasma treatment, the gate insulating film 6704 can also be oxidized or nitrided by plasma treatment as shown in FIGS. 70A to 70D (FIG. 73B). In this case, after the gate insulating film 6704 is oxidized by plasma treatment in an oxygen atmosphere once, plasma treatment may be performed again in a nitrogen atmosphere to nitride the gate insulating film 6704. In this case, silicon oxide (SiOx) or silicon oxynitride (SiOxNy) (x>y) is formed on the side on which the semiconductor films 6703a and 6703b are, and silicon nitride oxide (SiNxOy) (x>y) is formed to be in contact with the gate electrodes 6705.

As described above, the surface of the semiconductor film or the gate insulating film is modified by oxidizing or nitriding the semiconductor film or the gate insulating film by plasma treatment, so that a dense insulating film with good film quality can be formed. As a result, even when the insulating film is formed to be thinner, a defect such as a pinhole can be prevented, and miniaturization and higher performance of a semiconductor element such as a transistor can be realized.

This embodiment mode shows an example where plasma treatment is performed to oxide or nitride the semiconductor films 6703a and 6703b or the gate insulating film 6704 shown in FIGS. 67A to 67C; however, a layer to be oxidized or nitrided by plasma treatment is not limited thereto. For example, plasma treatment may be performed on the substrate 6701 or the insulating film 6702, or on the insulating film 6706 or the insulating film 6707.

Note that the content described in this embodiment mode can be freely implemented in combination with the content described in Embodiment Modes 1 to 7.

Embodiment Mode 9

In this embodiment mode, hardware controlling the driving method shown in Embodiment Modes 1 to 6 is described.

Figure 74:
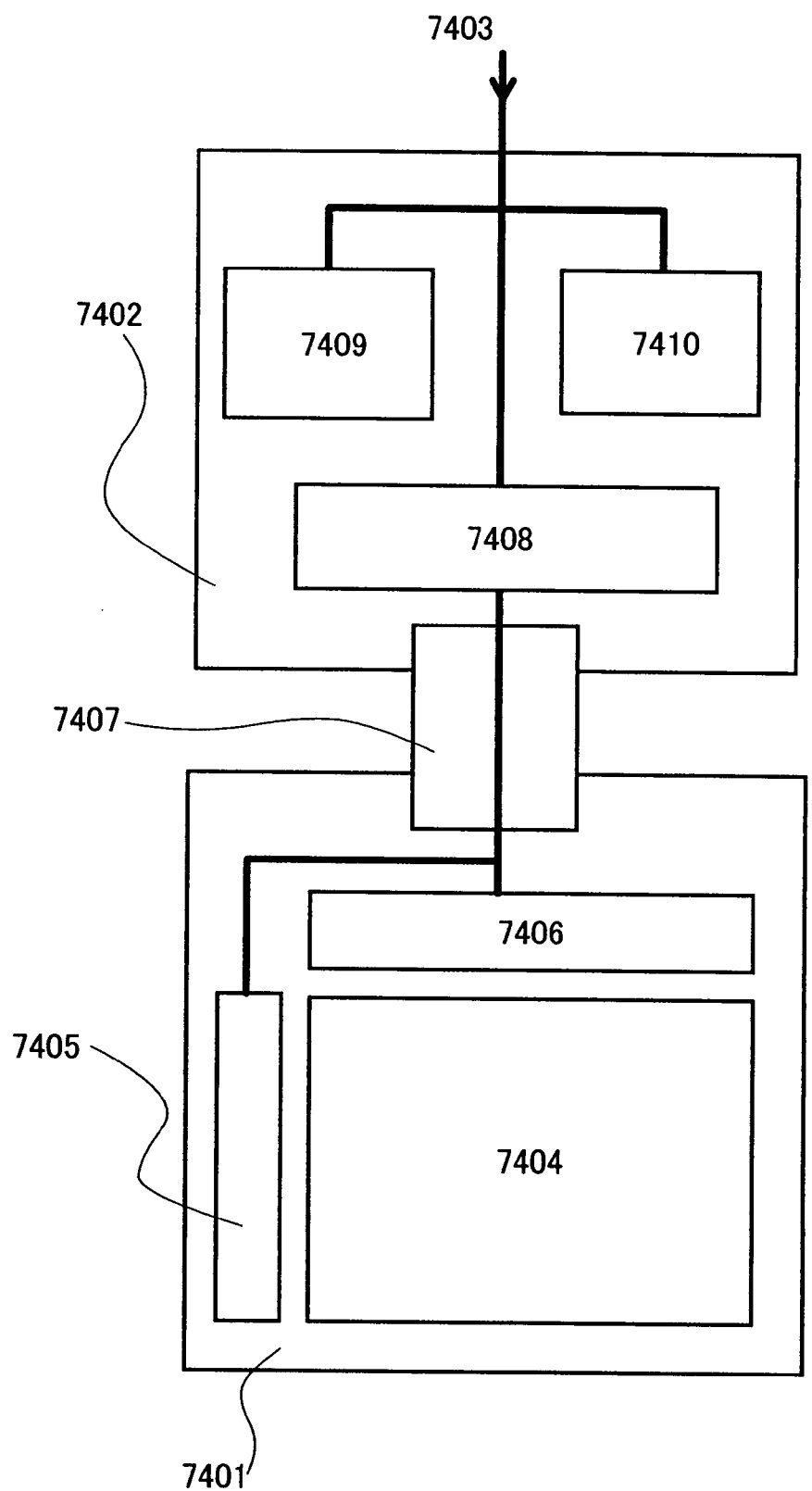
FIG. 74 is a diagram showing an example of hardware controlling a display device of the invention.

FIG. 74 shows a general block diagram. A pixel portion 7404, a signal line driver circuit 7406, and a scan line driver circuit 7405 are provided over a substrate 7401. Further, a power supply circuit, a precharge circuit, a timing generating circuit, and the like may also be provided. Note that the signal line driver circuit 7406 and the scan line driver circuit 7405 need not be provided if not necessary. In this case, a circuit which is not provided over the substrate may be formed into an IC. The IC may be provided over the substrate 7401 by COG (Chip On Glass). Alternatively, the IC may be provided over a connection substrate 7407 which connects a peripheral circuit substrate 7402 and the substrate 7401.

Signal 7403 are input to the peripheral circuit substrate 7402. Then, by control of a controller 7408, the signals are stored in memories 7409 and 7410, and the like. When the signals 7403 are analog signals, it is often converted from analog to digital to be stored in the memories 7409 and 7410 and the like. Then, the controller 7408 outputs a signal to the substrate 7401 by using the signals stored in the memories 7409 and 7410 and the like.

In order to realize the driving method shown in Embodiment Modes 1 to 6, the controller 7408 controls the order of appearance of subframes and the like to output the signal to the substrate 7401.

Note that the content described in this embodiment mode can be freely implemented in combination with the content described in Embodiment Modes 1 to 8.

Embodiment Mode 10

In this embodiment mode, structure examples of an EL module and an EL television receiver using a display device of the invention are described.

Figure 75:
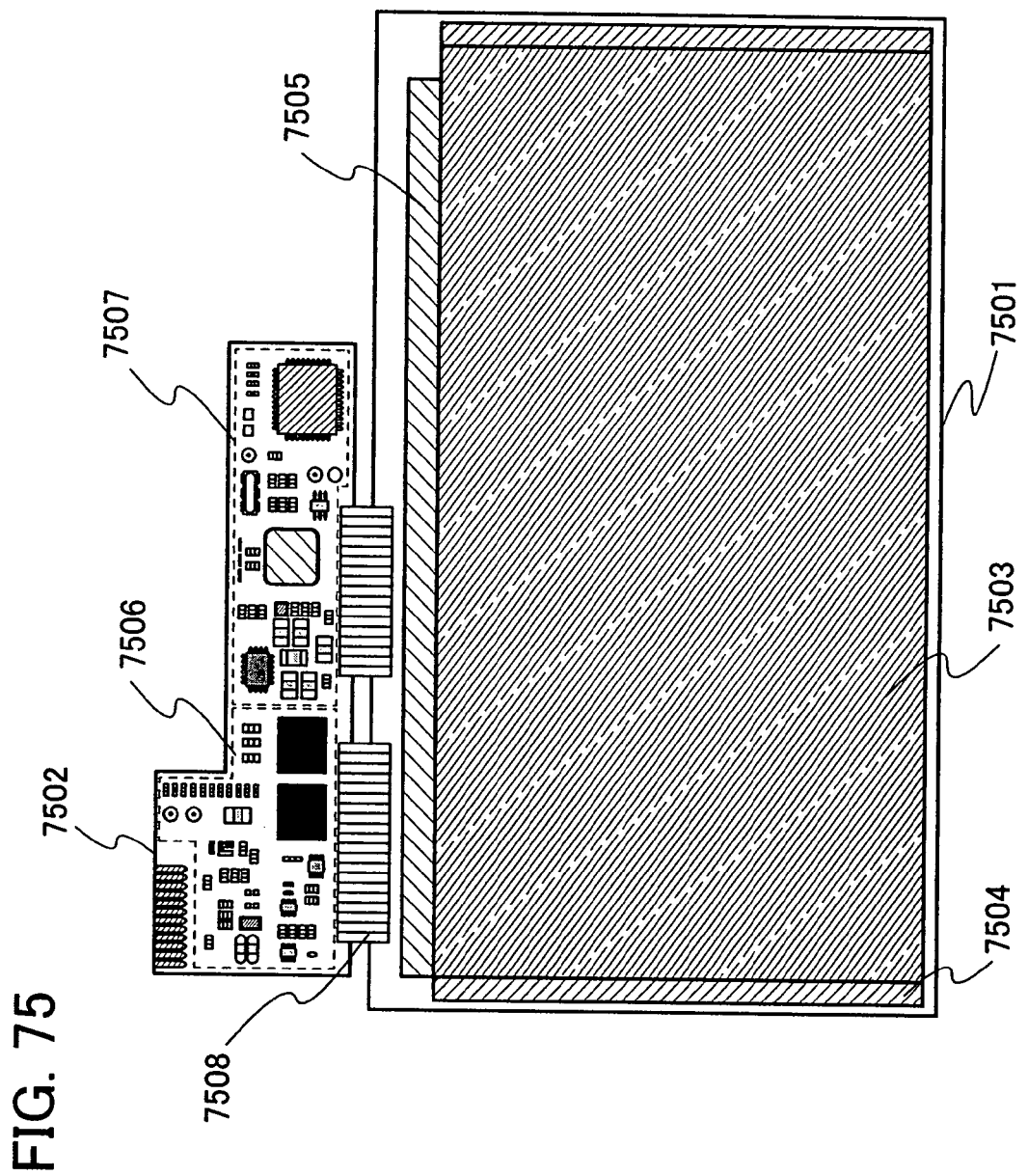
FIG. 75 is a diagram showing an example of an EL module using a display device of the invention.

FIG. 75 shows an EL module in which a display panel 7501 and a circuit board 7502 are combined. The display panel 7501 includes a pixel portion 7503, a scan line driver circuit 7504, and a signal line driver circuit 7505. For example, a control circuit 7506, a signal dividing circuit 7507, and the like are formed over the circuit board 7502. The display panel 7501 and the circuit board 7502 are connected to each other by a connection wiring 7508. As the connection wiring, an FPC or the like can be used.

The control circuit 7506 corresponds to the controller 7408, the memory 7409, the memory 7410, or the like in Embodiment Mode 9. The order of appearance of subframes and the like is controlled mainly by the control circuit 7506.

In the display panel 7501, the pixel portion and a part of peripheral driver circuits (a driver circuit having a low operation frequency among a plurality of driver circuits) may be formed over a substrate by using transistors in an integrated manner, and another part of the peripheral driver circuits (a driver circuit having a high operation frequency among the plurality of driver circuits) may be formed over an IC chip. The IC chip may be mounted on the display panel 7501 by COG (Chip On Glass) or the like.

Alternatively, the IC chip may be mounted on the display panel 7501 by using TAB (Tape Automated Bonding) or a printed wiring board.

In addition, by impedance conversion of a signal set to a scan line or a signal line by a buffer circuit, the length of a writing period for pixels of each row can be reduced. Thus, a high-definition display device can be provided.

Moreover, in order to further reduce power consumption, a pixel portion may be formed over a glass substrate by using transistors, and all signal line driver circuits may be formed over an IC chip, which may be mounted on a display panel by COG (Chip On Glass) or the like.

For example, the entire screen of the display panel may be divided into several regions, and an IC chip in which a part or all of the peripheral driver circuits (the signal line driver circuit, the scan line driver circuit, and the like) are formed may be arranged in each region to be mounted on the display panel by COG (Chip On Glass) or the like.

Figure 76:
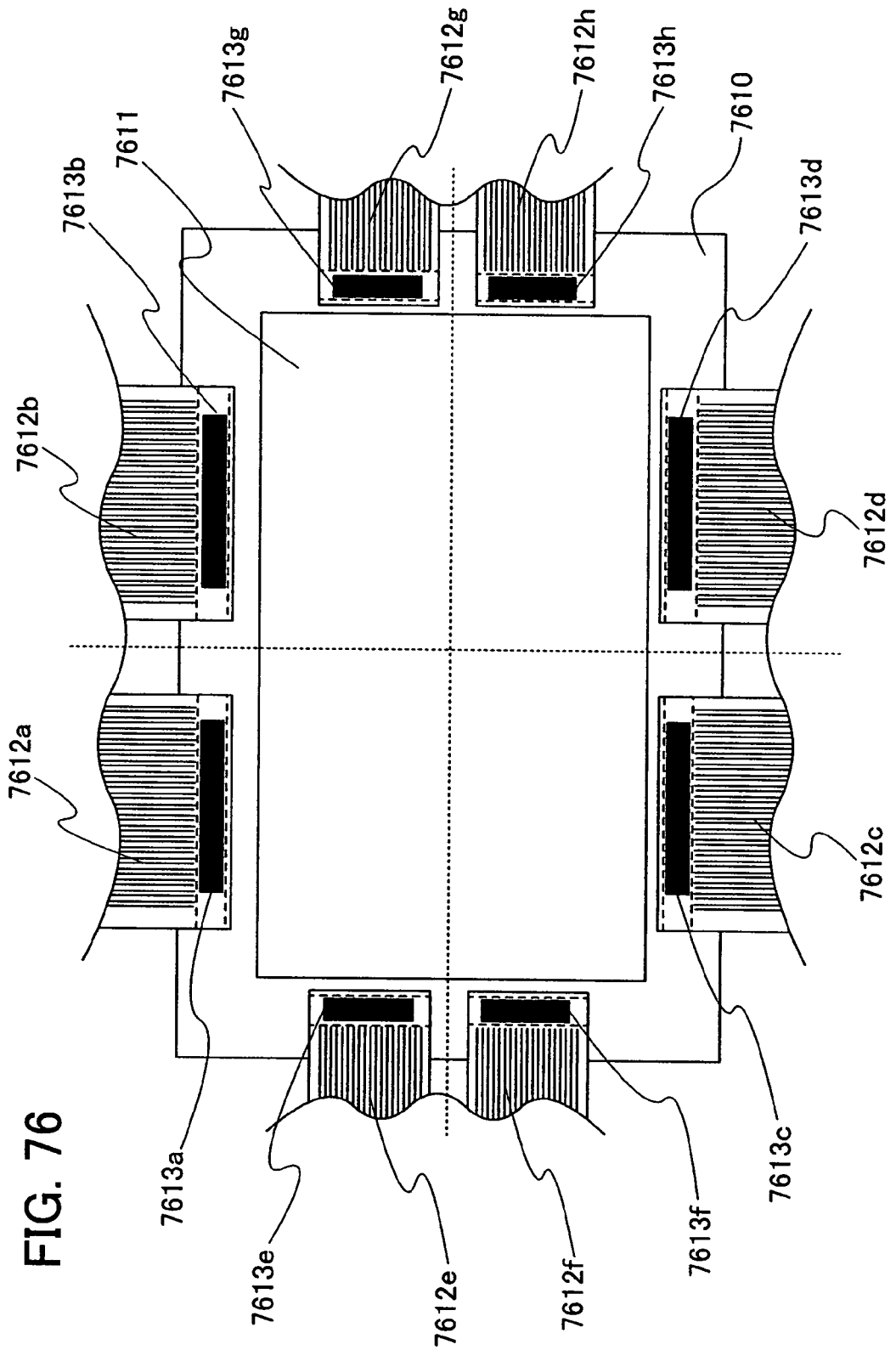
FIG. 76 is a diagram showing a structure example of a display panel using a display device of the invention.

FIG. 76 shows a structure of the display panel in this case.

FIG. 76 shows an example where driving is performed by dividing the entire screen into four regions and using eight IC chips. A display panel includes a substrate 7610, a pixel portion 7611, FPCs 7612*a* to 7612*h*, and IC chips 7613*a* to 7613*h*. Among the eight IC chips, a signal line driver circuit is formed using the IC chips 7613*a* to 7613*d*, and a scan line driver circuit is formed using the IC chips 7613*e* to 7613*h*. It becomes possible to drive only an arbitrary screen region of the four screen regions by driving arbitrary IC chips. For example, when only the IC chips 7613*a* and 7613*e* are driven, only the upper left region of the four screen regions can be driven. Thus, power consumption can be reduced.

Figure 77:
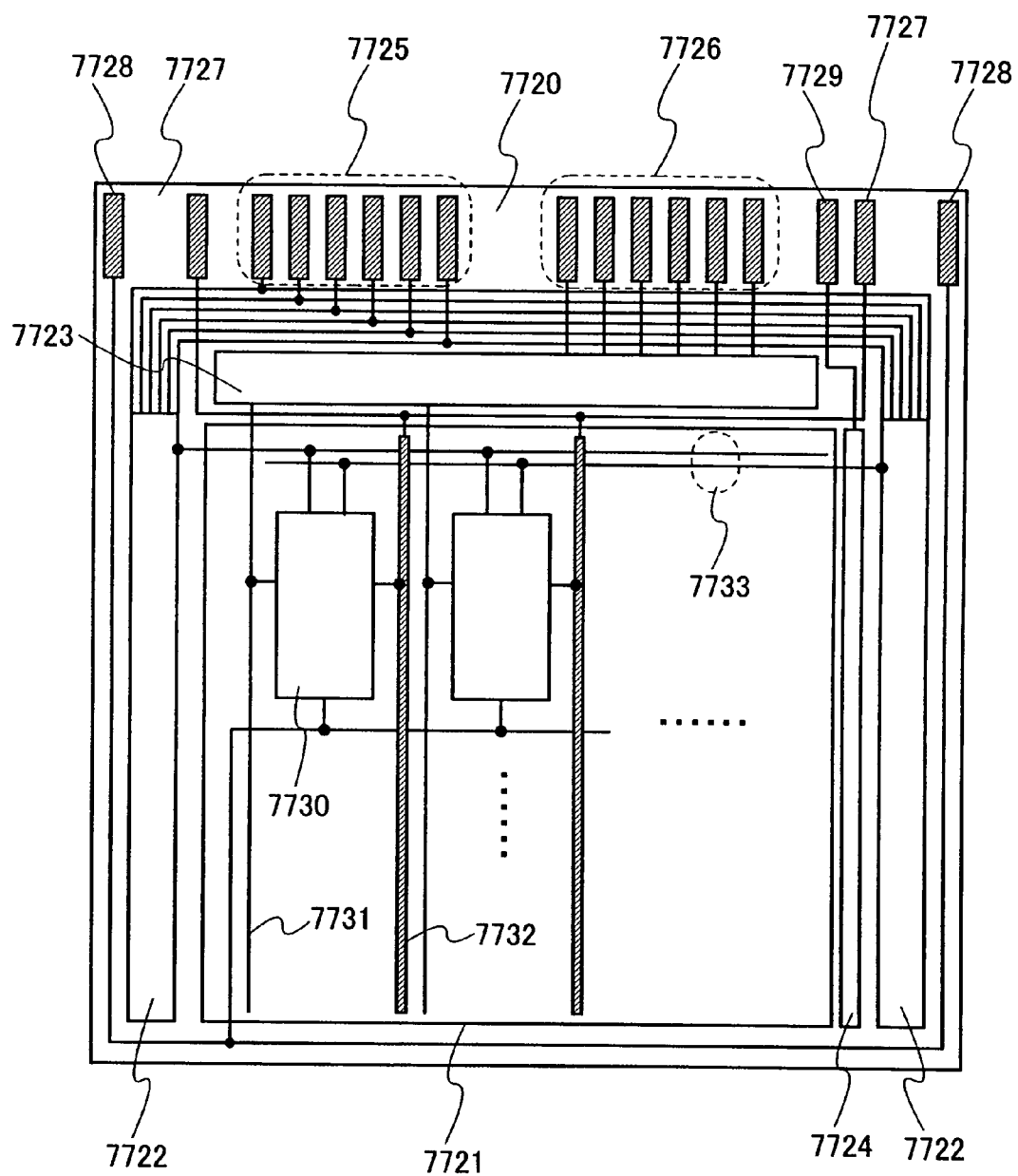
FIG. 77 is a diagram showing a structure example of a display panel using a display device of the invention.

FIG. 77 shows an example of a display device having a different structure. A display panel of FIG. 77 includes a pixel portion 7721 in which a plurality of pixels 7730 is arranged, a scan line driver circuit 7722 which controls a signal of a scan line 7733, and a signal line driver circuit 7723 which controls a signal of a signal line 7731, over a substrate 7720. In addition, a monitor circuit 7724 for correcting changes in the luminance of a light emitting element included in the pixel 7730 may also be provided.

The light emitting element included in the pixel 7730 and a light emitting element included in the monitor circuit 7724 have the same structure. The light emitting element has a structure where a layer including a material which exhibits electroluminescence is interposed between a pair of electrodes.

The peripheral portion of the substrate 7720 includes an input terminal 7725 which inputs a signal from an external circuit to the scan line driver circuit 772, an input terminal 7726 which inputs a signal from an external circuit to the signal line driver circuit 7723, and an input terminal 7729 which inputs a signal to the monitor circuit 7724.

In order to make the light emitting element included in the pixel 7730 emit light, power is necessary to be supplied from an external circuit. A power supply line 7732 provided in the pixel portion 7721 is connected to an external circuit through an input terminal 7727. Resistance loss occurs in the power supply line 7732 due to the length of a lead wiring; thus, a plurality of input terminals 7727 is preferably provided in the peripheral portion of the substrate 7720. The input terminals 7727 are provided on opposite sides of the substrate 7720 and arranged so that luminance unevenness is inconspicuous at the surface of the pixel portion 7721. In other words, display in which one side of the screen lights up while the opposite side remains dark is prevented from occurring. In addition, an electrode, which is one of a pair of electrodes included in the light emitting element, on the opposite side of the electrode connected to the power supply line 7732 is formed as a common electrode which is shared among the plurality of pixels 7730. Further, a plurality of terminals 7728 is provided to reduce resistance loss in the electrode.

In such a display panel, a power supply line is formed using a low resistance material such as Cu, which is especially effective when a screen size is increased. For example, when a screen size is a 13-inch class, the length of a diagonal line is 340 mm, while 1500 mm or more for a 60-inch class. In such a case, since wiring resistance cannot be ignored, it is preferable to use a low resistance material such as Cu for a wiring. In addition, in consideration of wiring delay, a signal line or a scan line may be formed in a similar manner.

Figure 78:
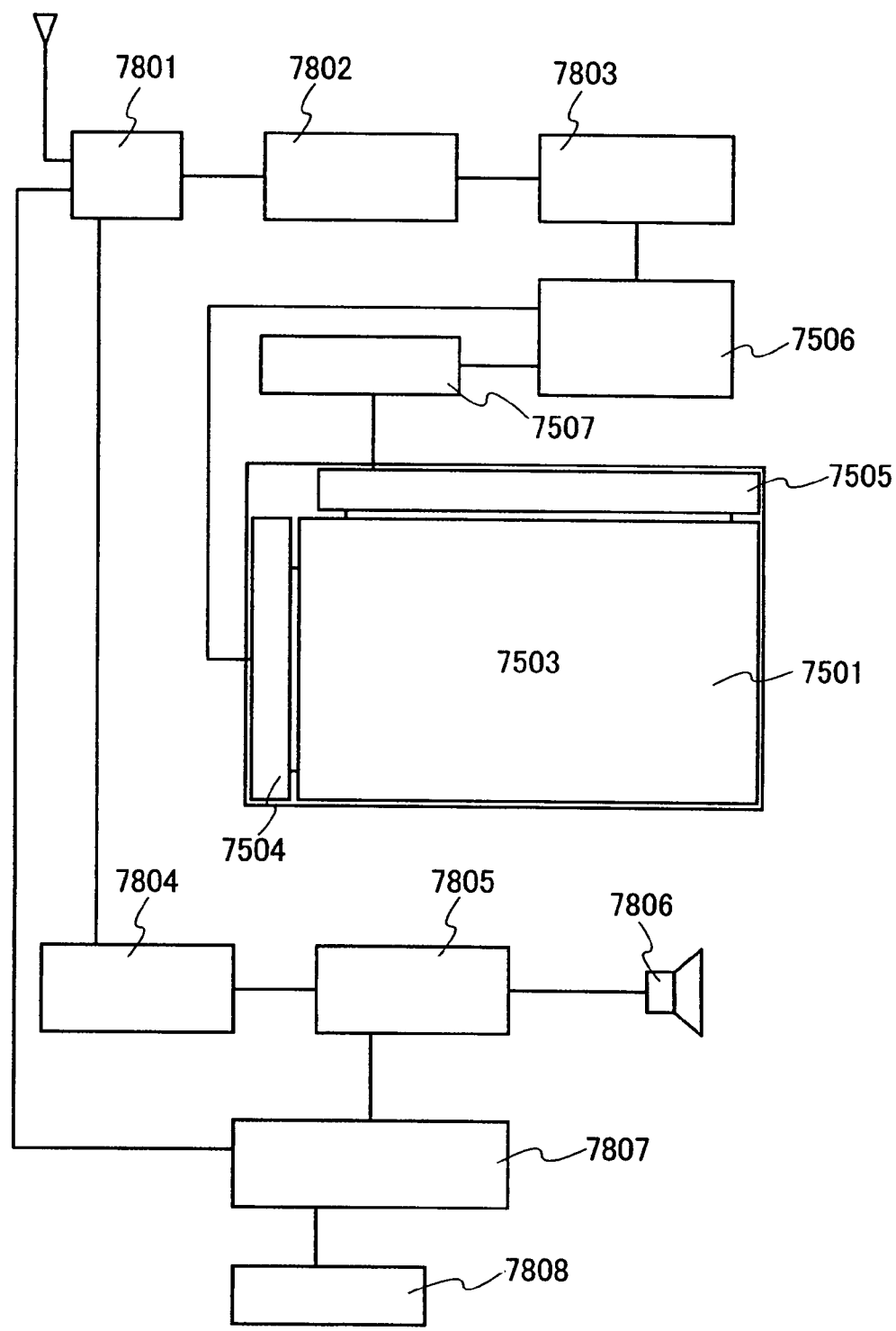
FIG. 78 is a diagram showing an example of an EL television receiver using a display device of the invention.

With such an EL module provided with the panel structure as described above, an EL television receiver can be completed. FIG. 78 is a block diagram showing the main structure of an EL television receiver. A tuner 7801 receives video signals and audio signals. The video signals are processed by a video signal amplifier circuit 7802; a video signal processing circuit 7803 for converting a signal output from the video signal amplifier circuit 7802 into a color signal corresponding to each color of red, green, and blue; and the control circuit 7506 for converting the video signal to be input to a driver circuit. The control circuit 7506 outputs signals to each of the scan line and the signal line. When digital drive is performed, the signal dividing circuit 7507 may be provided on the signal line side to divide an input digital signal into M signals before the signals are supplied.

Among the signals received by the tuner 7801, the audio signals are transmitted to an audio signal amplifier circuit 7804, and an output thereof is supplied to a speaker 7806 through an audio signal processing circuit 7805. A control circuit 7807 receives control data on a receiving station (reception frequency) or sound volume from an input portion 7808 and transmits signals to the tuner 7801 and the audio signal processing circuit 7805.

By incorporating the EL module into a housing, a television receiver can be completed. A display portion is formed using such an EL module. In addition, a speaker, a video input terminal, and the like are provided as appropriate.

It is needless to say that the invention is not limited to the television receiver and can be applied to various uses, especially as a large display medium such as a monitor of a personal computer, an information display board at a train station, airport, or the like, or an advertisement display board on the street.

By using a display device and a driving method thereof according to the invention, a clear image can be displayed with reduced pseudo contour.

Note that the content described in this embodiment mode can be freely implemented in combination with the content described in Embodiment Modes 1 to 9.

Embodiment Mode 11

Electronic appliances using the display device of the invention include cameras such as a video camera and a digital camera, a goggle-type display (head mounted display), a navigation system, an audio reproducing device (such as a car audio and an audio component), a notebook computer, a game machine, a portable information terminal (such as a mobile computer, a cellular phone, a mobile game machine, and an electronic book), an image reproducing device provided with a recording medium (specifically, a device for reproducing a recording medium such as a digital versatile disc (DVD) and having a display for displaying the reproduced image) and the like.

FIGS. 79A to 79H show specific examples of these electronic appliances.

Figure 79A:
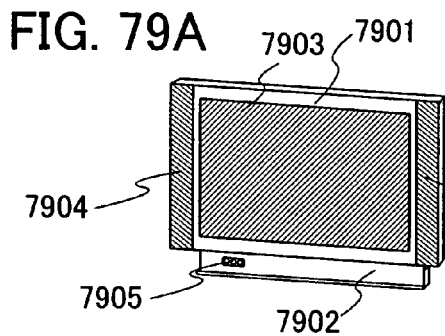
FIGS. 79A to 79H are diagrams each showing an example of an electronic appliance to which a display device of the invention is applied.

FIG. 79A shows a self-light emitting display, which includes a housing 7901, a supporting base 7902, a display portion 7903, speaker portions 7904, a video input terminal 7905, and the like. The invention can be used for a display device forming the display portion 7903. According to the invention, a clear image can be displayed with reduced pseudo contour. A backlight is not necessary since the display is a self-light emitting type, and the display portion can be made to be thinner than that of a liquid crystal display. Note that a display includes all display devices for information display, such as display devices for a personal computer, for TV broadcast reception, and for displays of advertisements.

Figure 79B:
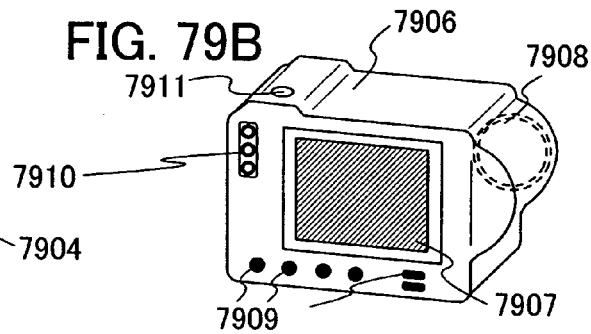

FIG. 79B shows a digital still camera, which includes a main body 7906, a display portion 7907, an image receiving portion 7908, operation keys 7909, an external connection port 7910, a shutter button 7911, and the like. The invention can be used for a display device forming the display portion 7907. According to the invention, a clear image can be displayed with reduced pseudo contour.

Figure 79C:
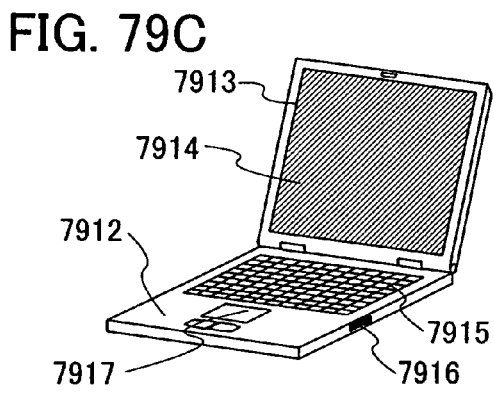

FIG. 79C shows a notebook computer, which includes a main body 7912, a housing 7913, a display portion 7914, a keyboard 7915, an external connection port 7916, a pointing device 7917, and the like. The invention can be used for a display device forming the display portion 7914. According to the invention, a clear image can be displayed with reduced pseudo contour.

Figure 79D:
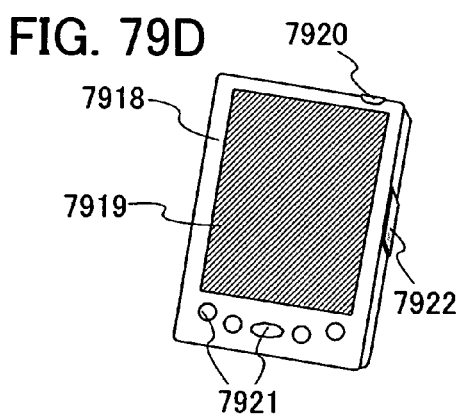

FIG. 79D shows a mobile computer, which includes a main body 7918, a display portion 7919, a switch 7920, operation keys 7921, an infrared port 7922, and the like. The invention can be used for a display device forming the display portion 7919. According to the invention, a clear image can be displayed with reduced pseudo contour.

Figure 79E:
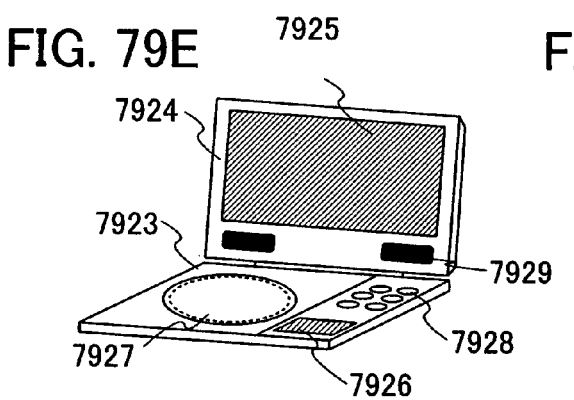

FIG. 79E shows an image reproducing device provided with a recording medium reading portion (specifically, a DVD reproducing device, for example), which includes a main body 7923, a housing 7924, a display portion A 7925, a display portion B 7926, a recording medium (such as DVD) reading portion 7927, an operation key 7928, a speaker portion 7929, and the like. The display portion A 7925 mainly displays image information, and the display portion B 7926 mainly displays text information. The invention can be used for a display device forming the display portion A 7925 and the display portion B 7926. According to the invention, a clear image can be displayed with reduced pseudo contour.

Figure 79F:
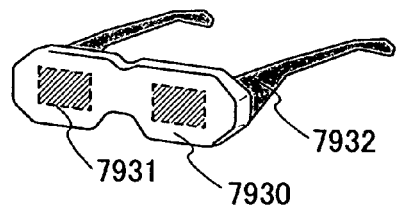

FIG. 79F shows a goggle-type display (head mounted display), which includes a main body 7930, a display portion 7931, an arm portion 7932, and the like. The invention can be used for a display device forming the display portion 7931.

According to the invention, a clear image can be displayed with reduced pseudo contour.

Figure 79G:
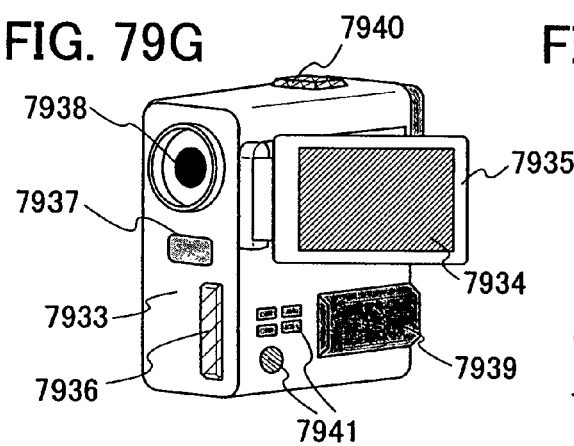

FIG. 79G shows a video camera, which includes a main body 7933, a display portion 7934, a housing 7935, an external connection port 7936, a remote control receiving portion 7937, an image receiving portion 7938, a battery 7939, an audio input portion 7940, operation keys 7941, and the like. The invention can be used for a display device forming the display portion 7934. According to the invention, a clear image can be displayed with reduced pseudo contour.

Figure 79H:
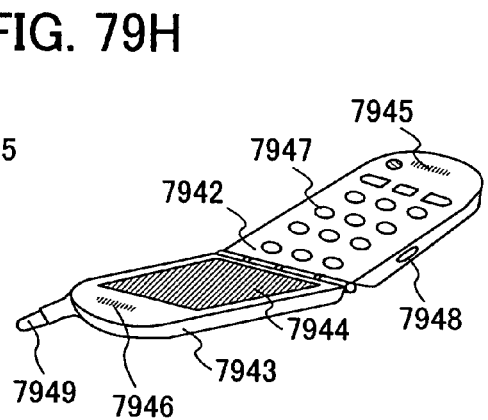

FIG. 79H shows a cellular phone, which includes a main body 7942, a housing 7943, a display portion 7944, an audio input portion 7945, an audio output portion 7946, operation keys 7947, an external connection port 7948, an antenna 7949, and the like.

The invention can be used for a display device forming the display portion 7944. According to the invention, a clear image can be displayed with reduced pseudo contour.

Note that when a light emitting material with high luminance is used, the invention can be applied to a front or rear projector which projects and magnifies light including output image information with a lens or the like.

Moreover, in recent years, the above electronic appliances have often been used for displaying information distributed through electronic communication lines such as the Internet or CATV (Cable TV), and in particular, opportunity to display moving image information has been increased. Since a light emitting material has extremely high response speed, a light emitting device is suitable for displaying moving images.

Since a light emitting display device consumes power in its light emitting portion, it is preferable to display information by utilizing as small a light emitting portion as possible. Accordingly, when a light emitting display device is used for a display portion of a portable information terminal which mainly displays text information, such as a cellular phone and an audio reproducing device in particular, it is preferable to drive the light emitting display device in such a manner that text information is displayed with a light emitting portion while using a non-light emitting portion as a background.

As described above, the application range of the invention is so wide that the invention can be applied to electronic appliances of various fields. Further, an electronic appliance of this embodiment mode can use the display device having any structure shown in Embodiment Modes 1 to 10.

This application is based on Japanese Patent Application serial No. 2006-151100 filed in Japan Patent Office on May 31, 2006, the entire contents of which are hereby incorporated by reference.

What is claimed is:

1. A driving method of a display device,
wherein the display device comprises a plurality of pixels each of which comprises a first pixel capable of emitting red light, a second pixel capable of emitting green light and a third pixel capable of emitting blue light,
wherein each of the first pixel, the second pixel and the third pixel includes first to m-th subpixels each of which comprises a light emitting element,
wherein an area of the first pixel, an area of the second pixel and an area of the third pixel are different from one another,
wherein an area of the (s+1)th subpixel is twice an area of the s-th subpixel,
wherein one frame of each of the first to m-th subpixels is divided into first to n-th subframes,
wherein a lighting period of the (p+1)th subframe is $2^m$ times longer than a lighting period of a p-th subframe,
wherein at least one of the first to n-th subframes is divided into a plurality of subframes each having a lighting period shorter than that of the one of the first to n-th subframes, so that the first to n-th subframes are increased to first to t-th subframes,
wherein when at least one of the first to m-th subpixels is lighted in at least one of the first to t-th subframes for displaying a gray scale level of i, the one of the first to m-th subpixels is lighted in the one of the first to t-th subframes for whenever displaying a gray scale level larger than i,
wherein one gate selection period is divided into two sub-gate selection periods,
wherein m is an integer of $m \geq 2$,
wherein s is an integer of $1 \leq s \leq (m-1)$,
wherein n is an integer of $n \geq 2$,
wherein p is an integer of $1 \leq p \leq (n-1)$,
wherein t is an integer of $t > n$, and
wherein i is an integer of $i \geq 0$.

2. The driving method of the display device according to claim 1, wherein the first to n-th subframes are arranged in ascending order of the length of the lighting periods.

3. The driving method of the display device according to claim 1, wherein the first to n-th subframes are arranged in descending order of the length of the lighting periods.

4. The driving method of the display device according to claim 1, wherein each of the first to n-th subframes has the lighting period and a signal writing period.

5. The driving method of the display device according to claim 1,
wherein in a low gray scale region, luminance is changed linearly with respect to the gray scale level, and
wherein in a region other than the low gray scale region, luminance is changed nonlinearly with respect to the gray scale level.

6. A driving method of a display device,
wherein the display device comprises a plurality of pixels each of which comprises a first pixel capable of emitting red light, a second pixel capable of emitting green light and a third pixel capable of emitting blue light,
wherein each of the first pixel, the second pixel and the third pixel includes first to m-th subpixels each of which comprises a light emitting element,
wherein an area of the first pixel, an area of the second pixel and an area of the third pixel are different from one another,
wherein an area of the (s+1)th subpixel is twice an area of the s-th subpixel,
wherein one frame of each of the first to m-th subpixels is divided into first to n-th subframes,
wherein a lighting period of the (p+1)th subframe is $2^m$ limes longer than a lighting period of a p-th subframe,
wherein at least one of the first to n-th subframes is divided into a plurality of subframes each having a lighting period shorter than that of the one of the first to n-th subframes, so that the first to n-th subframes are increased to first to t-th subframes,
wherein when at least one of the first to m-th subpixels is lighted in at least one of the first to t-th subframes for displaying a gray scale level of i, the one of the first to m-th subpixels is lighted in the one of the first to t-th subframes for whenever displaying a gray scale level larger than i,
wherein the one of the first to n-th subframes divided into the plurality of subframes is the n-th subframe,
wherein one gate selection period is divided into two sub-gate selection periods,
wherein m is an integer of $m \geq 2$,
wherein s is an integer of $1 \leq s \leq (m-1)$,
wherein n is an integer of $n \geq 2$,
wherein p is an integer of $1 \leq p \leq (n-1)$,
wherein t is an integer of $t > n$, and
wherein i is an integer of $i \geq 0$.

7. The driving method of the display device according to claim 6, wherein the first to n-th subframes are arranged in ascending order of the length of the lighting periods.

8. The driving method of the display device according to claim 6, wherein the first to n-th subframes are arranged in descending order of the length of the lighting periods.

9. The driving method of the display device according to claim 6, wherein each of the first to n-th subframes has the lighting period and a signal writing period.

10. The driving method of the display device according to claim 6,
   wherein in a low gray scale region, luminance is changed linearly with respect to the gray scale level, and
   wherein in a region other than the low gray scale region, luminance is changed nonlinearly with respect to the gray scale level.

11. A driving method of a display device,
   wherein the display device comprises a plurality of pixels each of which comprises a first pixel capable of emitting red light, a second pixel capable of emitting green light and a third pixel capable of emitting blue light,
   wherein each of the first pixel, the second pixel and the third pixel includes first to m-th subpixels each of which comprises a light emitting element,
   wherein an area of the first pixel, an area of the second pixel and an area of the third pixel are different from one another,
   wherein an area of the (s+1)th subpixel is twice an area of the s-th subpixel,
   wherein one frame of each of the first to m-th subpixels is divided into first to n-th subframes,
   wherein a lighting period of the (p+1)th subframe is $2^m$ times longer than a lighting period of a p-th subframe,
   wherein at least one of the first to n-th subframes is divided into a plurality of subframes each having a lighting period shorter than that of the one of the first to n-th subframes, so that the first to n-th subframes are increased to first to t-th subframes,
   wherein when at least one of the first to m-th subpixels is lighted in at least one of the first to t-th subframes for displaying a gray scale level of i, the one of the first to m-th subpixels is lighted in the one of the first to t-th subframes for whenever displaying a gray scale level larger than i,
   wherein the plurality of subframes has lighting periods equal to each other,
   wherein one gate selection period is divided into two sub-gate selection periods,
   wherein m is an integer of $m \geq 2$,
   wherein s is an integer of $1 \leq s \leq (m-1)$,
   wherein n is an integer of $n \geq 2$,
   wherein p is an integer of $1 \leq p \leq (n-1)$,
   wherein t is an integer of $t > n$, and
   wherein i is an integer of $i \geq 0$.

12. The driving method of the display device according to claim 11, wherein the first to n-th subframes are arranged in ascending order of the length of the lighting periods.

13. The driving method of the display device according to claim 11, wherein the first to n-th subframes are arranged in descending order of the length of the lighting periods.

14. The driving method of the display device according to claim 11, wherein each of the first to n-th subframes has the lighting period and a signal writing period.

15. The driving method of the display device according to claim 11,
   wherein in a low gray scale region, luminance is changed linearly with respect to the gray scale level, and
   wherein in a region other than the low gray scale region, luminance is changed nonlinearly with respect to the gray scale level.

16. A driving method of a display device,
   wherein the display device comprises a plurality of pixels each of which comprises a first pixel capable of emitting red light, a second pixel capable of emitting green light and a third pixel capable of emitting blue light,
   wherein each of the first pixel, the second pixel and the third pixel includes first to m-th subpixels each of which comprises a light emitting element,
   wherein an area of the first pixel, an area of the second pixel and an area of the third pixel are different from one another,
   wherein an area of the (s+1)th subpixel is twice an area of the s-th subpixel,
   wherein one frame of each of the first to m-th subpixels is divided into first to n-th subframes,
   wherein a lighting period of the (p+1)th subframe is $2^m$ times longer than a lighting period of a p-th subframe,
   wherein at least one of the first to n-th subframes is divided into a plurality of subframes each having a lighting period shorter than that of the one of the first to n-th subframes, so that the first to n-th subframes are increased to first to t-th subframes,
   wherein when at least one of the first to m-th subpixels is lighted in at least one of the first to t-th subframes for displaying a gray scale level of i, the one of the first to m-th subpixels is lighted in the one of the first to t-th subframes for whenever displaying a gray scale level larger than i,
   wherein the one of the first to n-th subframes divided into the plurality of subframes is the n-th subframe,
   wherein the plurality of subframes has lighting periods equal to each other,
   wherein one gate selection period is divided into two sub-gate selection periods,
   wherein m is an integer of $m \geq 2$,
   wherein s is an integer of $1 \leq s \leq (m-1)$,
   wherein n is an integer of $n \geq 2$,
   wherein p is an integer of $1 \leq p \leq (n-1)$,
   wherein t is an integer of $t > n$, and
   wherein i is an integer of $i \geq 0$.

17. The driving method of the display device according to claim 16, wherein the first to n-th subframes are arranged in ascending order of the length of the lighting periods.

18. The driving method of the display device according to claim 16, wherein the first to n-th subframes are arranged in descending order of the length of the lighting periods.

19. The driving method of the display device according to claim 16, wherein each of the first to n-th subframes has the lighting period and a signal writing period.

20. The driving method of the display device according to claim 16,
   wherein in a low gray scale region, luminance is changed linearly with respect to the gray scale level, and
   wherein in a region other than the low gray scale region, luminance is changed nonlinearly with respect to the gray scale level.

21. A display device comprising:
   a pixel comprising a first pixel capable of emitting red light, a second pixel capable of emitting green light and a third pixel capable of emitting blue light,
   wherein each of the first pixel, the second pixel and the third pixel includes first to m-th subpixels, each of which includes a light emitting element, a signal line, a scan line, a first power supply line, a second power supply line, a selection transistor, and a driving transistor,
   wherein an area of the first pixel, an area of the second pixel and an area of the third pixel are different from one another,
   wherein a first electrode of the selection transistor is electrically connected to the signal line and a second electrode of the selection transistor is electrically connected to a gate electrode of the driving transistor, wherein a first electrode of the driving transistor is electrically connected to the first power supply line, wherein a first electrode of the light emitting element is electrically connected to a second electrode of the driving transistor and a second electrode of the light emitting element is electrically connected to the second power supply line, wherein an area of the (s+1)th subpixel is twice an area of the s-th subpixel, wherein one frame of each of the first to m-th subpixels is divided into first to n-th subframes, wherein a lighting period of the (p+1)th subframe is $2^m$ times longer than a lighting period of a p-th subframe, wherein at least one of the first to n-th subframes is divided into a plurality of subframes each having a lighting period shorter than that of the one of the first to n-th subframes, so that the first to n-th subframes are increased to first to t-th subframes, wherein when at least one of the first to m-th subpixels is lighted in at least one of the first to t-th subframes for displaying a gray scale level of i, the one of the first to m-th subpixels is lighted in the one of the first to t-th subframes for whenever displaying a gray scale level larger than i, wherein one gate selection period is divided into two sub-gate selection periods, wherein m is an integer of m≧2, wherein s is an integer of 1≦s≦(m−1), wherein n is an integer of n≧2, wherein p is an integer of 1≦p≦(n−1)

wherein t is an integer of t>n, and wherein i is an integer of i≧0.

22. The display device according to claim 21, wherein the signal line is shared in the first to m-th subpixels.

23. The display device according to claim 21, wherein the scan line is shared in the first to m-th subpixels.

24. The display device according to claim 21, wherein the first power supply line is shared in the first to m-th subpixels.

25. The display device according to claim 21,
wherein the number of the signal lines included in the pixel is equal to or more than two and equal to or less than m, and
wherein the selection transistor included in one of the first to m-th subpixels is electrically connected to the signal line different from that connected to the selection transistor included in another subpixel.

26. The display device according to claim 21,
wherein the number of the scan lines included in the pixel is equal to or more than two, and
wherein the selection transistor included in one of the first to m-th subpixels is electrically connected to the scan line different from that connected to the selection transistor included in another subpixel.

27. The display device according to claim 21,
wherein the number of the first power supply lines included in the pixel is equal to or more than 2 and equal to or less than m, and
wherein the driving transistor included in one of the first to m-th subpixels is electrically connected to the first power supply line different from that connected to the driving transistor included in another subpixel.

28. An electronic appliance comprising the display device according to claim 21.

* * * * *

UNITED STATES PATENT AND TRADEMARK OFFICE
CERTIFICATE OF CORRECTION

PATENT NO. : 8,115,788 B2
APPLICATION NO. : 11/802473
DATED : February 14, 2012
INVENTOR(S) : Hajime Kimura et al.

Page 1 of 1

It is certified that error appears in the above-identified patent and that said Letters Patent is hereby corrected as shown below:

At column 68, exact line 36, nominally line 37, "limes" should be --times--.

Signed and Sealed this
Twenty-sixth Day of June, 2012

David J. Kappos
*Director of the United States Patent and Trademark Office*